(12) United States Patent
Koch, III et al.

(10) Patent No.: US 12,195,384 B2
(45) Date of Patent: *Jan. 14, 2025

(54) SCRATCH-RESISTANT LAMINATES WITH RETAINED OPTICAL PROPERTIES

(71) Applicant: CORNING INCORPORATED, Corning, NY (US)

(72) Inventors: Karl William Koch, III, Elmira, NY (US); Charles Andrew Paulson, Painted Post, NY (US); James Joseph Price, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/135,932

(22) Filed: Apr. 18, 2023

(65) Prior Publication Data
US 2023/0303432 A1 Sep. 28, 2023

Related U.S. Application Data

(63) Continuation of application No. 14/828,114, filed on Aug. 17, 2015, now Pat. No. 11,667,565, which is a
(Continued)

(51) Int. Cl.
*C03C 17/34* (2006.01)
*C03C 3/091* (2006.01)
(Continued)

(52) U.S. Cl.
CPC .......... *C03C 17/3435* (2013.01); *C03C 3/091* (2013.01); *C03C 17/245* (2013.01);
(Continued)

(58) Field of Classification Search
CPC ............ C03C 17/3435; C03C 2217/78; C03C 2217/91; C03C 17/3411
See application file for complete search history.

(56) References Cited

U.S. PATENT DOCUMENTS 3,067,021 A 12/1962 Pelley et al.
3,150,032 A 9/1964 Rubenstein
(Continued)

FOREIGN PATENT DOCUMENTS

AU 199540318 8/1996
AU 07667/73 B2 10/2003
(Continued)

OTHER PUBLICATIONS

Huang et al; "Effects of Substrate Temperature on Aluminum Nitride Films by Reactive Magnetron Sputtering." Xiyou Jinshu, 35 (5), pp. 715-718, 2011.
(Continued)

*Primary Examiner* — Laura A Auer
(74) *Attorney, Agent, or Firm* — William J. Tucker

(57) ABSTRACT

One or more aspects of the disclosure pertain to an article including an optical film structure disposed on an inorganic oxide substrate, which may include a strengthened or non-strengthened substrate that may be amorphous or crystalline, such that the article exhibits scratch resistance and retains the same or improved optical properties as the inorganic oxide substrate, without the optical film structure disposed thereon. In one or more embodiments, the article exhibits an average transmittance of 85% or more, over the visible spectrum (e.g., 380 nm-780 nm). Embodiments of the optical film structure include aluminum-containing oxides, aluminum-containing oxy-nitrides, aluminum-containing nitrides (e.g., AlN) and combinations thereof. The optical film structures disclosed herein also include a transparent dielectric including oxides such as silicon oxide, germanium oxide, aluminum oxide and a combination thereof. Methods of forming such articles are also provided.

21 Claims, 60 Drawing Sheets

Related U.S. Application Data continuation of application No. 14/267,516, filed on May 1, 2014, now Pat. No. 9,110,230.

(60) Provisional application No. 61/877,568, filed on Sep. 13, 2013, provisional application No. 61/820,407, filed on May 7, 2013.

(51) Int. Cl.
*C03C 17/245* (2006.01)
*C03C 21/00* (2006.01)
*C23C 14/34* (2006.01)
*G02B 1/10* (2015.01)
*G02B 1/14* (2015.01)

(52) U.S. Cl.
CPC ........ *C03C 17/3411* (2013.01); *C03C 21/002* (2013.01); *C23C 14/34* (2013.01); *C23C 14/3442* (2013.01); *G02B 1/10* (2013.01); *G02B 1/14* (2015.01); *C03C 2217/78* (2013.01); *C03C 2217/91* (2013.01); *Y10T 428/2495* (2015.01); *Y10T 428/31612* (2015.04)

(56) References Cited

U.S. PATENT DOCUMENTS

| | | |
|---|---|---|
| 3,413,058 A | 11/1968 | Fang et al. |
| 3,922,068 A | 11/1975 | Toshio |
| 3,934,961 A | 1/1976 | Itoh et al. |
| 3,989,350 A | 11/1976 | Cohen et al. |
| 4,033,667 A | 7/1977 | Fleming, Jr. |
| 4,137,365 A | 1/1979 | Fletcher et al. |
| 4,298,366 A | 11/1981 | Dabby et al. |
| 4,310,595 A | 1/1982 | Beall et al. |
| 4,423,925 A | 1/1984 | Dabby et al. |
| 4,495,684 A | 1/1985 | Sander et al. |
| 4,504,519 A | 3/1985 | Zelez |
| 4,519,966 A | 5/1985 | Aldinger et al. |
| 4,537,814 A | 8/1985 | Itoh et al. |
| 4,568,140 A | 2/1986 | Van et al. |
| 4,571,519 A | 2/1986 | Kawabata et al. |
| 4,579,765 A | 4/1986 | Schachtner |
| 4,687,707 A | 8/1987 | Matsuo et al. |
| 4,705,356 A | 11/1987 | Berning et al. |
| 4,797,316 A | 1/1989 | Hecq et al. |
| 4,826,734 A | 5/1989 | Jackson et al. |
| 4,851,095 A | 7/1989 | Scobey et al. |
| 4,896,928 A | 1/1990 | Perilloux et al. |
| 4,946,923 A | 8/1990 | Nagata et al. |
| 4,995,684 A | 2/1991 | Tustison et al. |
| 5,071,206 A | 12/1991 | Hood et al. |
| 5,138,219 A | 8/1992 | Krisl et al. |
| 5,178,911 A | 1/1993 | Gordon et al. |
| 5,210,253 A | 5/1993 | Kinami et al. |
| 5,234,769 A | 8/1993 | Shevlin |
| 5,268,217 A | 12/1993 | Kimock et al. |
| 5,300,951 A | 4/1994 | Yamazaki |
| 5,332,888 A | 7/1994 | Tausch et al. |
| 5,390,274 A | 2/1995 | Toyoda et al. |
| 5,393,574 A | 2/1995 | Sulzbach |
| 5,399,387 A | 3/1995 | Law et al. |
| 5,470,606 A | 11/1995 | De Boer |
| 5,478,634 A | 12/1995 | Setoyama et al. |
| 5,503,912 A | 4/1996 | Setoyama et al. |
| 5,506,038 A | 4/1996 | Knapp et al. |
| 5,508,092 A | 4/1996 | Kimock et al. |
| 5,549,953 A | 8/1996 | Li |
| 5,567,363 A | 10/1996 | Jung et al. |
| 5,597,622 A | 1/1997 | Zoeller et al. |
| 5,618,619 A | 4/1997 | Petrmichl et al. |
| 5,635,245 A | 6/1997 | Kimock et al. |
| 5,637,353 A | 6/1997 | Kimock et al. |
| 5,643,638 A | 7/1997 | Otto et al. |
| 5,718,773 A | 2/1998 | Shiozaki |
| 5,719,705 A | 2/1998 | Machol |
| 5,737,472 A | 4/1998 | Bernasson et al. |
| 5,766,783 A | 6/1998 | Utsumi et al. |
| 5,772,862 A | 6/1998 | Ando et al. |
| 5,773,148 A | 6/1998 | Charrue et al. |
| 5,811,191 A | 9/1998 | Neuman |
| 5,846,650 A | 12/1998 | Ko et al. |
| 5,935,716 A | 8/1999 | McCurdy et al. |
| 5,938,898 A | 8/1999 | Ando et al. |
| 6,045,894 A | 4/2000 | Jonza et al. |
| 6,046,855 A | 4/2000 | Goto |
| 6,074,730 A | 6/2000 | Laird et al. |
| 6,077,569 A | 6/2000 | Knapp et al. |
| 6,088,166 A | 7/2000 | Lee |
| 6,114,043 A | 9/2000 | Joret |
| 6,129,980 A | 10/2000 | Tsukada et al. |
| 6,132,650 A | 10/2000 | Nakamura |
| 6,165,598 A | 12/2000 | Nelson |
| 6,166,125 A | 12/2000 | Sugiyama et al. |
| 6,172,812 B1 | 1/2001 | Haaland et al. |
| 6,174,599 B1 | 1/2001 | Boire et al. |
| 6,208,389 B1 | 3/2001 | Aben et al. |
| 6,217,272 B1 | 4/2001 | Felsenthal et al. |
| 6,219,121 B1 | 4/2001 | Sahouani et al. |
| RE37,183 E | 5/2001 | Kawamura et al. |
| 6,238,781 B1 | 5/2001 | Anderson et al. |
| 6,250,758 B1 | 6/2001 | Yoshihara et al. |
| 6,254,913 B1 | 7/2001 | Wadsworth et al. |
| 6,267,915 B1 | 7/2001 | Park et al. |
| 6,286,965 B1 | 9/2001 | Caskey et al. |
| 6,303,225 B1 | 10/2001 | Veerasamy |
| 6,337,771 B1 | 1/2002 | Chu et al. |
| 6,338,901 B1 | 1/2002 | Veerasamy |
| 6,340,404 B1 | 1/2002 | Oka et al. |
| 6,344,288 B1 | 2/2002 | Oyama et al. |
| 6,355,334 B1 | 3/2002 | Rondeau et al. |
| 6,355,344 B1 | 3/2002 | Mamish et al. |
| 6,391,400 B1 | 5/2002 | Russell et al. |
| 6,395,333 B2 | 5/2002 | Veerasamy |
| 6,416,872 B1 | 7/2002 | Maschwitz |
| 6,495,251 B1 | 12/2002 | Arbab et al. |
| 6,503,557 B1 | 1/2003 | Joret |
| 6,521,677 B2 | 2/2003 | Yashiro et al. |
| 6,524,714 B1 | 2/2003 | Neuman et al. |
| 6,535,333 B1 | 3/2003 | Piepel et al. |
| 6,570,709 B2 | 5/2003 | Katayama et al. |
| 6,572,990 B1 | 6/2003 | Oyama et al. |
| 6,580,512 B1 | 6/2003 | Hussey et al. |
| 6,583,935 B1 | 6/2003 | Saif et al. |
| 6,596,368 B1 | 7/2003 | Liebig et al. |
| 6,605,358 B1 | 8/2003 | Stachowiak |
| 6,652,974 B1 | 11/2003 | Krisko |
| 6,707,610 B1 | 3/2004 | Woodard et al. |
| 6,723,423 B1 | 4/2004 | Kaneko et al. |
| 6,730,352 B2 | 5/2004 | Stachowiak |
| 6,743,516 B2 | 6/2004 | Murphy et al. |
| 6,746,775 B1 | 6/2004 | Boire et al. |
| 6,783,253 B2 | 8/2004 | Thomsen et al. |
| 6,785,468 B2 | 8/2004 | Takasaki et al. |
| 6,813,096 B2 | 11/2004 | Ohta |
| 6,824,709 B2 | 11/2004 | Shundo |
| 6,838,179 B1 | 1/2005 | Legrand |
| 6,846,599 B2 | 1/2005 | Ide |
| 6,862,139 B2 | 3/2005 | Chang et al. |
| 6,875,468 B2 | 4/2005 | Kunz et al. |
| 6,908,480 B2 | 6/2005 | Jayaraman |
| 6,924,037 B1 | 8/2005 | Joret et al. |
| 6,950,236 B2 | 9/2005 | Hokazono et al. |
| 6,986,857 B2 | 1/2006 | Klemm et al. |
| 6,998,177 B2 | 2/2006 | Krzyzak et al. |
| 7,005,188 B2 | 2/2006 | Anderson et al. |
| 7,018,727 B2 | 3/2006 | Dzick |
| 7,037,573 B2 | 5/2006 | Miyatake et al. |
| 7,055,954 B2 | 6/2006 | Marechal |
| 7,122,253 B2 | 10/2006 | Yamaguchi et al. |
| 7,128,428 B2 | 10/2006 | Takahashi et al. |
| 7,149,032 B2 | 12/2006 | Ohishi et al. |
| 7,156,533 B2 | 1/2007 | Hoeing |

(56) References Cited

U.S. PATENT DOCUMENTS

| | | |
|---|---|---|
| 7,166,360 B2 | 1/2007 | Coustet et al. |
| 7,171,676 B2 | 1/2007 | Takeda et al. |
| 7,189,456 B2 | 3/2007 | King |
| 7,229,684 B2 | 6/2007 | Enniss et al. |
| 7,253,861 B2 | 8/2007 | Niiyama et al. |
| 7,264,866 B2 | 9/2007 | Hashimoto et al. |
| 7,332,213 B2 | 2/2008 | Mimura et al. |
| 7,351,447 B2 | 4/2008 | Nishida et al. |
| 7,371,439 B2 | 5/2008 | Matsunaga et al. |
| 7,371,786 B2 | 5/2008 | Yoshihara et al. |
| 7,378,146 B1 | 5/2008 | Hedrick et al. |
| 7,381,469 B2 | 6/2008 | Moelle et al. |
| 7,390,099 B2 | 6/2008 | Takao et al. |
| 7,405,005 B2 | 7/2008 | Watanabe |
| 7,410,686 B2 | 8/2008 | Osada et al. |
| 7,426,328 B2 | 9/2008 | Zhou et al. |
| 7,498,058 B2 | 3/2009 | Harris et al. |
| 7,521,123 B2 | 4/2009 | Hattori et al. |
| 7,541,102 B2 | 6/2009 | Klippe et al. |
| 7,542,207 B2 | 6/2009 | Matsunaga |
| 7,569,269 B2 | 8/2009 | Takada et al. |
| 7,604,358 B2 | 10/2009 | Ninomiya et al. |
| 7,629,400 B2 | 12/2009 | Hyman |
| 7,643,719 B1 | 1/2010 | Zhou et al. |
| 7,645,502 B2 | 1/2010 | Mikami et al. |
| 7,655,298 B2 | 2/2010 | Thies et al. |
| 7,724,241 B2 | 5/2010 | Fukui et al. |
| 7,736,728 B2 | 6/2010 | Loboda et al. |
| 7,736,824 B2 | 6/2010 | Yoshikawa et al. |
| 7,737,633 B2 | 6/2010 | Zheng |
| 7,796,123 B1 | 9/2010 | Irvin et al. |
| 7,799,732 B2 | 9/2010 | Tanaka et al. |
| 7,903,340 B2 | 3/2011 | Nagahama et al. |
| 7,910,215 B2 | 3/2011 | Reymond et al. |
| 7,926,939 B2 | 4/2011 | Kato et al. |
| 7,973,892 B2 | 7/2011 | Lim |
| 7,978,402 B2 | 7/2011 | Sweeney et al. |
| 8,026,021 B2 | 9/2011 | Stumpe et al. |
| 8,062,731 B2 | 11/2011 | Takada et al. |
| 8,062,749 B2 | 11/2011 | Shelestak et al. |
| 8,067,094 B2 | 11/2011 | Benson et al. |
| 8,088,502 B2 | 1/2012 | Martin et al. |
| 8,110,278 B2 | 2/2012 | Hsu et al. |
| 8,118,896 B2 | 2/2012 | Can et al. |
| 8,124,215 B2 | 2/2012 | Takao et al. |
| 8,187,671 B2 | 5/2012 | Sol |
| 8,236,433 B2 | 8/2012 | Chiu et al. |
| 8,273,801 B2 | 9/2012 | Baikerikar et al. |
| 8,304,055 B2 | 11/2012 | Haga et al. |
| 8,304,078 B2 | 11/2012 | Varshneya |
| 8,312,739 B2 | 11/2012 | Lee et al. |
| 8,325,418 B2 | 12/2012 | Nagahama et al. |
| 8,360,574 B2 | 1/2013 | Ishak et al. |
| 8,383,214 B2 | 2/2013 | Schaepkens et al. |
| 8,400,592 B2 | 3/2013 | Hirakata et al. |
| 8,409,716 B2 | 4/2013 | Schultz et al. |
| 8,425,035 B2 | 4/2013 | Von Blanckenhagen |
| 8,432,611 B1 | 4/2013 | Wach |
| 8,445,112 B2 | 5/2013 | Di Stefano |
| 8,446,673 B2 | 5/2013 | Yoshihara |
| 8,460,804 B2 | 6/2013 | Henn et al. |
| 8,508,703 B2 | 8/2013 | Lee et al. |
| 8,514,351 B2 | 8/2013 | Sasaki et al. |
| 8,561,429 B2 | 10/2013 | Allan et al. |
| 8,568,890 B2 | 10/2013 | Murata et al. |
| 8,628,896 B2 | 1/2014 | Ikeda et al. |
| 8,679,631 B2 | 3/2014 | Murata |
| 8,691,351 B2 | 4/2014 | Asakura et al. |
| 8,746,880 B2 | 6/2014 | Fukagawa et al. |
| 8,753,744 B2 | 6/2014 | Borrelli et al. |
| 8,784,933 B2 | 7/2014 | Krzyak et al. |
| 8,822,018 B2 | 9/2014 | Thoumazet et al. |
| 8,840,257 B2 | 9/2014 | Kawagishi et al. |
| 8,842,365 B2 | 9/2014 | Koike et al. |
| 8,845,172 B2 | 9/2014 | Jang et al. |
| 8,854,623 B2 | 10/2014 | Fontaine et al. |
| 8,888,965 B2 | 11/2014 | Kuppuswamy et al. |
| 9,023,457 B2 | 5/2015 | Carrilero et al. |
| 9,041,885 B2 | 5/2015 | Weber et al. |
| 9,042,019 B2 | 5/2015 | Su et al. |
| 9,051,404 B2 | 6/2015 | Jiang et al. |
| 9,051,423 B2 | 6/2015 | Qiu |
| 9,079,802 B2 | 7/2015 | Bellman et al. |
| 9,102,131 B2 | 8/2015 | Derks et al. |
| 9,110,230 B2 | 8/2015 | Koch et al. |
| 9,158,044 B2 | 10/2015 | Akiyama et al. |
| 9,249,049 B2 | 2/2016 | Fujii |
| 9,263,202 B2 | 2/2016 | Lee et al. |
| 9,296,648 B2 | 3/2016 | Henn et al. |
| 9,316,885 B2 | 4/2016 | Lo et al. |
| 9,335,444 B2 | 5/2016 | Hart et al. |
| 9,359,261 B2 | 6/2016 | Bellman et al. |
| 9,366,784 B2 | 6/2016 | Bellman et al. |
| 9,400,420 B2 | 7/2016 | Pudleiner et al. |
| 9,411,180 B2 | 8/2016 | Gollier et al. |
| 9,418,193 B2 | 8/2016 | Dowski et al. |
| 9,535,280 B2 | 1/2017 | Borrelli et al. |
| 9,550,161 B2 | 1/2017 | Arfsten et al. |
| 9,573,842 B2 | 2/2017 | Gollier et al. |
| 9,574,262 B2 | 2/2017 | Henn et al. |
| 9,581,731 B2 | 2/2017 | Bookbinder et al. |
| 9,588,263 B2 | 3/2017 | Gollier et al. |
| 9,651,720 B2 | 5/2017 | Lander et al. |
| 9,663,400 B2 | 5/2017 | O'Malley et al. |
| 9,684,097 B2 | 6/2017 | Koch et al. |
| 9,701,248 B2 | 7/2017 | Neuman et al. |
| 9,701,579 B2 | 7/2017 | Gollier et al. |
| 9,703,011 B2 | 7/2017 | Adib et al. |
| 9,718,249 B2 | 8/2017 | Kwong |
| 9,726,786 B2 | 8/2017 | Hart et al. |
| 9,766,376 B2 | 9/2017 | Ho et al. |
| 9,786,194 B2 | 10/2017 | Hyman |
| 9,790,593 B2 | 10/2017 | Adib et al. |
| 9,823,209 B2 | 11/2017 | Yu et al. |
| 9,880,328 B2 | 1/2018 | Gollier et al. |
| 9,896,596 B2 | 2/2018 | Jung et al. |
| 9,939,557 B2 | 4/2018 | David et al. |
| 9,957,609 B2 | 5/2018 | Lee et al. |
| 9,964,773 B2 | 5/2018 | Wang |
| 9,987,820 B2 | 6/2018 | Mehlmann et al. |
| 10,162,084 B2 | 12/2018 | Hart et al. |
| 10,183,889 B2 | 1/2019 | Gollier et al. |
| 10,416,352 B2 | 9/2019 | Hart et al. |
| 10,444,408 B2 | 10/2019 | Bellman et al. |
| 10,451,773 B2 | 10/2019 | Hart et al. |
| 10,613,340 B2 | 4/2020 | Borrelli et al. |
| 10,698,151 B2 | 6/2020 | Hamilton et al. |
| 10,899,661 B2 | 1/2021 | Gollier et al. |
| 10,921,492 B2 | 2/2021 | Gregorski et al. |
| 10,948,629 B2 | 3/2021 | Hart et al. |
| 11,378,719 B2 | 7/2022 | Amin et al. |
| 11,567,237 B2 | 1/2023 | Hart et al. |
| 2001/0002295 A1 | 5/2001 | Anderson et al. |
| 2001/0016262 A1 | 8/2001 | Toyoshima et al. |
| 2001/0017452 A1 | 8/2001 | Bernard |
| 2001/0031365 A1 | 10/2001 | Anderson et al. |
| 2002/0009593 A1 | 1/2002 | Veerasamy |
| 2002/0017452 A1 | 2/2002 | Zimmermann et al. |
| 2002/0051274 A1 | 5/2002 | Kim et al. |
| 2002/0051294 A1 | 5/2002 | Katayama et al. |
| 2002/0085284 A1 | 7/2002 | Nakamura et al. |
| 2002/0090507 A1 | 7/2002 | Barth et al. |
| 2002/0136908 A1 | 9/2002 | Komatsu et al. |
| 2002/0167629 A1 | 11/2002 | Blanchard |
| 2003/0019363 A1 | 1/2003 | Grover et al. |
| 2003/0031879 A1 | 2/2003 | Neuman et al. |
| 2003/0035044 A1 | 2/2003 | Nakayama et al. |
| 2003/0044652 A1 | 3/2003 | Wang |
| 2003/0116270 A1 | 6/2003 | Hawa et al. |
| 2003/0116872 A1 | 6/2003 | Klemm et al. |
| 2003/0179454 A1 | 9/2003 | Thomsen et al. |
| 2003/0193636 A1 | 10/2003 | Allen et al. |
| 2003/0234460 A1 | 12/2003 | Hayashi et al. |
| 2004/0004778 A1 | 1/2004 | Liu et al. |

(56) References Cited

U.S. PATENT DOCUMENTS

| | | |
|---|---|---|
| 2004/0005482 A1 | 1/2004 | Kobayashi et al. |
| 2004/0043260 A1* | 3/2004 | Nadaud .................. G02B 1/16 204/192.15 |
| 2004/0065968 A1 | 4/2004 | Klemm et al. |
| 2004/0147185 A1 | 7/2004 | Decroupet |
| 2004/0184765 A1 | 9/2004 | Difrancesco et al. |
| 2004/0188874 A1 | 9/2004 | Hikita et al. |
| 2004/0195960 A1 | 10/2004 | Czeremuszkin et al. |
| 2004/0233174 A1 | 11/2004 | Robrecht et al. |
| 2004/0258947 A1 | 12/2004 | Moelle et al. |
| 2005/0007019 A1 | 1/2005 | Kim et al. |
| 2005/0008863 A1 | 1/2005 | Mimura et al. |
| 2005/0012569 A1 | 1/2005 | Sasaki |
| 2005/0074591 A1 | 4/2005 | Zagdoun |
| 2005/0084705 A1 | 4/2005 | Klippe et al. |
| 2005/0123772 A1 | 6/2005 | Coustet et al. |
| 2005/0196632 A1 | 9/2005 | Maschwitz et al. |
| 2005/0233091 A1 | 10/2005 | Kumar et al. |
| 2005/0263775 A1 | 12/2005 | Ikeda et al. |
| 2005/0287309 A1 | 12/2005 | Veerasamy |
| 2006/0008654 A1 | 1/2006 | Veerasamy |
| 2006/0008655 A1 | 1/2006 | Butz et al. |
| 2006/0008656 A1 | 1/2006 | Veerasamy |
| 2006/0017707 A1 | 1/2006 | Fukui et al. |
| 2006/0019119 A1 | 1/2006 | Spitsberg et al. |
| 2006/0093833 A1 | 5/2006 | Meyer et al. |
| 2006/0115651 A1 | 6/2006 | Merfeld et al. |
| 2006/0134436 A1 | 6/2006 | Maschwitz |
| 2006/0139783 A1 | 6/2006 | Decroupet |
| 2006/0152801 A1 | 7/2006 | Matsunaga |
| 2006/0153979 A1 | 7/2006 | Asakura et al. |
| 2006/0154044 A1 | 7/2006 | Yamada et al. |
| 2006/0165963 A1 | 7/2006 | Fleury et al. |
| 2006/0197096 A1 | 9/2006 | Kerdiles et al. |
| 2006/0222863 A1 | 10/2006 | Nadaud et al. |
| 2006/0240266 A1 | 10/2006 | Schicht et al. |
| 2006/0274047 A1 | 12/2006 | Spath et al. |
| 2006/0274048 A1 | 12/2006 | Spath et al. |
| 2006/0286465 A1 | 12/2006 | Kim |
| 2007/0014981 A1 | 1/2007 | Chiang et al. |
| 2007/0018671 A1 | 1/2007 | Steck, Jr. |
| 2007/0018871 A1 | 1/2007 | Riley |
| 2007/0030569 A1 | 2/2007 | Lu et al. |
| 2007/0063147 A1 | 3/2007 | Yamazaki et al. |
| 2007/0097509 A1 | 5/2007 | Nevitt et al. |
| 2007/0128528 A1 | 6/2007 | Hess et al. |
| 2007/0141357 A1 | 6/2007 | Bekiarian et al. |
| 2007/0146887 A1 | 6/2007 | Ikeda et al. |
| 2007/0152985 A1 | 7/2007 | Ostergaard et al. |
| 2007/0166536 A1 | 7/2007 | Dollase et al. |
| 2007/0188871 A1 | 8/2007 | Fleury et al. |
| 2007/0237918 A1 | 10/2007 | Jonza et al. |
| 2007/0240804 A1 | 10/2007 | Arai et al. |
| 2007/0247567 A1 | 10/2007 | Sato et al. |
| 2007/0249789 A1 | 10/2007 | Buehler et al. |
| 2007/0266896 A1 | 11/2007 | Suwa et al. |
| 2007/0285776 A1 | 12/2007 | Nakamura et al. |
| 2008/0024867 A1 | 1/2008 | Kawashima et al. |
| 2008/0032157 A1 | 2/2008 | Koeckert et al. |
| 2008/0138606 A1 | 6/2008 | Yoshihara et al. |
| 2008/0191463 A1 | 8/2008 | Vermeulen et al. |
| 2008/0239488 A1 | 10/2008 | Asakura et al. |
| 2008/0241523 A1 | 10/2008 | Huignard et al. |
| 2009/0004462 A1 | 1/2009 | Zhang et al. |
| 2009/0017314 A1 | 1/2009 | Nadaud et al. |
| 2009/0023254 A1 | 1/2009 | Lim et al. |
| 2009/0040440 A1 | 2/2009 | Park |
| 2009/0051668 A1 | 2/2009 | Cheng |
| 2009/0052041 A1 | 2/2009 | Watanabe et al. |
| 2009/0086778 A1 | 4/2009 | Kameyama et al. |
| 2009/0086783 A1 | 4/2009 | Kameyama et al. |
| 2009/0104385 A1 | 4/2009 | Reymond et al. |
| 2009/0109537 A1 | 4/2009 | Bright et al. |
| 2009/0135492 A1 | 5/2009 | Kusuda et al. |
| 2009/0141357 A1 | 6/2009 | Kamura et al. |
| 2009/0155490 A1 | 6/2009 | Bicker et al. |
| 2009/0178704 A1 | 7/2009 | Kalejs et al. |
| 2009/0195865 A1 | 8/2009 | Kleideiter et al. |
| 2009/0197048 A1 | 8/2009 | Amin et al. |
| 2009/0217968 A1 | 9/2009 | Joshi et al. |
| 2009/0223437 A1 | 9/2009 | Ballard |
| 2009/0268299 A1 | 10/2009 | Furui et al. |
| 2009/0297877 A1 | 12/2009 | Chang et al. |
| 2009/0298669 A1 | 12/2009 | Akiba et al. |
| 2009/0324844 A1 | 12/2009 | Haoto et al. |
| 2010/0009154 A1 | 1/2010 | Allan et al. |
| 2010/0027383 A1 | 2/2010 | Suzuki et al. |
| 2010/0028607 A1 | 2/2010 | Lee et al. |
| 2010/0047521 A1 | 2/2010 | Amin et al. |
| 2010/0060979 A1 | 3/2010 | Harris et al. |
| 2010/0062217 A1 | 3/2010 | Kurematsu |
| 2010/0062245 A1 | 3/2010 | Martin et al. |
| 2010/0119486 A1 | 5/2010 | Sakamoto et al. |
| 2010/0127154 A1 | 5/2010 | Kameyama |
| 2010/0130348 A1 | 5/2010 | Kang et al. |
| 2010/0149483 A1 | 6/2010 | Chiavetta, III |
| 2010/0167019 A1 | 7/2010 | Ohyanagi et al. |
| 2010/0177380 A1 | 7/2010 | Nagahama et al. |
| 2010/0177398 A1 | 7/2010 | Watanabe et al. |
| 2010/0182551 A1 | 7/2010 | Tochigi et al. |
| 2010/0183857 A1 | 7/2010 | Nouvelot et al. |
| 2010/0195311 A1 | 8/2010 | Furui et al. |
| 2010/0196650 A1 | 8/2010 | Okawa et al. |
| 2010/0196685 A1 | 8/2010 | Murata et al. |
| 2010/0215950 A1 | 8/2010 | Schultz et al. |
| 2010/0238384 A1 | 9/2010 | Tochigi et al. |
| 2010/0247745 A1 | 9/2010 | Rudmann et al. |
| 2010/0258752 A1 | 10/2010 | Mochizuki et al. |
| 2010/0272990 A1 | 10/2010 | Bondesan et al. |
| 2010/0291353 A1 | 11/2010 | Dejneka et al. |
| 2010/0304090 A1 | 12/2010 | Henn et al. |
| 2010/0311868 A1 | 12/2010 | Bekiarian et al. |
| 2010/0313875 A1 | 12/2010 | Kennedy |
| 2010/0316861 A1 | 12/2010 | Kubler et al. |
| 2010/0330350 A1 | 12/2010 | Osada et al. |
| 2011/0033635 A1 | 2/2011 | Nishimoto et al. |
| 2011/0033681 A1 | 2/2011 | Adachi et al. |
| 2011/0043719 A1 | 2/2011 | Thunhorst et al. |
| 2011/0064943 A1 | 3/2011 | Wang |
| 2011/0100424 A1 | 5/2011 | Roche et al. |
| 2011/0114160 A1 | 5/2011 | Murashige et al. |
| 2011/0120554 A1 | 5/2011 | Chhajed et al. |
| 2011/0128664 A1 | 6/2011 | Coue et al. |
| 2011/0129287 A1 | 6/2011 | Lecoutre |
| 2011/0151173 A1 | 6/2011 | Ramadas et al. |
| 2011/0157703 A1 | 6/2011 | Broadway et al. |
| 2011/0177241 A1 | 7/2011 | Lee et al. |
| 2011/0235181 A1 | 9/2011 | Hayashibe et al. |
| 2011/0262742 A1 | 10/2011 | Takeuchi et al. |
| 2011/0262752 A1 | 10/2011 | Bawendi et al. |
| 2011/0262754 A1 | 10/2011 | Zehentmaier et al. |
| 2011/0290982 A1 | 12/2011 | Boutami et al. |
| 2011/0293929 A1 | 12/2011 | Maschwitz |
| 2011/0297979 A1 | 12/2011 | Diana et al. |
| 2012/0008217 A1 | 1/2012 | Ishak et al. |
| 2012/0013983 A1 | 1/2012 | Chang et al. |
| 2012/0027968 A1 | 2/2012 | Chang et al. |
| 2012/0040179 A1 | 2/2012 | Dave |
| 2012/0052271 A1 | 3/2012 | Gomez et al. |
| 2012/0057236 A1 | 3/2012 | Broadway et al. |
| 2012/0070603 A1 | 3/2012 | Hsu |
| 2012/0099188 A1 | 4/2012 | Akozbek et al. |
| 2012/0099323 A1 | 4/2012 | Thompson |
| 2012/0107607 A1 | 5/2012 | Takaki et al. |
| 2012/0113043 A1 | 5/2012 | Liu et al. |
| 2012/0135153 A1 | 5/2012 | Osakabe et al. |
| 2012/0154921 A1 | 6/2012 | Yoshida et al. |
| 2012/0196103 A1 | 8/2012 | Murashige et al. |
| 2012/0198888 A1 | 8/2012 | Hasegawa et al. |
| 2012/0212826 A1 | 8/2012 | Henn et al. |
| 2012/0219792 A1 | 8/2012 | Yamamoto et al. |
| 2012/0228641 A1 | 9/2012 | Thoumazet et al. |
| 2012/0235399 A1 | 9/2012 | Lochbihler |
| 2012/0247152 A1 | 10/2012 | Ohara et al. |

(56) References Cited

U.S. PATENT DOCUMENTS

| | | |
|---|---|---|
| 2012/0250135 A1 | 10/2012 | Yeh et al. |
| 2012/0250314 A1 | 10/2012 | Maikowski et al. |
| 2012/0251773 A1 | 10/2012 | Krasnov et al. |
| 2012/0268809 A1 | 10/2012 | Guo et al. |
| 2012/0270041 A1 | 10/2012 | Matsumoto et al. |
| 2012/0281292 A1 | 11/2012 | Baca et al. |
| 2012/0301676 A1 | 11/2012 | Ushida et al. |
| 2012/0321898 A1 | 12/2012 | Meinhardt et al. |
| 2012/0327568 A1 | 12/2012 | Shedletsky et al. |
| 2013/0013574 A1 | 1/2013 | Wu |
| 2013/0021669 A1 | 1/2013 | Xi et al. |
| 2013/0022798 A1 | 1/2013 | Fukawa et al. |
| 2013/0029118 A1 | 1/2013 | Kishi et al. |
| 2013/0057950 A1 | 3/2013 | Lin et al. |
| 2013/0058640 A1 | 3/2013 | Taki |
| 2013/0059137 A1 | 3/2013 | Hevesi et al. |
| 2013/0120842 A1 | 5/2013 | Moens et al. |
| 2013/0127202 A1 | 5/2013 | Hart |
| 2013/0128342 A1 | 5/2013 | Mitarai et al. |
| 2013/0135741 A1 | 5/2013 | Lee et al. |
| 2013/0135742 A1 | 5/2013 | Fukagawa et al. |
| 2013/0135750 A1 | 5/2013 | Walker et al. |
| 2013/0142994 A1 | 6/2013 | Wang et al. |
| 2013/0170044 A1 | 7/2013 | Mont et al. |
| 2013/0176615 A1 | 7/2013 | Uefuji et al. |
| 2013/0177751 A1 | 7/2013 | Oh et al. |
| 2013/0183489 A1 | 7/2013 | Cremer et al. |
| 2013/0187185 A1 | 7/2013 | Deshazer et al. |
| 2013/0189184 A1 | 7/2013 | Lub et al. |
| 2013/0209762 A1 | 8/2013 | Damm et al. |
| 2013/0260115 A1 | 10/2013 | Suzuki et al. |
| 2013/0263784 A1 | 10/2013 | Lee et al. |
| 2013/0271836 A1 | 10/2013 | Fukaya et al. |
| 2013/0322270 A1 | 12/2013 | Ko |
| 2013/0334031 A1 | 12/2013 | Lee et al. |
| 2014/0022630 A1 | 1/2014 | Reymond et al. |
| 2014/0036175 A1 | 2/2014 | Morishima et al. |
| 2014/0049827 A1 | 2/2014 | Fujii et al. |
| 2014/0087101 A1 | 3/2014 | Tixhon et al. |
| 2014/0090864 A1 | 4/2014 | Paulson |
| 2014/0090974 A1 | 4/2014 | Ballet et al. |
| 2014/0091419 A1 | 4/2014 | Hasegawa et al. |
| 2014/0093711 A1 | 4/2014 | Paulson |
| 2014/0106141 A1 | 4/2014 | Bellman et al. |
| 2014/0106146 A1 | 4/2014 | Decker et al. |
| 2014/0106150 A1 | 4/2014 | Decker et al. |
| 2014/0111859 A1 | 4/2014 | Duraes et al. |
| 2014/0113083 A1 | 4/2014 | Lee et al. |
| 2014/0113120 A1 | 4/2014 | Thiel |
| 2014/0116329 A1 | 5/2014 | Chaudhari |
| 2014/0131091 A1 | 5/2014 | Smith |
| 2014/0139978 A1 | 5/2014 | Kwong |
| 2014/0154661 A1 | 6/2014 | Bookbinder et al. |
| 2014/0170765 A1 | 6/2014 | Ockenfuss |
| 2014/0174532 A1 | 6/2014 | Stewart et al. |
| 2014/0186615 A1 | 7/2014 | An et al. |
| 2014/0220327 A1 | 8/2014 | Adib et al. |
| 2014/0226208 A1 | 8/2014 | Gyorgy |
| 2014/0233104 A1 | 8/2014 | Nagahama et al. |
| 2014/0233106 A1 | 8/2014 | Vergoehl et al. |
| 2014/0247415 A1 | 9/2014 | Kleptsyn |
| 2014/0255616 A1 | 9/2014 | Paulson |
| 2014/0261615 A1 | 9/2014 | Nair et al. |
| 2014/0264321 A1 | 9/2014 | Liang et al. |
| 2014/0295330 A1 | 10/2014 | Pruneri et al. |
| 2014/0313441 A1 | 10/2014 | Lim |
| 2014/0320422 A1 | 10/2014 | Williams et al. |
| 2014/0320806 A1 | 10/2014 | Cohen-Tannoudji et al. |
| 2014/0334006 A1 | 11/2014 | Adib et al. |
| 2014/0335330 A1 | 11/2014 | Bellman et al. |
| 2014/0347722 A1 | 11/2014 | Hevesi |
| 2014/0353618 A1 | 12/2014 | Shim et al. |
| 2014/0362444 A1 | 12/2014 | Paulson |
| 2014/0368029 A1 | 12/2014 | Park |
| 2014/0370264 A1 | 12/2014 | Ohara et al. |
| 2014/0376094 A1 | 12/2014 | Bellman et al. |
| 2014/0377522 A1 | 12/2014 | Koch et al. |
| 2015/0002809 A1 | 1/2015 | Cohen-Tannoudji et al. |
| 2015/0037554 A1 | 2/2015 | Gao et al. |
| 2015/0043058 A1 | 2/2015 | Saito |
| 2015/0062695 A1 | 3/2015 | Chu et al. |
| 2015/0062710 A1 | 3/2015 | Grillmayer et al. |
| 2015/0079368 A1 | 3/2015 | Koike et al. |
| 2015/0079398 A1 | 3/2015 | Amin et al. |
| 2015/0083464 A1 | 3/2015 | Zilbauer et al. |
| 2015/0111725 A1 | 4/2015 | Van et al. |
| 2015/0116832 A1 | 4/2015 | Kamiuto et al. |
| 2015/0160376 A1 | 6/2015 | Kohli et al. |
| 2015/0174625 A1 | 6/2015 | Hart et al. |
| 2015/0177778 A1 | 6/2015 | Chen et al. |
| 2015/0185554 A1 | 7/2015 | Zhao et al. |
| 2015/0212245 A1 | 7/2015 | Kei |
| 2015/0219798 A1 | 8/2015 | Sonoda et al. |
| 2015/0250237 A1 | 9/2015 | Shoham et al. |
| 2015/0253467 A1 | 9/2015 | Sano |
| 2015/0260888 A1 | 9/2015 | Yoshihara et al. |
| 2015/0284840 A1 | 10/2015 | Henn et al. |
| 2015/0293284 A1 | 10/2015 | Tatemura |
| 2015/0309628 A1 | 10/2015 | Chen et al. |
| 2015/0316442 A1 | 11/2015 | Tamada et al. |
| 2015/0322270 A1 | 11/2015 | Amin et al. |
| 2015/0323705 A1 | 11/2015 | Hart et al. |
| 2015/0323812 A1 | 11/2015 | Ishak et al. |
| 2015/0346403 A1 | 12/2015 | Jidai et al. |
| 2015/0355382 A1 | 12/2015 | Henn et al. |
| 2015/0376057 A1 | 12/2015 | Koch et al. |
| 2016/0002498 A1 | 1/2016 | Maghsoodi et al. |
| 2016/0011348 A1 | 1/2016 | Hirakoso et al. |
| 2016/0016845 A1 | 1/2016 | Cho et al. |
| 2016/0018576 A1 | 1/2016 | Yamamoto et al. |
| 2016/0041308 A1 | 2/2016 | Kramer et al. |
| 2016/0076135 A1 | 3/2016 | Cheah et al. |
| 2016/0083835 A1 | 3/2016 | Adib et al. |
| 2016/0137548 A1 | 5/2016 | Cabral et al. |
| 2016/0137873 A1 | 5/2016 | Kostromine et al. |
| 2016/0146978 A1 | 5/2016 | Lee et al. |
| 2016/0236974 A1 | 8/2016 | Sinapi et al. |
| 2016/0246154 A1 | 8/2016 | O'Keeffe |
| 2016/0306046 A1 | 10/2016 | Axelsson et al. |
| 2016/0362583 A1 | 12/2016 | Naik et al. |
| 2016/0363698 A1 | 12/2016 | Fan et al. |
| 2016/0372532 A1 | 12/2016 | Song et al. |
| 2017/0003420 A1 | 1/2017 | Berit-Debat et al. |
| 2017/0015584 A1 | 1/2017 | Krzyzak et al. |
| 2017/0050349 A1 | 2/2017 | Hara et al. |
| 2017/0075039 A1 | 3/2017 | Hart et al. |
| 2017/0087144 A1 | 3/2017 | Rowe et al. |
| 2017/0129806 A1 | 5/2017 | Fujii et al. |
| 2017/0183255 A1 | 6/2017 | Walther et al. |
| 2017/0183257 A1 | 6/2017 | Apitz et al. |
| 2017/0184762 A1 | 6/2017 | Fujii et al. |
| 2017/0199307 A1 | 7/2017 | Hart et al. |
| 2017/0210666 A1 | 7/2017 | Chang et al. |
| 2017/0235418 A1 | 8/2017 | Inamoto et al. |
| 2017/0260620 A1 | 9/2017 | Cheah et al. |
| 2017/0276838 A1 | 9/2017 | Oishi et al. |
| 2017/0285227 A1 | 10/2017 | Chen et al. |
| 2017/0307790 A1 | 10/2017 | Bellman et al. |
| 2017/0317217 A1 | 11/2017 | Ito et al. |
| 2017/0355172 A1 | 12/2017 | Paulson |
| 2017/0369992 A1 | 12/2017 | Adib et al. |
| 2018/0095303 A1 | 4/2018 | Cho et al. |
| 2018/0128957 A1 | 5/2018 | Davis et al. |
| 2018/0162091 A1 | 6/2018 | Takeda et al. |
| 2018/0203163 A1 | 7/2018 | Thakkar et al. |
| 2018/0251398 A1 | 9/2018 | Ikegami et al. |
| 2018/0321425 A1 | 11/2018 | Hart et al. |
| 2018/0352668 A1 | 12/2018 | Amin et al. |
| 2018/0372919 A1 | 12/2018 | Suzuki et al. |
| 2019/0039935 A1 | 2/2019 | Couillard et al. |
| 2019/0039946 A1 | 2/2019 | Bayne et al. |
| 2019/0045038 A1 | 2/2019 | Zhou et al. |
| 2019/0062200 A1 | 2/2019 | He et al. |
| 2019/0077352 A1 | 3/2019 | Bhatia et al. |

(56) References Cited

U.S. PATENT DOCUMENTS

| | | | |
|---|---|---|---|
| 2019/0219739 | A1 | 7/2019 | Gregorski et al. |
| 2020/0057177 | A1 | 2/2020 | Hart et al. |
| 2020/0158917 | A1 | 5/2020 | Hart et al. |
| 2020/0158922 | A1 | 5/2020 | Hayashi et al. |
| 2020/0377409 | A1 | 12/2020 | Jin et al. |
| 2020/0379143 | A1 | 12/2020 | Gu et al. |
| 2021/0017068 | A1 | 1/2021 | Torfs et al. |
| 2021/0181382 | A1 | 6/2021 | Gregorski et al. |
| 2022/0011467 | A1 | 1/2022 | Feng et al. |
| 2023/0010461 | A1 | 1/2023 | Hart et al. |

FOREIGN PATENT DOCUMENTS

| | | |
|---|---|---|
| AU | 2002341016 B2 | 8/2008 |
| AU | 2015252116 A1 | 11/2015 |
| CA | 2141536 A1 | 2/1994 |
| CA | 2629555 A1 | 11/2009 |
| CN | 1134555 A | 10/1996 |
| CN | 1312450 A | 9/2001 |
| CN | 1318722 A | 10/2001 |
| CN | 1423682 A | 6/2003 |
| CN | 1575970 A | 2/2005 |
| CN | 1653880 A | 8/2005 |
| CN | 1688904 A | 10/2005 |
| CN | 1703631 A | 11/2005 |
| CN | 1869736 A | 11/2006 |
| CN | 2859579 Y | 1/2007 |
| CN | 1936623 A | 3/2007 |
| CN | 1940601 A | 4/2007 |
| CN | 1946646 A | 4/2007 |
| CN | 101019043 A | 8/2007 |
| CN | 101044266 A | 9/2007 |
| CN | 100360449 C | 1/2008 |
| CN | 101236264 A | 8/2008 |
| CN | 101295030 A | 10/2008 |
| CN | 201165502 Y | 12/2008 |
| CN | 101349769 A | 1/2009 |
| CN | 101356455 A | 1/2009 |
| CN | 201201777 Y | 3/2009 |
| CN | 101400619 A | 4/2009 |
| CN | 101639663 A | 2/2010 |
| CN | 201483977 U | 5/2010 |
| CN | 101724812 A | 6/2010 |
| CN | 101734867 A | 6/2010 |
| CN | 101809512 A | 8/2010 |
| CN | 101939266 A | 1/2011 |
| CN | 201707457 U | 1/2011 |
| CN | 102016962 A | 4/2011 |
| CN | 102109630 A | 6/2011 |
| CN | 201945707 U | 8/2011 |
| CN | 201984393 U | 9/2011 |
| CN | 102278833 A | 12/2011 |
| CN | 202171708 U | 3/2012 |
| CN | 202177751 U | 3/2012 |
| CN | 202177765 U | 3/2012 |
| CN | 202182978 U | 4/2012 |
| CN | 102470637 A | 5/2012 |
| CN | 102574736 A | 7/2012 |
| CN | 102627407 A | 8/2012 |
| CN | 102681042 A | 9/2012 |
| CN | 102736136 A | 10/2012 |
| CN | 202615053 U | 12/2012 |
| CN | 202661651 U | 1/2013 |
| CN | 102923969 A | 2/2013 |
| CN | 102934010 A | 2/2013 |
| CN | 102967947 A | 3/2013 |
| CN | 103011618 A | 4/2013 |
| CN | 103013196 A | 4/2013 |
| CN | 103013219 A | 4/2013 |
| CN | 103068764 A | 4/2013 |
| CN | 202904161 U | 4/2013 |
| CN | 103073196 A | 5/2013 |
| CN | 103099529 A | 5/2013 |
| CN | 202924088 U | 5/2013 |
| CN | 202924096 U | 5/2013 |
| CN | 103171230 A | 6/2013 |
| CN | 203025361 U | 6/2013 |
| CN | 103254670 A | 8/2013 |
| CN | 103302934 A | 9/2013 |
| CN | 103305816 A | 9/2013 |
| CN | 203260587 U | 10/2013 |
| CN | 103395247 A | 11/2013 |
| CN | 103492173 A | 1/2014 |
| CN | 103499852 A | 1/2014 |
| CN | 103508678 A | 1/2014 |
| CN | 103707578 A | 4/2014 |
| CN | 203535376 U | 4/2014 |
| CN | 203567294 U | 4/2014 |
| CN | 203620645 U | 6/2014 |
| CN | 103902122 A | 7/2014 |
| CN | 103921487 A | 7/2014 |
| CN | 103934756 A | 7/2014 |
| CN | 203689480 U | 7/2014 |
| CN | 103964705 A | 8/2014 |
| CN | 104040016 A | 9/2014 |
| CN | 104418511 A | 3/2015 |
| CN | 104422971 A | 3/2015 |
| CN | 104553126 A | 4/2015 |
| CN | 104559625 A | 4/2015 |
| CN | 104845544 A | 8/2015 |
| CN | 204727835 U | 10/2015 |
| CN | 105142900 A | 12/2015 |
| CN | 204894681 U | 12/2015 |
| CN | 105446558 A | 3/2016 |
| CN | 105593705 A | 5/2016 |
| CN | 105737103 A | 7/2016 |
| CN | 105764866 A | 7/2016 |
| CN | 205368144 U | 7/2016 |
| CN | 105843452 A | 8/2016 |
| CN | 105848883 A | 8/2016 |
| CN | 105859148 A | 8/2016 |
| CN | 106113837 A | 11/2016 |
| CN | 205687804 U | 11/2016 |
| CN | 106199812 A | 12/2016 |
| CN | 205818592 U | 12/2016 |
| CN | 106338783 A | 1/2017 |
| CN | 106378880 A | 2/2017 |
| CN | 106431004 A | 2/2017 |
| CN | 106604900 A | 4/2017 |
| CN | 106941545 A | 7/2017 |
| CN | 107042642 A | 8/2017 |
| CN | 107076874 A | 8/2017 |
| CN | 107174867 A | 9/2017 |
| CN | 107310209 A | 11/2017 |
| CN | 107735697 A | 2/2018 |
| CN | 108585479 A | 9/2018 |
| DE | 102014104798 A1 | 10/2015 |
| DE | 102015114877 A1 | 3/2017 |
| EP | 0566271 A2 | 10/1993 |
| EP | 0592986 A1 | 4/1994 |
| EP | 0698798 A2 | 2/1996 |
| EP | 0966410 A1 | 12/1999 |
| EP | 0996410 A1 | 5/2000 |
| EP | 1069088 A1 | 1/2001 |
| EP | 1275623 A1 | 1/2003 |
| EP | 1432874 A1 | 6/2004 |
| EP | 2149540 A1 | 2/2010 |
| EP | 2196870 A1 | 6/2010 |
| EP | 2363383 A1 | 9/2011 |
| EP | 1289898 B1 | 8/2012 |
| EP | 2492090 A1 | 8/2012 |
| EP | 2328818 B1 | 12/2012 |
| EP | 1490715 B1 | 1/2013 |
| EP | 2628818 A1 | 8/2013 |
| EP | 2711744 A1 | 3/2014 |
| EP | 3178796 A1 | 6/2017 |
| EP | 3822234 A1 | 5/2021 |
| FR | 2966934 A3 | 5/2012 |
| FR | 2982607 A1 | 5/2013 |
| GB | 1517585 A | 7/1978 |
| GB | 2485522 A | 5/2012 |
| IN | 201201777 | 10/2015 |
| JP | 58-127463 A | 7/1983 |
| JP | 61-019888 A | 1/1986 |

(56) References Cited

FOREIGN PATENT DOCUMENTS

| | | |
|---|---|---|
| JP | 63-238260 A | 10/1988 |
| JP | 63-265846 A | 11/1988 |
| JP | 02-077434 A | 3/1990 |
| JP | 02-156448 A | 6/1990 |
| JP | 04-250834 A | 9/1992 |
| JP | 07-035267 B2 | 4/1995 |
| JP | 07-290652 A | 11/1995 |
| JP | 07-331115 A | 12/1995 |
| JP | 09-068602 A | 3/1997 |
| JP | 10-000009 A | 1/1998 |
| JP | 11-311702 A | 11/1999 |
| JP | 2974879 B2 | 11/1999 |
| JP | 2000-121806 A | 4/2000 |
| JP | 2000-171601 A | 6/2000 |
| JP | 2000-171605 A | 6/2000 |
| JP | 2000-214302 A | 8/2000 |
| JP | 2000-275404 A | 10/2000 |
| JP | 2001-503100 A | 3/2001 |
| JP | 2001-511539 A | 8/2001 |
| JP | 2001-281402 A | 10/2001 |
| JP | 2001-281406 A | 10/2001 |
| JP | 2001-303246 A | 10/2001 |
| JP | 2001-311806 A | 11/2001 |
| JP | 2002-082207 A | 3/2002 |
| JP | 2002-116303 A | 4/2002 |
| JP | 2002-174810 A | 6/2002 |
| JP | 2002-210906 A | 7/2002 |
| JP | 2002-212317 A | 7/2002 |
| JP | 2002-267835 A | 9/2002 |
| JP | 2003-026826 A | 1/2003 |
| JP | 2003-082127 A | 3/2003 |
| JP | 2003-514746 A | 4/2003 |
| JP | 2003-131011 A | 5/2003 |
| JP | 2003-236970 A | 8/2003 |
| JP | 2003-266607 A | 9/2003 |
| JP | 2003-285343 A | 10/2003 |
| JP | 2004-069878 A | 3/2004 |
| JP | 2004-138662 A | 5/2004 |
| JP | 2004-163549 A | 6/2004 |
| JP | 2004-244594 A | 9/2004 |
| JP | 2004-526605 A | 9/2004 |
| JP | 2004-291303 A | 10/2004 |
| JP | 2004-333901 A | 11/2004 |
| JP | 2005-042072 A | 2/2005 |
| JP | 2005-070724 A | 3/2005 |
| JP | 2005-114649 A | 4/2005 |
| JP | 2005-187639 A | 7/2005 |
| JP | 2005-187640 A | 7/2005 |
| JP | 2005-219223 A | 8/2005 |
| JP | 2005-227415 A | 8/2005 |
| JP | 2005-246296 A | 9/2005 |
| JP | 2005-274527 A | 10/2005 |
| JP | 2005-300576 A | 10/2005 |
| JP | 2006-047504 A | 2/2006 |
| JP | 2006-079067 A | 3/2006 |
| JP | 2006-110754 A | 4/2006 |
| JP | 2006-116754 A | 5/2006 |
| JP | 2006-208726 A | 8/2006 |
| JP | 2006-317957 A | 11/2006 |
| JP | 2006-352105 A | 12/2006 |
| JP | 2007-055064 A | 3/2007 |
| JP | 2007-072372 A | 3/2007 |
| JP | 2007-086521 A | 4/2007 |
| JP | 2007-099557 A | 4/2007 |
| JP | 2007-114377 A | 5/2007 |
| JP | 2007-156017 A | 6/2007 |
| JP | 2007-156205 A | 6/2007 |
| JP | 2007-213021 A | 8/2007 |
| JP | 2007-523776 A | 8/2007 |
| JP | 2007-240707 A | 9/2007 |
| JP | 2007-527328 A | 9/2007 |
| JP | 2007-271953 A | 10/2007 |
| JP | 2007-271958 A | 10/2007 |
| JP | 2007-298667 A | 11/2007 |
| JP | 2008-003425 A | 1/2008 |
| JP | 2008-032949 A | 2/2008 |
| JP | 2008-033348 A | 2/2008 |
| JP | 2008-116596 A | 5/2008 |
| JP | 2008-133535 A | 6/2008 |
| JP | 2008-158156 A | 7/2008 |
| JP | 2008-524030 A | 7/2008 |
| JP | 2008-242425 A | 10/2008 |
| JP | 2008-247732 A | 10/2008 |
| JP | 2009-025384 A | 2/2009 |
| JP | 4250834 B2 | 4/2009 |
| JP | 2009-109850 A | 5/2009 |
| JP | 2009-116218 A | 5/2009 |
| JP | 2009-116219 A | 5/2009 |
| JP | 2009-116220 A | 5/2009 |
| JP | 2009-149468 A | 7/2009 |
| JP | 2009-175725 A | 8/2009 |
| JP | 2009-529715 A | 8/2009 |
| JP | 2009-199022 A | 9/2009 |
| JP | 2009-204506 A | 9/2009 |
| JP | 2009-265601 A | 11/2009 |
| JP | 2010-037115 A | 2/2010 |
| JP | 4421142 B2 | 2/2010 |
| JP | 2010-061044 A | 3/2010 |
| JP | 2010-125719 A | 6/2010 |
| JP | 2010-167410 A | 8/2010 |
| JP | 2010-202514 A | 9/2010 |
| JP | 2011-017782 A | 1/2011 |
| JP | 4612827 B2 | 1/2011 |
| JP | 2011-057547 A | 3/2011 |
| JP | 2011-093728 A | 5/2011 |
| JP | 4707656 B2 | 6/2011 |
| JP | 2011-133800 A | 7/2011 |
| JP | 2011-134464 A | 7/2011 |
| JP | 2011-150821 A | 8/2011 |
| JP | 4765069 B2 | 9/2011 |
| JP | 4790396 B2 | 10/2011 |
| JP | 2011-237789 A | 11/2011 |
| JP | 2011-246365 A | 12/2011 |
| JP | 2012-132022 A | 7/2012 |
| JP | 2012-171866 A | 9/2012 |
| JP | 2012-189760 A | 10/2012 |
| JP | 2012-194546 A | 10/2012 |
| JP | 2012-203187 A | 10/2012 |
| JP | 2012-228811 A | 11/2012 |
| JP | 2012-230290 A | 11/2012 |
| JP | 2012-242837 A | 12/2012 |
| JP | 2013-025318 A | 2/2013 |
| JP | 2013-070093 A | 4/2013 |
| JP | 2013-097356 A | 5/2013 |
| JP | 2013-122516 A | 6/2013 |
| JP | 2013-142817 A | 7/2013 |
| JP | 2013-205634 A | 10/2013 |
| JP | 2013-224964 A | 10/2013 |
| JP | 2013-226666 A | 11/2013 |
| JP | 2013-234571 A | 11/2013 |
| JP | 2013-252992 A | 12/2013 |
| JP | 2013-258209 A | 12/2013 |
| JP | 2014-056215 A | 3/2014 |
| JP | 2014-081522 A | 5/2014 |
| JP | 2014-194530 A | 10/2014 |
| JP | 2015-006650 A | 1/2015 |
| JP | 5650347 B1 | 1/2015 |
| JP | 2015-058605 A | 3/2015 |
| JP | 2015-058606 A | 3/2015 |
| JP | 2015-506895 A | 3/2015 |
| JP | 2015-068944 A | 4/2015 |
| JP | 5736214 B2 | 6/2015 |
| JP | 2015-167470 A | 9/2015 |
| JP | 2015-171770 A | 10/2015 |
| JP | 2015-535804 A | 12/2015 |
| JP | 2015-536892 A | 12/2015 |
| JP | 2016-009172 A | 1/2016 |
| JP | 2016-530194 A | 9/2016 |
| JP | 2016-531330 A | 10/2016 |
| JP | 2016-534962 A | 11/2016 |
| JP | 2016-201236 A | 12/2016 |
| JP | 2017-515780 A | 6/2017 |
| JP | 2017-523310 A | 8/2017 |
| JP | 2017-528411 A | 9/2017 |

(56) References Cited

FOREIGN PATENT DOCUMENTS

| | | |
|---|---|---|
| JP | 2018-010275 A | 1/2018 |
| KR | 10-2006-0024545 A | 3/2006 |
| KR | 10-2006-0060171 A | 6/2006 |
| KR | 10-2006-0065724 A | 6/2006 |
| KR | 10-0709879 B1 | 4/2007 |
| KR | 10-2007-0054850 A | 5/2007 |
| KR | 10-2007-0063134 A | 6/2007 |
| KR | 10-2008-0048578 A | 6/2008 |
| KR | 10-2008-0057443 A | 6/2008 |
| KR | 10-2008-0102154 A | 11/2008 |
| KR | 10-2009-0098975 A | 9/2009 |
| KR | 10-2009-0119968 A | 11/2009 |
| KR | 10-2010-0013836 A | 2/2010 |
| KR | 10-2010-0123624 A | 11/2010 |
| KR | 10-2011-0054057 A | 5/2011 |
| KR | 2011-0047596 A | 5/2011 |
| KR | 10-2011-0078682 A | 7/2011 |
| KR | 10-1103041 B1 | 1/2012 |
| KR | 10-1121207 B1 | 3/2012 |
| KR | 10-1194257 B1 | 10/2012 |
| KR | 10-2013-0031689 A | 3/2013 |
| KR | 2013-0031689 | 3/2013 |
| KR | 10-2014-0034172 A | 3/2014 |
| KR | 10-2014-0061842 A | 5/2014 |
| KR | 10-2015-0045476 A | 4/2015 |
| KR | 10-1517051 B1 | 5/2015 |
| KR | 10-2015-0116802 A | 10/2015 |
| KR | 10-2017-0028190 A | 3/2017 |
| KR | 10-2017-0043566 A | 4/2017 |
| TW | I245919 B | 12/2005 |
| TW | 200600824 A | 1/2006 |
| TW | 201335090 A | 9/2013 |
| TW | 201500757 A | 1/2015 |
| TW | 201520585 A | 6/2015 |
| TW | 201615588 A | 5/2016 |
| TW | 201715257 A | 5/2017 |
| TW | 201815720 A | 5/2018 |
| WO | 97/13003 A2 | 4/1997 |
| WO | 98/37254 A2 | 8/1998 |
| WO | 98/40323 A1 | 9/1998 |
| WO | 98/52518 A1 | 11/1998 |
| WO | 00/37384 A1 | 6/2000 |
| WO | 02/00772 A1 | 1/2002 |
| WO | 02/42834 A2 | 5/2002 |
| WO | 02/42843 A2 | 5/2002 |
| WO | 03/09767 A1 | 2/2003 |
| WO | 03/27397 A1 | 4/2003 |
| WO | 2006/066101 A2 | 6/2006 |
| WO | 2006/099765 A1 | 9/2006 |
| WO | 2007/049589 A1 | 5/2007 |
| WO | 2008/062605 A1 | 5/2008 |
| WO | 2008/108332 A1 | 9/2008 |
| WO | 2009/008240 A1 | 1/2009 |
| WO | 2009/037886 A1 | 3/2009 |
| WO | 2009/041528 A1 | 4/2009 |
| WO | 2009/065490 A2 | 5/2009 |
| WO | 2010/114135 A1 | 10/2010 |
| WO | 2012/043341 A1 | 4/2012 |
| WO | 2012/144499 A1 | 10/2012 |
| WO | 2012/157719 A1 | 11/2012 |
| WO | 2013/001023 A1 | 1/2013 |
| WO | 2013/023359 A1 | 2/2013 |
| WO | 2013/082477 A2 | 6/2013 |
| WO | 2013/082488 A2 | 6/2013 |
| WO | 2013/085795 A1 | 6/2013 |
| WO | 2013/088856 A1 | 6/2013 |
| WO | 2013/098641 A2 | 7/2013 |
| WO | 2013/160233 A1 | 10/2013 |
| WO | 2014/041257 A1 | 3/2014 |
| WO | 2014/055489 A1 | 4/2014 |
| WO | 2014/061614 A1 | 4/2014 |
| WO | 2014/117333 A1 | 8/2014 |
| WO | 2014/167293 A1 | 10/2014 |
| WO | 2014/182639 A1 | 11/2014 |
| WO | 2014/182640 A1 | 11/2014 |
| WO | 2014/182693 A1 | 11/2014 |
| WO | 2015/000534 A1 | 1/2015 |
| WO | 2015/009377 A1 | 1/2015 |
| WO | 2015/015338 A2 | 2/2015 |
| WO | 2015/030118 A1 | 3/2015 |
| WO | 2015/031428 A2 | 3/2015 |
| WO | 2015/041257 A1 | 3/2015 |
| WO | 2015/070254 A1 | 5/2015 |
| WO | 2015/076914 A1 | 5/2015 |
| WO | 2015/084253 A1 | 6/2015 |
| WO | 2015/085283 A1 | 6/2015 |
| WO | 2015/095288 A2 | 6/2015 |
| WO | 2015/108266 A1 | 7/2015 |
| WO | 2015/115154 A1 | 8/2015 |
| WO | 2015/125498 A1 | 8/2015 |
| WO | 2015/137196 A1 | 9/2015 |
| WO | 2015/142837 A1 | 9/2015 |
| WO | 2015/174625 A1 | 11/2015 |
| WO | 2015/175390 A1 | 11/2015 |
| WO | 2015/179739 A1 | 11/2015 |
| WO | 2015/190374 A1 | 12/2015 |
| WO | 2016/018490 A1 | 2/2016 |
| WO | 2016/069113 A1 | 5/2016 |
| WO | 2016/118462 A2 | 7/2016 |
| WO | 2016/190047 A1 | 12/2016 |
| WO | 2016/204009 A1 | 12/2016 |
| WO | 2016/205317 A1 | 12/2016 |
| WO | 2017/041307 A1 | 3/2017 |
| WO | 2018/043253 A1 | 3/2018 |
| WO | 2018/125676 A1 | 7/2018 |
| WO | 2019/055745 A1 | 3/2019 |
| WO | 2020/013012 A1 | 1/2020 |
| WO | 2020/123367 A1 | 6/2020 |
| WO | 2022/011070 A1 | 1/2022 |
| WO | 2022/011071 A1 | 1/2022 |
| WO | 2022/125846 A1 | 6/2022 |

OTHER PUBLICATIONS

I.V. Afanasyev-Charkin et al. "Hard Si-N-C films with a tunable band gap produced by pulsed glow discharge deposition", Surface & Coatings Technology, 1999, pp. 38-42. (Year: 1999).

Inkin et al; "Properties of aluminium nitride coaling obtained by vacuum arc discharge method with plasma flow separation." Elsevier, Diamond and Related Materials, 10 (2001) 1314-1316.

Ishiguro et al."Solar Light Absorption Property of Sputtered Al-N Films with Enhanced Surface Roughness during Film Growth." Jpn. J. Appl. Phys. Vol. 41 (2002) pp. 292-300.

Kelley, E., "Proposed Diffuse Ambient Contrast Measurement Methods for Flat Panel Displays," 2001, NISTIR 6738, National Institute of Standards and Technology, Gaithersburg, Maryland, 7 pages.

Kitiel, "Introduction to Solid State Physics." Seventh Edition, John Wiley & Sons, Inc., NY, 1996, pp. 611-627.

Krupitskaya, Auner. "Optical Characatization of Inn Films Grown by Plasma Source Molecular Beam Epitaxy." Journal of Applied Physices 84, 2861-2865, 1998.

Li et al., "Low-temperature magnetron sputter deposition, hardness and electrical resistivity of amorphous and crystalline alumina thin films" Journal of Vacuum Science & Technology A 18, 2333 (2000). (See copy.

Liaoning Provincial Popular Science Writers Association, "High Technology Around Your Life", Popular Science Press, p. 217, Oct. 1992 (English Translation Attached.

Liu, B.T. et al., "Strength of the interactions between light-scattering particles and resins affects the haze of anti-glare films," Colloids Surf. A Physicochem. Eng. Aspects 2011, 389, pp. 138-143.

Madocks et al Durable Neutral Color Anti-Reflective Coating for Mobile Displays; SVC Bulletin Fall 2014 3 pages.

Mania "Magnetron Sputtering for Deposition of Aluminum Nitride Thin Films." Prace Komisji Nauk Ceramiczynych, 54, 429-433, 1997.

Martinet ER AL; "Deposition of SiO2 and TiO2 thin films by plasma enhanced chemical vapors deposition for antireflection coating", J_ Non-Crystalline Solids; 216 (1997) 77-82.

(56) References Cited

OTHER PUBLICATIONS

McCauley, et al, "Alon: A brief history of its emergence and evolution." Journal of the European Ceramic Society 29 (2009), 223-236. (See Copy.

Modified ASTM D5767-18 test protocol, "Standard Test Method for Instrumental Measurement of Distinctness-of-Image (DOI) Gloss of Coated Surfaces using a Rhopoint IQ Gloss Haze & DOI Meter," Rhopoint Instruments Ltd., 2021.

Moghal et al., "Nanomechanical study of thin film nanocomposite and PVD thin films on polymer substrate for optical applications", J_ Phys. D: Appl. Phys. 46 (2013).

Moore; "Gradient Index Optics: A Review," Applied Optics, vol. 19, No. 7, Apr. 1, 1980, pp. 1035-1038.

Oliver et al. "An improved technique for determining hardness and elastic modulus using load and displacement sensing indentation experiments". J_ Mater. Res., vol. 7, No. 6, 1992, 1564-1583.

Oliver et al. "Measurement of Hardness and Elastic Modulus by Instrument Indentation: Advances in Understanding and Refinements to Methodology". J_ Mater. Res., vol. 19, No. 1, 2004, 3-20.

Pantano; "Al2O3 Coating by Atomic Layer Deposition (ALD) on various glass substrates for Surface Strength Improvement" the 23rd International Congress on Glass, Jul. 1-5, 2013. 3 pgs.

Paradis, Suzanne, Characterization and optimization of SiO2 and Si3N4 thin films. 2013, Defence Research and Development Canada (Year: 2013).

Park et al; "Atomic Layer Deposition of Yttria-Stabilized Zirconia Thin Films for Enhanced Reactivity and Stability of Solid Oxide Fuel Cells"; Energy; vol. 116; (2016); pp. 170-176.

Portinha et al., "Hard Zr02/Al2O3 nanolamianted PVD coatings evaluated by nanoindentation" , Surface & Coatings Technology 200 (2005) 765-768.

Reinhold et al; "Plasma Nitriding of Aluminum Alloys." Proceedings of the 1st International Automotive Heat Treating Conference. Jul. 13-15, 1998. pp. 213-220.

Ruddell et al; "The Effect of Deposition Parameters on the Properties of Yttria-Stabilzed Zrconia Thin Films"; Thin Solid Films, 445 (2003) pp. 14-19.

Savage; "Preparation and properties of hard crystalline materials for optical applications—a review." Journal of Crystal Growth 113 (1991) 698-715.

Schlömer, T. et al., "Farthest-points optimized point sets with maximized minimum distance," Proc. ACM Siggraph Symposium on high performance graphics: HPG 2011 pp. 135-142.

Schroter et al; "X-ray pholoelectron diffraction on SiC and AIN epitaxial films: polytype structure and polarity." Elsevier, Journal of Electron Spectroscopy and Related Phenomena. 114-116 (2001) 443-450.

Shackelford, Introduction to Materials Science for Engineers, "Sixth Edition, Pearson Prentice Hall, New Jersey, 2005, pp. 404-418".

Simonsen, et al., "Haze of random systems: an approximate analytic approach," Phys Rev A 79 063813 (2009), 23 pages.

Singh et al; "Structural and optical properties of RF magnetron sputtered aluminium nitride films without external substrate healing." Elsevier, Applied Surface Sceince 257 (2011) 9568-9573.

Smart and Moore, Solid State Chemistry, an introduction, Chapman & Hall University and Professional Division, London, 1992, pp. 136-151.

Sonderby et al; "Deposition of Yttria-Stabilized Zirconia Thin Films By High Power Impulse Magnetron Sputiering and Pulsed Magnetron Sputiering"; Surface & Coatings Technology; 240; (2014) pp. 1-6.

Southwell; "Coating design using very thin high- and low-index layers," Applied Optics, vol. 24, Issue 4, pp. 457-460 (1985).

Stillwell, A. et al., "Perception of Sparkle in Anti-Glare Display Screens," JSID 22(2), 129-136 (2014).

Taguchi et al; "Ultra-Low-Reflective 60-IN. LCD With Uniform Moth-Eye Surface for Digital Signage," SID 10 DIGEST, 80.3, p. 1196, 2010.

Tang et al. "Optical, structural, and mechanical properties of silicon oxyynitride films sputtering by pulsed magnetron sputtering," Applied Optics 56(4) 2016, pp. C168-C174.

Tsui, et al., "Effects of Adhesion on the Measurement of Thin Film Mechanical Properties by Nanoindenlalion." Mal. Res. Soc. Symp. Proc. vol. 473 1997.

Urushidani et al; "Etalon-Type Optical Filters, Their Modules, Spectrometers, and Optical Devices." Jpn. Kokai Tokkyo Koho, 2012.

Urushidani et al; "Optical Filters Including Optical Films Covered with Thickness-Controlled Dielectric Films, and Optical Filter Modules, Spectrometers and Optical Apparatus Containing Them." 2012.

Wang et al. "Tribological and optical properties of crystalline and amorphous alumina thin films grown by low iemperature reactive magnetron sputter-deposition", Surface and coatings technology, 146-147 (2001) pp. 189-194.

Wang et al; "Roughness Improvement and Hardness Enhancement in Nanoscale Al/AlN Multilayered Thin Films." Applied Physics Letters vol. 71, No. 14, 1951-1953, Oct. 6, 1997.

Wang et al; "Study of ALON and CRON films deposited by arc ion plating as diffusion barriers." Jinshu Xuebao (2004), 40, 1, 83-87.

Wang et al; "Towards Hard yet Touch Ceramic Coatings", Surface & Coatings Technology; 258 (2014) pp. 1-16.

Watanabe et al; "Surface Oxidation of Aluminum Nitride Thin Films."Surface Modification Technologies XIII, Edited by Sudarshan, Khor, Jeandin, ASM International, Materials Park, Ohio, 1999. pp. 209-215.

Wen et al. "The AIN layer thickness dependent coherent epitaxial growth, stress and hardness in NbN/AIN nanostructured multi-layer films." Surface and Coatings Technology 235 (2013) 367-375.

Xi et al; "The Preparation and Optical properties of AIN Thin Films." Diwen Wuli Xuebao (2012), 34)6), 467-470.

XS Miao and YC Chan. "Optical Properties and Reactive Sputtering Conditions of AIN and AlSiN Thin Films for Magneto-Optical Applications." Journal of Electronic Materials, vol. 26, No. 1, 1997.

Xu et al; "Chemical control of physical properties in silicon nitride films"; Appl Phys A (2013) 111: 867-876.

Yamamoto et al; "Manufacture of IR-Reflecling Bent Plate Glass." Jpn. Kokai Tokkyo Koho, 1988.

"Cieluv", Available at: https://en.wikipedia.org/wiki/CIELUV, 1976, 5 pages.

"Heron's formula", Available at: https://en.wikipedia.org/wiki/Heron%27s_formula, Jul. 2021, 8 pages.

"High-precision, fast array spectroradiometer—for demanding measurements", Available at: https://www.instrumentsystems.com/en/products/spectrometers/cas-140d, 4 pages, retreived on Aug. 6, 2021.

"Illuminance Meters", Available at: https://sensing.konicaminolta.us/us/technologies/illuminance-meters/, 2 pages, Retreived on Aug. 2021.

"Welcome to Display-Metrology & Systems", Available at: www.display-messtechnik.de/en/measurement, 2014, 1 page.

Aissa et al; "Comparison of the structural properties and residual stress of AlN films deposited by de magnetron sputtering and high power impulse magnetron sputtering at different working pressures." Elsevier, Thin Solid Films, 550 (2014) 264-267.

Al-Dahoudi, N. et al., "Transparent conducting, anti-static and anti-static-anti-glare coatings on plastic substrates," Thin Solid Films 2001, 392, pp. 299-304.

Assouar et al; "Study of Acoustical and Optical Properties of AIN Films for SAW and BAW Devices: Correlation Between These Properties." Integrated Ferroelectrics, 82: 45-54, 2006.

ASTM C770-16(2020), "Standard Test Method for Measurement of Glass Stress-Optical Coefficient," ASTM International, West Conshohocken, PA, 2020, www.astm.org.

ASTM D1003-21, "Standard Test Method for Haze and Luminous Transmittance of Transparent Plastics," ASTM International, West Conshohocken, PA, 2021, www.astm.org.

ASTM D523-14(2018), "Standard Test Method for Specular Gloss," ASTM International, West Conshohocken, PA, 2018, www.astm.org.

(56) References Cited

OTHER PUBLICATIONS

ASTM E2001-13, "Standard Guide for Resonant Ultrasound Spectroscopy for Defect Detection in Both Metallic and Non-metallic Parts," ASTM International, West Conshohocken, PA, 2013, www.astm.org.
ASTM Standard Test Method for Haze and Luminous Transmittance of Transparent Plastics; Designation D 1003-07, Nov. 2007.
Baek et al; "Correlations between optical properties, microstructure, and processing conditions of Aluminum nitride thin films fabricated by pulsed laser deposition." Elsevier, Thin Solid Films 515 (2007) 7096-7104.
Bitierlich et al; "Particle-reinforced SiAIONs for Cutting Tools." Materials Science Forum vol. 554 (2007) pp. 129-134.
Boerner et al; "Holographic Antiglare and Antireflection Films for Flat Panel Displays" SID 03 DIGEST, 7.3, p. 68, 2003.
Boichot et al; "Epitaxial growth of AIN on c-plane sapphire by High Temperature Hydride Vapor Phase Epitaxy: Inluence of the gas phase NIAi ratio and low temperature protective layer." Elsevier, Surface & Coatings Technology 237 (2013) 118-125.
Borges et al "Optical Properties of AINxOy Thin Films Deposited by DC Magnetron Sputtering." Proceedings of SPIE, 2011.
Caceres and Prieto, "Mechanical properties of sputtered silicon notride thin films", Journal of Applied Physics 94(12) 2003, pp. 7868-7873.
Caliendo et al; "Structural, optical, and acoustic characterization of high-quality AIN thick films sputtered on Al2O3 (001) at temperature for GHz band electroacoustic devices applications." Journal of Applied Physics 96, No. 5, 2610 (2004).
Carniero et al. "Hardness Evaluation of Nanolayered PVD Coatings Using Nanoindenlalion" , Rev. Adv. Maler. Sci., 2014 p. 83-90.
Cecala, C. et al., "Fourier Optics Modeling of Display Sparkle from Anti-Glare Cover Glass: Comparison to Experimental Data," Imaging and Applied Optics Congress, OSA Technical Digest (Optical Society of America, 2020), paper JW5B.8, 2 pages.
Chan et al; "Fracture Toughness Improvements of Dental Ceramic Through Use of Ytiria-Stabilized Zirconia (YSZ) Thin-Film Coating"; Dental Materials, 29 (2013) pp. 881-887.
Chang et al. "Characteristics of Si-C-N films deposited by microwave plasma CVD on Si wafers with various buffer layer materials", Diamond and Related Material, 2001, vol. 10, pp. 1910-1915 (Year: 2001).
Chen et al; "Optical Reflectance of Bulk AIN Crystals and AIN Epitaxial Films." AIP Conference Proceedings, 772, 297-298, 2005.
Chen et al; "Thickness-dependent structural transformation in the AIN film." Elsevier, Acta Materialia 53 (2005) 5223-5227.
Chi et. al. "Cracking in coating-substrate composites with multi-layered and FGM coatings," Engineering Fracture Mechanics 70 (2003) p. 1227.
Chou, S.Y. et al., "Imprint of Sub-25 nm Vias and Trenches in Polymers," Appl. Phys. Lett. 67, 3114, 1995, 3 pages.
Coming, Coming Eagle XG AMLCD Glass Substrates Material Information, MIE 301, Issued: Jan. 2006, pp. 1-3.
Cook, R. L., "Stochastic sampling in computer graphics," Computer Graphics (Proceedings of ACM Siggraph 86) 5, 1 (1986), pp. 51-72.
Corbin et al; Aluminum Oxynitride Spinel (ALON): A Review, Jul. 1987. Journal of the European Ceramic Society vol. 5, Issue 3, 1989, pp. 143-154.
Corning, "Corning Gorilla Glass 5," Product Info Sheet, 2 pgs, 2016, retrieved from: https://www.coming.com/microsites/csm/gorillaglass/Plsheets/Coming%20Gorilla%2-Glass%205%2005%20Sheet.pdf.
Corning, Corning Eagle XG AMLCD Glass Substrates Material Information, MIE 301, Issued: Jan. 2006, pp. 1-3.
Corning, Corning EAGLE2000 Glass, Materials Information, Revised Aug. 2000, 5 PGS.
Corning, Corning Gorilla Glass for Large Cover Glass Applications, 2013, 3 PGS.

Danylyuk, et al., "Optical and Electrical Properties of Al 1-x InxN Films Grown on Sapphire (0001) by Plasma Source Molecular Beam Epitaxy." Mat. Res. Soc. Symp., vol. 639, 2001.
Easwarakhanthan et al; "Spectroellipsometric investigation of optical, morphological, and structural properties of reactively sputtered polycrystalline AIN films." J_ Vac. Sci. Technology A 28 (3), pp. 495-501, May/Jun. 2010.
Fischer-Cripps; "Critical Review of Analysis and Interpretation of Nanoindentation Test Data"; Surface & Coatings Technology 200 (2006) pp. 4153-4165.
Fraunhofer IWS, Available online at <https://www.iws.fraunhofer.de/content/dam/iws/en/documents/publications/product_sheets/200-1a_large_en.pdf>, retrieved in 2020, 1 page.
Gazda et al; "Formation of ALN films on Ti/TiN Arc-Layer Interface with Al-0.5% Cu Interconects evaluated by XPS and Energy-filtered-TEM." Mat. Res. Soc. Symp. Proc. vol. 589, 365-370, 2001.
General Plasma INC., "Introducing disruptive large area Coating technology for the 21st century", Available online at https://web.archive.org/web/20140704064921/http://generalplasma.com/products/large-area-pecvd/, retrieved on 2014, 1 page.
Godeker et al., "Antireflection coating for sapphire with consideratino of mechanical properties" , Surface & Cotings Technology, 241 (2014) 59-63.
Goldman et al., "Scale Up of Large ALON Windows", Window and Dome Technologies and Materials XIII, edited by Randal W. Tustison, Brian J. Zelinski, Proc. of SPIE vol. 8708, 870804 (Jun. 4, 2013) (See Copy).
Gy, "Ion exchange for glass strengthening," Materials Science and Engineering B 149 (2008) 159-165.
Hajakbari et al; "Optical Properties of Amorphous AIN Thin Films on Glass and Silicon Substrates Grown by Single Ion Beam Sputtering." Jpn. J. Appl. Phys. 49, 095802 (2010).
Harding et al; "Cracking During Indentation and Its Use in the Measurement of Fracture Toughness" ; Mat. Res. Soc. Symp. Proc.; vol. 356, 1995, pp. 663-668.
Hay et al; "Continuous Stiffness Measurement During Instrumented Indentation Testing"; Experimental Techniques; May/Jun. 2010; pp. 86-94.
Hirai et al; "Formation of Aluminum Nitride by CartJothermic Reduction of Alumina in a Flowing Nitrogen Atmosphere." Nippon Kinzoku Gakkaishi (1989, 53 (10), 1035-40.
Hu et al; "Dynamic Fracturing of Strengthened Glass Under Biaxial Tensile Loading"; Journal of Non-Crystalline Solids; 405 (2014); pp. 153-158.
Huang et al; "Effect of deposition conditions on mechanical properties of low-temperature PECVD silicon nitride films" ; Materials Science and Engineering A 435-436 (2006) 453-459.
Yamashita et al. "Preparation and Properties of AION-SiAION Composites." Journal of the Ceramic Society of Japan 109, pp. 434-439, 2001.
Yan et al; "The Preparation and Properties of Y2O3/AIN Anti-Reflection Films on Chemical Vapor Deposition Diamond. "Elsevier, Thin Solid Films, 520, pp. 734-738, 2011.
Yang et al; "Preparation and Properties of AIN Thin Films by Pure Nitrogen Reactive Sputtering." Rengong Jingti Kuebao, 39 (1), pp. 190-196, 2010.
Yang et al; "Preparation and Properties of C-Axis Preferred Orientation AIN Thin Films by Pure Nitrogen Reactive Sputtering." Xianjiang Daxue Xuebao, Ziran Kexueban, 26 (4), pp. 444-449, 2009.
Yun et al.. "Optical and Structural Investigation of AIN Grown on Sapphire with Reactive MBE Using RF Nitrogen or Ammonia." Mat. Res. Soc. Symp. Proc., vol. 764, 2003.
Zabinski et al "Stoichiometry and characterization of aluminium oxynitride thin films grown by ion-beam assisted pulsed laser deposition." Elsevier, Thin Solid Films, 516, pp. 6215-6219, 2008.
Zayats et al; "Optical Studies of AIN/n-Si(100) Films Obtained by the Method of High-Frequency Magnetron Sputtering." Semiconductors, 2008, vol. 42 No.2 , pp. 195-198.

\* cited by examiner

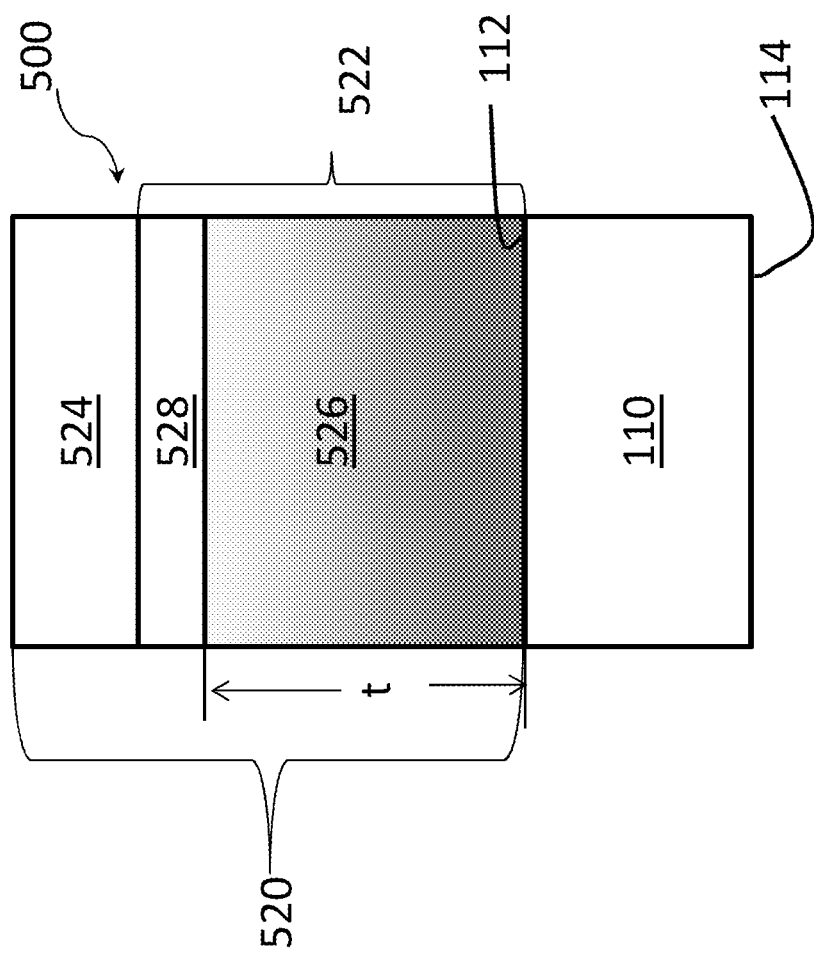

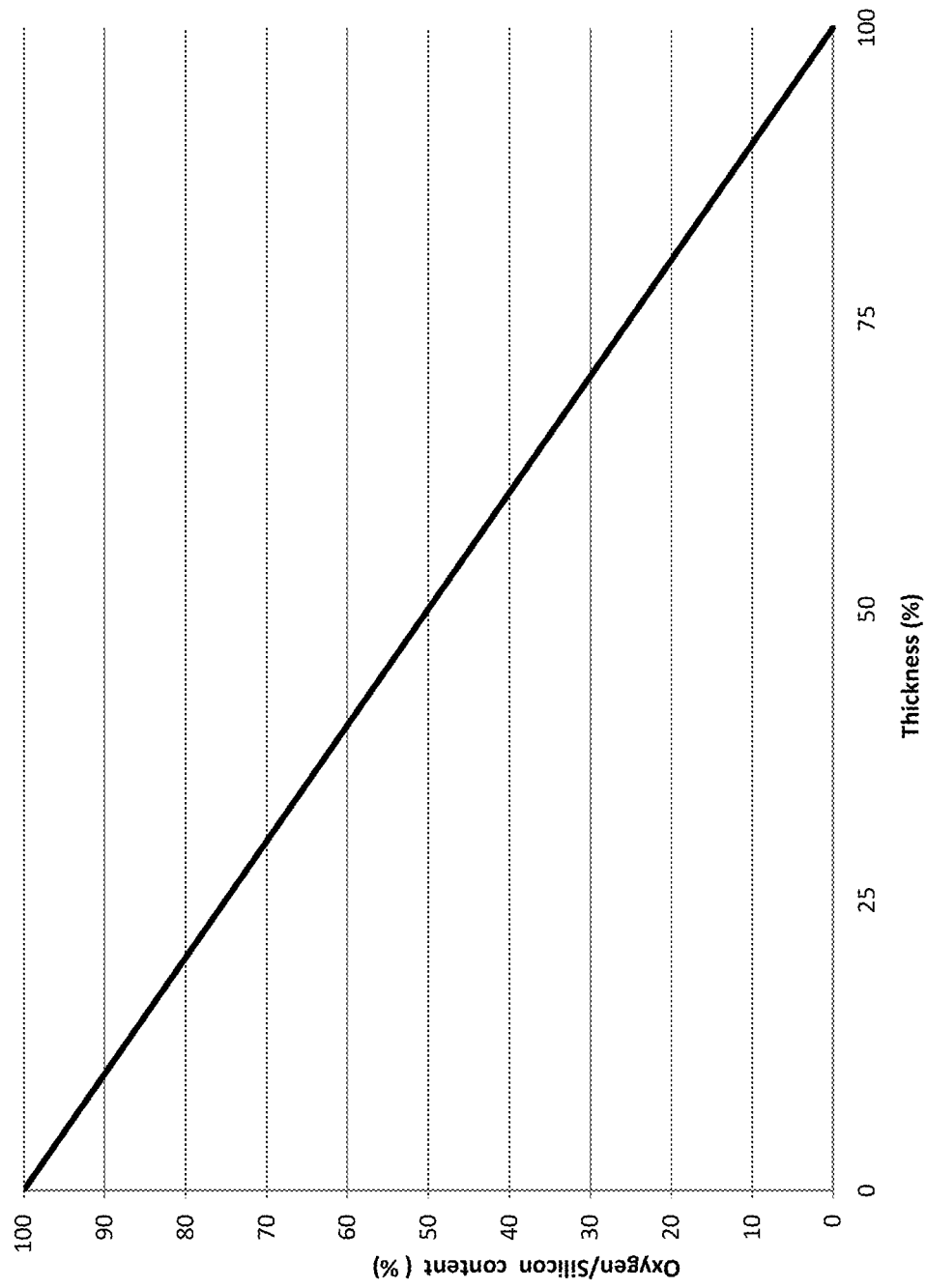

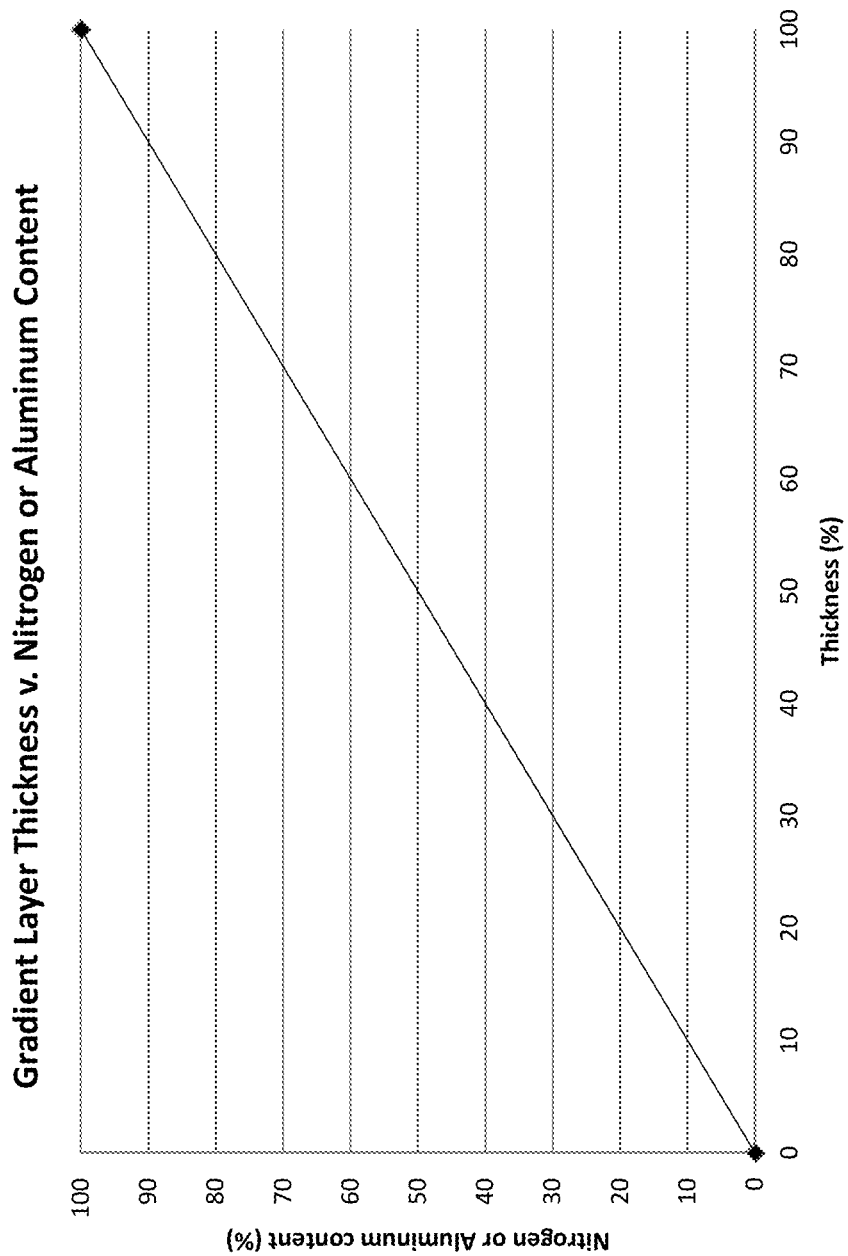

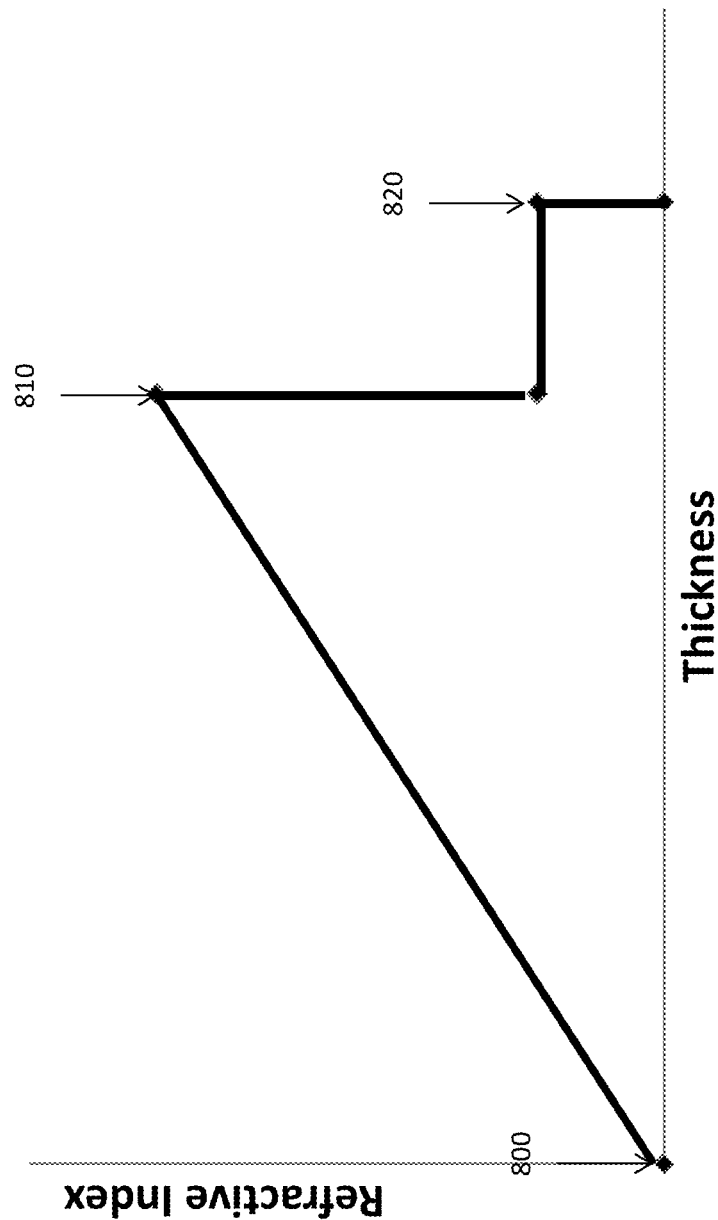

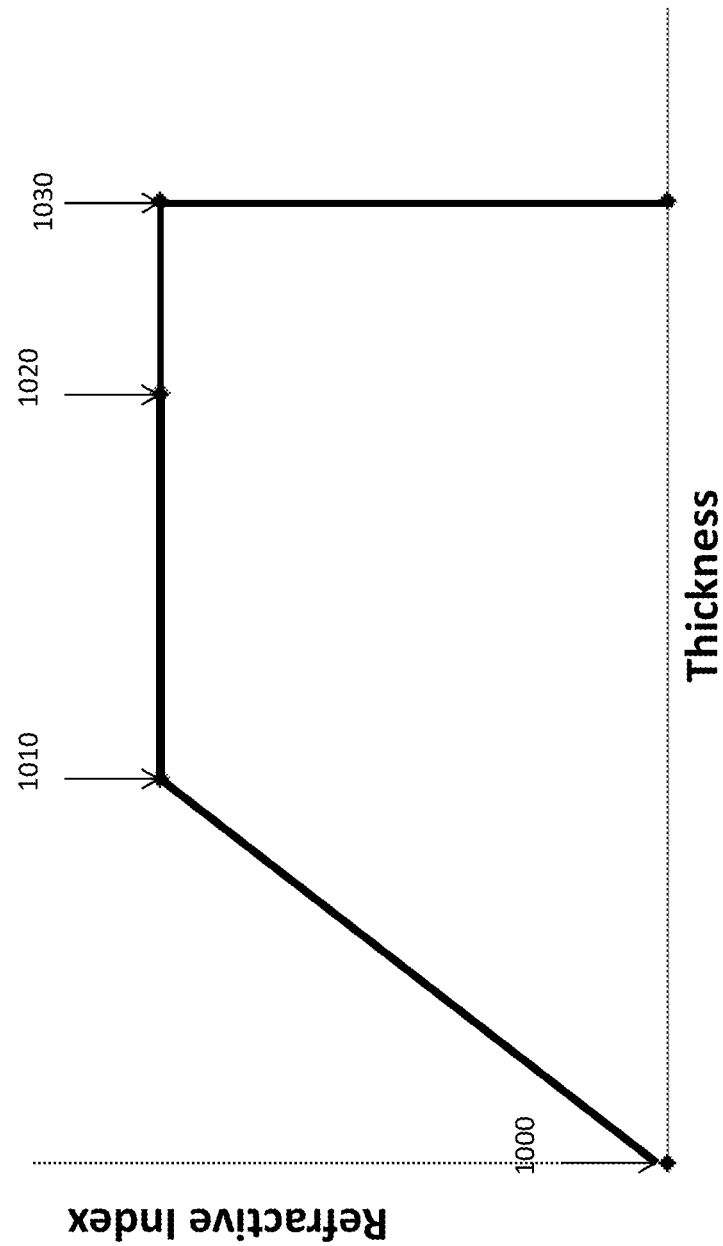

Zeros of a* and b*

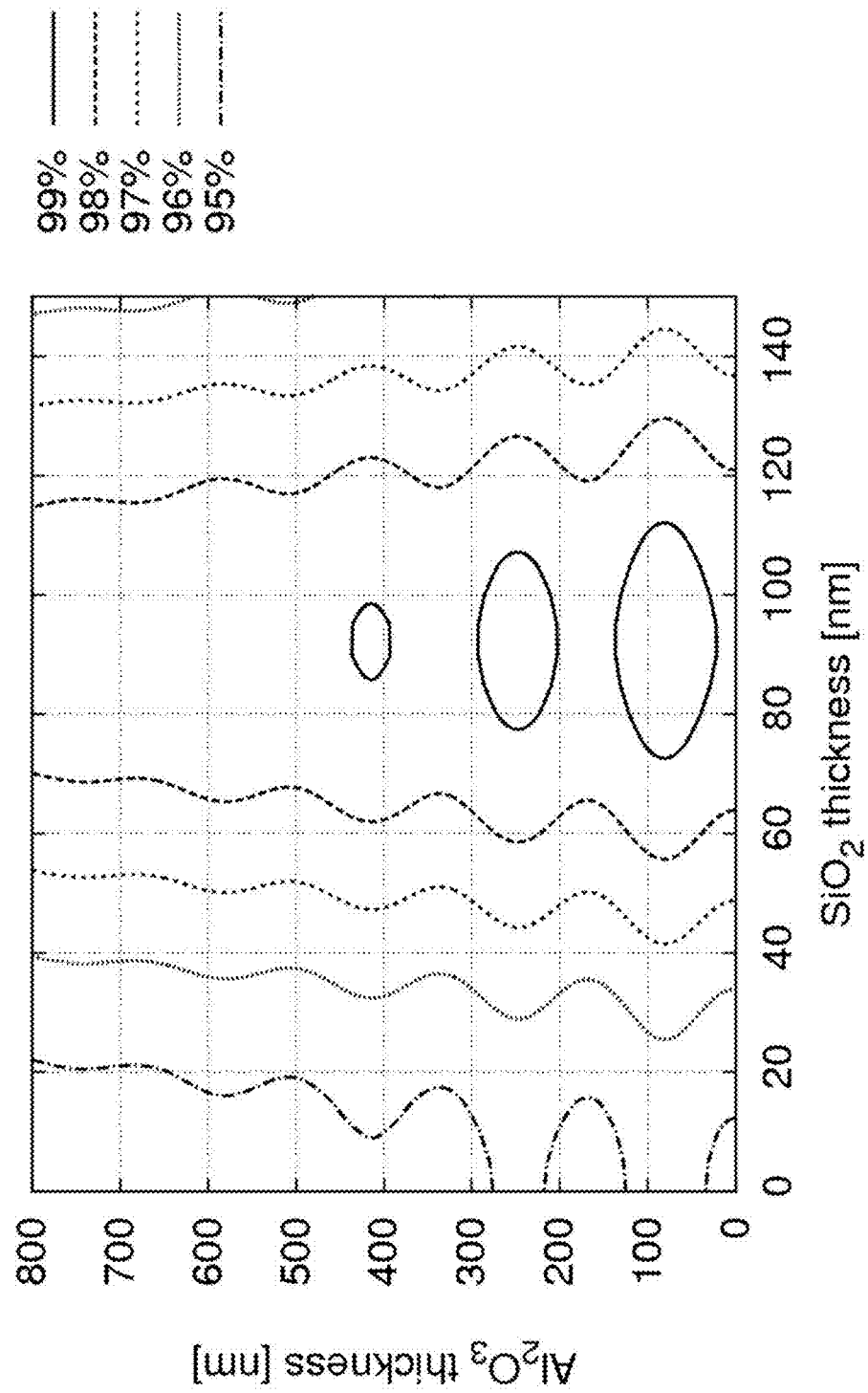

AlOxNy thickness 1850nm

AlOxNy thickness 1850nm

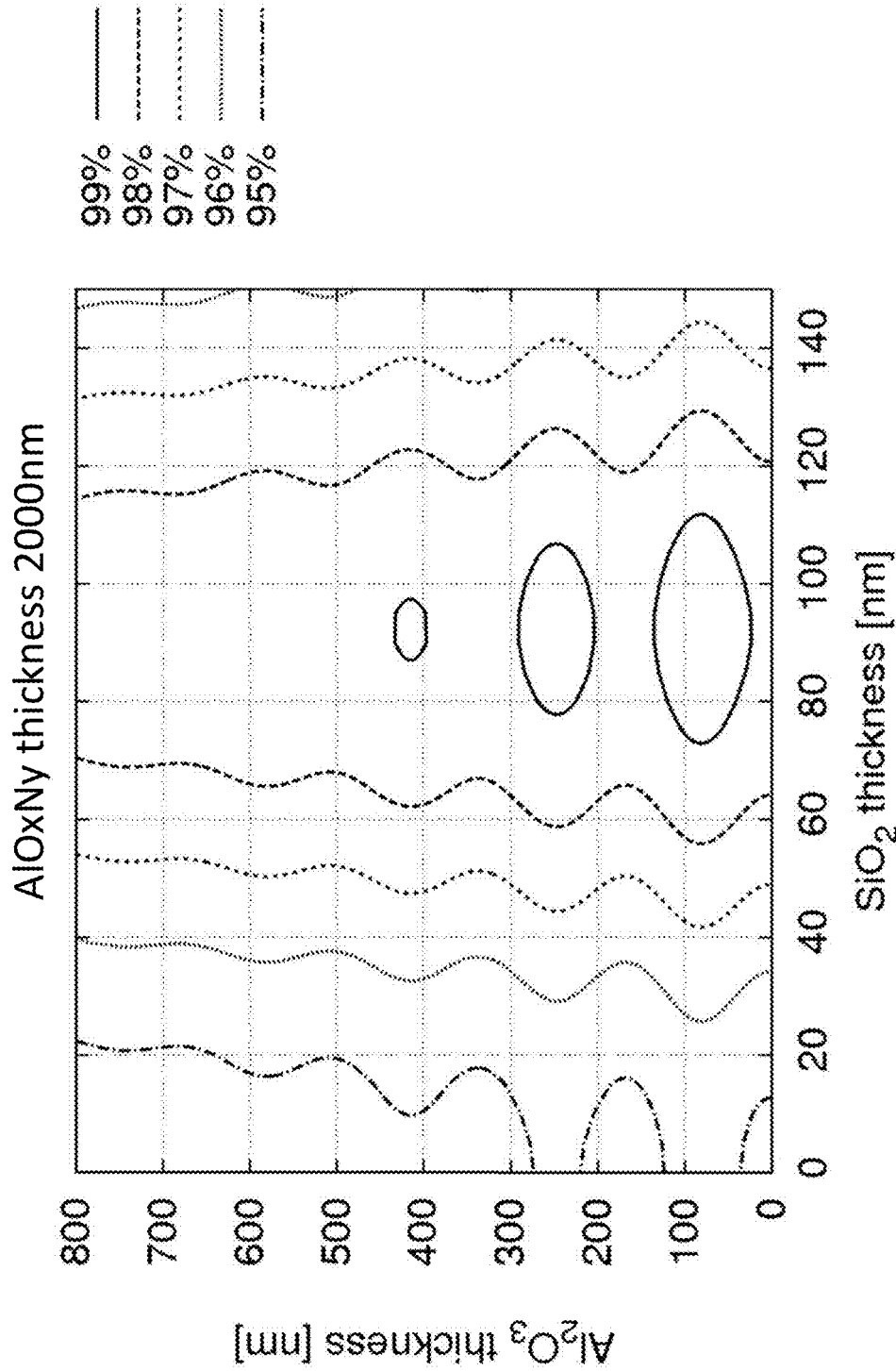

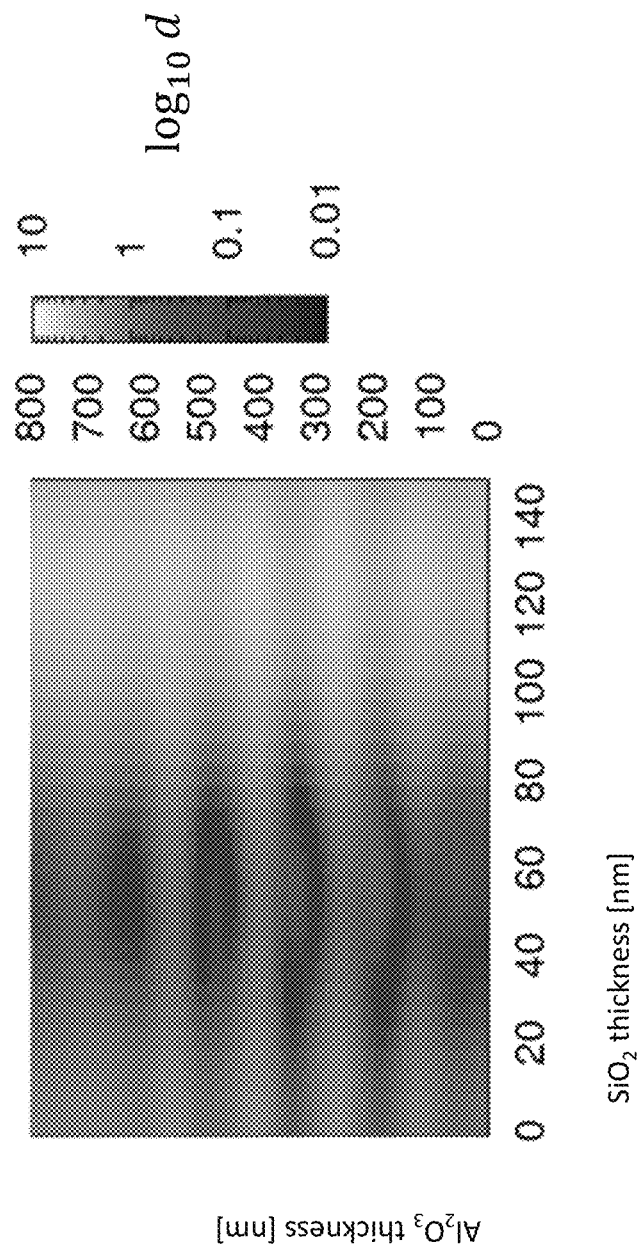

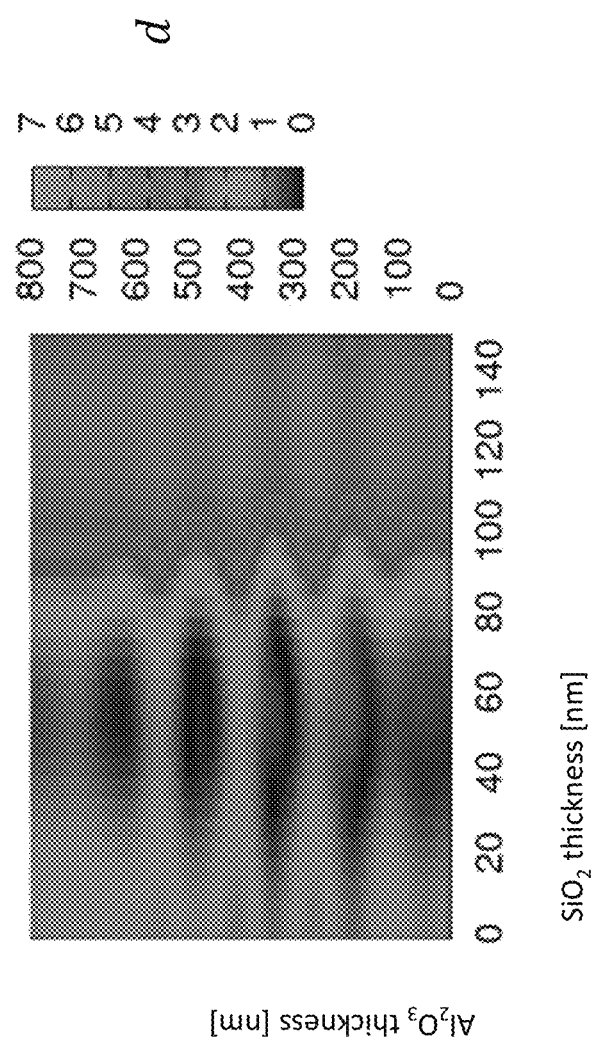

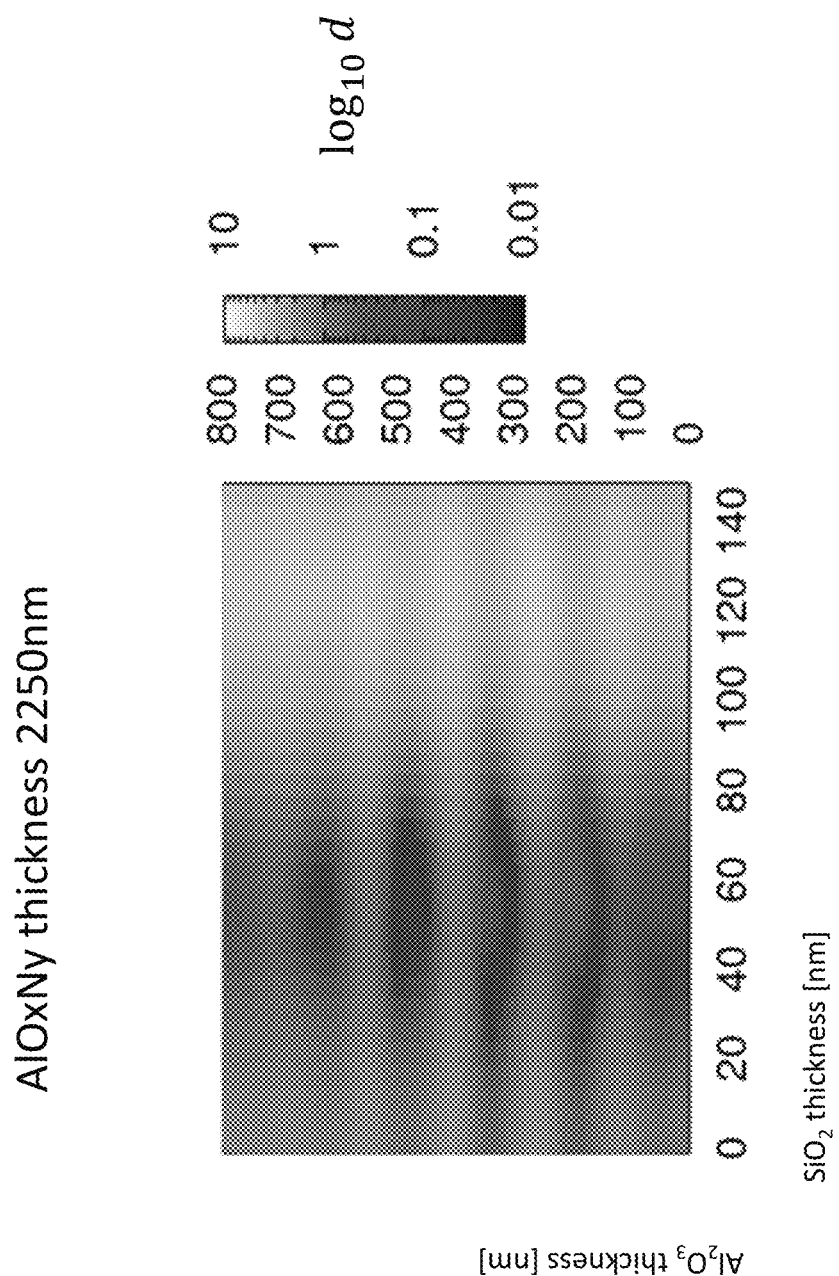

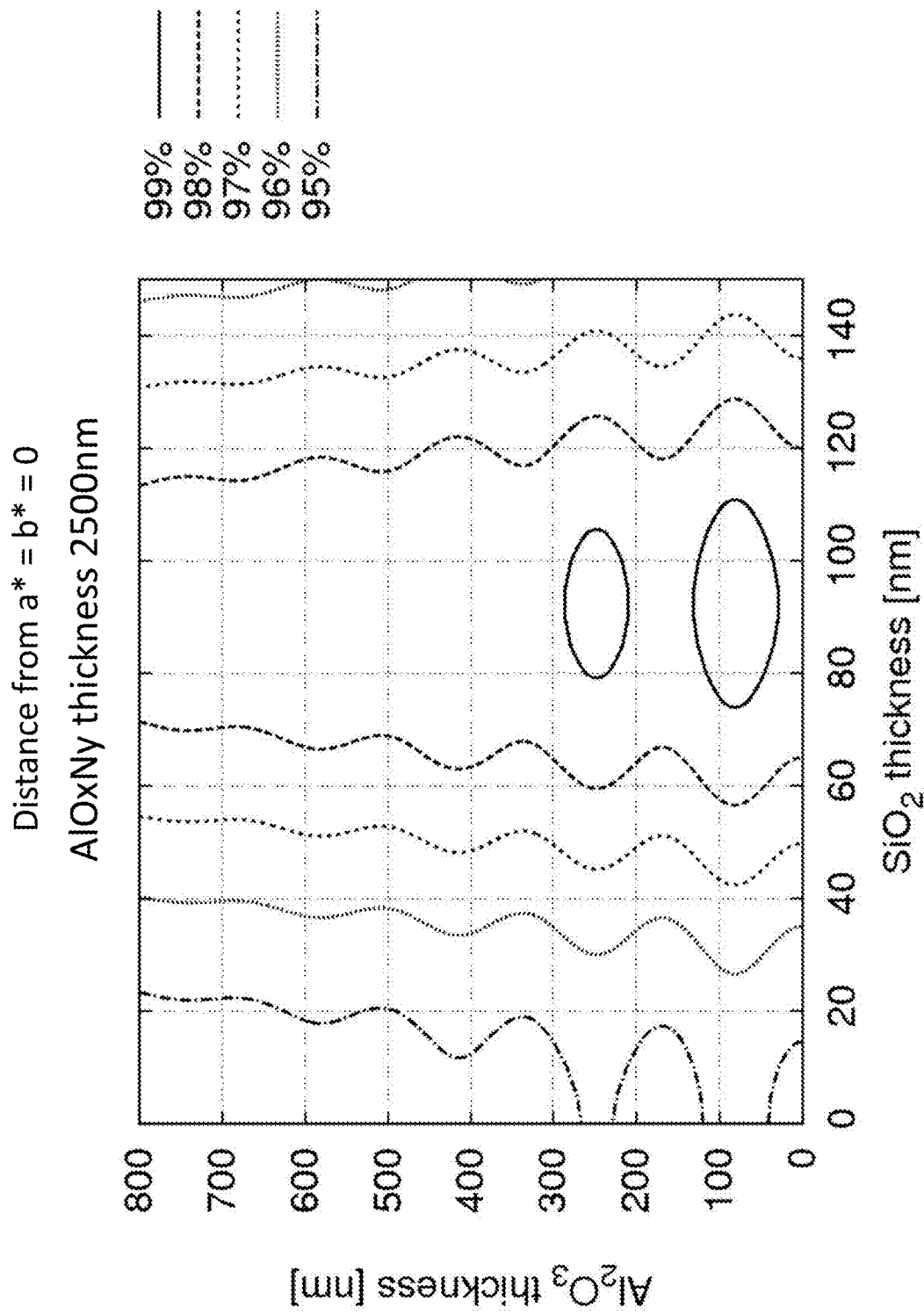

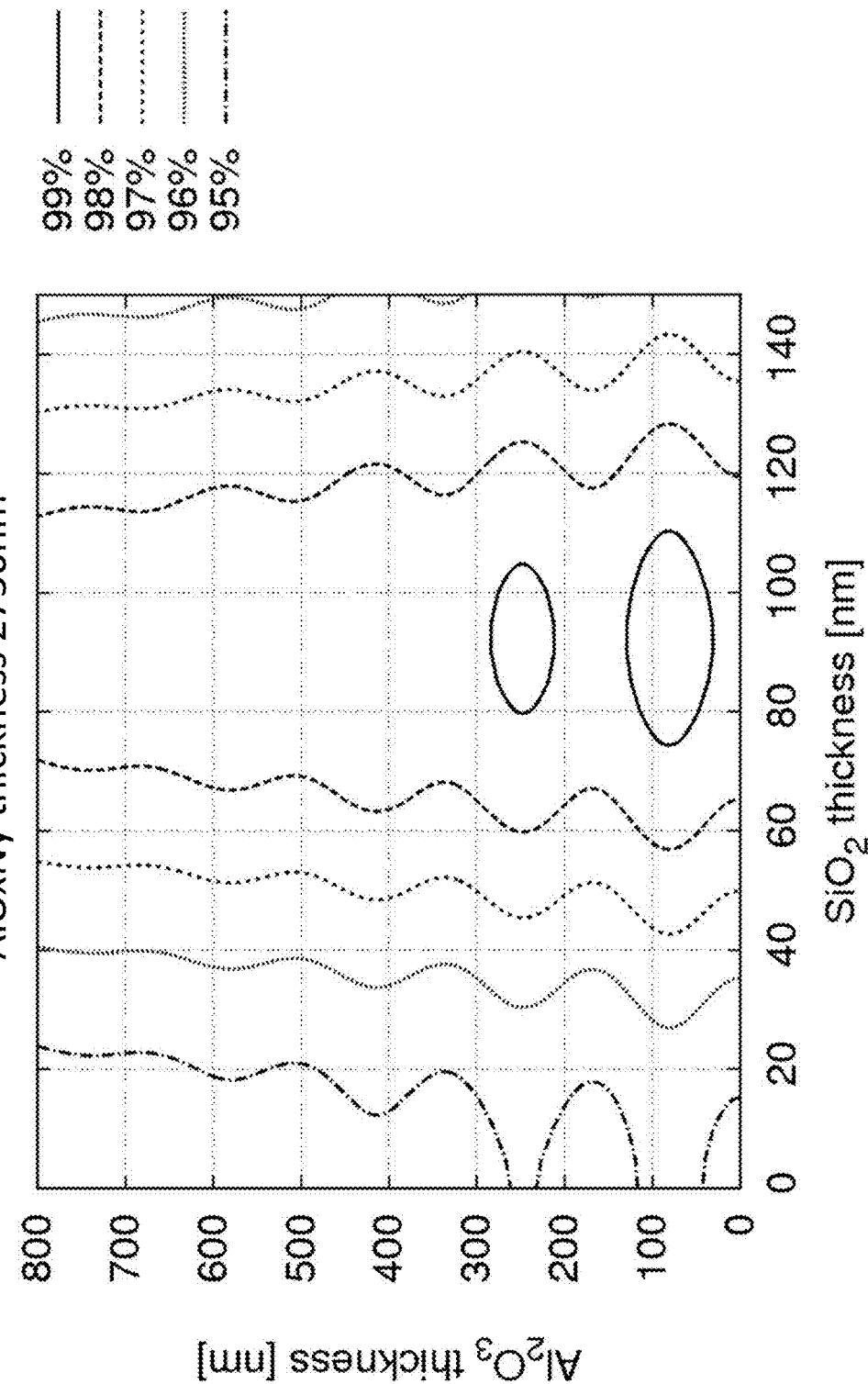

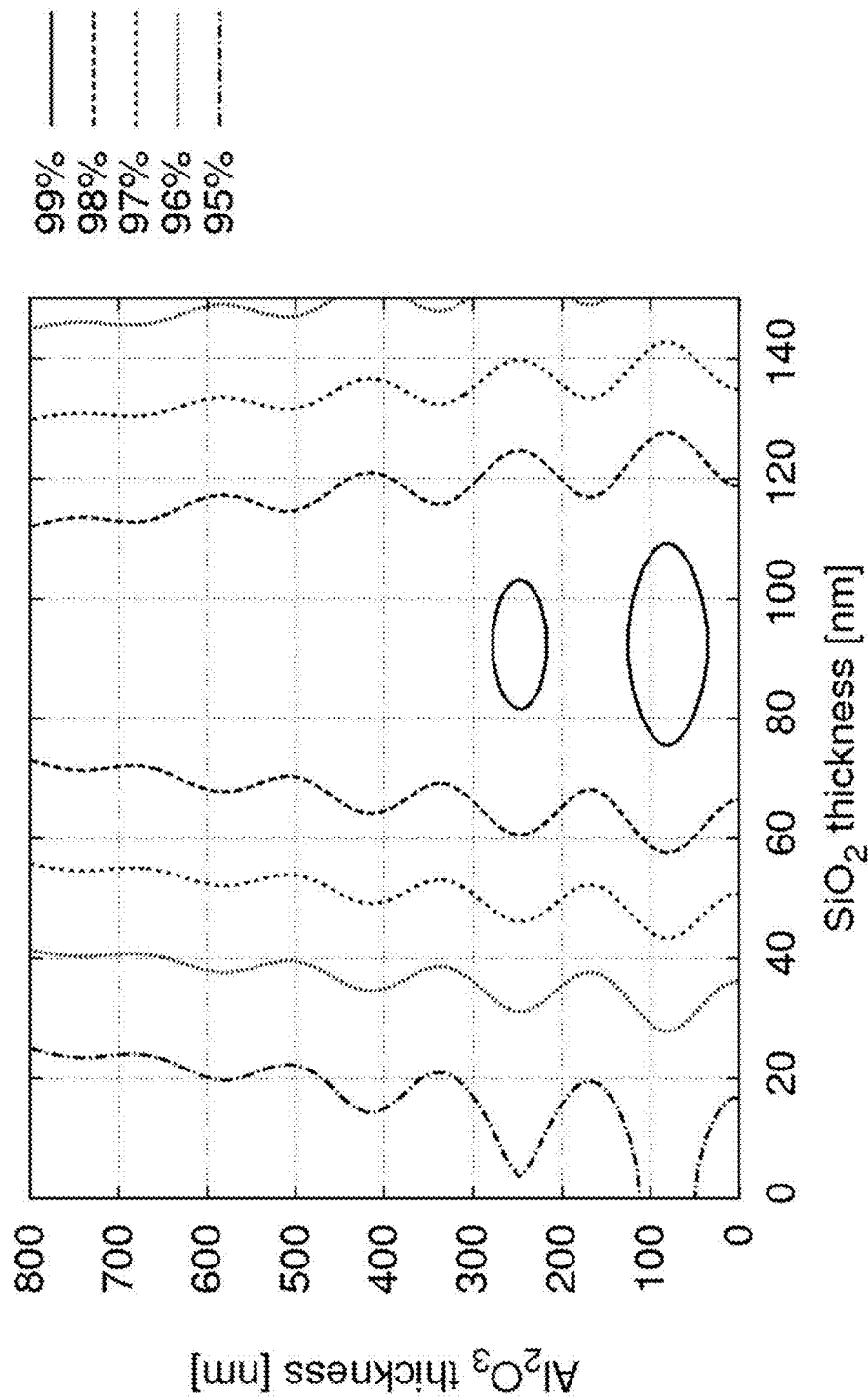

AlOxNy thickness 3250nm

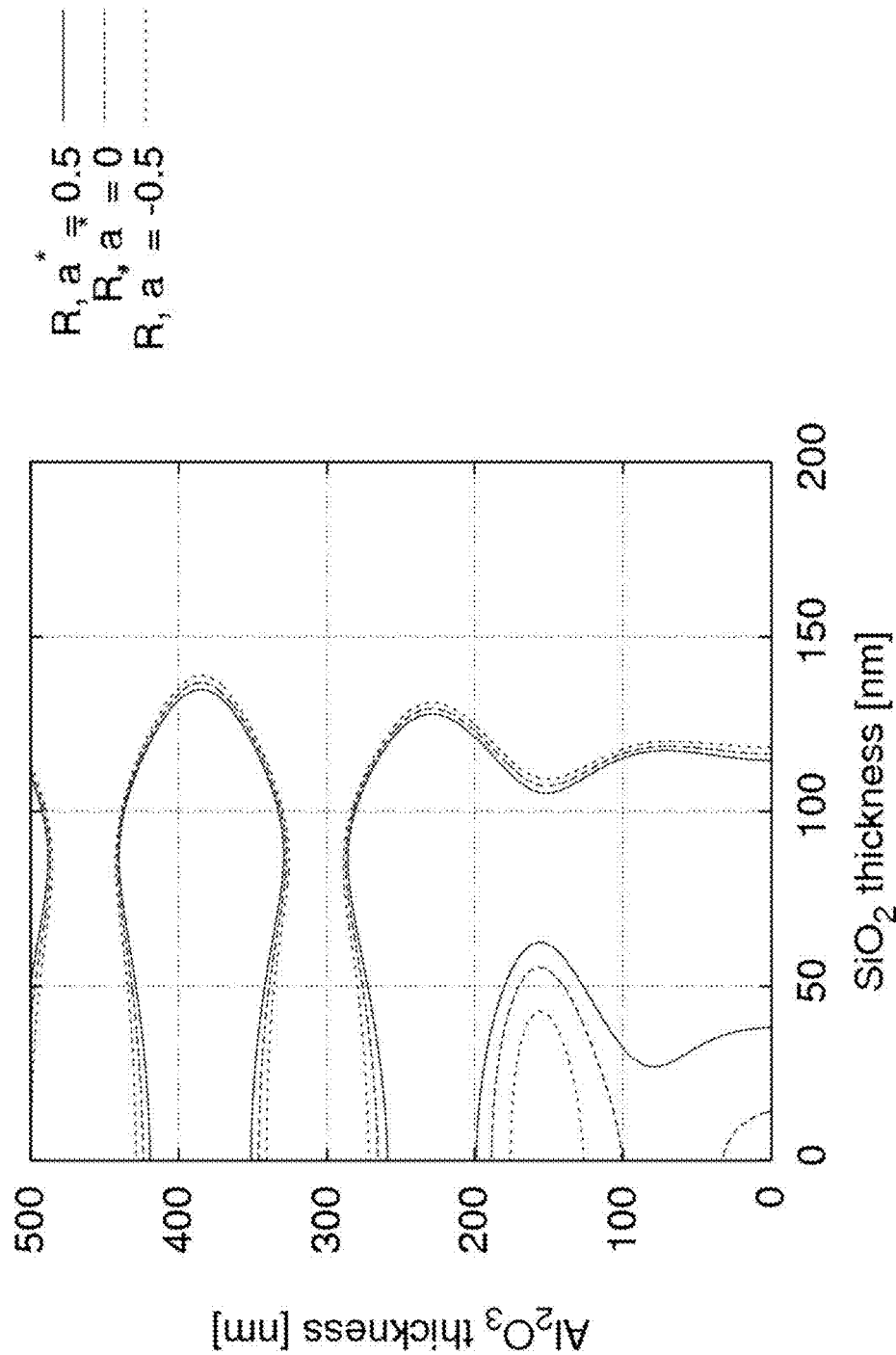

Contours of reflectance Δa*b* with respect to substrate reference point

SCRATCH-RESISTANT LAMINATES WITH RETAINED OPTICAL PROPERTIES

CLAIM OF PRIORITY

This application is a continuation and claims the benefit of priority under 35 U.S.C. § 120 of U.S. patent application Ser. No. 14/828,114, filed on Aug. 17, 2015, now U.S. Pat. No. 11,667,565, and of U.S. patent application Ser. No. 14/267,516, filed on May 1, 2014, now U.S. Pat. No. 9,110,230, which claims the benefit of priority under 35 U.S.C. § 119 of U.S. Provisional Application Ser. No. 61/877,568 filed on Sep. 13, 2013 and of U.S. Provisional Application Ser. No. 61/820,407 filed on May 7, 2013, the contents of which are relied upon and incorporated herein by reference in their entirety.

BACKGROUND

This disclosure relates to articles for display cover glass applications having scratch-resistance and retained optical properties, and more particularly to articles that include an optical film structure comprising scratch resistance, wherein the article exhibits 85% or more average light transmittance over the visible spectrum. As defined herein, the phrase "visible spectrum" includes wavelengths in the range from about 380 nm to about 780 nm.

Cover glass articles are often used to protect critical devices within electronic products, to provide a user interface for input and/or display, and/or many other functions. Such products include mobile devices, such as smart phones, mp3 players and computer tablets. These applications often demand scratch-resistance and strong optical performance characteristics, in terms of maximum light transmittance and minimum reflectance. Furthermore, cover glass applications require that the color exhibited or perceived, in reflection and/or transmission, does not change appreciably as the viewing angle is changed. This is because, if the color in reflection or transmission changes with viewing angle to an appreciable degree, the user of the product will perceive a change in color or brightness of the display, which can diminish the perceived quality of the display.

Known cover glass articles often exhibit scratches after use in harsh operating conditions. Evidence suggests that the damage caused by sharp contact that occurs in a single event is a primary source of visible scratches in cover glass articles used in mobile devices. Once a significant scratch appears on a cover glass article, the appearance of the product is degraded since the scratch causes an increase in light scattering, which may cause significant reduction in brightness, clarity and contrast of images on the display. Significant scratches can also affect the accuracy and reliability of touch sensitive displays. Thus, these scratches, and even less significant scratches, are unsightly and can affect product performance.

Single event scratch damage can be contrasted with abrasion damage. Cover glass does not typically experience abrasion damage because abrasion damage is typically caused by reciprocating sliding contact from hard counter face objects (e.g., sand, gravel and sandpaper). Instead, cover glass articles typically endure only reciprocating sliding contact from soft objects, such as fingers. In addition, abrasion damage can generate heat, which can degrade chemical bonds in the film materials and cause flaking and other types of damage to the article. In addition, since abrasion damage is often experienced over a longer term than the single events that cause scratches, the film material experiencing abrasion damage can also oxidize, which further degrades the durability of the film and thus the article. The single events that cause scratches generally do not involve the same conditions as the events that cause abrasion damage and therefore, the solutions often utilized to prevent abrasion damage may not prevent scratches in articles. Moreover, known scratch and abrasion damage solutions often compromise the optical properties.

Accordingly, there is a need for new articles, and methods for their manufacture, which exhibit scratch resistance and good optical performance.

SUMMARY

A first aspect of this disclosure pertains to an article including an inorganic oxide substrate having opposing major surfaces and opposing mirror surfaces and an optical film structure disposed on at least one of the opposing major surfaces of the inorganic oxide substrate. The articles according to one or more embodiments exhibit an average light transmittance of 85% or more over the visible spectrum (e.g., 380 nm-780 nm). In a specific embodiment, the article exhibits a total reflectance (which includes specular and diffuse reflectance) that is the same or less than the total reflectance of the inorganic oxide substrate without the optical film structure disposed thereon. The article of one or more embodiments exhibits a substantially flat transmittance spectra (or reflectance spectra) or a transmittance (or reflectance) that is substantially constant over the visible spectrum. The article may also exhibit a color in the (L, a*, b*) colorimetry system, such that the transmittance color or reflectance coordinates distance from a reference point is less than about 2. In one or more embodiments, the reference point may be the origin (0, 0) in the L*a*b* color space (or the color coordinates a*=0, b*=0) or the color coordinates of the inorganic oxide substrate.

In one or more embodiments, the inorganic oxide substrate may include an amorphous substrate, crystalline substrate or a combination thereof. In embodiments in which an amorphous substrate is utilized, the amorphous substrate can include a glass substrate that may be strengthened or non-strengthened. Examples of amorphous substrates include soda lime glass, alkali aluminosilicate glass, alkali containing borosilicate glass and/or alkali aluminoborosilicate glass. Examples of crystalline substrates include strengthened glass ceramic substrates, a non-strengthened glass ceramic substrates, single crystalline substrates (e.g., single crystal substrates such as sapphire) or a combination thereof.

In accordance with one or more embodiments, the optical film structure imparts scratch resistance to the article. For example, the optical film structure may include at least one layer that has a hardness of at least 16 GPa, as measured by the diamond Berkovitch indenter test as described herein. In other embodiments, the optical film structure may exhibit a coefficient of friction of less than 0.3, when measured against a silicon carbide sphere counter surface.

The optical film structure may include a silicon-containing oxide, a silicon-containing nitride, an aluminum-containing nitride (e.g., AlN and $Al_xSi_yN$), an aluminum-containing oxy-nitride (e.g., $AlO_xN_y$ and $Si_uAl_vO_xN_y$), an aluminum-containing oxide or combinations thereof. In some embodiments, the optical film structure includes transparent dielectric materials such as $SiO_2$, $GeO_2$, $Al_2O_3$, $Nb_2O_5$, $TiO_2$, $Y_2O_3$ and other similar materials and combinations thereof. The optical film structure of one or more embodiments may have a layered structure or, more specifically, at least two layers (e.g., a first layer and a second layer)

such that a first layer is disposed between the inorganic oxide substrate and the second layer.

In one or more embodiments, the first layer of the optical film structure may include a silicon-containing oxide, a silicon-containing nitride, an aluminum-containing oxide, an aluminum-containing oxy-nitride (e.g., AlOxNy and $Si_uAl_vO_xN_y$), an aluminum-containing nitride (e.g., AlN and AlxSiyN) or combinations thereof. Specifically, the first layer may include $Al_2O_3$, AlN, $AlO_xN_y$, or combinations thereof. In another option, the first layer may also include a transparent dielectric material such as $SiO_2$, $GeO_2$, $Al_2O_3$, $Nb_2O_5$, $TiO_2$, $Y_2O_3$ and other similar materials and combinations thereof.

In embodiments in which the optical film structure includes AlN or AlOxNy, the AlN or AlOxNy may include an amorphous structure, a microcrystalline structure, or a combination thereof. Alternatively or additionally, the AlN or AlOxNy may include a polycrystalline structure.

In one or more embodiments, the optical film structure may incorporate one or more modifiers. Alternatively, the optical film structure may be free of modifiers. In one or more specific embodiments, at least one modifier may be incorporated into optical film structures that utilize AlN. In such embodiments, the AlN may be doped or alloyed with at least one modifier. Exemplary modifiers include BN, Ag, Cr, Mg, C and Ca. In one variant, the optical film structure exhibits conductive properties. In such embodiments, the optical film structure may incorporate a modifier including Mg and/or Ca therein.

The first layer of the optical film structure may include a first sub-layer and a second sub-layer. In such embodiments, the first sub-layer may be disposed between the second sub-layer and the inorganic oxide substrate. In one variant, the first sub-layer may include $Al_2O_3$ and a second sub-layer may include AlN.

In one or more embodiments, the first sub-layer may include $AlO_xN_y$, and the second sub-layer may include AlN. In another variant, the first layer includes three sub-layers (e.g., a first sub-layer, a second sub-layer and a third sub-layer). In such embodiments, the first sub-layer and third sub-layer may include AlN and the second sub-layer may include a transparent dielectric material such as $SiO_2$, $GeO_2$, $Al_2O_3$, $Nb_2O_5$, $TiO_2$, $Y_2O_3$ and other similar materials and combinations thereof.

In one or more embodiments, the first layer of the optical film structure may include a compositional gradient. The composition gradient may include an oxygen content gradient, a nitrogen content gradient, a silicon content gradient and/or an aluminum content gradient. In one or more embodiments, the composition gradient may include a silicon/aluminum composition gradient, where the atomic % of silicon and aluminum change along the thickness of the first layer independently of one another or in relation to one another. In other embodiments, the compositional gradient may include an oxygen/nitrogen composition gradient, where the atomic % of oxygen and nitrogen change along the thickness of the first layer independently of one another or in relation to one another.

In a specific embodiment, the oxygen content and/or the silicon content of the first layer may decrease along the thickness of the first layer in a direction moving away from the inorganic oxide substrate. In another embodiment, the aluminum and/or nitrogen content gradient may increase along the thickness of the first layer in a direction moving away from the inorganic oxide substrate. In one or more examples, the first layer may include an oxygen content gradient and include AlN. In such embodiments, the first layer and may be free of oxygen adjacent to the second layer. In specific examples, the compositional gradient in the first layer is constant along the thickness of the first layer. In other specific examples, the compositional gradient in the first layer is not constant along the thickness of the first layer. In other more specific examples, the compositional gradient in the first layer occurs step-wise along the thickness of the first layer and the step-wise composition gradient may be constant or inconstant.

In accordance with one or more embodiments, the first layer includes a refractive index gradient. The refractive index of the first layer may increase or decrease or otherwise change along the thickness of the first layer to improve the optical properties described herein of the optical film structure and/or the article.

In one or more embodiments, second layer of the optical film structure includes a transparent dielectric material such as $SiO_2$, $GeO_2$, $Al_2O_3$, $Nb_2O_5$, $TiO_2$, $Y_2O_3$ and other similar materials and combinations thereof.

Optionally, the optical film structure may include additional films or layers disposed on the second layer of the optical film structure. In one variant, the article may include a wrapped film. The wrapped film may be disposed on one or more of the opposing mirror surfaces and/or one or more of the opposing major surfaces of the inorganic oxide substrate. In embodiments in which the wrapped film is disposed on one or more of the opposing major surfaces of the inorganic oxide substrate, the wrapped film may be disposed between the inorganic oxide substrate and the optical film structure. The wrapped film may also form a portion of the optical film structure (e.g., the first sub-layer of the optical film structure).

The articles may optionally include a passivation film or an interlayer. In one or more embodiments, the interlayer may be disposed between the optical film structure and the inorganic oxide substrate. In one or more alternative embodiments, the interlayer may be part of the optical film structure. For example, one or more embodiments, the interlayer may form part of the first layer or the first sub-layer of the optical film structure.

In one or more embodiments, the optical film structure may have a thickness of at least about 1 µm or at least about 2 µm. Where the optical film structure includes a layered structure, the first layer may have a thickness that is greater than the thickness of the second layer of the optical film structure.

A second aspect of this disclosure pertains to a method of forming an article, as described herein. In one or more embodiments, the method includes providing an inorganic oxide substrate, as otherwise provided herein, and disposing a low-stress optical film structure on the inorganic oxide substrate at a pressure in the range from about 0.5 mTorr to about 10 mTorr. The optical film structure may exhibit a hardness of at least 16 GPa. The optical film structure may have a layered structure as described herein.

In one or more embodiments, the method includes using a vacuum deposition technique to dispose the optical film structure on the inorganic oxide substrate. The vacuum deposition technique may include chemical vapor deposition, physical vapor deposition, thermal evaporation and/or atomic layer deposition. In one or more embodiments, the method further includes increasing the conductivity of the optical film structure, by, for example, doping the optical film structure with a modifier. Exemplary modifiers that may be utilized to increase the conductivity of the optical film structure include Mg, Ca and a combination thereof. One or more embodiments of the method may include increasing the lubricity of the optical film structure. In a specific embodiment, increasing the lubricity of the optical film structure includes incorporating BN into the optical film structure. In one or more embodiments, the method may include reducing the stress of the optical film structure. In a specific embodiment, the method may include reducing the stress of the optical film structure by incorporating one or more of BN, Ag, Cr or a combination thereof into the optical film structure.

In accordance with one or more embodiments, the method may include introducing oxygen and/or nitrogen into the optical film structure. In one example, the method may optionally include creating an oxygen content gradient and/or a nitrogen content gradient in the optical film structure. In one variant, the oxygen content gradient includes an oxygen content that decreases along the thickness of the optical film structure in a direction moving away from the inorganic oxide substrate. In one variant, the nitrogen content gradient includes a nitrogen content that increases along the thickness of the optical film structure in a direction moving away from the inorganic oxide substrate. The method may also include creating a silicon content gradient and/or an aluminum content gradient. In one or more embodiments, the method may include depositing one or more source materials (e.g., silicon and/or aluminum) on the inorganic oxide substrate to form the optical film structure and varying one or more process conditions such as the power supplied to the one or more source materials to create the silicon content gradient and/or the aluminum content gradient in the optical film structure. In one or more embodiments, the method includes disposing an interlayer between the optical film structure and the inorganic oxide substrate or incorporating an interlayer into the optical film structure.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 5 is an illustration of an article according to one or more embodiments.

FIG. 6A is a graph of the oxygen or silicon content of an article shown in FIGS. 4 and 5.

FIG. 6B is a graph of the nitrogen or aluminum content of an article shown in FIGS. 4 and 5.

FIG. 9 is a graph of the relationship between the thickness and refractive indices of the optical film structure of the article of FIG. 4.

FIG. 10B is a graph of the relationship between the thickness and refractive indices of the optical film structure of the article according to one or more alternative embodiments.

FIG. 19A is a contour plot of the luminosity, L*, in transmittance, for Example 1.

FIG. 20A is a contour plot of the luminosity, L*, in transmittance, for Example 2.

FIG. 20C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 2.

FIG. 21B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 3.

FIG. 21C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 3.

FIG. 22A is a contour plot of the luminosity, L*, in transmittance, for Example 4.

FIG. 23A is a contour plot of the luminosity, L*, in transmittance, for Example 5.

FIG. 25A is a contour plot of the luminosity, L*, in transmittance, for Example 7.

FIG. 29B is a contour plot of a*, in reflectance, for the optical film structure and substrate of Example 11.

DETAILED DESCRIPTION

Figure 1:
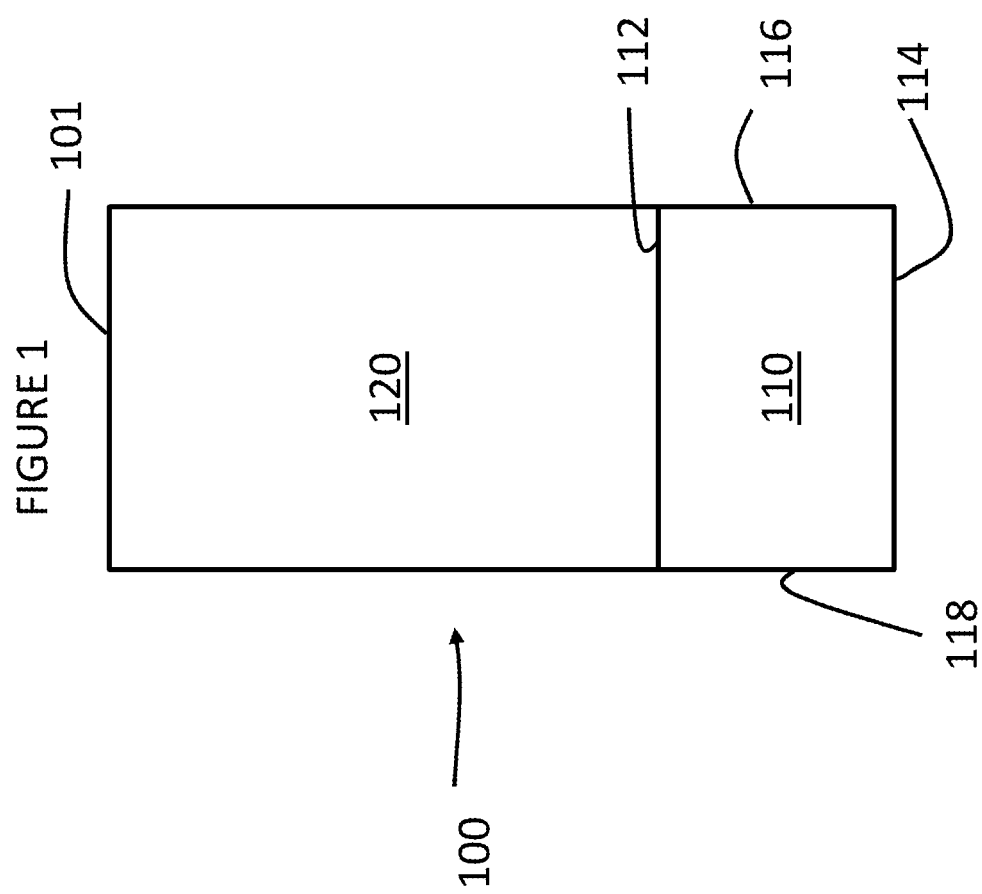
FIG. 1 is an illustration of an article according to one or more embodiments.

Reference will now be made in detail to the embodiment(s), examples of which are illustrated in the accompanying drawings. Whenever possible, the same reference numerals will be used throughout the drawings to refer to the same or like parts.

Referring to FIG. 1, a first aspect of the disclosure pertains to an article 100 including an inorganic oxide substrate 110 having major opposing sides 112, 114 and opposing mirror sides 116, 118 and an optical film structure 120 disposed on one of the opposing major sides 112 of the inorganic oxide substrate 110. The optical film structure may be disposed on the other opposing major side 114 and/or one or both opposing minor sides 116, 118 in addition to or instead of being disposed on the opposing major side 112.

The term "film", as applied to the optical film structures described herein may include one or more layers that are formed by any known method in the art, including discrete deposition or continuous deposition processes. Such layers may be in direct contact with one another. The layers may be formed from the same material or more than one different material. In one or more alternative embodiments, such layers may have intervening layers of different materials disposed therebetween. In one or more embodiments a film may include one or more contiguous and uninterrupted layers and/or one or more discontinuous and interrupted layers (i.e., a layer having different materials formed adjacent to one another).

As used herein, the term "dispose" includes coating, depositing and/or forming a material onto a surface using any known method in the art. The disposed material may constitute a layer or film as defined herein. The phrase "disposed on" includes the instance of forming a material onto a surface such that the material is in direct contact with the surface and also includes the instance where the material is formed on a surface, with one or more intervening material(s) is between the disposed material and the surface. The intervening material(s) may constitute a layer or film, as defined herein.

According to one or more embodiments, the article 100 exhibits an average transmittance of 85% or greater over the visible spectrum. In one or more embodiments, the article 100 has a total reflectance of 15% or less. As used herein, the term "transmittance" is defined as the percentage of incident optical power within a given wavelength range transmitted through a material (e.g., the article, the inorganic oxide substrate or the optical film structure or portions thereof). The term "reflectance" is similarly defined as the percentage of incident optical power within a given wavelength range that is reflected from a material (e.g., the article, the inorganic oxide substrate or the optical film structure or portions thereof). Transmittance and reflectance are measured using a specific linewidth. In one or more embodiments, the spectral resolution of the characterization of the transmittance and reflectance is less than 5 nm or 0.02 eV.

In one or more specific examples, the article 100 may exhibit an average transmittance of about 85% or greater, about 85.5% or greater, about 86% or greater, about 86.5% or greater, about 87% or greater, about 87.5% or greater, about 88% or greater, about 88.5% or greater, about 89% or greater, about 89.5% or greater, about 90% or greater, about 90.5% or greater, about 91% or greater, about 91.5% or greater, about 92% or greater, about 92.5% or greater, about 93% or greater, about 93.5% or greater, about 94% or greater, about 94.5% or greater, about 95% or greater, about 96% or greater, about 97% or greater, about 98% or greater, or about 99% or greater, over the visible spectrum. In one or more other examples, the article may have a total reflectance of about 15% or less, about 14% or less, about 13% or less, about 12% or less, about 11% or less, about 10% or less, about 9% or less, about 8% or less, about 7% or less, or about 6% or less. In some specific embodiments, the article has a total reflectance of about 6.8% or less, about 6.6% or less, about 6.4% or less, about 6.2% or less, about 6% or less, about 5.8% or less, about 5.6% or less, about 5.4% or less, about 5.2% or less, about 5% or less, about 4.8% or less, about 4.6% or less, about 4.4% or less, about 4.2% or less, about 4% or less, about 3.8% or less, about 3.6% or less, about 3.4% or less, about 3.2% or less, about 3% or less, about 2.8% or less, about 2.6% or less, about 2.4% or less, about 2.2% or less, about 2% or less, about 2.8% or less, about 2.6% or less, about 2.4% or less, about 2.2% or less, about 2% or less, about 1.8% or less, about 1.6% or less, about 1.4% or less, about 1.2% or less, about 1% or less, or about 0.5% or less. In accordance with one or more embodiments, the article 100 has a total reflectance that is the same or less than the total reflectance of the inorganic oxide substrate 110. In other embodiments, the article has a total reflectance differs from the total reflectance of the inorganic oxide substrate by less than about 20%, or 10%.

According to one or more embodiments, the article 100 exhibits an average light transmission of 85% or greater over the visible spectrum. The term "light transmission" refers to the amount of light that is transmitted through a medium. The measure of light transmission is the ratio between the light incident on the medium and the amount of light exiting the medium (that is not reflected or absorbed by the medium). In other words, light transmission is the fraction of incident light that is both not reflected and not absorbed by a medium. The term "average light transmission" refers to spectral average of the light transmission multiplied by the luminous efficiency function, as described by CIE standard observer. The article 100 may exhibit an average light transmission of 85% or greater, 85.5% or greater, 86% or greater, 86.5% or greater, 87% or greater, 87.5% or greater, 88% or greater, 88.5% or greater, 89% or greater, 89.5% or greater, 90% or greater, 90.5% or greater, 91% or greater, 91.5% or greater, 92% or greater, 92.5% or greater, 93% or greater, 93.5% or greater, 94% or greater, 94.5% or greater, or 95% or greater, over the visible spectrum.

The article 100 includes a front face 101 and optical properties such that, when the article is viewed at an angle other than normal incidence from the front face, the article does not provide a reflectance color tone, or the reflectance color tone provided is neutral or colorless. In other words, observed from an angle other than directly in front of the front face 101, the reflectance is colorless. Additionally or alternatively, the reflected color from the article does not substantially vary, even if a viewing angle changes. In one or more embodiments, the article exhibits color transmittance and/or reflectance in the (L, a*, b*) colorimetry system with a color coordinates distance from a reference point of is less than about 2, at normal incidence for the transmitted light. In one or more embodiments, the reference point may be the color coordinates a*=0, b*=0 or the reference point may be the color coordinates of the inorganic oxide substrate 110. In one or more specific embodiments, the transmittance and/or reflectance color coordinates distance may be less than 1 or even less than 0.5. In one or more specific embodiments, the transmittance and/or reflectance color coordinates distance may be 1.8, 1.6, 1.4, 1.2, 0.8, 0.6, 0.4, 0.2, 0 and all ranges and sub-ranges therebetween. Where the reference point is the color coordinates a*=0, b*=0, the color coordinate distance is calculated by the equation, color coordinate distance=$\sqrt{((a^*)^2+(b^*)^2)}$. Where the reference point is the color coordinates of the inorganic oxide substrate 110, the color coordinate distance is calculated by the equation, color coordinate distance=$\sqrt{((a^*_{article}-a^*_{substrate})^2+(b^*_{article}-b^*_{substrate})^2)}$.

Inorganic Oxide Substrate

As shown in FIGS. 1-5, the inorganic oxide substrate 110 includes an optical film system 120, 220, 320, 420, 520 disposed on at least one opposing major surface (112, 114). The inorganic oxide substrate 110 includes minor surfaces 116, 118, which may or may not include a film or material disposed thereon. The inorganic oxide substrate 110 may include an amorphous substrate, a crystalline substrate, or a combination thereof. In one or more embodiments, the amorphous substrate may include a glass substrate, which may be strengthened or non-strengthened. Examples of suitable glass substrates include soda lime glass substrates, alkali aluminosilicate glass substrates, alkali containing borosilicate glass substrates and alkali aluminoborosilicate glass substrates. In some variants, the glass substrates may be free of lithia. In one or more alternative embodiments, the inorganic oxide substrate 110 may include crystalline substrates such as glass-ceramic substrates (which may be strengthened or non-strengthened) or may include a single crystal structure, such as sapphire. In one or more specific embodiments, the inorganic oxide substrate 110 includes an amorphous base (e.g., glass) and a crystalline cladding (e.g., sapphire layer, a polycrystalline alumina layer and/or or a spinel ($MgAl_2O_4$) layer).

The inorganic oxide substrate 110 may be substantially planar, although other embodiments may utilize a curved or otherwise shaped or sculpted inorganic oxide substrate. The inorganic oxide substrate 110 may be substantially optically clear, transparent and free from light scattering. The inorganic oxide substrate 110 may have a refractive index in the range from about 1.45 to about 1.55. The inorganic oxide substrate 110 may be characterized as having a high average flexural strength (when compared to inorganic oxide substrates that are not strengthened, as described herein) or high surface strain-to-failure (when compared to inorganic oxide substrates that are not strengthened, as described herein) as measured on one or more major opposing surfaces 112, 114 of such substrates.

Additionally or alternatively, the thickness of the inorganic oxide substrate 110 may vary along one or more of its dimensions for aesthetic and/or functional reasons. For example, the edges of the inorganic oxide substrate 110 may be thicker as compared to more central regions of the inorganic oxide substrate 110. The length, width and thickness dimensions of the inorganic oxide substrate 110 may also vary according to the article application or use.

The inorganic oxide substrate 110 may be provided using a variety of different processes. For instance, where the inorganic substrate 110 includes a glass substrate, exemplary glass substrate forming methods include float glass processes and down-draw processes such as fusion draw and slot draw.

A glass substrate prepared by a float glass process may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass substrate that can be lifted from the tin onto rollers. Once off the bath, the glass substrate can be cooled further and annealed to reduce internal stress.

Down-draw processes produce glass substrates having a uniform thickness that possess relatively pristine surfaces. Because the average flexural strength of the glass substrate is controlled by the amount and size of surface flaws, a pristine surface that has had minimal contact has a higher initial strength. When this high strength glass substrate is then further strengthened (e.g., chemically), the resultant strength can be higher than that of a glass substrate with a surface that has been lapped and polished. Down-drawn glass substrates may be drawn to a thickness of less than about 2 mm. In addition, down drawn glass substrates have a very flat, smooth surface that can be used in its final application without costly grinding and polishing.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass substrate. The fusion draw method offers the advantage that, because the two glass films flowing over the channel fuse together, neither of the outside surfaces of the resulting glass substrate comes in contact with any part of the apparatus. Thus, the surface properties of the fusion drawn glass substrate are not affected by such contact.

The slot draw process is distinct from the fusion draw method. In slow draw processes, the molten raw material glass is provided to a drawing tank. The bottom of the drawing tank has an open slot with a nozzle that extends the length of the slot. The molten glass flows through the slot/nozzle and is drawn downward as a continuous substrate and into an annealing region.

In some embodiments, the compositions used for the glass substrate may be batched with 0-2 mol. % of at least one fining agent selected from a group that includes $Na_2SO_4$, NaCl, NaF, NaBr, $K_2SO_4$, KCl, KF, KBr, and $SnO_2$.

Once formed, a glass substrate may be strengthened to form a strengthened glass substrate. It should be noted that glass ceramic substrates may also be strengthened in the same manner as glass substrates. As used herein, the term "strengthened substrate" may refer to a glass substrate or a glass ceramic substrates that has been chemically strengthened, for example through ion-exchange of larger ions for smaller ions in the surface of the glass or glass ceramic substrate. However, other strengthening methods known in the art, such as thermal tempering, may be utilized to form strengthened glass substrates.

The strengthened substrates described herein may be chemically strengthened by an ion exchange process. In the ion-exchange process, typically by immersion of a glass or glass ceramic substrate into a molten salt bath for a predetermined period of time, ions at or near the surface(s) of the glass or glass ceramic substrate are exchanged for larger metal ions from the salt bath. In one embodiment, the temperature of the molten salt bath is about 400-430° C. and the predetermined time period is about four to about eight hours. The incorporation of the larger ions into the glass or glass ceramic substrate strengthens the substrate by creating a compressive stress in a near surface region or in regions at and adjacent to the surface(s) of the substrate. A corresponding tensile stress is induced within a central region or regions at a distance from the surface(s) of the substrate to balance the compressive stress. Glass or glass ceramic substrates utilizing this strengthening process may be described more specifically as chemically-strengthened or ion-exchanged glass or glass ceramic substrates.

In one example, sodium ions in a strengthened glass or glass ceramic substrate are replaced by potassium ions from the molten bath, such as a potassium nitrate salt bath, though other alkali metal ions having larger atomic radii, such as rubidium or cesium, can replace smaller alkali metal ions in the glass. According to particular embodiments, smaller alkali metal ions in the glass or glass ceramic can be replaced by Ag+ ions. Similarly, other alkali metal salts such as, but not limited to, sulfates, phosphates, halides, and the like may be used in the ion exchange process.

The replacement of smaller ions by larger ions at a temperature below that at which the glass network can relax produces a distribution of ions across the surface(s) of the strengthened substrate that results in a stress profile. The larger volume of the incoming ion produces a compressive stress (CS) on the surface and tension (central tension, or CT) in the center of the strengthened substrate. The compressive stress is related to the central tension by the following relationship:

$$CS = CT\left(\frac{t - 2DOL}{DOL}\right)$$

where t is the total thickness of the strengthened glass or glass ceramic substrate and compressive depth of layer (DOL) is the depth of exchange. Depth of exchange may be described as the depth within the strengthened glass or glass ceramic substrate (i.e., the distance from a surface of the glass substrate to a central region of the glass or glass ceramic substrate), at which ion exchange facilitated by the ion exchange process takes place.

In one embodiment, a strengthened glass or glass ceramic substrate can have a surface compressive stress of 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened glass or glass ceramic substrate may have a compressive depth of layer 15 µm or greater, 20 µm or greater (e.g., 25 µm, 30 µm, 35 µm, 40 µm, 45 µm, 50 µm or greater) and/or a central tension of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened glass or glass ceramic substrate has one or more of the following: a surface compressive stress greater than 500 MPa, a depth of compressive layer greater than 15 µm, and a central tension greater than 18 MPa.

Without being bound by theory, it is believed that strengthened glass or glass ceramic substrates with a surface compressive stress greater than 500 MPa and a compressive depth of layer greater than about 15 µm typically have greater strain-to-failure than non-strengthened glass or glass ceramic substrates (or, in other words, glass substrates that have not been ion exchanged or otherwise strengthened).

Example glasses that may be used in the inorganic oxide substrate may include alkali aluminosilicate glass compositions or alkali aluminoborosilicate glass compositions, though other glass compositions are contemplated. Such glass compositions may be characterized as ion exchangeable. As used herein, "ion exchangeable" means that a substrate comprising the composition is capable of exchanging cations located at or near the surface of the substrate with cations of the same valence that are either larger or smaller in size. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the inorganic oxide substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the inorganic oxide substrate can comprise 61-75 mol. % SiO2; 7-15 mol. % $Al_2O_3$; 0-12 mol. % $B_2O_3$; 9-21 mol. % $Na_2O$; 0-4 mol. % $K_2O$; 0-7 mol. % MgO; and 0-3 mol. % CaO.

A further example glass composition suitable for the inorganic oxide substrate comprises: 60-70 mol. % $SiO_2$; 6-14 mol. % $Al_2O_3$; 0-15 mol. % $B_2O_3$; 0-15 mol. % $Li_2O$; 0-20 mol. % $Na_2O$; 0-10 mol. % $K_2O$; 0-8 mol. % MgO; 0-10 mol. % CaO; 0-5 mol. % $ZrO_2$; 0-1 mol. % $SnO_2$; 0-1 mol. % $CeO_2$; less than 50 ppm $As_2O_3$; and less than 50 ppm $Sb_2O_3$; where 12 mol. % $\leq (Li_2O+Na_2O+K_2O) \leq 20$ mol. % and 0 mol. % $\leq (MgO+CaO) \leq 10$ mol. %.

A still further example glass composition suitable for the inorganic oxide substrate comprises: 63.5-66.5 mol. % $SiO_2$; 8-12 mol. % $Al_2O_3$; 0-3 mol. % $B_2O_3$; 0-5 mol. % $Li_2O$; 8-18 mol. % $Na_2O$; 0-5 mol. % $K_2O$; 1-7 mol. % MgO; 0-2.5 mol. % CaO; 0-3 mol. % $ZrO_2$; 0.05-0.25 mol. % $SnO_2$; 0.05-0.5 mol. % $CeO_2$; less than 50 ppm $As_2O_3$; and less than 50 ppm $Sb_2O_3$; where 14 mol. % $\leq (Li_2O+Na_2O+K_2O) \leq 18$ mol. % and 2 mol. % $\leq (MgO+CaO) \leq 7$ mol. %.

In a particular embodiment, an alkali aluminosilicate glass composition suitable for the inorganic oxide substrate comprises alumina, at least one alkali metal and, in some embodiments, greater than 50 mol. % $SiO_2$, in other embodiments at least 58 mol. % $SiO_2$, and in still other embodiments at least 60 mol. % $SiO_2$, wherein the ratio $$\frac{Al_2O_3 + B_2O_3}{\sum \text{modifiers}} > 1,$$

where in the ratio the components are expressed in mol. % and the modifiers are alkali metal oxides. This glass composition, in particular embodiments, comprises: 58-72 mol. % $SiO_2$; 9-17 mol. % $Al_2O_3$; 2-12 mol. % $B_2O_3$; 8-16 mol. % $Na_2O$; and 0-4 mol. % $K_2O$, wherein the ratio $$\frac{Al_2O_3 + B_2O_3}{\sum \text{modifiers}} > 1.$$

In still another embodiment, the inorganic oxide substrate may include an alkali aluminosilicate glass composition comprising: 64-68 mol. % $SiO_2$; 12-16 mol. % $Na_2O$; 8-12 mol. % $Al_2O_3$; 0-3 mol. % $B_2O_3$; 2-5 mol. % $K_2O$; 4-6 mol. % MgO; and 0-5 mol. % CaO, wherein: 66 mol. % $\leq SiO_2 + B_2O_3 + CaO \leq 69$ mol. %; $Na_2O+K_2O+B_2O_3+MgO+CaO+SrO > 10$ mol. %; 5 mol. % $\leq MgO+CaO+SrO \leq 8$ mol. %; $(Na_2O+B_2O_3)-Al_2O_3 \leq 2$ mol. %; 2 mol. % $\leq Na_2O-Al_2O_3 \leq 6$ mol. %; and 4 mol. % $\leq (Na_2O+K_2O)-Al_2O_3 \leq 10$ mol. %.

In an alternative embodiment, the inorganic oxide substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the inorganic oxide substrate 110 includes a crystalline substrate, the substrate may include a single crystal, which may include $Al_2O_3$. Such single crystal substrates are referred to as sapphire. Other suitable materials for a crystalline substrate include polycrystalline alumina layer and/or or a spinel ($MgAl_2O_4$).

Optionally, the crystalline substrate 100 may include a glass ceramic substrate, which may be strengthened or non-strengthened. Examples of suitable glass ceramics may include $Li_2O$—$Al_2O_3$—$SiO_2$ system (i.e. LAS-System) glass ceramics, MgO—$Al_2O_3$—$SiO_2$ System (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the glass substrate strengthening processes disclosed herein. In one or more embodiments, MAS-System glass ceramic substrates may be strengthened in $Li_2SO_4$ molten salt, whereby $2Li^+$ for $Mg^{2+}$ exchange can occur.

The inorganic oxide substrate 110 according to one or more embodiments can have a thickness ranging from about 100 µm to about 5 mm. Example inorganic oxide substrate 110 thicknesses range from about 100 µm to about 500 µm (e.g., 100, 200, 300, 400 or 500 µm). Further example inorganic oxide substrate 110 thicknesses range from about 500 µm to about 1000 µm (e.g., 500, 600, 700, 800, 900 or 1000 µm). The inorganic oxide substrate 110 may have a thickness greater than about 1 mm (e.g., about 2, 3, 4, or 5 mm). In one or more specific embodiments, the inorganic oxide substrate 110 may have a thickness of 2 mm or less or less than 1 mm. The inorganic oxide substrate 110 may be acid polished or otherwise treated to remove or reduce the effect of surface flaws.

Optical Film Structure

The optical film structures described herein have scratch resistance, which may be characterized by the hardness of the optical film structure and/or the hardness of one or more of the layers that form the optical film structure. In one or more specific embodiments, the optical film structure has a hardness of about 16 GPa or greater, about 17 GPa or greater, about 18 GPa or greater, about 19 GPa or greater, about 20 GPa or greater, about 22 GPa or greater, as measured by a diamond Berkovitch indenter test. As used herein, the "Berkovitch indenter test" includes a test to measure hardness on a surface by indenting the surface with a Berkovitch indenter to form an indent having an indentation depth of at least 100 nm from the surface. The optical film structure 120 may have at least one layer having a hardness of about 16 GPa or greater, about 17 GPa or greater, about 18 GPa or greater, about 19 GPa or greater, about 20 GPa or greater, about 22 GPa or greater, as measured by a diamond Berkovitch indenter test.

In one or more embodiments, the optical film structure has scratch resistance that is measured by a reduction in scratch depth. Specifically, articles that include the optical film structure may exhibit a reduction in scratch depth, when compared to the scratch depth in the inorganic oxide substrate 110 without the optical film structure. When the article having an optical film structure disposed thereon is scratched using a diamond Berkovitch indenter, using a load of 160 mN at a speed of 10 μm/second for a length of at least 100 μm along the surface of the article (on the side of the optical film structure), the resulting scratch has a depth that less than the depth of a scratch formed identically (i.e., using the same indenter, load, speed, and length) on an inorganic oxide substrate 110 (without the optical film structure disposed thereon) by at least about 30%, at least about 31%, at least about 322%, at least about 33%, at least about 34%, at least about 35%, at least about 366%, at least about 37%, at least about 38%, at least about 39%, at least about 40%, at least about 410%, at least about 42%, at least about 43%, at least about 44%, at least about 45%, at least about 46%, at least about 47%, at least about 48%, at least about 49%, at least about 50%, at least about 51%, at least about 52%, at least about 53%, at least about 54%, at least about 55%, at least about 56%, at least about 57%, at least about 58%, at least about 59%, at least about 60% (and all ranges and sub-ranges therebetween). This scratch resistant property of the optical film structure may be present where the article utilizes an amorphous substrate (e.g., strengthened glass substrate and/or a non-strengthened glass substrate), a crystalline substrate (e.g., a strengthened glass ceramic substrate, a non-strengthened glass ceramic glass substrate, and a single crystal substrate such as sapphire) or a combination thereof. In addition, this scratch resistant property of the optical film structure may be present when the article is scratched using the diamond Berkovitch indenter, at a speed of 10 μm/second for a length of at least 1 mm, at least 2 mm, at least 3 mm, at least 4 mm or at least 5 mm. In one or more embodiments, the optical film structure has scratch resistance such that, when an article including the optical film structure is scratched by a diamond Berkovitch indenter using a load of 160 mN at a speed of 10 μm/seconds for at least a length of 100 μm along the surface of the article, the resulting scratch has a scratch depth of less than 250 nm, less than 240 nm, less than 230 nm or less than 220 nm. The scratch depths described herein may be measured from the original and undisturbed surface of the optical film structure. In other words, the scratch depth does not include any amount of optical film structure that may be built up around the edges of the scratch due to displacement of the optical film structure materials caused by the penetration of the diamond Berkovitch indenter into the optical film structure.

In one or more embodiments, the article 100 exhibits a reduction in scratch depth when compared to bare inorganic oxide substrates 110 that include sapphire and when compared to bare inorganic oxide substrates 110 that include chemically strengthened glass. In one or more specific embodiments, the reduction in scratch depth of the article 100 versus a bare inorganic oxide substrate 110 that includes chemically strengthened glass is at least two times greater than the reduction in scratch depth of a bare sapphire substrate versus a bare chemically strengthened glass substrate. For example, a bare sapphire substrate may exhibit a 30-40% scratch depth reduction when compared to a bare strengthened glass substrate; however, the article exhibits a 60-75% or greater scratch depth reduction when compared to bare strengthened glass substrate. In one or more specific embodiments, the reduction in scratch depth of the article 100 is at least 50%, at least 55%, at least 60%, at least 65%, at least 70%, at least 75% or at least 85%, and all ranges and sub-ranges therebetween, when compared to bare inorganic oxide substrates 110 that include chemically strengthened glass.

In one or more embodiments, the optical film structure exhibits scratch resistance that is measured by a reduction in scratch width. Specifically, articles that include the optical film structure may exhibit a reduction in scratch width, when compared to the scratch depth in the inorganic oxide substrate 110 without the optical film structure. When the article having an optical film structure, as described herein, disposed thereon is scratched using a diamond Berkovitch indenter, using a load of 160 mN at a speed of 10 μm/second for a length of at least 100 μm along the surface of the article (on the side of the optical film structure), the resulting scratch has a width that is at least about 30%, at least about 310%, at least about 32%, at least about 33%, at least about 34%, at least about 35%, at least about 36%, at least about 37%, at least about 38%, at least about 39%, at least about 40%, at least about 41%, at least about 42%, at least about 43%, at least about 44%, at least about 45% (and all ranges and sub-ranges therebetween) less than the width of a scratch formed identically (i.e., using the same indenter, load, speed, and length) on an inorganic oxide substrate 110, without the optical film structure disposed thereon. This scratch resistant property of the optical film structure may be present where the article utilizes an amorphous substrate (e.g., strengthened glass substrate and/or a non-strengthened glass substrate), a crystalline substrate (e.g., a strengthened glass ceramic substrate, a non-strengthened glass ceramic glass substrate, and a single crystal substrate such as sapphire) or a combination thereof. In addition, this scratch resistant property of the optical film structure may be present when the article is scratched using the diamond Berkovitch indenter, at a speed of 10 μm/second for a length of at least 1 mm, at least 2 mm, at least 3 mm, at least 4 mm or at least 5 mm. In one or more embodiments, the optical film structure has scratch resistance such that, when an article including the optical film structure is scratched by a diamond Berkovitch indenter using a load of 160 mN at a speed of 10 μm/seconds for at least a length of 100 μm along the surface of the article, the resulting scratch has a scratch width of less than 20 nm, less than 19 nm, less than 18 nm, less than 17 nm, less than about 16 nm, less than about 15 nm, less than about 14 nm, less than about 13 nm, less than about 12 nm, less than about 11 nm, less than about 10 nm, less than about 9 nm, less than about 8 nm, less than about 7 nm, less than about 6 nm, less than about 5 nm, less than about 4 nm, less than about 3 nm, and all ranges and sub-ranges therebetween. The scratch widths described herein may be measured from the original and undisturbed surface of the optical film structure. In other words, the scratch width does not include any amount of optical film structure that may be built up around the edges of the scratch due to displacement of the optical film structure materials caused by the penetration of the diamond Berkovitch indenter into the optical film structure.

In some embodiments, the optical film prevents the formation of microductile scratches and/or lateral scratches. A microductile scratch includes a single groove in a material having unlimited length. Lateral scratches are cracks or scratches that are formed as a result of microductile scratches. Lateral scratches are similarly unlimited in length but are oriented transversely from the microductile scratch(es) from which they are formed.

In one or more embodiments, articles with optical film structures described herein may exhibit scratch resistance when evaluated using a garnet sandpaper test. The garnet sandpaper test is intended to replicate or imitate the day-to-day conditions of use of the articles described herein, when incorporated into mobile electronic devices, such as mobile phones. The articles described herein are substantially free of any scratches on the surface thereof, when observed with the naked eye, after the surface has been swiped a single time with a 150-grit garnet sandpaper (supplied by 3M) by hand.

In one or more embodiments, articles with the optical film structures described herein also exhibit abrasion resistance. In some embodiments, abrasion resistance is measured by known tests in the art such as those using a Crockmeter, a Taber abraser and other similar standard instruments. For example, Crockmeters are used to determine the Crock resistance of a surface subjected to such rubbing. The Crockmeter subjects a surface to direct contact with a rubbing tip or "finger" mounted on the end of a weighted arm. The standard finger supplied with the Crockmeter is a 15 millimeter (mm) diameter solid acrylic rod. A clean piece of standard crocking cloth is mounted to this acrylic finger. The finger then rests on the sample with a pressure of 900 g and the arm is mechanically moved back and forth repeatedly across the sample in an attempt to observe a change in the durability/crock resistance. The Crockmeter used in the tests described herein is a motorized model that provides a uniform stroke rate of 60 revolutions per minute. The Crockmeter test is described in ASTM test procedure F1319-94, entitled "Standard Test Method for Determination of Abrasion and Smudge Resistance of Images Produced from Business Copy Products," the contents of which are incorporated herein by reference in their entirety. Crock resistance or durability of the coated articles described herein is determined by optical (e.g., reflectance, haze, or transmittance) measurements after a specified number of wipes as defined by ASTM test procedure F1319-94. A "wipe" is defined as two strokes or one cycle, of the rubbing tip or finger.

The optical film structure may include one or more layers, as shown in FIGS. 1-5. One or more of these layers may impart scratch resistant properties to the optical film structure and thus the article 100, while also providing in optical management function (e.g., providing anti-reflection and/or colorless transmittance properties). In one or more alternative embodiments, the thickest layer in the optical film structure provides scratch resistant properties to the optical film structure, and thus the article. The thickness of the layers of the optical film structure may be modified to tune the scratch resistance of the optical film structure and/or the article. Additionally or alternatively, the one or more layers of the optical film structure may include specific materials and/or material properties to tune the optical properties of the optical film structure and/or the article. For example, the layer may include transparent dielectric materials such as $SiO_2$, $GeO_2$, $Al_2O_3$, $Nb_2O_5$, $TiO_2$, $Y_2O_3$ and other similar materials and combinations thereof.

The optical film structure may have a thickness of 1 μm or greater. In one or more specific embodiments, the thickness of the optical film structure may be about 2 μm or greater. In one or more alternative embodiments, the thickness of the optical film structure may be in the range from about 1 μm to about 20 μm, from about 1 μm to about 15 μm, from about 1 μm to about 10 μm, from about 1 μm to about 8 μm, from about 1 μm to about 5 μm, from about 1.5 μm to about 20 μm, from about 2 μm to about 20 μm, from about 2.5 μm to about 20 μm, from about 3 μm to about 20 μm and all ranges and sub-ranges therebetween. In some embodiments, the optical film structure may have a thickness in the range from about 0.5 μm to about 5 μm, or from about 1 μm to about 3 μm. Specific optical film structures 120 may have a thickness of about 1.1 μm, about 1.3 μm, about 1.4 μm, about 1.5 μm, about 1.6 μm, about 1.7 μm, about 1.8 μm, about 1.9 μm, about 2.1 μm, about 2.2 μm, about 2.3 μm, about 2.4 μm, about 2.5 μm, about 2.6 μm, about 2.7 μm, about 2.8 μm, about 2.9 μm, about 3.0 μm, about 4 μm, about 5 μm, about 6 μm, about 7 μm, about 8 μm, about 9 μm, about 10 μm, about 15 μm, or about 20 μm.

The optical film structure in accordance with one or more embodiments may be substantially clear or transparent in the visible spectrum. In one or more embodiments, the optical film structure maintains or reduces the reflectivity of the article 100 and does not include any materials for purposely increasing the reflectivity of the article 100. In one or more embodiments, the optical film structure has an average refractive index in the range from about 1.8 to 2.2.

The optical film structure may include one or more of the following materials: a silicon-containing oxide, a silicon-containing nitride, a silicon-containing oxy-nitride, an aluminum-containing nitride (e.g., AlN and $Al_xSi_yN$), an aluminum-containing oxy-nitride (e.g., $AlO_xN_y$, and $Si_uAl_vO_xN_y$, where x and y are greater than zero) and an aluminum-containing oxide. In one or more embodiments, $Si_uAl_vO_xN_y$ includes composition where (u+v)=1 and (x+y)=1. In one or more embodiments, $AlO_xN_y$ includes compositions where x+y=1 and x<0.5. An example of a suitable aluminum-containing oxide includes $Al_2O_3$. In one or more embodiments, the optical film structure includes a single layer comprising $AlO_xN_y$, or $Si_uAl_vO_xN_y$. In one or more alternative embodiments, the optical film structure may include $AlO_xN_y$ or $Si_uAl_vO_xN_y$, where x can be in the range from about 0 to about 1. In one or more alternative embodiments, the optical film structure may also include other metal oxides, metal nitrides, metal oxynitrides, metal carbides, metal borides, diamond-like carbon materials and/or combinations thereof. Exemplary metals, in addition to aluminum and silicon include B, Ti, V, Cr, Y, Zr, Nb, Mo, Sn, Hf, Ta and W.

In one or more embodiments, the optical film structure may include at least one of AlN, $AlO_xN_y$, SiAlN, $Si_uAl_vO_xN_y$, and an aluminum oxide and/or a silicon oxide. Optionally, an optical film structure including AlN and an aluminum oxide may be free of an aluminum-containing oxy-nitride. In one or more alternative embodiments, the optical film structure may include AlN and an aluminum-containing oxy-nitride. Optionally, an optical film structure including AlN and an aluminum-containing oxynitrides may be free of an aluminum-containing oxide. In a specific embodiment, the optical film structure may comprise an aluminum oxy-nitride where the amount of oxygen and nitrogen may be varied such that all three of an aluminum-containing oxide, AlN and an aluminum-containing oxy-nitride are present in the optical film structure. The optical film structure may include silicon such that the optical film structure includes one or more of $SiO_2$, $SiO_xN_y$, $Al_xSi_yN$, $Si_uAl_vO_xN_y$, and $Si_3N_4$ and the amount of oxygen, nitrogen, silicon and/or aluminum may be varied to provide any and all of these materials.

In one or more embodiments, the materials utilized in the optical film structure may be selected to optimize the optical properties of the optical film structure. For example, $Al_2O_3$, $SiO_2$, $SiO_xN_y$, $Si_uAl_vO_xN_y$, and $AlO_xN_y$ may be utilized in the optical film structure to minimize the variation on the reflectance color points as the viewing angle is changed from normal incidence (i.e., 0 degrees) to oblique incidence. Oblique incidence may be in the range from greater than 0 degrees to less than 90 degrees (e.g., 10 degrees or greater, 20 degrees or greater, 30 degrees or greater, 40 degrees or greater, 50 degrees or greater, 60 degrees or greater, 70 degrees or greater, 75 degrees or greater, 80 degrees or greater, 85 degrees or greater, 86 degrees or greater, 87 degrees or greater, 88 degrees or greater, 89 degrees or greater or 89.5 degrees or greater).

In one or more specific embodiments, the amount of oxygen and/or nitrogen in the optical film structure or the amount of oxygen and/or nitrogen in one or more layers of the optical film structure may be tuned such that the optical film structure has a refractive index of greater than 1.9 at a wavelength of about 500 nm. In one or more specific embodiments, the oxygen content and/or nitrogen content may be tuned such that the optical film structure or one or more layers of the optical film structure exhibits a refractive index that is 1.92 or greater, 1.94 or greater, 1.96 or greater, 1.98 or greater, 2.0 or greater, 2.2 or greater, 2.4 or greater or 2.5 or greater, at a wavelength of about 500 nm. The oxygen content and/or nitrogen content may be tuned in specific layers of the optical film structure. For example, the oxygen content and/or nitrogen content may be tuned in the foregoing manner in layers of the optical film structure containing $AlO_xN_y$, $SiO_xN_y$, and/or $Al_xSi_yN$.

In one or more embodiments, the materials utilized in the optical film structure may be selected to optimize the scratch resistance of the optical film structure. For example, $Si_3N_4$ and/or AlN may comprise at least 50% by weight of the materials utilized in the optical film structure 120. $Si_3N_4$ and/or AlN may optionally comprise 55% by weight or more, 60% by weight or more, 65% by weight or more, 70% by weight or more or 75% by weight or more of the materials utilized in the optical film structure 120. Additionally or alternatively, the oxygen content may be modified to tune the hardness, and/or dopants and alloys may be used to modify the lubricity of the optical film structure 120.

The materials selected for the optical film structure may impart ion diffusion barrier properties. In one or more embodiments, the optical film structure may provide a diffusion barrier against the diffusion of sodium ions and/or potassium ions from the inorganic oxide substrate 110 into other films or layers disposed on the inorganic oxide substrate (e.g., the optical film structure itself or any transparent conductive oxide layers, anti-reflection layers or other such layers).

In one more embodiments, the optical film structure may include AlN having a small grain polycrystalline structure. In one or more specific embodiments, the optical film structure may include AlN having an amorphous and/or microcrystalline structure. Without being bound by theory, it is believed the inclusion of at least some amorphous structure in the optical film structure imparts isotropic mechanical properties that may prevent cracks from forming in the optical film structure and/or dissipates energy from a crack or crack-causing force.

Figure 2:
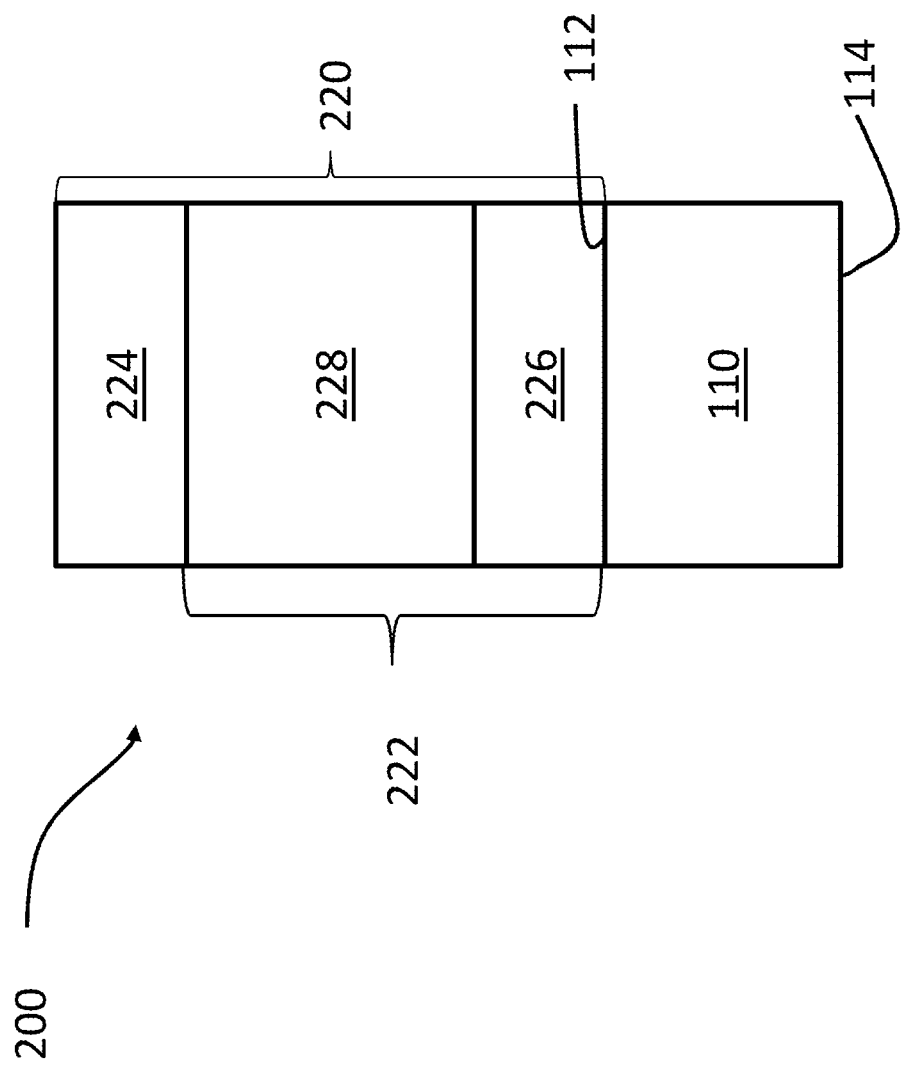
FIG. 2 is an illustration of an article according to one or more embodiments.

In the embodiment illustrated in FIG. 2, an article 200 includes an optical film structure 220 disposed on one of the opposing major surfaces 112, 114 of the inorganic oxide substrate 110. The optical film structure 220 shown in FIG. 2 includes a first layer 222 and a second layer 224. The first layer 222 includes a first sub-layer 226 and a second sub-layer 228 such that the first sub-layer 226 is disposed between the inorganic oxide substrate 110 and the second sub-layer 228. In one or more embodiments, the first layer 222 may include an aluminum-containing oxide, an aluminum-containing oxy-nitride, AlN or combinations thereof and the second layer 224 may include a transparent dielectric material such as $SiO_2$, $GeO_2$, $Al_2O_3$, $Nb_2O_5$, $TiO_2$, $Y_2O_3$ and other similar materials and combinations thereof. In one or more specific embodiments, the first layer 222 may include $Al_2O_3$, AlN, $AlO_xN_y$, SiAlN, $Si_uAl_vO_xN_y$ or combinations thereof. In one variant, the first sub-layer 226 may include $Al_2O_3$. In another variant, the first sub-layer may include $AlO_xN_y$. In yet another variant, the second sub-layer 228 includes AlN. In one embodiment, the optical film structure 220 comprises a first layer 222 including a first sub-layer 226 comprising $Al_2O_3$ and a second sub-layer 228 including AlN, and a second layer 224 including a transparent dielectric material (e.g., $SiO_2$, $GeO_2$, $Al_2O_3$, $Nb_2O_5$, $TiO_2$, $Y_2O_3$ and other similar materials and combinations thereof). In another embodiment, the optical film structure 220 comprises a first layer 222 with a first sub-layer 226 including $AlO_xN_y$ and a second sub-layer 228 including AlN, and a second layer 224 including a transparent dielectric material (e.g., $SiO_2$, $GeO_2$, $Al_2O_3$, $Nb_2O_5$, $TiO_2$, $Y_2O_3$ and other similar materials and combinations thereof). In embodiments in which $Al_2O_3$ is utilized in the second layer 224, the nitrogen and oxygen gas concentrations can be modified to form $Al_2O_3$, $AlO_xN_y$ and/or AlN to form the layers of the optical film structure.

In one or more specific embodiments, the second sub-layer 228 can include AlN, $AlO_xN_y$, SiAlN, $Si_uAl_vO_xN_y$ or combinations thereof, and is thicker or substantially thicker than the first sub-layer 226 and/or the second layer 224. In one or more embodiments, the second sub-layer 228 has a thickness that is greater or substantially greater than the combined thickness of the first sub-layer 226 and the second layer 224. In one variant, the second sub-layer 228 may have a thickness of 1 μm or greater. For example, the second sub-layer 228 may have a thickness in the range from about 1 μm to about 3 μm or more specifically from about 2 μm to about 3 μm. Specific embodiments may include a second sub-layer 228 having a thickness of about 1.1 μm or greater, about 1.2 μm or greater, about 1.3 μm or greater, about 1.4 μm or greater, about 1.5 μm or greater, about 1.6 μm or greater, about 1.7 μm or greater, about 1.8 μm or greater, about 1.9 μm or greater, about 2 μm or greater, about 2.1 μm or greater, about 2.2 μm or greater, about 2.3 μm or greater, about 2.4 μm or greater, about 2.5 μm or greater, about 2.6 μm or greater, about 2.7 μm or greater, about 2.8 μm or greater, about 2.9 μm or greater, or about 3 μm or greater. In embodiments in which the second sub-layer 228 includes AlN, the thickness of the second sub-layer may be about 2 μm or greater. For example, the second sub-layer may have a thickness of about 2.2 μm or greater, about 2.3 μm or greater, about 2.4 μm or greater, about 2.5 μm or greater, about 2.6 μm or greater, about 2.7 μm or greater, about 2.8 μm or greater, about 2.9 μm or greater, or about 3 μm or greater. Exemplary thicknesses of the $1^{st}$ sub-layer 226 and the second layer 224 are illustrated in the examples herein and can be modified to provide the optical properties described herein.

In some embodiments, the use of a thicker second sub-layer 228 (e.g., having a thickness greater than about 5 μm, or greater than about 10 μm) provides enhanced optical properties. For example, in some instances, the use of a thicker sub-layer 228 reduces or eliminates angular metamerism. Angular metamerism results in perceived color change in transmittance or reflectance, when the viewing angle is at an oblique incidence. In some designs of the optical film, the reflectance spectrum or transmittance spectrum include oscillations over the visible spectrum. Under certain conditions, these oscillations move when the viewing angle changes from normal incidence to an oblique incidence. When the line width of the illuminant is narrow (e.g., the line width of a spectral component in a F02 illuminant), this movement in the oscillations are more readily perceived as a change in color (in transmittance or reflectance) (and thus angular metamerism is present). When the line width of the illuminant is wider (e.g., the line width of a spectral component in a D65 illuminant), the movement in the oscillations are not as readily or are not perceived as a change in color (in transmittance or reflectance) (and thus angular metamerism is reduced or eliminated). Without being bound by theory, it is believed that use of a thicker second sub-layer at least reduces or may even eliminate angular metamerisms under all or specific illuminants. Such illuminants include standard illuminants as determined by the CIE, such as A illuminants (representing tungsten-filament lighting), B illuminants (daylight simulating illuminants), C illuminants (daylight simulating illuminants), D series illuminants (representing natural daylight), and F series illuminants (representing various types of fluorescent lighting). In specific embodiments, the use of a thicker second sub-layer may reduce or eliminate angular metamerism under F02 illuminants. The angular metamerism may be reduced or even eliminated through the use of thicker second sub-layers when the viewing angle is at an oblique incidence in the range from about 0 degrees to about 80 degrees, from about 0 degrees to about 75 degrees, from about 0 degrees to about 70 degrees, from about 0 degrees to about 65 degrees, from about 0 degrees to about 60 degrees, from about 0 degrees to about 55 degrees, from about 0 degrees to about 50 degrees, from about 0 degrees to about 45 degrees, from about 0 degrees to about 40 degrees, from about 0 degrees to about 35 degrees, from about 0 degrees to about 30 degrees, from about 0 degrees to about 25 degrees, from about 0 degrees to about 20 degrees, from about 0 degrees to about 15 degrees, from about 5 degrees to about 80 degrees, from about 5 degrees to about 80 degrees, from about 5 degrees to about 70 degrees, from about 5 degrees to about 65 degrees, from about 5 degrees to about 60 degrees, from about 5 degrees to about 55 degrees, from about 5 degrees to about 50 degrees, from about 5 degrees to about 45 degrees, from about 5 degrees to about 40 degrees, from about 5 degrees to about 35 degrees, from about 5 degrees to about 30 degrees, from about 5 degrees to about 25 degrees, from about 5 degrees to about 20 degrees, from about 5 degrees to about 15 degrees, and all ranges and sub-ranges therebetween, from normal incidence. The optical film may exhibit reduced angular metamerism all the oblique incidence angles in the range from about 0 degrees to about 80 degrees from normal incidence.

The refractive index of the first sub-layer 226 may be in the range from about 1.45 to about 1.8. In one or more specific embodiments, the refractive index of the first sub-layer 226 may be in the range from about 1.6 to about 1.75. For example, the refractive index of the first sub-layer 226 may include 1.45, 1.46, 1.47, 1.48, 1.49, 1.5, 1.51, 1.52, 1.53, 1.54, 1.55, 1.56, 1.57, 1.58, 1.59, 1.60, 1.61, 1.62, 1.63, 1.64, 1.65, 1.66, 1.67, 1.68, 1.69, 1.70, 1.71, 1.72, 1.73, 1.74, 1.76, 1.77, 1.78, 1.79, 1.8 and all ranges and sub-ranges therebetween, which may be present at locations along the first sub-layer. The refractive index of the second sub-layer 228 may be in the range from about 1.8 to about 2.2. In one or more embodiments, the refractive index of the second sub-layer may be from about 2.0 to about 2.15. For example, the refractive index of the second sub-layer 228 may include 1.8, 1.82, 1.84, 1.86, 1.88, 1.90, 1.92, 1.94, 1.96, 1.98, 1.99, 2.0, 2.02, 2.04, 2.06, 2.08, 2.1, 2.12, 2.14, 2.15, 2.16, 2.18, 2.2 and all ranges or sub-ranges therebetween, which may be present at locations along the second sub-layer. The refractive index of the second layer 224 may be in the range from about 1.4 to about 1.6. In specific embodiments, the second layer 224 may have a refractive index in the range from about 1.45 to about 1.55. For example, the refractive index of the second layer 224 may include 1.4, 1.42, 1.44, 1.46, 1.48, 1.50, 1.52, 1.54, 1.56, 1.58, 1.6 and all ranges and sub-ranges therebetween, which may be present at locations along the second layer.

Figure 7:
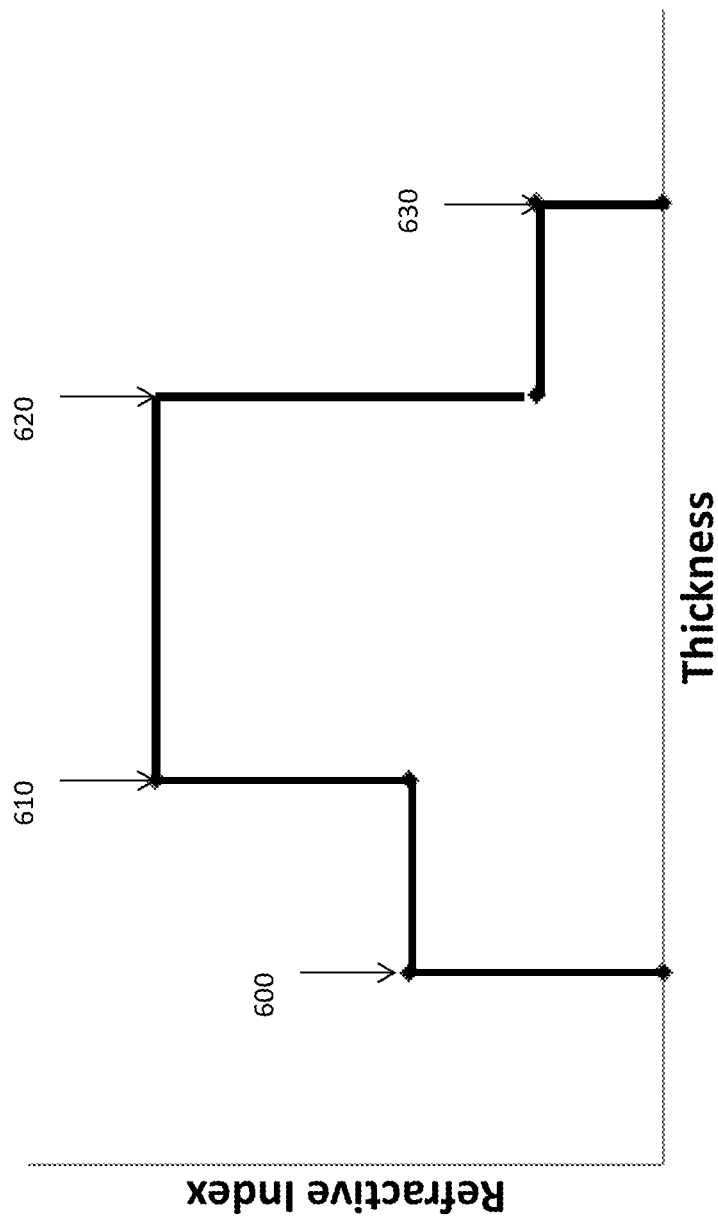
FIG. 7 is a graph of the relationship between the thickness and refractive indices of the optical film structure of the article of FIG. 2.

FIG. 7 generally illustrates the optical properties of the optical film structure 220 illustrated in FIG. 2. In the graph, the thickness values on the x-axis illustrate the thickness of the optical film structure 220 in a direction moving away from the inorganic oxide substrate 110. The refractive index values of the optical film structure 220 are provided on the y-axis to illustrate the changes in refractive index along the thickness of the optical film structure. The graph of FIG. 7 does not take into account the refractive indices of the inorganic oxide substrate 110 (or any other layer between the inorganic oxide substrate 110 and the optical film structure 220) or air (or any other layer disposed on the optical film structure 220). The interface between the inorganic oxide substrate 110 and the first sub-layer 226 is indicated by reference number 600, the interface between the first sub-layer 226 and the second sub-layer 228 is indicated by reference number 610, the interface between the second sub-layer 228 and the second layer 224 is indicated by reference number 620 and the interface between the second layer 224 and air is indicated by reference number 630. As shown in FIG. 7, the refractive index of the first sub-layer 226 and the second layer 224 are less than the refractive index of the second sub-layer 228. In one particular embodiment, the first sub-layer 226 has a refractive index of about 1.75, the second sub-layer has a refractive index of about 2.1 and the second layer 224 has a refractive index of about 1.5. In FIG. 7, the second sub-layer 228 has a greater thickness than the first sub-layer 226 and the second layer 224.

Figure 3:
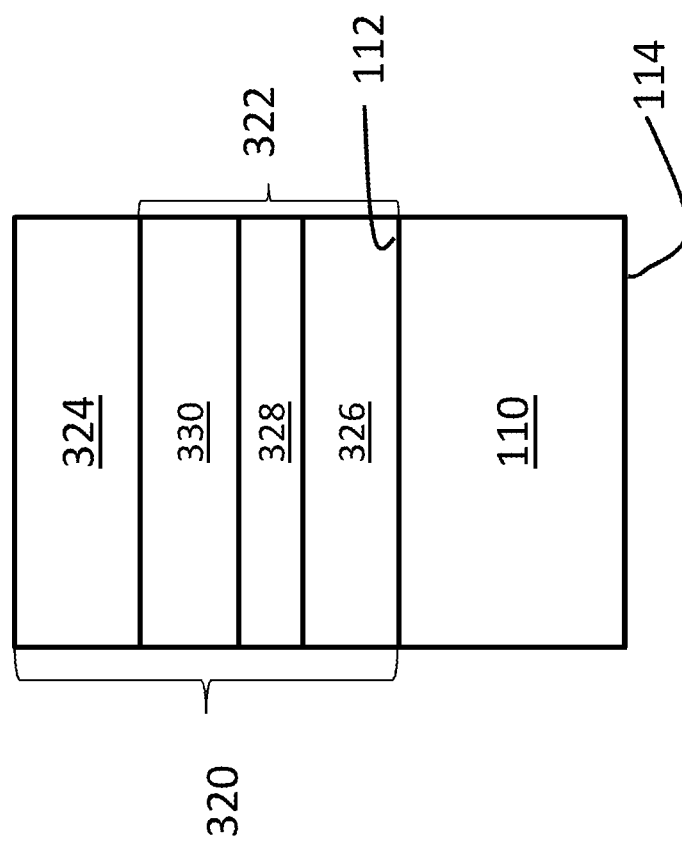
FIG. 3 is an illustration of an article according to one or more embodiments.

In the embodiment illustrated in FIG. 3, the article 300 includes an optical film structure 320 disposed on one of the opposing major surfaces 112, 114 of the inorganic oxide substrate 110. The optical film structure 320 shown in FIG. 3 includes a first layer 322 and a second layer 324. The first layer 322 includes a first sub-layer 326, a second sub-layer 328 and a third sub-layer 330. In the embodiment shown in FIG. 3, in the first layer 320, the second sub-layer 328 between is between the first sub-layer 326 and the third sub-layer 330. The first sub-layer 326 is disposed between the inorganic oxide substrate 110 and the second sub-layer 328 while the third sub-layer 330 is disposed between the second sub-layer 328 and the second layer 324. In one or more embodiments, the first layer 322 may include an aluminum-containing oxide, an aluminum-containing oxynitride, AlN or combinations thereof and may further include a transparent dielectric material (e.g., $SiO_2$, $GeO_2$, $Al_2O_3$, $Nb_2O_5$, $TiO_2$, $Y_2O_3$ and other similar materials and combinations thereof). In one or more specific embodiments, the first layer 322 may include $Al_2O_3$, AlN, $AlO_xN_y$, or combinations thereof, and may further include a transparent dielectric material (e.g., $SiO_2$, $GeO_2$, $Al_2O_3$, $Nb_2O_5$, $TiO_2$, $Y_2O_3$ and other similar materials and combinations thereof). The second layer 324 may include a transparent dielectric material (e.g., $SiO_2$, $GeO_2$, $Al_2O_3$, $Nb_2O_5$, $TiO_2$, $Y_2O_3$ and other similar materials and combinations thereof). In one variant, the first sub-layer 326 may include AlN, the second sub-layer 328 may include $SiO_2$ and the third sub-layer 330 may include AlN. In another variant, the first sub-layer 326 may include AlN, the second sub-layer 328 may include $Al_2O_3$ and the third sub-layer 330 may include AlN. In embodiments in which $Al_2O_3$ is utilized in the second sub-layer 328 and the second layer 324, the nitrogen and oxygen gas concentrations can be modified to form either $Al_2O_3$ or AlN to form the layers of the optical film structure.

In one or more specific embodiments, the first sub-layer 326 and the third sub-layer 330 may each have a thickness or may have a combined thickness that is greater or substantially greater than the thickness of either the second sub-layer 328 or the second layer 324. In one or more embodiments, the first sub-layer 326 and the third sub-layer 330 may each have a thickness or may have a combined thickness that is greater or substantially greater than the combined thickness of the second sub-layer 328 and the second layer 324. In one variant, the first sub-layer 326 and/or the third sub-layer 330 may have a thickness each or combined of about 1 µm or greater. For example, the first sub-layer 326 and/or the third sub-layer 330 may have a thickness each or combined of about 1.1 µm or greater, about 1.2 µm or greater, about 1.3 µm or greater, about 1.4 µm or greater, about 1.5 µm or greater, about 1.6 µm or greater, about 1.7 µm or greater, about 1.8 µm or greater, about 1.9 µm or greater, or about 2 µm or greater. In embodiments in which the first sub-layer 326 and/or the third sub-layer 330 include AlN, the thickness of these sub-layers 326, 328 may be about 2 µm or greater each or in combination. For example, the first sub-layer 326 and/or the third sub-layer 328 may each or combined have a thickness of about 2.1 µm or greater, about 2.2 µm or greater, about 2.3 µm or greater, about 2.4 µm or greater, about 2.5 µm or greater, about 2.6 µm or greater, about 2.7 µm or greater, about 2.8 µm or greater, about 2.9 µm or greater, or about 3 µm or greater. In one or more embodiments, the first sub-layer 326 may have the same or different thickness as the third sub-layer 330. The first sub-layer 326 may have a thickness that is greater than or less than the thickness of the third sub-layer 330. In one or more embodiments, the thicknesses of the second sub-layer 328 and the second layer 324 are the same. In one or more alternative embodiments, the optical film structure 320 has a thickness regime of thick/thin/thick/thin wherein the first and third sub-layers 326, 330 are thick and the second-sub-layer 328 and the second layer 324 are thin relative to the first and third sub-layers 326, 330.

Figure 8:
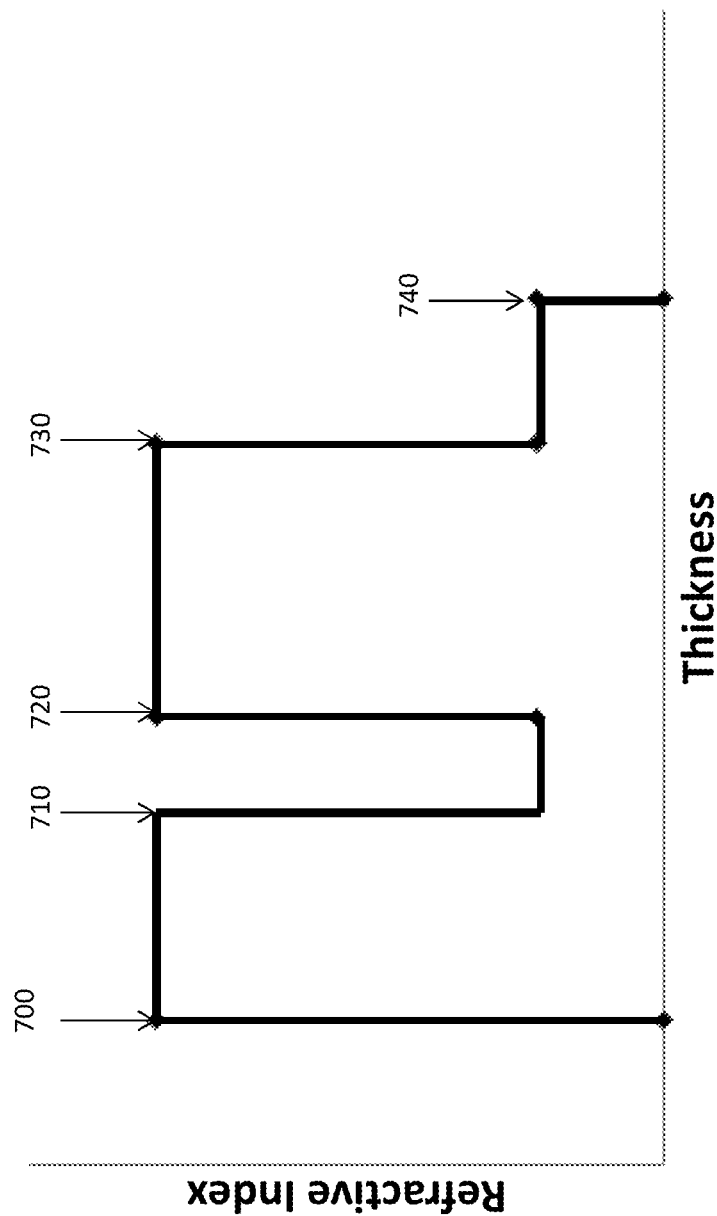
FIG. 8 is a graph of the relationship between the thickness and refractive indices of the optical film structure of the article of FIG. 3.

The refractive index of the first sub-layer 326 may be in the range from about 1.7 to about 2.1. For example, the refractive index of the first sub-layer 326 may include 1.70, 1.72, 1.74, 1.76, 1.78, 1.80, 1.82, 1.84, 1.86, 1.88, 1.90, 1.92, 1.94, 1.96, 1.98, 2.0, 2.1 and all ranges and sub-ranges therebetween. In one or more alternative embodiments, the refractive index is related to an increase in hardness of the first sub-layer 326. The refractive index of the third sub-layer 330 may be in the range from about 1.7 to about 2.1. In one or more embodiments, the refractive index of the third sub-layer 330 may be in the range from about 2.0 to about 2.1. For example, the refractive index of the third sub-layer 330 may include 1.70, 1.72, 1.74, 1.76, 1.78, 1.80, 1.82, 1.84, 1.86, 1.88, 1.90, 1.92, 1.94, 1.96, 1.98, 2.0, 2.1 and all ranges and sub-ranges therebetween. In one or more alternative embodiments, the refractive index is related to an increase in hardness of the first sub-layer 326. The refractive index of the second sub-layer 328 may be in the range from about 1.45 to about 1.8. In one or more embodiments, the refractive index of the second sub-layer 328 may be in the range from about 1.65 to about 1.75. For example, the refractive index of the second sub-layer 328 may be 1.45, 1.46, 1.48, 1.50, 1.52, 1.54, 1.56, 1.58, 1.60, 1.62, 1.64, 1.65, 1.66, 1.67, 1.68, 1.69, 1.70, 1.71, 1.72, 1.73, 1.74, 1.75, 1.76, 1.78, 1.8 and all ranges and sub-ranges therebetween. The refractive index of the second layer 324 may be in the range from about 1.45 to about 1.8. In one or more embodiments, the refractive index of the second sub-layer 328 may be in the range from about 1.45 to about 1.55. For example, the refractive index of the second sub-layer 328 may be 1.45, 1.46, 1.47, 1.48, 1.49, 1.50, 1.51, 1.52, 1.53, 1.54, 1.55, 1.56, 1.58, 1.60, 1.62, 1.64, 1.65, 1.66, 1.67, 1.68, 1.69, 1.70, 1.71, 1.72, 1.73, 1.74, 1.75, 1.76, 1.78, 1.8 and all ranges and sub-ranges therebetween FIG. 8 generally illustrates the optical properties of the optical film structure 320 illustrated in FIG. 3. In the graph, the thickness values on the x-axis illustrate the thickness of the optical film structure 320 in a direction moving away from the inorganic oxide substrate 110. The refractive index values of the optical film structure 320 are provided on the y-axis to illustrate the changes in refractive index along the thickness of the optical film structure. In FIG. 8, the graph does not take into account the refractive indices of the inorganic oxide substrate 110 (or any other layer between the inorganic oxide substrate 110 and the optical film structure 320) or air (or any other layer disposed on the optical film structure 320). The interface between the inorganic oxide substrate 110 and the first sub-layer 326 is indicated by reference number 700, the interface between the first sub-layer 326 and the second sub-layer 328 is indicated by reference number 710, the interface between the second sub-layer 328 and the third sub-layer 330 is indicated by reference number 720, the interface between the third sub-layer 330 and the second layer 324 is indicated by reference number 730 and the interface between the second layer 324 and air is indicated by reference number 740. As shown in FIG. 8, the refractive index of the first sub-layer 326 and the third sub-layer 330 are greater than the refractive index of the second sub-layer 328 and the refractive index of the second layer 324. In the embodiment illustrated in FIG. 8, the refractive indices of the first sub-layer 326 and the third sub-layer 330 are shown as equal to each other and the refractive indices of the second sub-layer 328 and the second layer 324 are shown as equal to each other. In one or more alternative embodiments, the refractive index of the first sub-layer 326 may be different from the refractive index of the third sub-layer 330 and the refractive index of the second sub-layer 328 may be different from the refractive index of the second layer 324. In FIG. 8, the thickness of the first and third sub-layers 326, 330 are shown as being greater than the thickness of the second sub-layer 328 and the second layer 324. In addition, the thickness of the third sub-layer 330 is shown as greater than the thickness of the first sub-layer 324; however, it may be possible for the first sub-layer 324 to have a greater thickness than the third sub-layer 330.

Figure 4:
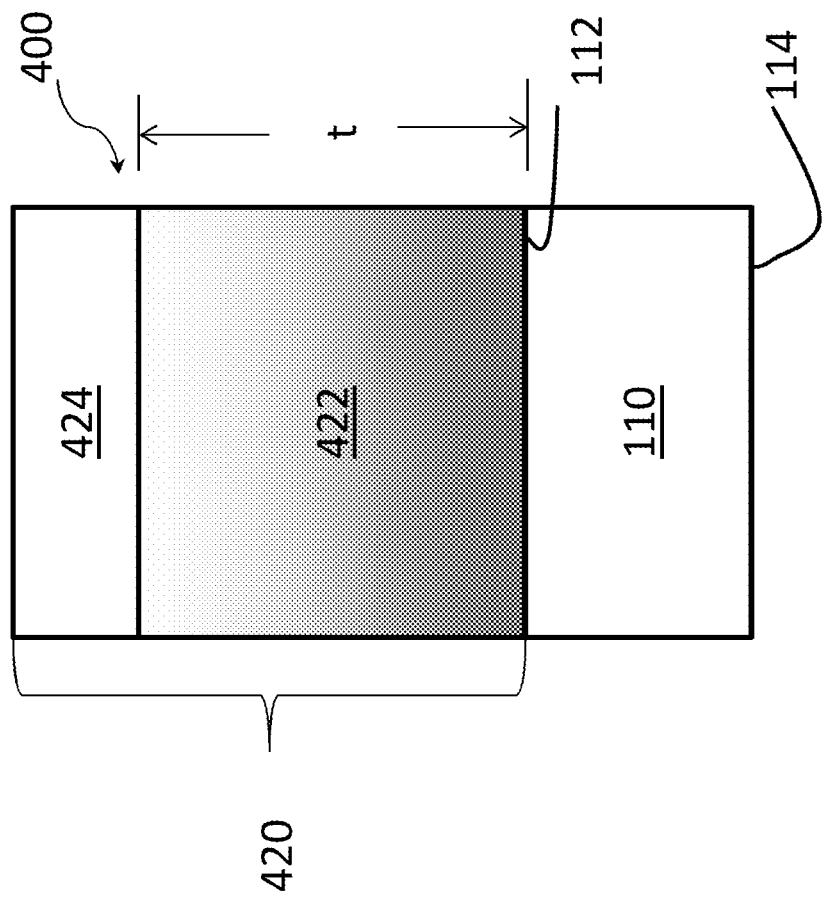
FIG. 4 is an illustration of an article according to one or more embodiments.

In the embodiment illustrated in FIG. 4, the article 400 includes an optical film structure 420 disposed on one of the opposing major surfaces 112, 114 of the inorganic oxide substrate 110. The optical film structure 420 shown in FIG. 4 includes a first layer 422 and a second layer 424. The first layer 422 includes a silicon-containing oxide, a silicon-containing oxy-nitride, silicon nitride, an aluminum-containing oxide, an aluminum-containing oxy-nitride (e.g., $AlO_xN_y$, and $Si_uAl_vO_xN_y$), aluminum-containing nitride (e.g., AlN and $Al_xSi_yN$) or combinations thereof. The second layer 424 may include a transparent dielectric material (e.g., $SiO_2$, $GeO_2$, $Al_2O_3$, $Nb_2O_5$, $TiO_2$, $Y_2O_3$ and other similar materials and combinations thereof).

The first layer 422 may include at least one of an oxygen content gradient, a nitrogen content gradient, a silicon content gradient and aluminum content gradient and various combinations thereof. As used herein, the term "gradient" refers to a variation in atomic % of an element in the composition of a layer. The variation in atomic % of an element may occur among a plurality of sub-layers of a layer. In some instances, up to 10, 20, 30, 40, 50, 60, 70, 80, 90, 100, 110, 120 or even 130 sub-layers having a different atomic % of an element from one another may be utilized to form a layer having a gradient. In a layer that includes an oxygen gradient, the amount of oxygen (atomic %) in the composition of the layer at or near the interface between the layer and the inorganic oxide substrate 110 may differ from the amount of oxygen (atomic %) in the composition of the layer at or near the interface between the layer and another layer (e.g., the first layer and the second layer) and other areas therebetween.

In one or more embodiments, the composition gradient may include a silicon/aluminum composition gradient, where the atomic % of silicon and aluminum change along the thickness of the first layer independently of one another or in relation to one another. In other embodiments, the compositional gradient may include an oxygen/nitrogen composition gradient, where the atomic % of oxygen and nitrogen change along the thickness of the first layer independently of one another or in relation to one another. In one or more embodiments, the ratio of oxygen to nitrogen at or near the interface between the inorganic oxide substrate 110 and the first layer 422 may be greater than the ratio of oxygen to nitrogen at or near the interface between the first layer 422 and the second layer 424. For example, there may be very little or no nitrogen present in the first layer 422 at or near the interface between the inorganic oxide substrate 110 and the first layer 422 and/or there may be very little or no oxygen present in the first layer 422 at or near the interface between the first layer 422 and the second layer 424. In one or more embodiments, the ratio of silicon to aluminum at or near the interface between the inorganic oxide substrate 110 and the first layer 422 may be greater than the ratio of silicon to aluminum at or near the interface between the first layer 422 and the second layer 424. For example, there may be very little or no aluminum present in the first layer 422 at or near the interface between the inorganic oxide substrate 110 and the first layer 422 and/or there may be very little or no silicon present in the first layer 422 at or near the interface between the first layer 422 and the second layer 424.

In one or more embodiments, the oxygen content gradient and/or the nitrogen content gradient may be controlled by the flow rate of oxygen gas and/or nitrogen gas introduced into the deposition process (i.e., into the deposition chamber in which the optical film structure is being deposited onto the inorganic oxide substrate). To increase the oxygen or nitrogen content, the flow rate of oxygen or nitrogen is increased. In some embodiments, the aluminum and/or silicon gradient may be controlled by controlling the power directed at the aluminum and/or silicon source materials (e.g., where sputtering is used to form the optical film structure, the power directed at the aluminum and/or silicon sputtering targets is controlled). To increase the aluminum or silicon content, the power directed to the aluminum and/or silicon source materials is increased.

The oxygen and/or silicon content in the first layer 422 may decreases along the thickness t of the first layer 422 moving along the thickness t moving away from the inorganic oxide substrate 110, as illustrated in FIG. 6A. The oxygen content and/or silicon content gradient may extend along the entire thickness t of the first layer 422. In another variant, the oxygen content and/or silicon content gradient may extend along a portion of the thickness t of the first layer 422, while the remaining portion of the first layer 422 may not include an oxygen content and/or silicon content gradient, and thus may have a constant oxygen and/or silicon content (which may include no oxygen and/or silicon). For example, the oxygen content and/or silicon content gradient may continue until the interface between the optical film structure and the inorganic oxide substrate 110 or any other layer between the inorganic oxide substrate 110 and the layer containing the oxygen content and/or silicon content gradient, such as an interlayer, which will be discussed below in greater detail. Alternatively, the oxygen content and/or silicon content gradient may stop at a distance from the inorganic oxide substrate 110 or an interlayer disposed between the inorganic oxide substrate 110 and the first layer 422. In one or more embodiments, the oxygen content and/or silicon content of the first layer 422 may be the greatest near the interface between the optical film structure 420 and the inorganic oxide substrate 110 and the least near the interface between the first layer 422 and the second layer 424. In one or more embodiments, the composition of the first layer 422 may depend on the oxygen content and/or silicon content of the first layer 422. For example, the first layer 422 may include the highest oxygen content and/or silicon content in a region of the first layer 422 adjacent to the inorganic oxide substrate 110. The first layer 422 may include the lowest oxygen content and/or silicon content in a region of the first layer 422 adjacent to the second layer 424, such as the embodiment shown in FIG. 5.

In one or more specific embodiments, the region of the first layer 422 adjacent to the inorganic oxide substrate 110 may include the highest oxygen content and no nitrogen content (i.e. y=0). In one such specific embodiment, the region of the first layer 422 adjacent to the inorganic oxide substrate 110 may include $Al_2O_3$, $SiO_2$ or a combination thereof.

Figure 4A:
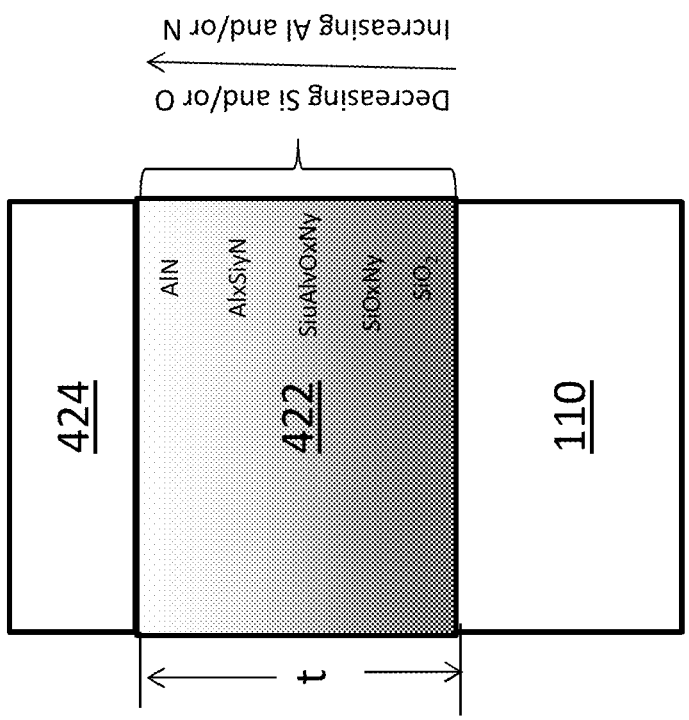
FIG. 4A shows a specific embodiment of the article shown in FIG. 4.

In one or more embodiments, the first layer 422 may include an aluminum content gradient and/or a nitrogen content gradient. The aluminum content and/or nitrogen content in the first layer 422 increase along the thickness t of the first layer 422 moving along the thickness t moving away from the inorganic oxide substrate 110, as illustrated in FIG. 6B. The aluminum content and/or nitrogen content gradient may extend along the entire thickness t of the first layer 422. In another variant, the aluminum content and/or nitrogen content gradient may extend along a portion of the thickness t of the first layer 422, while the remaining portion of the first layer 422 may not include an aluminum content and/or nitrogen content gradient, and thus may have a constant aluminum content and/or nitrogen content (which may include no aluminum and/or nitrogen). For example, the aluminum content and/or nitrogen content gradient may continue until the interface between the optical film structure and the inorganic oxide substrate 110 or any other layer between the inorganic oxide substrate 110 and the layer containing the aluminum content and/or nitrogen content gradient, such as the interlayer, which will be discussed below in greater detail. Alternatively, the aluminum content and/or nitrogen content gradient may stop at a distance from the inorganic oxide substrate 110 or an interlayer disposed between the inorganic oxide substrate 110 and the first layer 422. In one or more embodiments, the aluminum content and/or nitrogen content of the first layer 422 may be the lowest near the interface between the optical film structure 420 and the inorganic oxide substrate 110 and the greatest near the interface between the first layer 422 and the second layer 424. FIG. 6B illustrates the relative aluminum content and/or nitrogen content of the first layer 424. In one or more embodiments, the first layer 422 includes a silicon oxide, a silicon oxynitrides, silicon nitride, aluminum-containing oxide, an aluminum-containing oxy-nitride (e.g., $AlO_xN_y$ and $Si_uAl_vO_xN_y$) or aluminum-containing nitride (e.g., AlN and $Al_xSi_yN$) depending on the silicon content, oxygen content, aluminum content and/or nitrogen content of the first layer 422. For example, the first layer 422 may include the lowest silicon content and/or oxygen content in a region of the first layer 422 adjacent to the second layer 424, as shown in FIG. 6A. As also shown in FIG. 6A, the first layer 422 may include the highest silicon content and/or oxygen content in a region of the first layer 422 adjacent to the inorganic oxide substrate 110. FIG. 4A illustrates an embodiment in which the first layer 422 includes a silicon gradient, an aluminum gradient, an oxygen gradient and a nitrogen gradient. In FIG. 4A, the silicon and oxygen contents decrease with thickness in a direction moving away from the inorganic oxide substrate 110 and the aluminum and nitrogen contents increase with thickness in a direction moving away from the inorganic oxide substrate 110. The relative amounts of each of silicon, aluminum, oxygen and nitrogen are shown in FIG. 4A; however, it should be noted that the changes in the contents of silicon, aluminum, oxygen and nitrogen may not be linear or consistent and mixtures of $SiO_2$, $SiO_xN_y$, $Si_1$, $Al_vO_xN_y$, $Al_xSi_yN$ and AlN may be present at various thicknesses of the first layer 422.

Between the region adjacent to the inorganic oxide substrate 110 and the region adjacent to the second layer 424, the first layer 422 may include $AlO_xN_y$, where x and y are dependent on the amount of nitrogen present and may change as the nitrogen content increases along thickness t in a direction moving away from the inorganic oxide substrate 110. Moreover, between the region adjacent to the inorganic oxide substrate 110 and the region adjacent to the second layer 424, the first layer 422 may include $Si_uAl_vO_xN_y$ (where (u+v)=1 and (x+y)=1) or $SiO_xN_y$ where x and y are dependent on the amount of nitrogen and/or aluminum present and change as the nitrogen content and/or aluminum content increases along thickness t in a direction moving away from the inorganic oxide substrate 110.

In another embodiment, the first layer includes $Si_uAl_vO_xN_y$ and/or $SiO_xN_y$ where, in at least one region of the first layer 422 along thickness t, x or y may equal zero. In one or more specific embodiments, the region of the first layer 422 adjacent to the inorganic oxide substrate 110 may include no nitrogen content and the highest oxygen content (i.e. y=0). In one such specific embodiment, the region of the first layer 422 adjacent to the inorganic oxide substrate 110 may include $SiO_2$. In another specific embodiment, the region of the first layer 422 adjacent to the second layer 424 may include the highest nitrogen content and/or highest aluminum content and the lowest oxygen content and/or lowest silicon content. In such embodiments, the region of the first layer 422 adjacent to the second layer 424 may include AlN, $Si_3N_4$ or $Al_xSi_yN$.

In one or more embodiments, the first layer 422 includes $SiO_2$ adjacent to the inorganic oxide substrate 110 or may be rich in silicon and/or oxygen and may be deficient or lack aluminum and/or nitrogen. In one or more embodiments, the first layer 422 includes AlN adjacent to the second layer 424 or may be rich in aluminum and/or nitrogen and may be deficient or lack silicon and/or oxygen.

In another embodiment, the first layer includes $AlO_xN_y$, where, in at least one region of the first layer 422 along thickness t, y may equal zero. In one or more specific embodiments, the region of the first layer 422 adjacent to the inorganic oxide substrate 110 may include the highest oxygen content and no nitrogen content (i.e. y=0). In one such specific embodiment, the region of the first layer 422 adjacent to the inorganic oxide substrate 110 may include $Al_2O_3$.

In one or more embodiments, the composition of layer 422 may tuned to minimize the variation on the reflectance color points as the viewing angle is changed from normal incidence (i.e., 0 degrees) to oblique incidence. In such embodiments, the composition of layer 422 is graded such that the composition near the interface between the first layer 422 and the second layer 424, the first layer comprises AlN, $Al_xSi_yN$, $Si_3N_4$, $Si_uAl_vO_xN_y$ (where x<0.1) or $AlO_xN_y$ (where x<0.1).

In one or more specific embodiments, the first layer 422 has a thickness that is greater or substantially greater than the thickness of the second layer 424. In one variant, the first layer 422 has a thickness of 1 μm or greater. For example, the first layer 422 may have a thickness of 1.1 μm or greater, 1.2 μm or greater, 1.3 μm or greater, 1.4 μm or greater, 1.5 μm or greater, 1.6 μm or greater, 1.7 μm or greater, 1.8 μm or greater, 1.9 μm or greater, 2p m or greater, 2.1 μm or greater, 2.2 μm or greater, 2.3 μm or greater, 2.4 μm or greater, 2.5 μm or greater, 2.6 μm or greater, 2.7 μm or greater, 2.8 μm or greater, 2.9 μm or greater, or 3 μm or greater.

In the embodiment shown in FIG. 4, the refractive index of the first layer 422 may be in the range from about 1.6 to about 2.1. For example, the refractive index of the first layer 422 may include 1.6, 1.62, 1.64, 1.66, 1.68, 1.70, 1.72, 1.74, 1.76, 1.78, 1.80, 1.82, 1.84, 1.86, 1.88, 1.90, 1.92, 1.94, 1.96, 1.98, 2.0, 2.1 and all ranges and sub-ranges therebetween. The refractive index of the second layer 424 may be in the range from about 1.45 to about 1.55. For example, the refractive index of the second layer 424 may include 1.45, 1.46, 1.47, 1.48, 1.49, 1.50, 1.51, 1.52, 1.53, 1.54, 1.55 and all ranges and sub-ranges therebetween. As will be discussed below in greater detail, the first layer 422 of the optical film structure 420 may have a refractive index gradient.

In embodiments in which $Al_2O_3$ is utilized in the second layer 424, the nitrogen and oxygen gas concentrations can be modified to form any of $Al_2O_3$, $AlO_xN_y$ and/or AlN to form the layers of the optical film structure.

In one or more alternative embodiments, the optical film structure 420 may not include a second layer 424 and may only include the first layer 422.

FIG. 9 generally illustrates the optical properties of the optical film structure 420 illustrated in FIG. 4. In the graph, the thickness values on the x-axis illustrate the thickness of the optical film structure 420 in a direction moving away from the inorganic oxide substrate 110. The refractive index values of the optical film structure 420 are provided on the y-axis to illustrate the changes in refractive index along the thickness of the optical film structure. In FIG. 9, the graph does not take into account the refractive indices of the inorganic oxide substrate 110 (or any other layer between the inorganic oxide substrate 110 and the optical film structure 420) or air (or any other layer disposed on the optical film structure 420). The interface between the inorganic oxide substrate 110 and the first layer 422 is indicated by reference number 800, the interface between the first layer 422 and the second layer 424 is indicated by reference number 810, the interface between the second layer 424 and air is indicated by reference number 820. As shown in FIG. 9, the refractive index of the first layer 422 increases along the thickness moving away from the inorganic oxide substrate 110 (or the inorganic oxide substrate-first layer interface 800). In one or more embodiments, the refractive index changes with the changes in oxygen content in the first layer 422. In FIG. 9, the refractive index of the first layer 422 is greater than the refractive index of the second layer 424 for a greater portion of the first layer 422. In other words, a larger portion of the first layer 422 has a higher refractive index than the second layer 424. In FIG. 9, the thickness of the first layer 422 is shown as being greater than the thickness of the second layer 424.

FIG. 5 illustrates a article 500 that includes an optical film structure 520 disposed on one of the opposing major surfaces 112, 114 of the inorganic oxide substrate 110. The optical film structure 520 shown in FIG. 5 includes a first layer 522 and a second layer 524. The first layer 522 includes a silicon-containing oxide, a silicon-containing oxynitrides, silicon nitride, an aluminum-containing oxide, an aluminum-containing oxy-nitride (e.g., $AlO_xN_y$ and $Si_uAl_vO_xN_y$), an aluminum-containing nitride (e.g., AlN and $Al_xSi_yN$), or combinations thereof. The second layer 524 may include a transparent dielectric material (e.g., $SiO_2$, $GeO_2$, $Al_2O_3$, $Nb_2O_5$, $TiO_2$, $Y_2O_3$ and other similar materials and combinations thereof), or a combination thereof. The first layer 522 includes a first sub-layer 526 and a second sub-layer 528. The first sub-layer 526 may include an oxygen content gradient, a nitrogen content gradient, a silicon content gradient and aluminum content gradient and various combinations thereof, as described with reference to optical film structure 420.

In one or more embodiments, the first sub-layer 526 includes a silicon-containing oxide, a silicon-containing oxynitrides, silicon nitride, an aluminum-containing oxide, an aluminum-containing oxy-nitride (e.g., $AlO_xN_y$ and $Si_uAl_vO_xN_y$), aluminum-containing nitride (e.g., AlN and $Al_xSi_yN$), and/or combinations thereof depending on the oxygen content, silicon content, nitrogen content and/or aluminum content of the first sub-layer 526. In a specific embodiment, the first sub-layer 526 may be free of AlN and/or $Si_3N_4$. In other words, the first sub-layer 526 of one or more specific embodiments includes oxygen throughout the thickness t, but the amount of oxygen varies along the thickness t. The second sub-layer 528 may include AlN and/or $Si_3N_4$. In one or more embodiments, the second sub-layer 528 may be free of any intentionally included oxygen. Accordingly, in one or more embodiments, the oxygen content gradient of the first layer 522 may extend only along the thickness t of the first sub-layer 526, while the second sub-layer 528 may be free of oxygen.

Figure 5A:
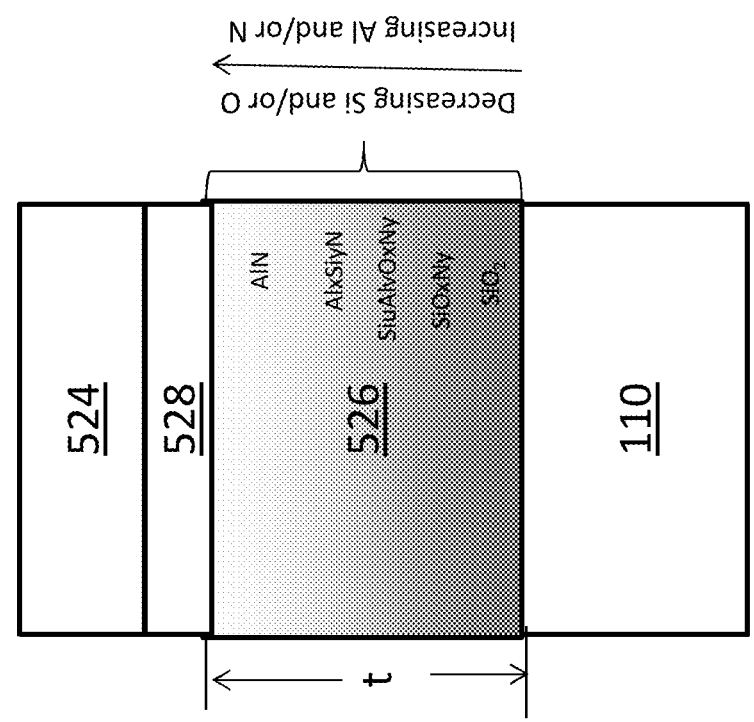
FIG. 5A shows a specific embodiment of the article shown in FIG. 5.

FIG. 5A illustrates an embodiment in which the first sub-layer 526 includes a silicon gradient, an aluminum gradient, an oxygen gradient and a nitrogen gradient. In FIG. 5A, the silicon and oxygen contents decrease with thickness in a direction moving away from the inorganic oxide substrate 110 and the aluminum and nitrogen contents increase with thickness in a direction moving away from the inorganic oxide substrate 110. The relative amounts of each of silicon, aluminum, oxygen and nitrogen are shown; however, it should be noted that the changes in the contents of silicon, aluminum, oxygen and nitrogen may not be linear or consistent and mixtures of $SiO_2$, $SiO_xN_y$, $Si_uAl_vO_xN_y$, $Al_xSi_yN$ and AlN may be present at various thicknesses of the first sub-layer 526. In one or more embodiments, the first sub-layer may not include AlN and may include only $SiO_2$, $SiO_xN_y$, $Si_uAl_vO_xN_y$, and/or $Al_xSi_yN$, and the second sub-layer may include AlN.

In one or more embodiments, the decrease or increase in oxygen, silicon, aluminum and/or nitrogen content along thickness t of the first layer 422, or first sub-layer 526 in a direction moving away from the inorganic oxide substrate 110 may be constant. In one or more alternative embodiments, the decrease or increase in oxygen, silicon, aluminum and/or nitrogen is not constant. In such embodiments in which the decrease or increase in oxygen, silicon, aluminum and/or nitrogen is not constant, it will be understood that the oxygen, silicon, aluminum and/or nitrogen will either decrease or remain constant along portions of the thickness t in the direction moving away from the inorganic oxide substrate 110; however the respective oxygen, silicon, aluminum and/or nitrogen content of the first layer 422, or first sub-layer 526 will decrease or increase, as a general trend, along the thickness t in the direction moving away from the inorganic oxide substrate 110. For example, the layers of the optical film structures with an oxygen content gradient disclosed herein do not include an increase in oxygen content along the thickness t in a direction moving away from the inorganic oxide substrate 110. The oxygen content gradient of embodiments in which the oxygen content either decreases or remains constant along portions of the thickness t of the first layer 422, or first sub-layer 526, may be referred to as "step-wise" oxygen content gradients or may be described as having an oxygen content that decreases step-wise, along the thickness to of the first layer 422, or first sub-layer 526. In one or more specific embodiments, the oxygen content may decrease at a slower rate along the thickness of the first layer 422, or first sub-layer 526 closer to the inorganic oxide substrate 110 and decrease at a faster rate along the thickness of the first layer 422, or first sub-layer 526 closer to the second layer 424 or second sub-layer 528. In other words, the rate at which the oxygen content decreases along the thickness of the first layer 422, or first sub-layer 526 may increase in a direction moving away from the inorganic oxide substrate 110. Accordingly, the oxygen content gradient may increase linearly or non-linearly along the thickness t in a direction moving away from the inorganic oxide substrate. These types of gradients (i.e., stepwise, constant, faster/slower rates, linear and non-linear) are equally applicable to silicon content gradients, aluminum gradients, and nitrogen gradients described herein where the silicon content, aluminum content and/or nitrogen content increases and decreases along the thickness of the first layer 422, or first sub-layer 526.

In one or more embodiments, the second sub-layer 528 has a thickness that is tuned to optimize the hardness of the optical film structure. In one or more specific embodiments, the thickness of the second sub-layer 528 may be tuned in relation to the first sub-layer 526. In one or more specific embodiments, the second sub-layer 528 is thicker or substantially thicker than either of the first sub-layer 526 or the second layer 524. In one or more embodiments, the second sub-layer 528 has a thickness that is greater or substantially greater than the combined thickness of the first sub-layer 526 and the second layer 524. In one variant, the second sub-layer 528 may have a thickness of 1 µm or greater. For example, the second sub-layer 528 may have a thickness in the range from about 1 µm to about 3 µm or more specifically from about 2 µm to about 3 µm. Specific embodiments of the second sub-layer 528 may have a thickness of about 1.1 µm or greater, about 1.2 µm or greater, about 1.3 µm or greater, about 1.4 µm or greater, about 1.5 µm or greater, about 1.6 µm or greater, about 1.7 µm or greater, about 1.8 µm or greater, about 1.9 µm or greater, about 2 µm or greater, about 2.1 µm or greater, about 2.2 µm or greater, about 2.3 µm or greater, about 2.4 µm or greater, about 2.5 µm or greater, about 2.6 µm or greater, about 2.7 µm or greater, about 2.8 µm or greater, about 2.9 µm or greater, or about 3 µm or greater. In embodiments in which the second sub-layer 528 includes AlN, the thickness of the second sub-layer may be 2 µm or greater. For example, the second sub-layer 528 may have a thickness of about 2.2 µm or greater, about 2.3 µm or greater, about 2.4 µm or greater, about 2.5 µm or greater, about 2.6 µm or greater, about 2.7 µm or greater, about 2.8 µm or greater, about 2.9 µm or greater, or about 3 µm or greater.

The refractive index of the first sub-layer 526 may be in the range from about 1.6 to about 2.1. For example, the refractive index of the first sub-layer 326 may include 1.6, 1.62, 1.64, 1.66, 1.68, 1.70, 1.72, 1.74, 1.76, 1.78, 1.80, 1.82, 1.84, 1.86, 1.88, 1.90, 1.92, 1.94, 1.96, 1.98, 2.0, 2.1 and all ranges and sub-ranges therebetween. The refractive index of the second sub-layer 528 may be in the range from about 2.0 to about 2.1. For example, the refractive index of the second sub-layer may include 2.0, 2.01, 2.02, 2.03, 2.04, 2.05, 2.06, 2.07, 2.08, 2.09, 2.1 and all ranges and sub-ranges therebetween. The refractive index of the second layer 524 may be in the range from about 1.45 to about 1.55. For example, the refractive index of the second layer 524 may include 1.45, 1.46, 1.47, 1.48, 1.49, 1.50, 1.51, 1.52, 1.53, 1.54, 1.55 and all ranges and sub-ranges therebetween. As will be discussed below in greater detail, the first layer 522 of the optical film structure 520 may have a refractive index gradient.

In embodiments in which $Al_2O_3$ is utilized in the second layer 524, the nitrogen and oxygen gas concentrations can be modified to form any of $Al_2O_3$, AlOxNy and/or AlN to form the layers of the optical film structure.

Figure 10A:
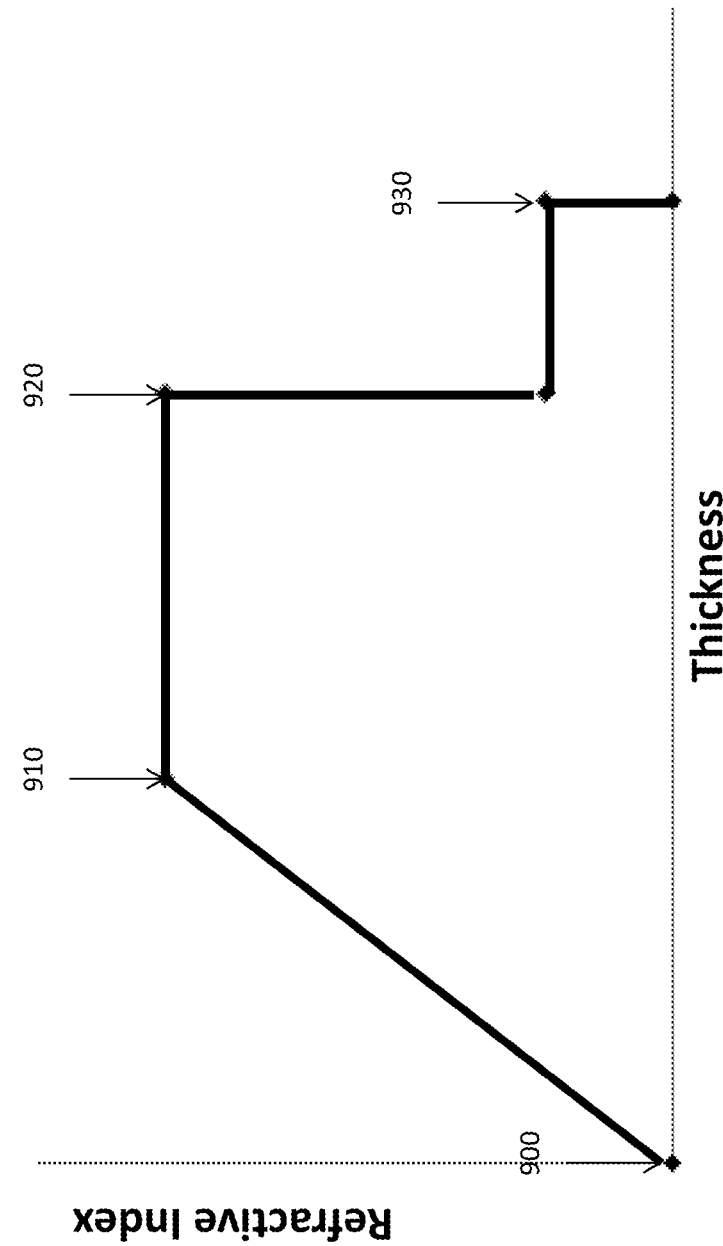
FIG. 10A is a graph of the relationship between the thickness and refractive indices of the optical film structure of the article of FIG. 5.

FIG. 10A generally illustrates the optical properties of the optical film structure 520 illustrated in FIG. 5. In the graph, the thickness values on the x-axis illustrate the thickness of the optical film structure 520 in a direction moving away from the inorganic oxide substrate 110. The refractive index values of the optical film structure 520 are provided on the y-axis to illustrate the changes in refractive index along the thickness of the optical film structure. In FIG. 10A, the graph does not take into account the refractive indices of the inorganic oxide substrate 110 (or any other layer between the inorganic oxide substrate 110 and the optical film structure 520) or air (or any other layer disposed on the optical film structure 520). The interface between the inorganic oxide substrate 110 and the first sub-layer 526 is indicated by reference number 900, the interface between the first sub-layer 526 and the second sub-layer 528 is indicated by reference number 910, the interface between the second sub-layer 528 and the second layer 524 is indicated by reference number 920 and the interface between the second layer 524 and air is indicated by reference number 930. As shown in FIG. 10A, the refractive index of the first sub-layer 526 increases along the thickness of the first sub-layer 526 in a direction moving away from the inorganic oxide substrate 110 (or the inorganic oxide substrate-first sub-layer 526 interface 900). In one or more alternative embodiments, the refractive index of the first sub-layer 526 changes with the change in oxygen content in the first sub-layer 526. In addition, the first sub-layer 526 has a refractive index that is greater than the refractive index of the second layer 524 along a majority of the thickness of the first sub-layer 526. The second sub-layer has a refractive index that is greater than the refractive index of the second layer 524 along the entire thickness of the second sub-layer. In FIG. 10A, the thickness of the first and second sub-layers 526, 528 are shown as being greater than the thickness of the second layer 524. In addition, the thickness of the first and second sub-layers 526, 528 are shown as about equal; however in some embodiments one of the first and second sub-layers 526, 528 may have a greater thickness than the other of the first and second sub-layers.

FIG. 10B generally illustrates the optical properties of an alternative embodiment of the optical film structure shown in FIG. 5. In the embodiment shown in FIG. 10B, the second-sub-layer 528 has the same refractive index as the second layer 524. In one or more embodiments, the second sub-layer 528 may be compositionally similar or identical to at least a portion of the second layer 524. In the graph shown in FIG. 10B, the thickness values on the x-axis illustrate the thickness of the optical film structure 520 in a direction moving away from the inorganic oxide substrate 110. The refractive index values of the optical film structure 520 are provided on the y-axis to illustrate the changes in refractive index along the thickness of the optical film structure. In FIG. 10B, the graph does not take into account the refractive indices of the inorganic oxide substrate 110 (or any other layer between the inorganic oxide substrate 110 and the optical film structure 520) or air (or any other layer disposed on the optical film structure 520). The interface between the inorganic oxide substrate 110 and the first sub-layer 526 is indicated by reference number 1000, the interface between the first sub-layer 526 and the second sub-layer 528 is indicated by reference number 1010, the interface between the second sub-layer 528 and the second layer 524 is indicated by reference number 1020 and the interface between the second layer 524 and air is indicated by reference number 1030. As shown in FIG. 10AB, the refractive index of the first sub-layer 526 increases along the thickness of the first sub-layer 526 in a direction moving away from the inorganic oxide substrate 110 (or the inorganic oxide substrate-first sub-layer 526 interface 900). In one or more alternative embodiments, the refractive index of the first sub-layer 526 changes with the change in oxygen content in the first sub-layer 526. In addition, the first sub-layer 526 has a refractive index that is less than the refractive index of the second layer 524 along at least a portion of the thickness of the first sub-layer 526. The second sub-layer has a refractive index that is the same as the refractive index of the second layer 524 along the entire thickness of the second sub-layer. In FIG. 10B, the thickness of the first and second sub-layers 526, 528 are shown as being greater than the thickness of the second layer 524; however, the thicknesses of the first sub-layer 526, the second sub-layer 528 and the second layer 524 may be equal or may be thicker or thinner with respect to one another as needed to provide the desired scratch resistance and optical properties. In addition, the thickness of the first and second sub-layers 526, 528 are shown as about equal; however in some embodiments one of the first and second sub-layers 526, 528 may have a greater thickness than the other of the first and second sub-layers.

In the embodiments shown in FIGS. 4 and 5, the first layer 422, 522 of the optical film structure may have a refractive index gradient. The refractive index gradient may be related to the oxygen and/or nitrogen content gradient in the first layer 422, 522 or may be caused by a compositional gradient in the first layer 422, 522. The first layer 222, 322 shown in FIGS. 2 and 3 may also have a refractive index gradient. In such embodiments, the refractive index of the first layer of the optical film structure may increase along the thickness t in a direction moving away from the inorganic oxide substrate 110. For example, the refractive index gradient may be in the range from about 1.45 to about 2.2 or, more specifically, in the range from about 1.7 to about 2.1. In embodiments utilizing an oxygen content gradient, the oxygen content may be adjusted to optimize optical properties along the visible spectrum. Similarly, in embodiments utilizing a nitrogen content gradient, the nitrogen content may be adjusted to optimize optical properties along the visible spectrum.

In one or more embodiments, the first layer 222, 322, 422, 522 is free of silicon or is free of aluminum. In one or more specific embodiments, the first layer 222, 322, 422, 522 includes AlN or $Si_3N_4$, however an oxide is disposed between the AlN or $Si_3N_4$ in the first layer 222, 322, 422, 522 and the inorganic oxide substrate 110. The oxide may be selected to adjust the optical properties such that the article exhibits an average transmittance of about 85% or greater over the visible spectrum, as otherwise described herein. In one or more embodiments, the oxide may be selected to adjust the optical properties such that the article exhibits a total reflectivity that is the same or less than the total reflectivity of the inorganic oxide substrate 110 without the optical film structures described herein over the visible spectrum. In one or more embodiments, the oxide may be selected to adjust the optical properties such that the article exhibits a color transmittance or reflectance in the (L, a*, b*) colorimetry system, such that the color coordinates distance from a reference point is less than about 2, as otherwise described herein.

In one or more embodiments, the optical film structures described herein are free of nanostructures or intentionally added nanostructures, such as particulates. Intentionally added nanostructures are particulates that are purposely introduced into the optical film structure for the properties of such nanostructures (e.g., to increase surface area of the optical film structure or any of the layers therein, to provide anti-glare properties etc.). In one or more embodiments, the optical film structures described herein are free of porous layers or layers with intentionally added porosity. Intentionally added porosity includes treating the optical film structure to provide or increase porosity or including a pore forming material into the optical film structure to provide or increase porosity. In one or more embodiments, the second layer 224, 324, 424, 524 excludes aluminum or aluminum oxy-nitrides.

In one or more embodiments, the optical film structures described herein may include a modifier to enhance or suppress one or more properties. In one or more specific embodiments, the modifiers can be incorporated into the optical film structure to enhance the conductivity of the optical film structure. In such embodiments, the optical film structure may be modified or doped with Mg and/or Cato control conductivity. Other modifiers dopants such as Si and/or Ge may be incorporated into the optical film structures described herein, and specifically into layers of the optical film structures comprising AlN. In one or more embodiments, the use of Si and/or Ge modifiers or dopants allow refractive index control, without having to alter the oxygen or nitrogen content of a given layer of the optical film structures described herein. In other words, the use of Si and/or Ge allows refractive index control of a given layer within the optical film structure without having to change oxygen or nitrogen content. Moreover, Si may also enhance the hardness of AlN when used in small amounts (i.e., to provide $AlN_xSi_y$, where y<0.1, and x+y=1). Boron may also be alloyed with any material disclosed herein as appropriate. For example, AlN may be alloyed with boron to provide $Al_xB_yN$, where x+y=1. The incorporation of small amounts of boron may provide improved lubricity to specific layers within the optical film structure or to the optical film structure, as a whole. The incorporation of boron could also provide increased hardness to specific layers within the optical film structure or to the optical film structure, as a whole. Layers of the optical film structures described herein that include nitrogen or a nitride may optionally include a carbon modifier or dopant. In one or more embodiments, the carbon modifier or dopant may be used as an alloy to form carbides within the optical film structure. Alternatively, the optical film structure may be free of modifiers or dopants or may be free of intentionally added modifiers or dopants.

In one or more alternative embodiments, a modifier or dopant including hexagonal BN can be incorporated into the optical film structure to improve the optical properties of the optical film structure. For example, hexagonal BN may be incorporated into the optical film structure to increase the refractive index of one or more layers of the optical film structure. The layers of the optical film structure that are modified or doped in this manner may include AlN, $Si_3N_4$, $SiO_xN_y$, $Si_uAl_vO_xN_y$, $Al_xSi_yN$ or $AlO_xN_y$.

Optionally, a modifier including hexagonal BN, Ag, Cr and/or other large atoms may be incorporated into the optical film structure to improve the mechanical properties of the optical film structure. Specifically, the use of modifiers including hexagonal BN, Ag, Cr and/or other large atoms may be incorporated into the optical film structure to manage the stress in the optical film structure. Without being bound by theory, the doping of the AlN, $Si_3N_4$, $SiO_xN_y$, $Si_uAl_vO_xN_y$, $Al_xSi_yN$ or $AlO_xN_y$ layers with certain atoms may allow the film to relax and have less stress. Relaxed films tend not to flake apart when subjected to a force, such as a single event scratch, which prevents scratch damage and also prevents optical damage. Example atoms include silver (Ag), Yttrium (Y), Indium (In) and Tin (Sn), and other elements of row 5 on the periodic table. Additionally the use of phosphorous as a dopant may also provide a relaxation effect to the optical film structure. Relaxed films also resist being pulled apart by the forces that occur during the sliding contact event that cause scratches. Accordingly, the inclusion of certain atoms into the optical film structure allows the film to have the desired hardness, without the undesirable tension or compression. As such the inclusion of certain atoms provides an additional degree of freedom for tuning the optical properties of the optical film structure.

In one or more embodiments, a hexagonal BN modifier may be incorporated into the optical film structure to impart lubricity to the optical film structure. The hexagonal BN may have a sheet-like structure that is similar to graphene.

In one or more embodiments, the optical film structure may have a coefficient of friction that is less than the coefficient of friction of other optical film structures that include AlN, $Si_3N_4$, $SiO_xN_y$, $Si_uAl_vO_xN_y$, $Al_xSi_yN$ or $AlO_xN_y$ but do not incorporate a hexagonal BN modifier into the optical film structure. For example, when measured using a silicon carbide sphere counter surface, the optical film structure comprising AlN, $Si_3N_4$, $SiO_xN_y$, $Si_uAl_vO_xN_y$, $Al_xSi_yN$ or $AlO_xN_y$ and incorporating a hexagonal BN modifier may have a coefficient of friction of less than about 0.3. In one or more embodiment, the coefficient of friction may be about 0.28 or less, about 0.26 or less, about 0.24 or less, about 0.22 or less, about 0.20 or less, about 0.18 or less, about 0.16 or less, about 0.14 or less, about 0.12 or less or about 0.1 or less.

In one or more embodiments, the modifier may be incorporated into a layer of the optical film structure comprising AlN, $Si_3N_4$, $SiO_xN_y$, $Si_uAl_vO_xN_y$, $Al_xSi_yN$ or $AlO_xN_y$. For example, in the embodiment shown in FIG. 2, the modifier may be incorporated into a second sub-layer 226 including AlN or $AlO_xN_y$. In the embodiment shown in FIG. 3, the first sub-layer 326 and/or the third sub-layer 330 may incorporate a modifier. In the embodiment shown in FIG. 4, the first layer 422 may incorporate a modifier. In the embodiment shown in FIG. 5, the first sub-layer 526 or the second sub-layer 528 may incorporate a modifier.

In one or more embodiments, a modifier comprising fluorine may be incorporated into the second layers 224, 324, 424, 524 disclosed herein. In such embodiments, the fluorine modifier decreases the coefficient of friction of the second layer and thus the optical film structure. A fluorine modifier may be incorporated into other layers of the optical film structures. In one or more embodiments, the second layers disclosed herein comprise $SiO_2$ and a modifier comprising fluorine.

In one or more embodiments, the optical film structures described herein exclude infrared reflecting layers or material. The optical film structures may also exclude layers or materials that have optical properties that are specifically tuned to the infrared region.

As shown in FIG. 1, the inorganic oxide substrate 110 includes opposing minor surfaces 116, 118. In one or more embodiments, the article 100 may include a wrapped film (not shown) that may be disposed on the opposing minor surfaces 116, 118 and/or the opposing major surfaces 112, 114. In such embodiments, the wrapped film may be disposed between the inorganic oxide substrate 110 and the optical film structure 120, 220, 320, 420, 520. Alternatively, the wrapped film may form all or part of the first layer 222, 322, 422, 522. In a specific embodiment, the wrapped film may form all or part of the first sub-layer 226, 326, 526. The wrapped film may include $Al_2O_3$. The wrapped film may provide nucleation layer(s) for the first sub-layers 226, 326, 526 and first layer 424 disclosed herein. The nucleation layer may effect on the atomic arrangements of atoms in the first few atomic layers of the first sub-layers 226, 326, and 526 or first layer 424 (i.e. the nucleation layers that are less than 10 nm from the interface between the first sub-layers 226, 326, 526 or first layer 424 and the wrapped film.

The articles disclosed herein may include additional films or layers disposed thereon. For example, the articles may include an anti-reflective film and/or a passivation film. Exemplary anti-reflective films may include single layers or multiple layers (e.g., 4 layer films, 6 layer films etc.). Where anti-reflective films with multiple layers are utilized, the layers may include different refractive indices and may include layers with high refractive indices (H) and low refractive indices (L) where "high" and "low" are with respect to one another and within known ranges for anti-reflective films. The layers may be arranged so that high and low refractive index layers alternate. In one or more embodiments, an interlayer may be disposed between the inorganic oxide substrate 110 and the optical film structures described herein. In a specific embodiment, the interlayer may include a film or layers of organic materials, inorganic materials or a combination thereof for maintaining the average flexural strength of the article. The interlayer may be a composite of several layers which may have the same composition or different compositions from one another. In one or more specific embodiments, the interlayer includes a polymer. Exemplary polymers include polyimides, polysiloxanes, polyethersulfones, polysulfones, polyetherketones, parylenes, polytetrafluoroethanes, and the like. The interlayer may also include diamond-like carbon. The interlayer may have average strain-to-failure, fracture toughness or modulus properties that prevent cracks originating in the optical film structure from bridging into the inorganic oxide substrate. In one or more embodiments, the interlayer may form the first sub-layer of the optical film structures described herein. In such embodiments, the first sub-layer comprising the interlayer may have a thickness of about 300 nm. It will be understood that the other layers of the optical film structure may have thicknesses that are greater than 300 nm such that the optical film structure, as a whole, has a thickness as otherwise described herein. Where an interlayer is included as a separate layer between the optical film structure or as part of the optical film structure, the optical film structure (and/or any of the layers therein) may be tuned to modify the optical properties of the structure.

The optical film structures described herein may be disposed on the inorganic oxide substrate 110 using vacuum deposition techniques, for example, chemical vapor deposition (e.g., plasma enhanced chemical vapor deposition), physical vapor deposition (e.g., reactive or nonreactive sputtering or laser ablation), thermal or e-beam evaporation and/or atomic layer deposition. The processing conditions for disposing the optical film structures disclosed herein may be modified to tune the mechanical properties of the optical film structure or the mechanical properties of one or more specific layers of the optical film structure. For example, in one or more embodiments, the optical film structure is deposited at an elevated pressure to reduce the stress within the optical film structure. Exemplary elevated pressures include pressures in the range from about 0.5 mTorr to about 50 mTorr. In one or more embodiments, the elevated pressure includes 10 mTorr. In one or more embodiments, the layers of the optical film structure including AlN are disposed at a high pressure. In specific embodiments, other layers of the optical film structure, for example, those not including AlN may be disposed at low pressure. Examples of low pressure include pressure in the range from about 2 mTorr to about 20 mTorr.

A second aspect of the disclosure pertains to a method of forming the articles described herein. In one or more embodiments, the method includes providing an inorganic oxide substrate, which may be a strengthened glass substrate, a non-strengthened glass substrate, a strengthened glass ceramic substrate or a non-strengthened glass ceramic substrate, as described herein, having opposing major surfaces, and disposing an optical film structure on one of the opposing major surfaces of the inorganic oxide substrate. In one or more embodiments, the optical film structure is disposed on the inorganic oxide substrate at a pressure in the range of about 2 mTorr to about 20 m Torr to provide an optical film structure having lower stress than an optical film structure that is deposited at a lower pressure. In one or more specific embodiments, the optical film structure is disposed at a pressure of about 3 mTorr. The pressures that may be utilized may vary. Please note that these are examples, and their exact value can change from depending on the reactor utilized, the reactor engineering (e.g., the reactor shape, dimensions, carrier gasses, throughput etc.)

In one or more embodiments, the optical film structure may be disposed on the inorganic oxide substrate via a vacuum deposition technique. Exemplary vacuum deposition techniques include chemical vapor deposition, plasma-enhanced chemical vapor deposition, physical vapor deposition such as sputtering, thermal evaporation and atomic layer deposition.

In one or more embodiments, the method includes modifying one or more properties of the optical film structure. The one or more properties may include conductivity, lubricity, stress, refractive index, hardness, thickness, deposition rate, and film reactivity with the environment, and combinations thereof. Modification of one or more of the conductive, lubricity, stress, and refractive index properties may include incorporation of one or more modifiers, as described herein, into the optical film structure. In one or more embodiments, the method includes increasing the conductivity of the optical film structure. In a specific embodiment, increasing the conductivity of the optical film structure includes doping the optical film structure with a modifier or dopant, which may include Mg, Ca or a combination thereof. The method according to one or more embodiments may include increasing the lubricity of the optical film structure. In one or more specific embodiments, increasing the lubricity of the optical film structure includes incorporating BN into the optical film structure.

In one or more embodiments, the method includes reducing the stress in the optical film structure. In such embodiments, reducing the stress includes incorporating one or more of BN, Ag, Cr or a combination thereof into the optical film structure.

In one or more embodiments, the method includes introducing oxygen into the optical film structure. The introduction of oxygen may modify the refractive index of the optical film structure. In one or more embodiments, the method may include creating an oxygen content gradient in the optical film structure, as otherwise described herein.

EXAMPLES

Various embodiments will be further clarified by the following examples.

It will be apparent to those skilled in the art that various modifications and variations can be made without departing from the spirit or scope of the disclosure.

Examples 1-8

In the following examples, three-layer optical film structures were designed and the transmittance of the samples was evaluated across the visible spectrum using various models. Ellipsometry was used to characterize the refractive index and extinction coefficient of each layer in the three-layer optical film structures. The refractive index and extinction coefficient information of each of the layers was used in known modeling tools (e.g., thin film designing codes) to determine the optical behavior of the optical film structures described in Examples 1-8. The foregoing characterization and modeling can be used with 2-layer, 4-layer or other layer configurations of the optical film structures described herein.

The optical film structure from which the refractive index and extinction coefficient information were measured and used in Examples 1-8 was formed using an ion beam sputtering process on a strengthened glass substrate having width and length dimensions of about 2" by 2". The glass substrate included an alkali aluminoborosilicate glass having a composition that includes about 65 mol % $SiO_2$, about 14 mol % $Al_2O_3$; about 5 mol % $B_2O_3$; about 14 mol % $Na_2O$; about 2.5 mol % MgO and about 0.1 mol % $SnO_2$. The glass substrate was strengthened to exhibit a CS of at least about 700 MPa and a DOL of at least about 40 μm. The CS and DOL were formed by immersing the glass substrate in a molten salt bath having a temperature of about 400-430° C. for about four to about eight hours. The thicknesses of the respective layers of the optical film structure were controlled by deposition time. The deposition temperature was maintained at about 200° C. and the pressure was maintained at $6.7\times10^{-6}$ Torr. Each of the layers of the optical film structure was sputtered from an appropriate target (e.g., Ge target to form germanium-containing oxides, Si target to form silicon-containing oxides or Al target to form aluminum-containing oxides, nitrides or oxynitrides) in the presence of argon flowed at a rate of about 75 sccm, with DC power supplied at about 4 kW. The ion beam was generated at a power in the range from about 180 W to about 800 W using a mixture of oxygen (flowed at a rate of about 2 sccm), nitrogen (flowed at a rate of about 50 sccm) and argon (flowed at a rate of about 25 sccm) gases. For example, when forming $Al_2O_3$, the ion beam was generated at a power of about 600 W, when forming $AlO_xN_y$, the ion beam was generated at a power of about 180 W, and when forming $SiO_2$, the ion beam was generated at a power of about 800 W. $Al_2O_3$ was formed at a rate of about 3 Å/second, $AlO_xN_y$ was formed at a rate of about 1.6 Å/second and $SiO_2$ was formed at a rate of about 5 Å/second.

In known structures, designs with the lowest reflectivity still showed a variation on the reflectance color points as the viewing angle was changed from normal incidence (i.e., 0 degrees) to oblique incidence. Accordingly, the low-reflectivity regions (and not necessarily the lowest reflectivity regions) have a reduced color, (i.e., the low-reflectivity regions are closer to the (a*, b*) origin), achieved through variation of the thicknesses and dispersion of the two impedance-matching layers of the design.

Figure 11:
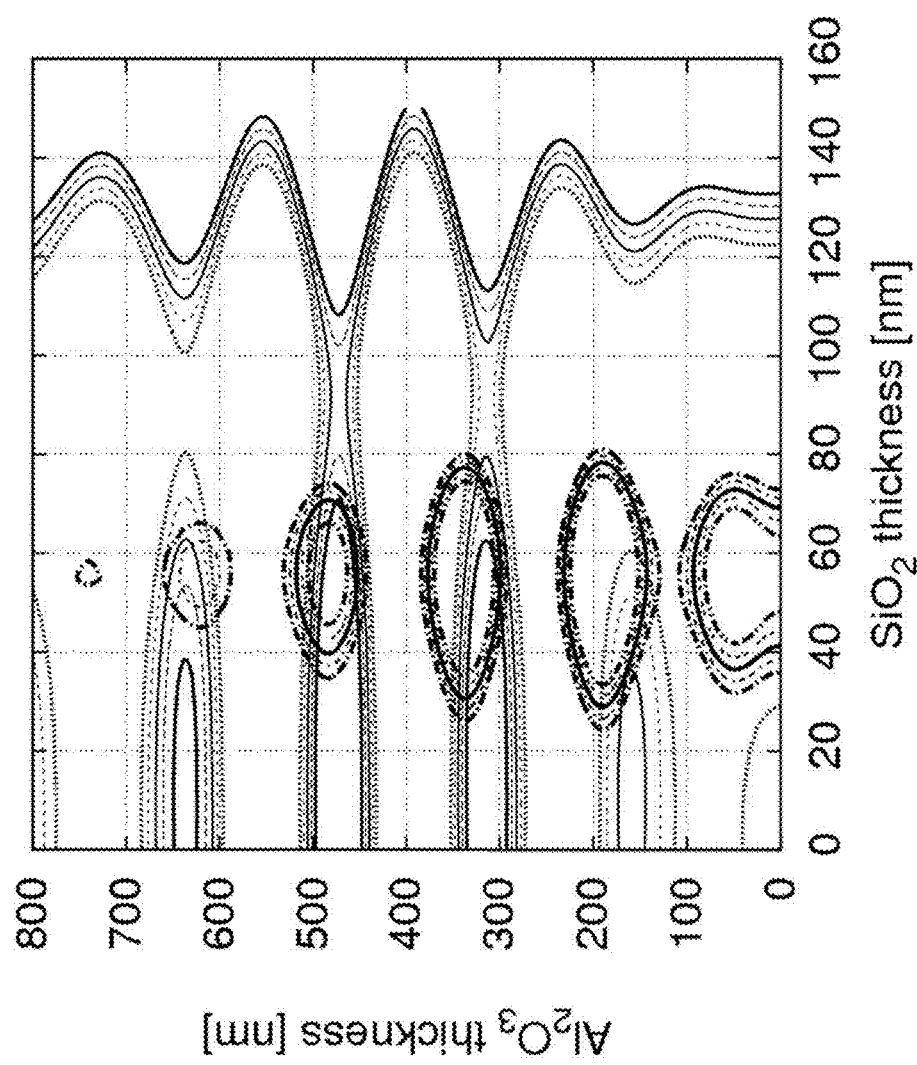
FIG. 11 is a contour plot showing the color transmittance of an optical film structure according to Example 1.

In Example 1, the impedance-matching layers of an optical film structure include $Al_2O_3$ and $SiO_2$ layers surrounding a layer having a high refractive index and a relatively high hardness (e.g., $AlO_xN_y$, where x≥0). Specifically, in Example 1, samples having an optical film structure including a first sub-layer of $Al_2O_3$, a second sub-layer of $AlO_xN_y$, and a second layer of $SiO_2$, were prepared and the refractive index and extinction coefficient values of each layer was measured using ellipsometry. The thicknesses of the $Al_2O_3$ and $SiO_2$ layers were varied using modeling, as described above, based on the measured refractive index and extinction coefficient values. The thickness of the $AlO_xN_y$ layer was constant. For each thickness of the $SiO_2$ and $Al_2O_3$ layers, the L*a*b* color coordinates of the samples according to Example 1 were predicted. FIG. 11 shows a contour plot of the optical film structure color performance, in transmission, according to Example 1, in which the conditions for a* is zero and b* is zero. Additionally, the distance in (a*, b*) space of the design's performance from the origin gives a measure of nearness to a truly unbiased, white (or colorless) transparency.

For the contour plot shown in FIG. 11, the $AlO_xN_y$ thickness is held constant at 1850 nm and the thicknesses of the $SiO_2$ and $Al_2O_3$ layers are varied from 0 to 160 nm and 0 to 800 nm, respectively, using modeling as described above. Dispersion functions that were fit to experimental measurements of the refractive index and extinction coefficients of layers including the three materials were utilized.

The contour plot shown in FIG. 11 is limited to contours near zero, to provide data regarding the sensitivity of the low-color solution (a*, b*)≈(0, 0) to the design parameters (i.e., the SiO$_2$ layer and Al$_2$O$_3$ layer thicknesses). Other contours levels were suppressed for clarity.

The results indicate that there are coincident solutions in the regions where the solid, thinnest contour line (where a*=0.0) and the dashed, thickest contour line (where b*=0.0) intersect or nearly intersect. The inclusion of SiO$_2$, Al$_2$O$_3$, and AlO$_x$N$_y$ layers having the thicknesses at these intersections in FIG. 11 would provide an optical film structure having a colorless transmittance. Such optical film structures are shown in Table 1.

TABLE 1

Optical Film Structures having colorless transmittance from FIG. 11.

| | SiO$_2$ | AlOxNy | Al$_2$O$_3$ |
|---|---|---|---|
| Optical Film Structure 1 | 40 nm | 1850 nm | 500 nm |
| Optical Film Structure 2 | 52 nm | 1850 nm | 440 nm |
| Optical Film Structure 3 | 62 nm | 1850 nm | 450 nm |
| Optical Film Structure 4 | 30 nm | 1850 nm | 350 nm |
| Optical Film Structure 5 | 75 nm | 1850 nm | 330 nm |
| Optical Film Structure 6 | 35 nm | 1850 nm | 160 nm |

Figure 12:
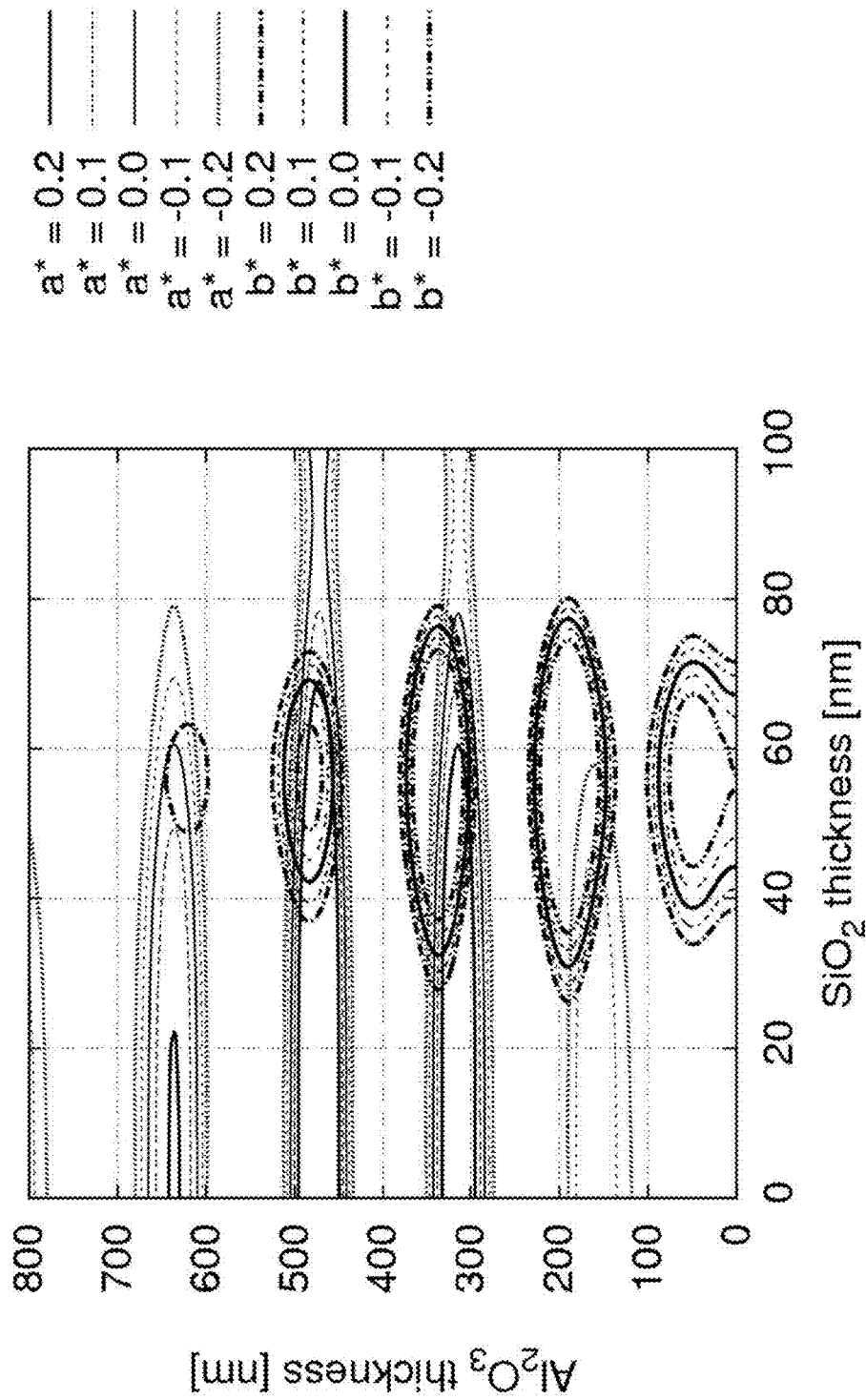
FIG. 12 is a contour plot showing the color transmittance of the optical film structure according to Example 2.

In Example 2, the refractive index and extinction coefficient values measured in Example 1 were utilized. The thicknesses of Al$_2$O$_3$ and SiO$_2$ layers were varied using modeling, as described above, based on the measured refractive index and extinction coefficient values; however, the thickness of the AlO$_x$N$_y$ layer was constant at about 2000 nm. For each modeled thickness of the SiO$_2$ and Al$_2$O$_3$ layers, the L*a*b* color coordinates of the samples according to Example 2 were predicted. In relation to Example 1, the thickness of the AlO$_x$N$_y$ layer was increased to 2000 nm to show the dependence of the contours on the thickness of the AlO$_x$N$_y$ layer. FIG. 12 is a contour plot of the optical film structure color performance, in transmission, according to Example 2.

The inclusion of SiO$_2$, Al$_2$O$_3$, and AlO$_x$N$_y$ layers having the thicknesses at these intersections in FIG. 12 would provide an optical film structure having a colorless transmittance. Such optical film structures are shown in Table 2.

TABLE 2

Optical Film Structures having colorless transmittance from FIG. 12.

| | SiO$_2$ | AlOxNy | Al$_2$O$_3$ |
|---|---|---|---|
| Optical Film Structure 7 | 43 nm | 2000 nm | 500 nm |
| Optical Film Structure 8 | 67 nm | 2000 nm | 490 nm |
| Optical Film Structure 9 | 62 nm | 2000 nm | 450 nm |
| Optical Film Structure 10 | 35 nm | 2000 nm | 350 nm |
| Optical Film Structure 11 | 63 nm | 2000 nm | 300 nm |
| Optical Film Structure 12 | 75 nm | 2000 nm | 380 nm |

Figure 13:
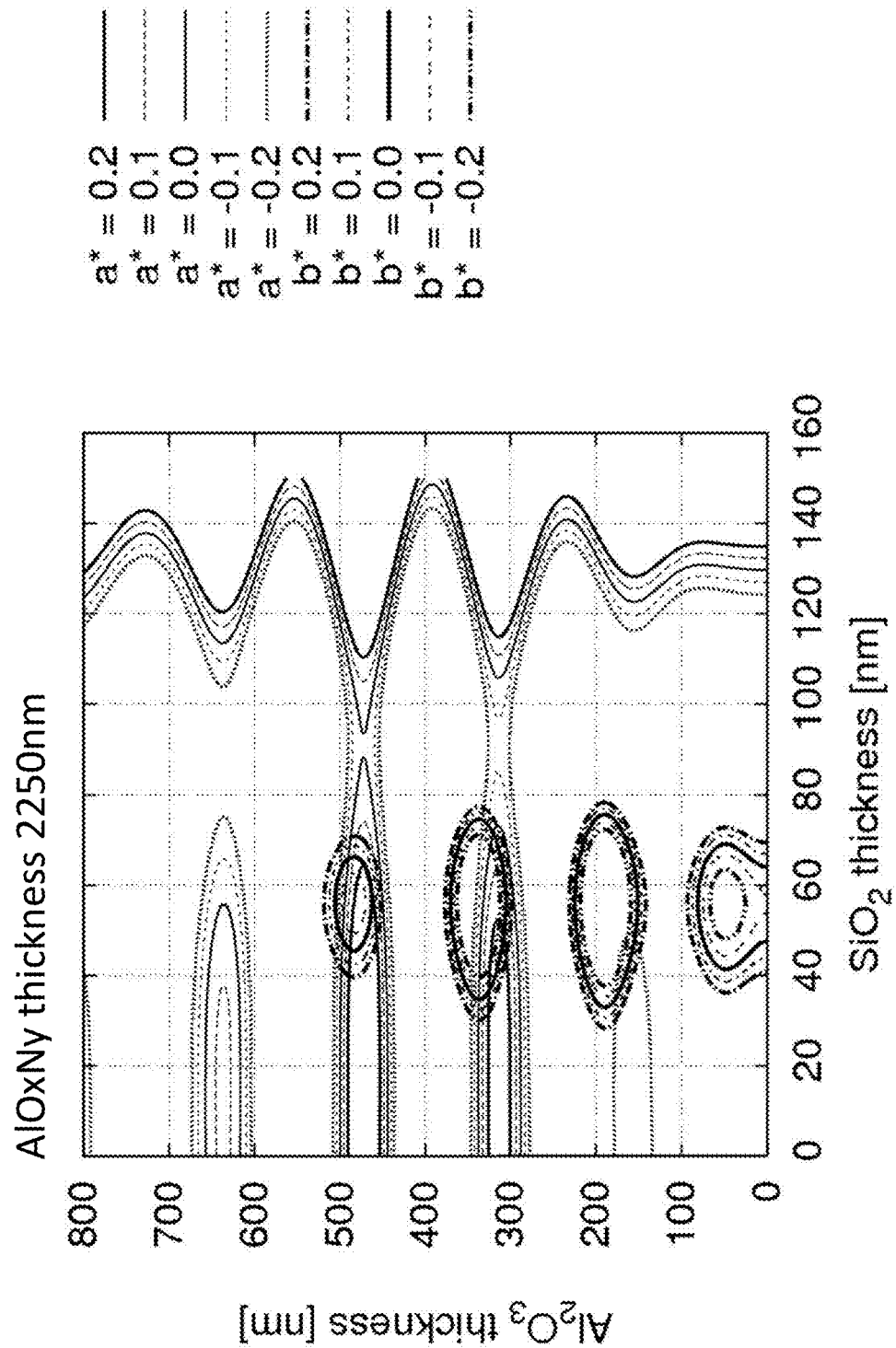
FIG. 13 is a contour plot showing the color transmittance of the optical film structure according to Example 3.

In Example 3, the refractive index and extinction coefficient values measured in Example 1 were utilized. The thicknesses of Al$_2$O$_3$ and SiO$_2$ layers were varied using modeling, as described above, based on the measured refractive index and extinction coefficient values; however, the thickness of the AlO$_x$N$_y$ layer was constant at about 2250 nm. FIG. 13 is a contour plot of the optical film structure color performance, in transmission, according to Example 3, in which the AlO$_x$N$_y$ layer has a constant thickness of 2250 nm.

The inclusion of SiO$_2$, Al$_2$O$_3$, and AlO$_x$N$_y$ layers having the thicknesses at these intersections in FIG. 13 would provide an optical film structure having a colorless transmittance. Such optical film structures are shown in Table 3.

TABLE 3

Optical Film Structures having colorless transmittance from FIG. 13.

| | SiO$_2$ | AlOxNy | Al$_2$O$_3$ |
|---|---|---|---|
| Optical Film Structure 13 | 48 nm | 2250 nm | 495 nm |
| Optical Film Structure 14 | 65 nm | 2250 nm | 490 nm |
| Optical Film Structure 15 | 60 nm | 2250 nm | 310 nm |
| Optical Film Structure 16 | 37 nm | 2250 nm | 350 nm |
| Optical Film Structure 17 | 72 nm | 2250 nm | 320 nm |

Figure 14:
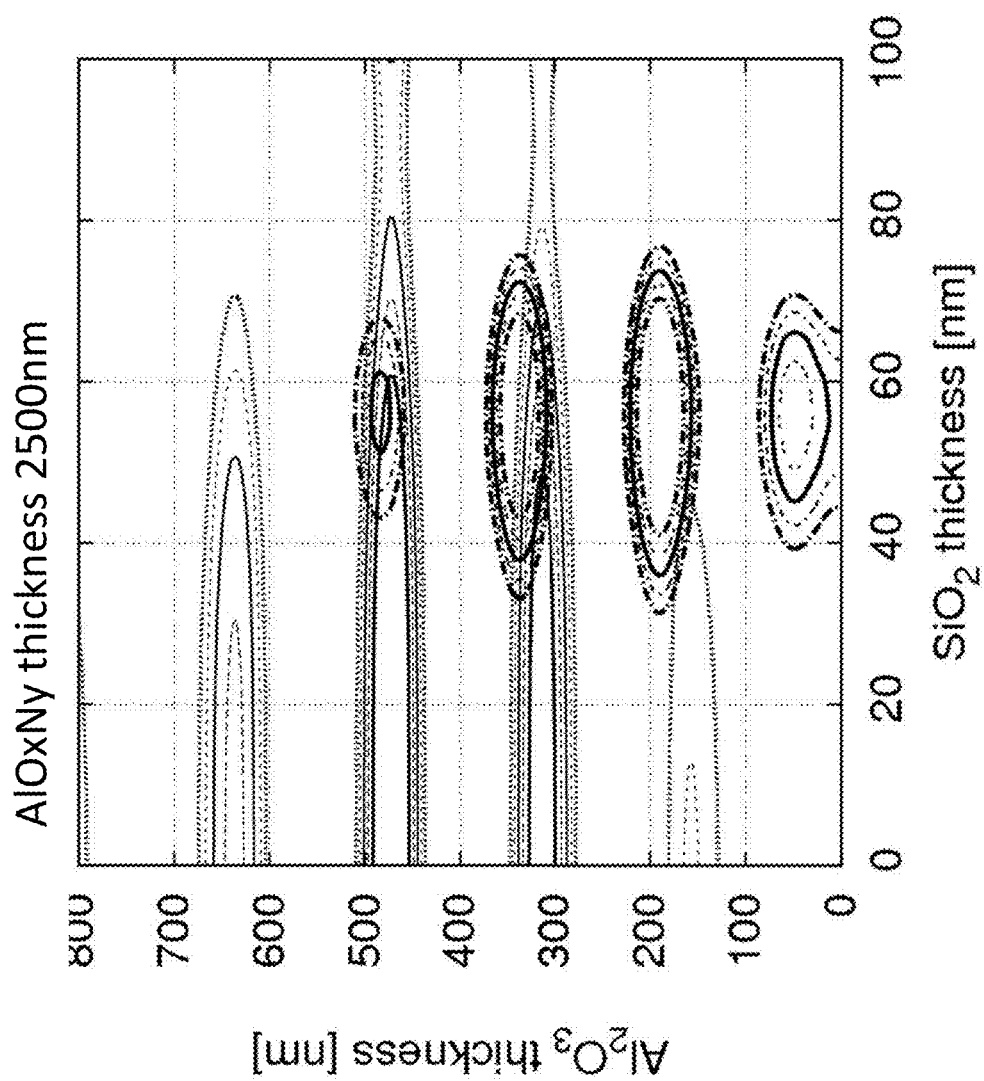
FIG. 14 is a contour plot showing the color transmittance of the optical film structure according to Example 4.

In Example 4, the retractive index an extinction coefficient values measure in Example 1 were utilized. The thicknesses of Al$_2$O$_3$ and SiO$_2$ layers were varied using modeling, as described above, based on the measured refractive index and extinction coefficient values; however, the thickness of the AlO$_x$N$_y$ layer was constant at about 2500 nm. FIG. 14 is a contour plot of the optical film structure color performance, in transmission, according to Example 4, in which the AlO$_x$N$_y$ layer has a constant thickness of 2500 nm.

The inclusion of SiO$_2$, Al$_2$O$_3$, and AlO$_x$N$_y$ layers having the thicknesses at these intersections in FIG. 14 would provide an optical film structure having a colorless transmittance. Such optical film structures are shown in Table 4.

TABLE 4

Optical Film Structures having colorless transmittance from FIG. 14.

| | SiO$_2$ | AlOxNy | Al$_2$O$_3$ |
|---|---|---|---|
| Optical Film Structure 18 | 53 nm | 2500 nm | 490 nm |
| Optical Film Structure 19 | 60 nm | 2500 nm | 490 nm |
| Optical Film Structure 20 | 38 nm | 2500 nm | 240 nm |
| Optical Film Structure 21 | 68 nm | 2500 nm | 325 nm |

Figure 15:
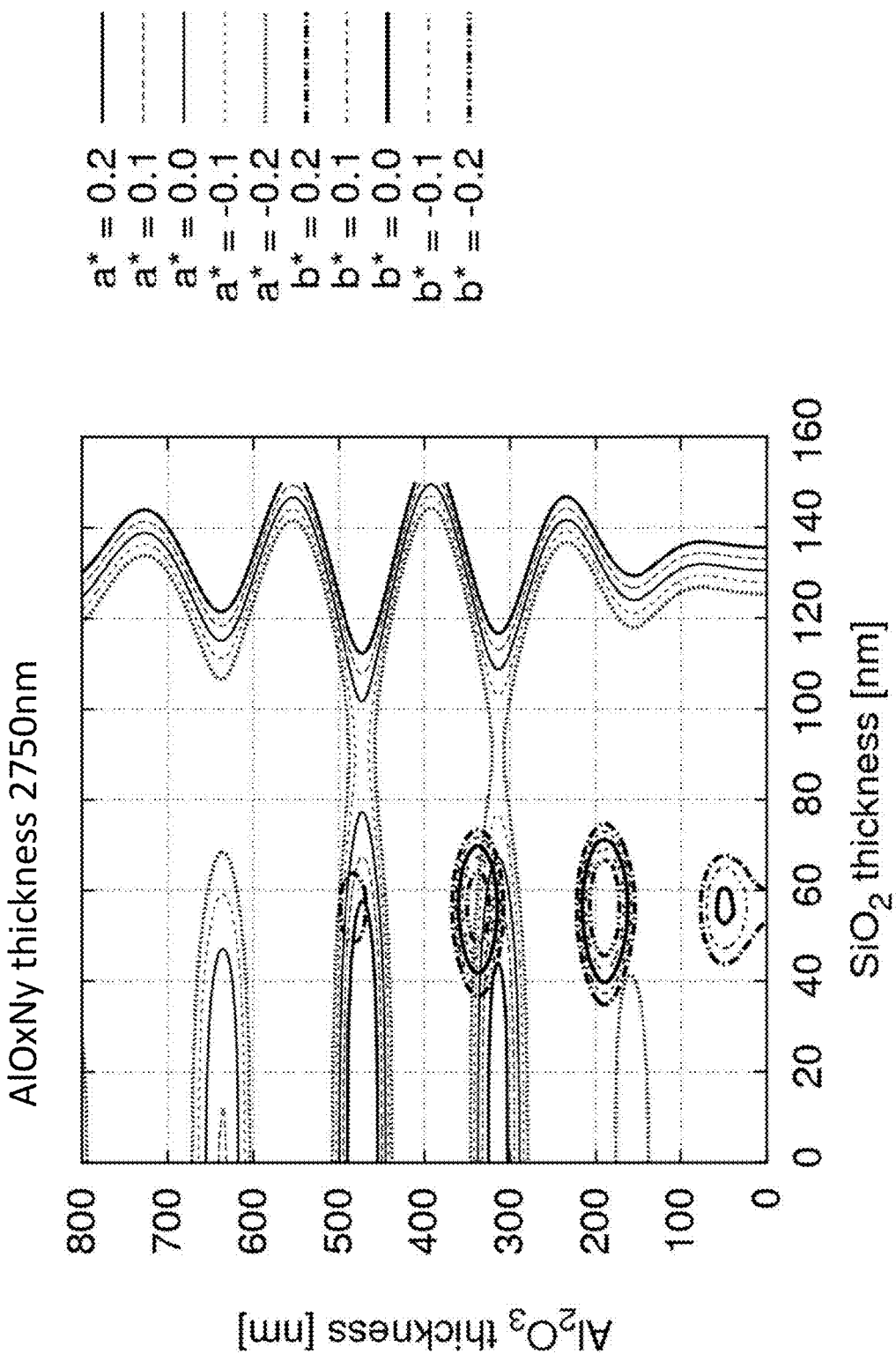
FIG. 15 is a contour plot showing the color transmittance of the optical film structure according to Example 5.

In Example 5, the refractive index and extinction coefficient values measured in Example 1 were utilized. The thicknesses of Al$_2$O$_3$ and SiO$_2$ layers were varied using modeling, as described above, based on the measured refractive index and extinction coefficient values; however, the thickness of the AlO$_x$N$_y$ layer was constant at about 2750 nm. FIG. 15 is a contour plot of the optical film structure color performance, in transmission, according to Example 5, in which the AlO$_x$N$_y$ layer has a constant thickness of 2750 nm.

The inclusion of SiO$_2$, Al$_2$O$_3$, and AlO$_x$N$_y$ layers having the thicknesses at these intersections in FIG. 15 would provide an optical film structure having a colorless transmittance. Such optical film structures are shown in Table 5.

TABLE 5

Optical Film Structures having colorless transmittance from FIG. 15.

| | SiO$_2$ | AlOxNy | Al$_2$O$_3$ |
|---|---|---|---|
| Optical Film Structure 22 | 42 nm | 2750 nm | 340 nm |
| Optical Film Structure 23 | 65 nm | 2750 nm | 330 nm |

Figure 16:
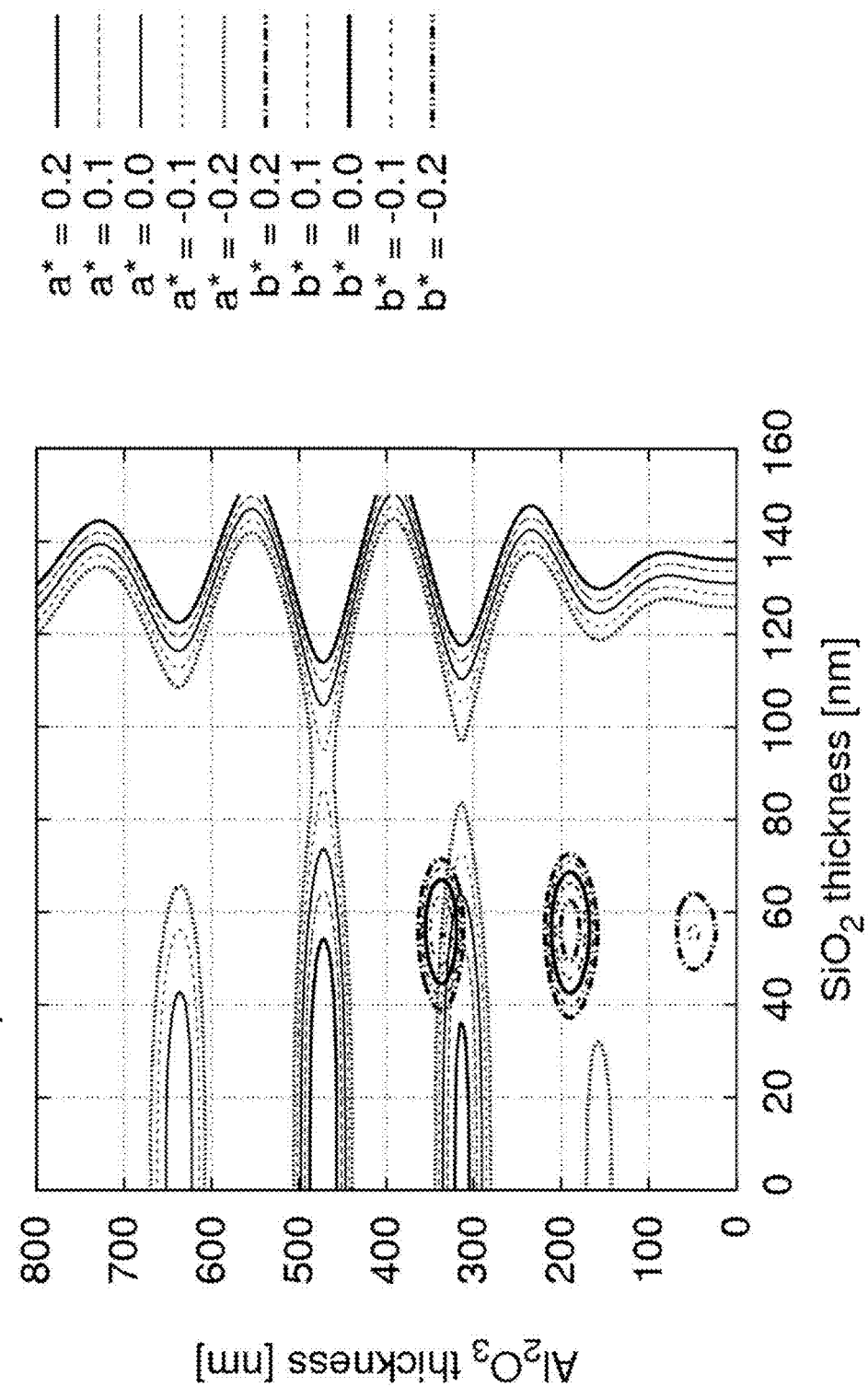
FIG. 16 is a contour plot showing the color transmittance of the optical film structure according to Example 6.

In Example 6, the refractive index an extinction coefficient values measure in Example 1 were utilized. The thicknesses of Al$_2$O$_3$ and SiO$_2$ layers were varied using modeling, as described above, based on the measured refractive index and extinction coefficient values; however, the thickness of the $AlO_xN_y$ layer was constant at about 3000 nm. FIG. 16 is a contour plot of the optical film structure color performance, in transmission, according to Example 6, in which the $AlO_xN_y$ layer has a constant thickness of 3000 nm.

The inclusion of $SiO_2$, $Al_2O_3$, and $AlO_xN_y$ layers having the thicknesses at these intersections in FIG. 16 would provide an optical film structure having a colorless transmittance. Such optical film structures are shown in Table 6.

TABLE 6

Optical Film Structures having colorless transmittance from FIG. 16.

| | $SiO_2$ | AlOxNy | $Al_2O_3$ |
|---|---|---|---|
| Optical Film Structure 24 | 42 nm | 3000 nm | 340 nm |
| Optical Film Structure 25 | 61 nm | 3000 nm | 320 nm |

Figure 17:
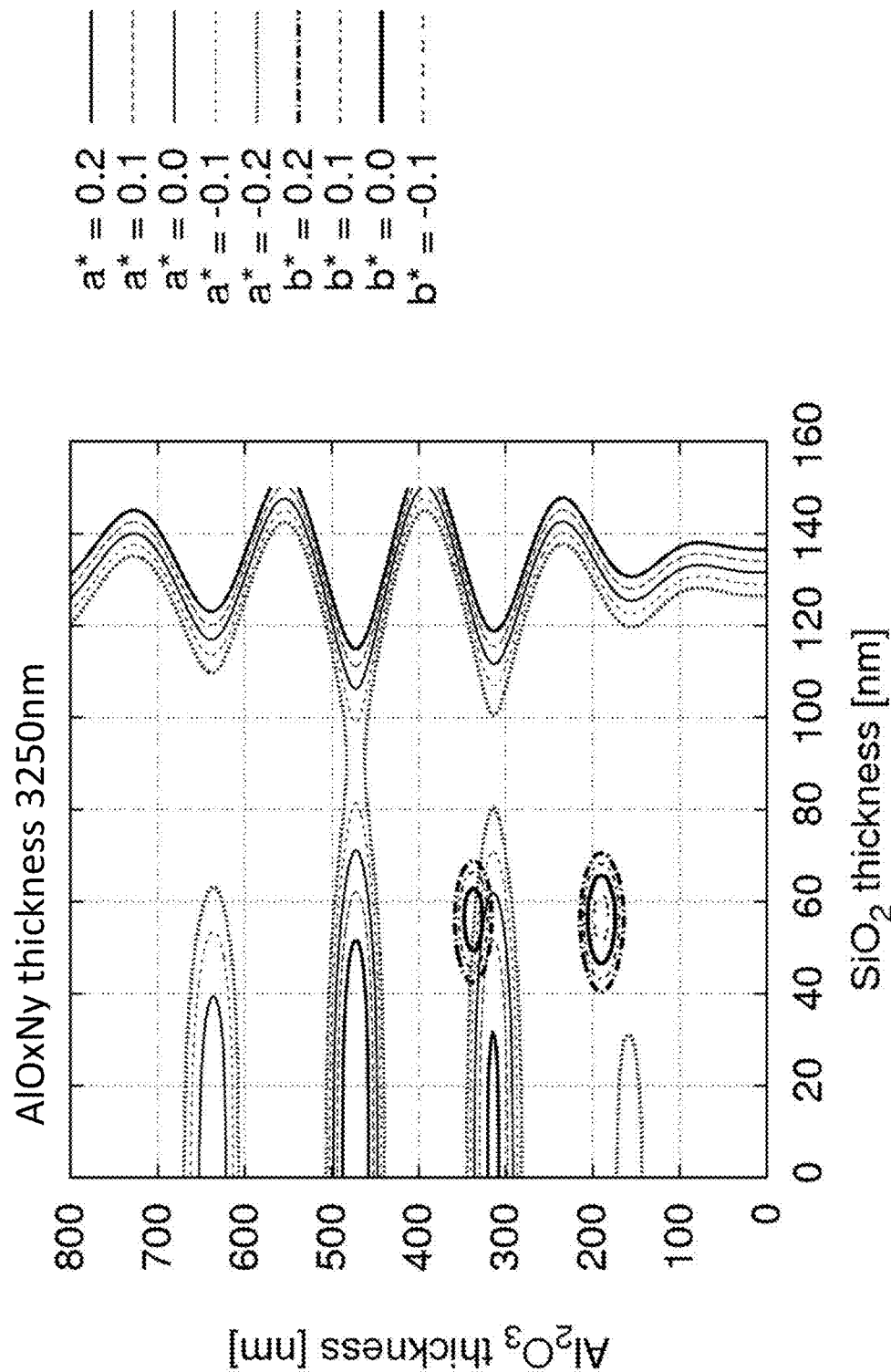
FIG. 17 is a contour plot showing the color transmittance of the optical film structure according to Example 7.

In Example 7, the refractive index and extinction coefficient values measured in Example 1 were utilized. The thicknesses of $Al_2O_3$ and $SiO_2$ layers were varied using modeling, as described above, based on the measured refractive index and extinction coefficient values; however the thickness of the $AlO_xN_y$ layer was constant at about 3250 nm. FIG. 17 is a contour plot of the optical film structure color performance, in transmission, according to Example 7, in which the $AlO_xN_y$ layer has a constant thickness of 3250 nm.

The inclusion of $SiO_2$, $Al_2O_3$, and $AlO_xN_y$ layers having the thicknesses at this intersection in FIG. 17 would provide an optical film structure having a colorless transmittance. Such optical film structure is shown in Table 7.

TABLE 7

Optical Film Structure having colorless transmittance from FIG. 17.

| | $SiO_2$ | AlOxNy | $Al_2O_3$ |
|---|---|---|---|
| Optical Film Structure 26 | 55 nm | 3250 nm | 330 nm |

Figure 18:
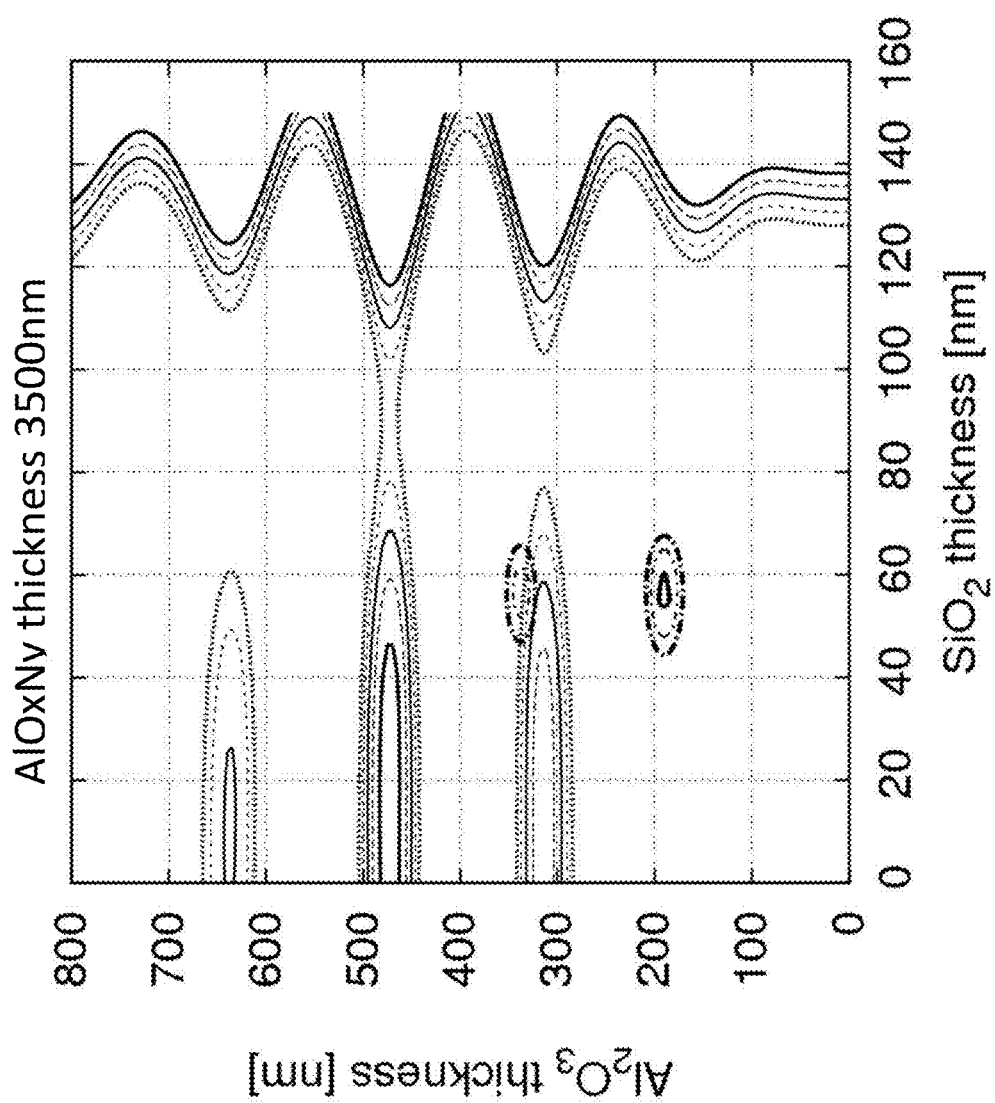
FIG. 18 is a contour plot showing the color transmittance of the optical film structure according to Example 8.
Figure 19B:
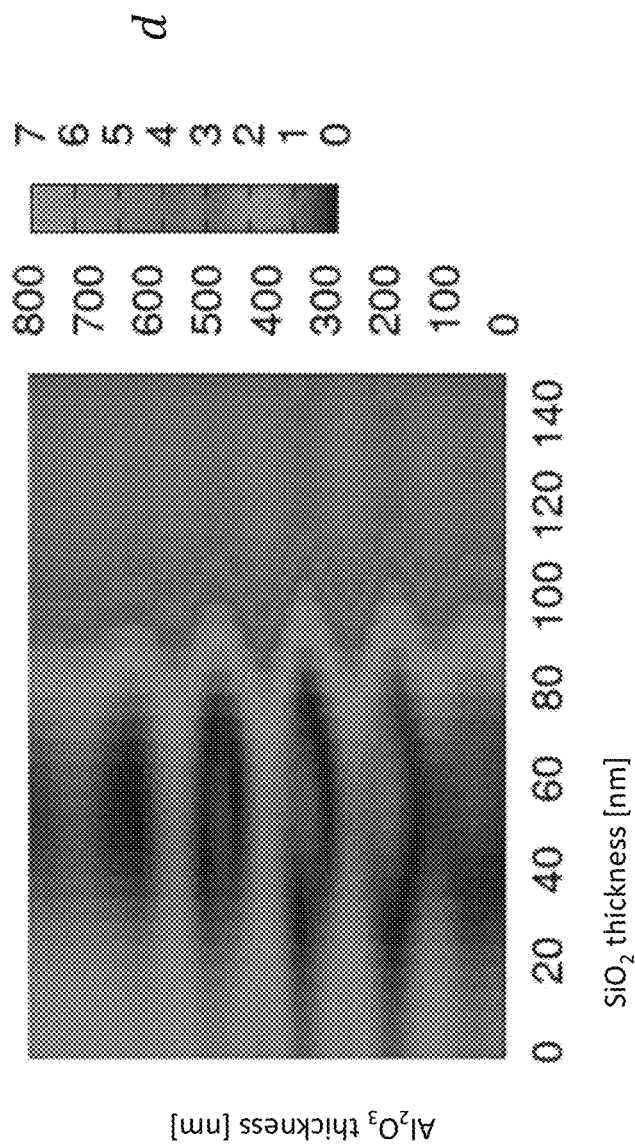
FIG. 19B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 1.
Figure 19C:
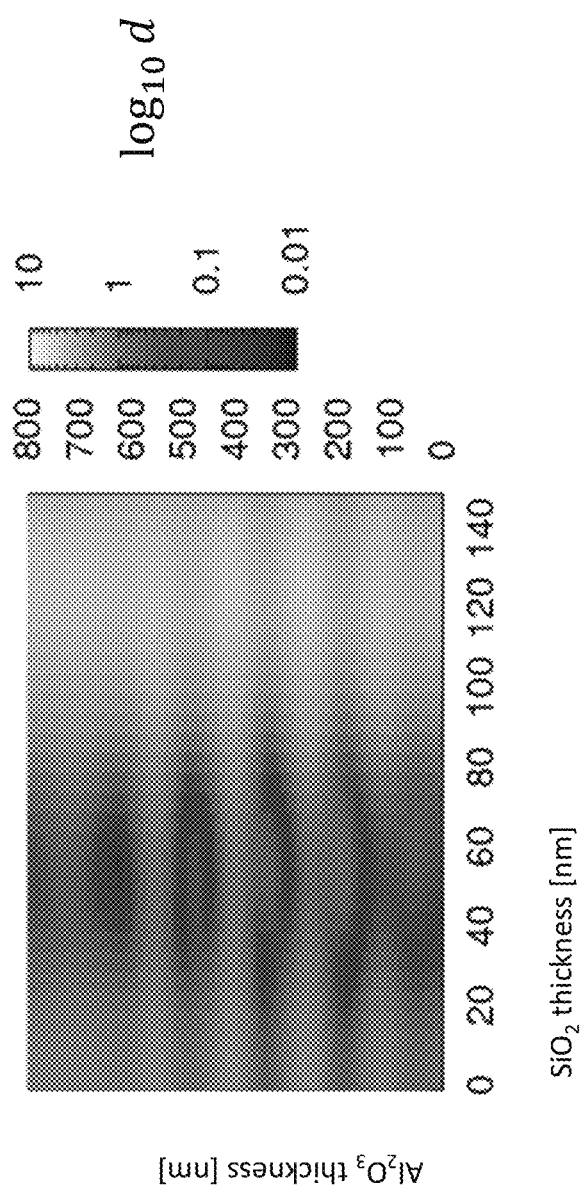
FIG. 19C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 1.
Figure 20B:
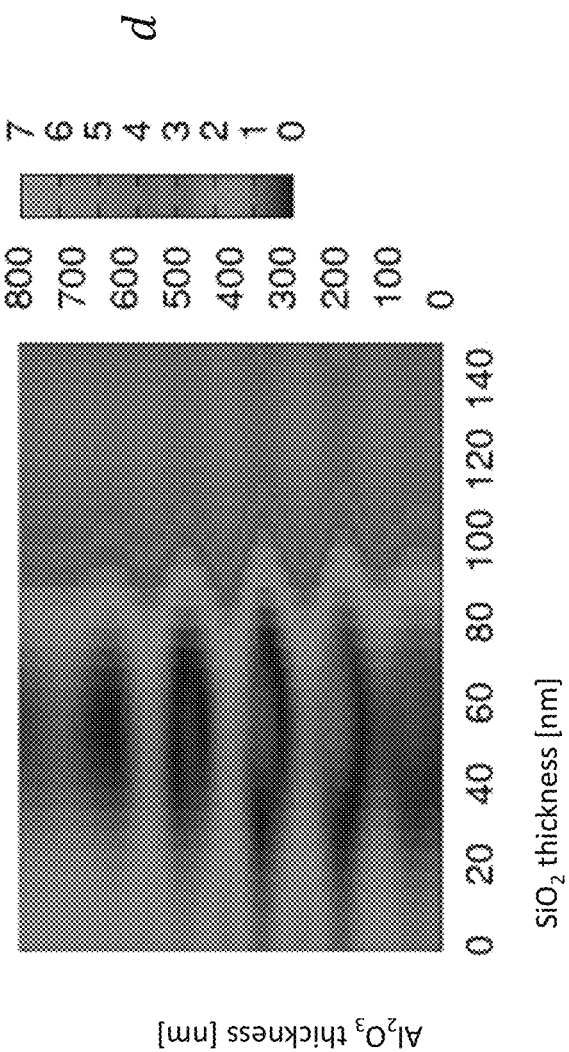
FIG. 20B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 2.
Figure 21A:
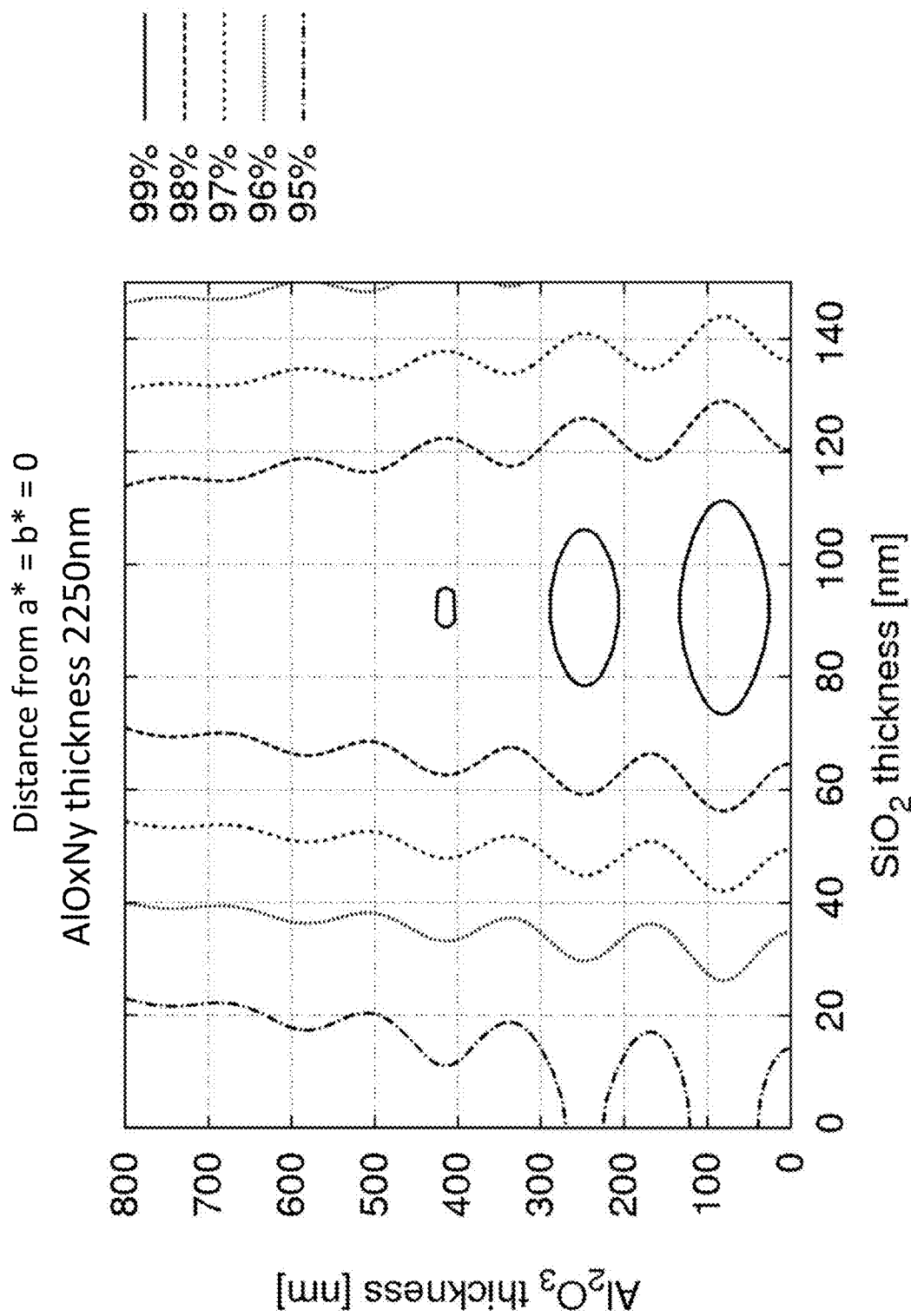
FIG. 21A is a contour plot of the luminosity, L*, in transmittance, for Example 3.
Figure 22B:
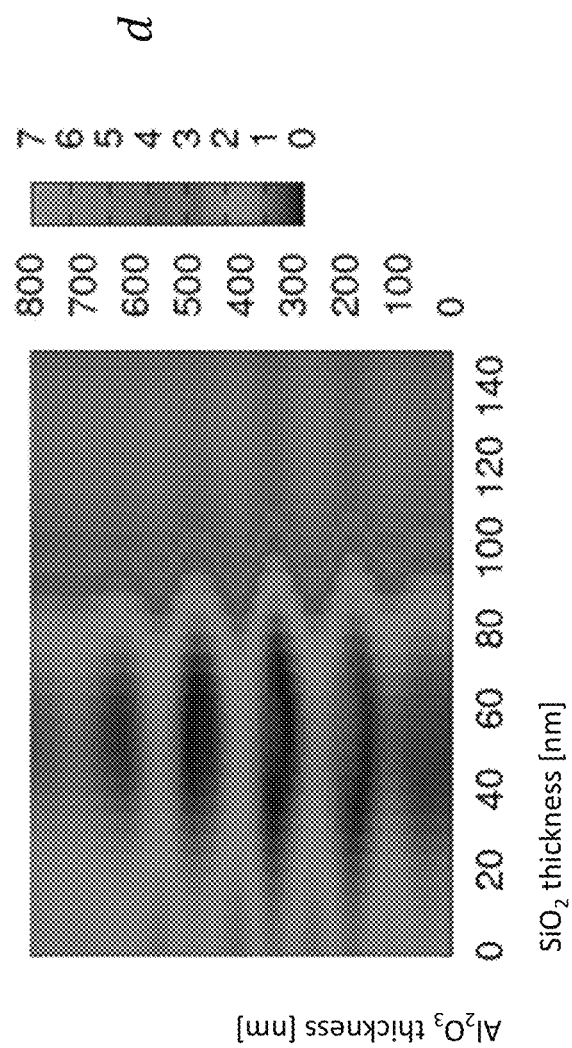
FIG. 22B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 4.
Figure 22C:
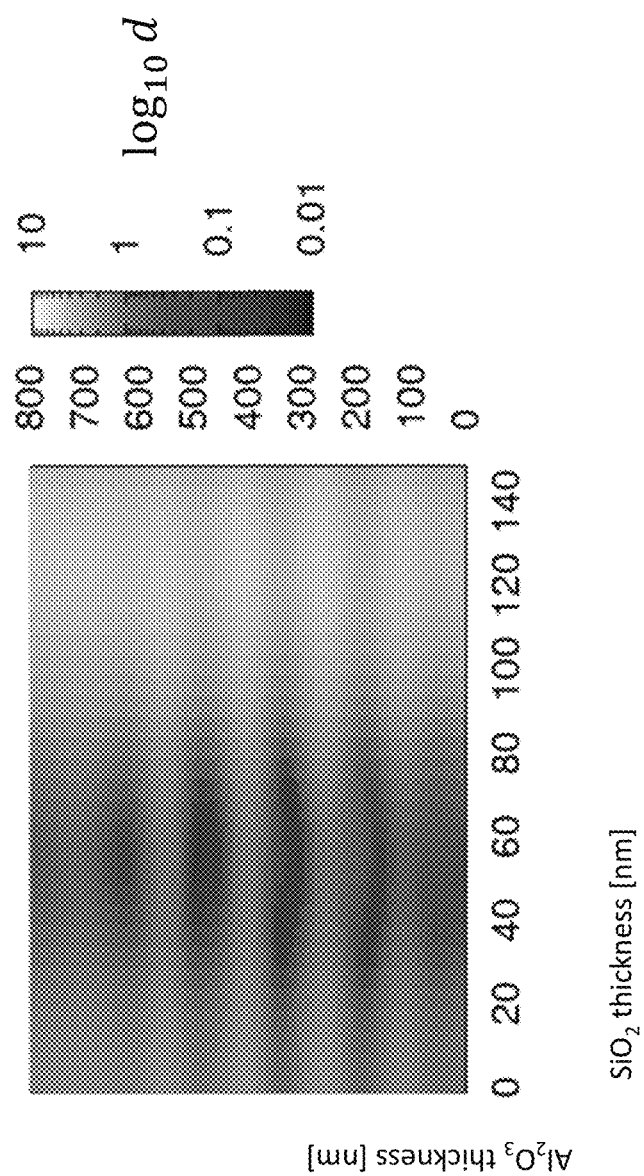
FIG. 22C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 4.
Figure 23B:
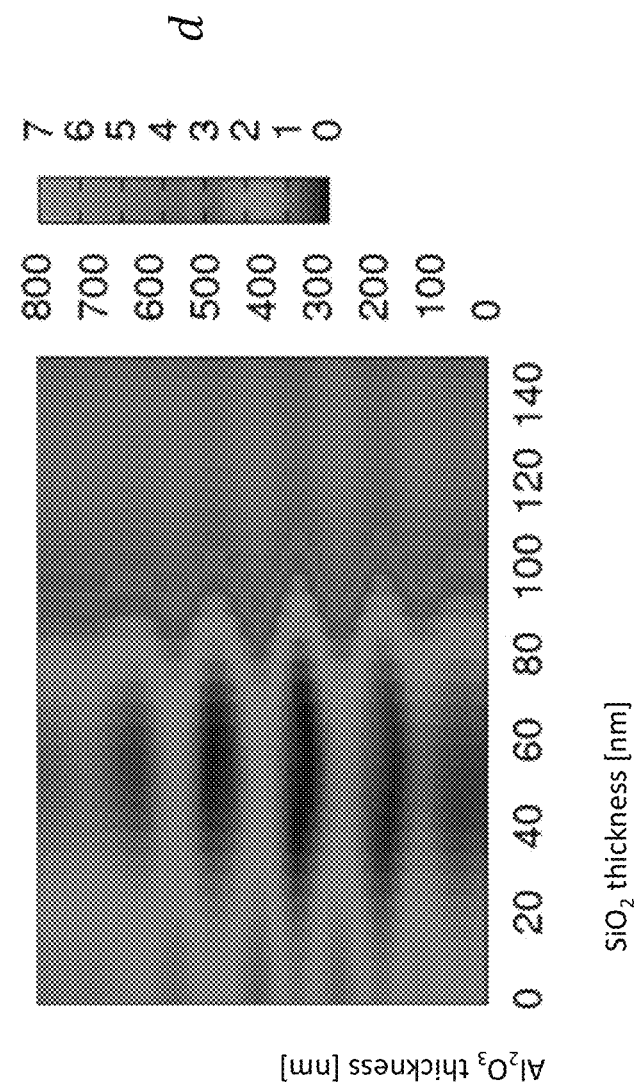
FIG. 23B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 5.
Figure 23C:
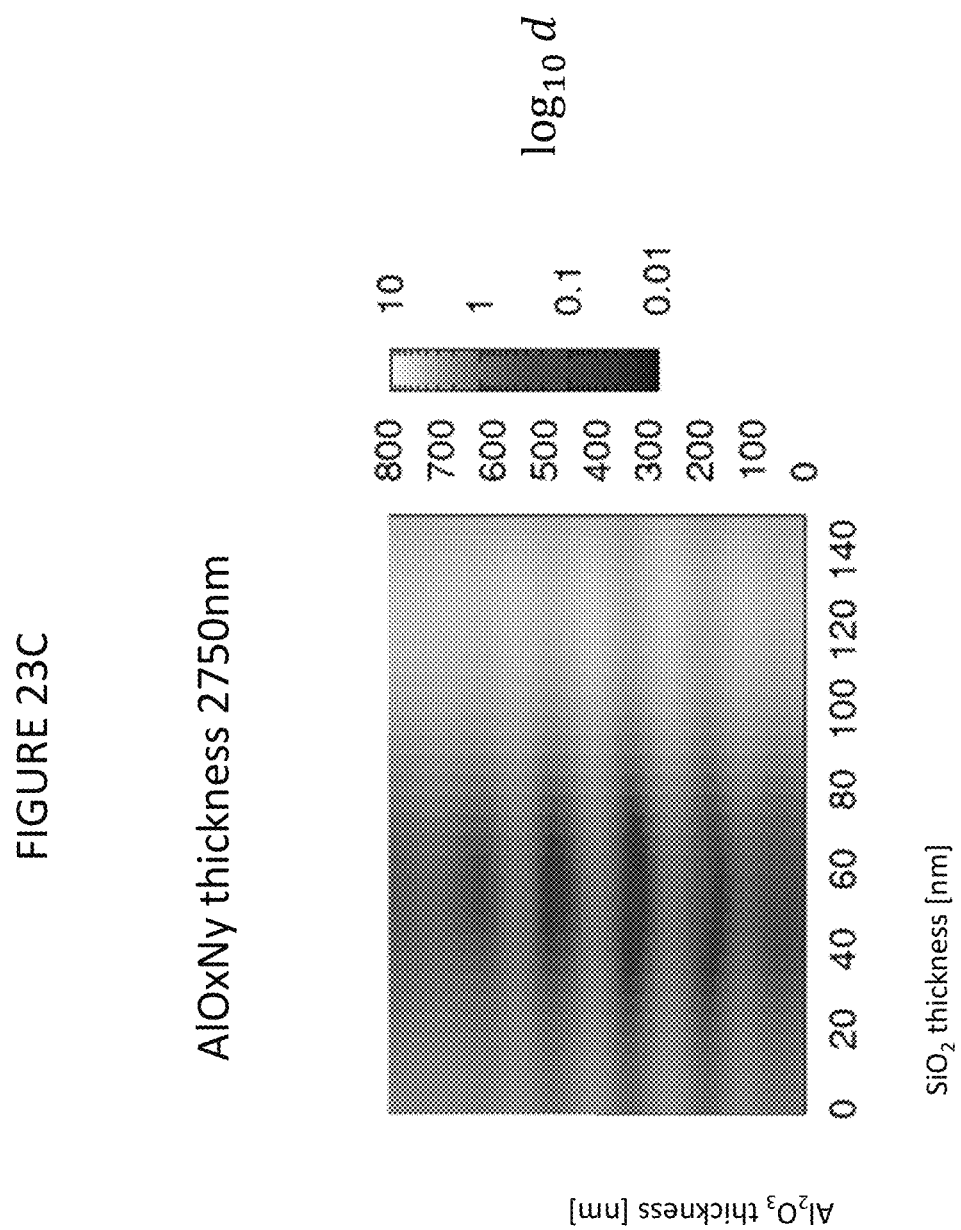
FIG. 23C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 5.
Figure 24A:
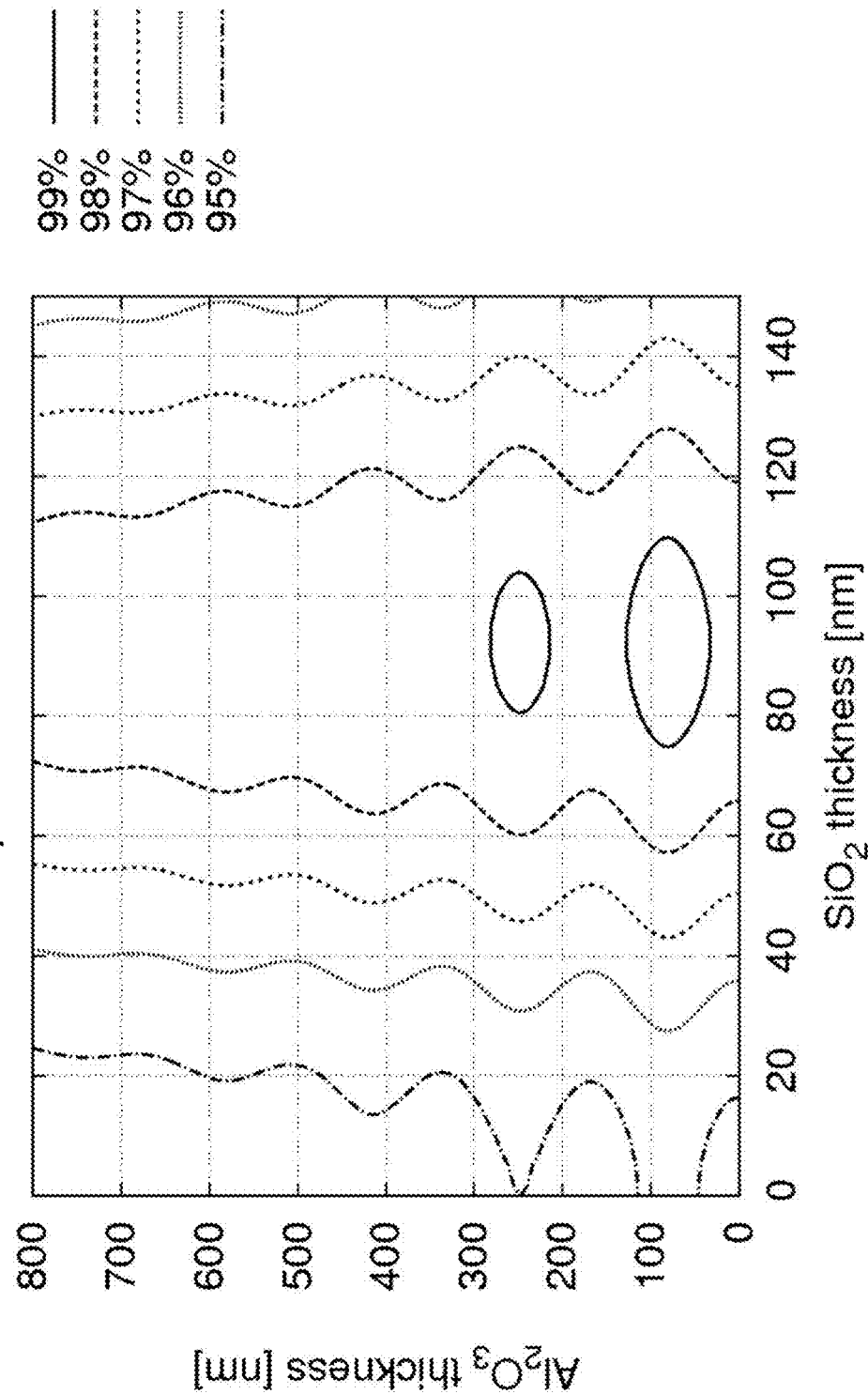
FIG. 24A is a contour plot of the luminosity, L*, in transmittance, for Example 6.
Figure 24B:
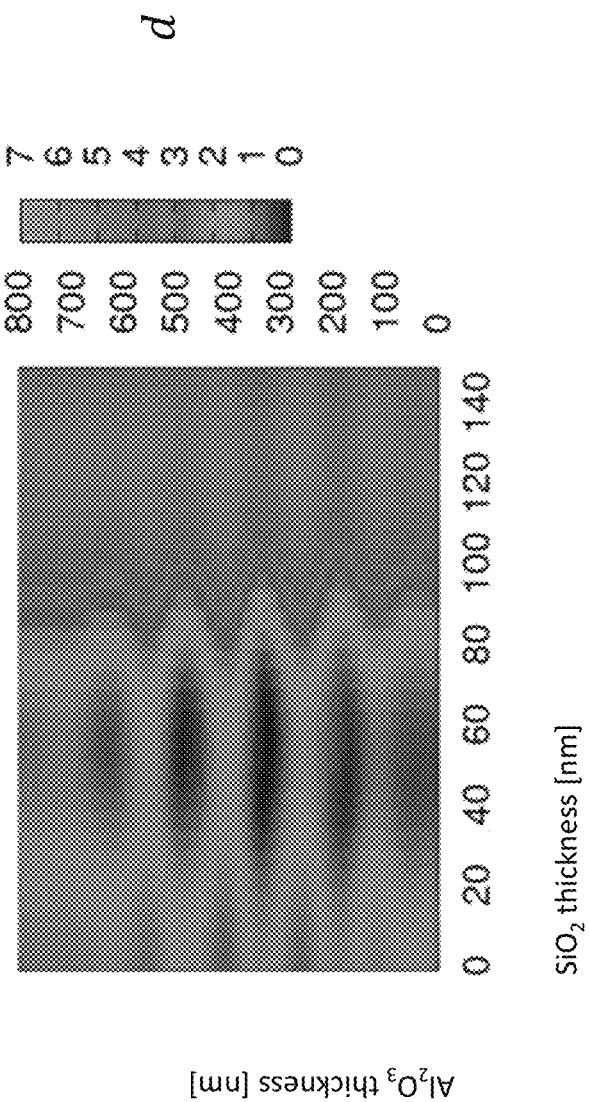
FIG. 24B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 6.
Figure 24C:
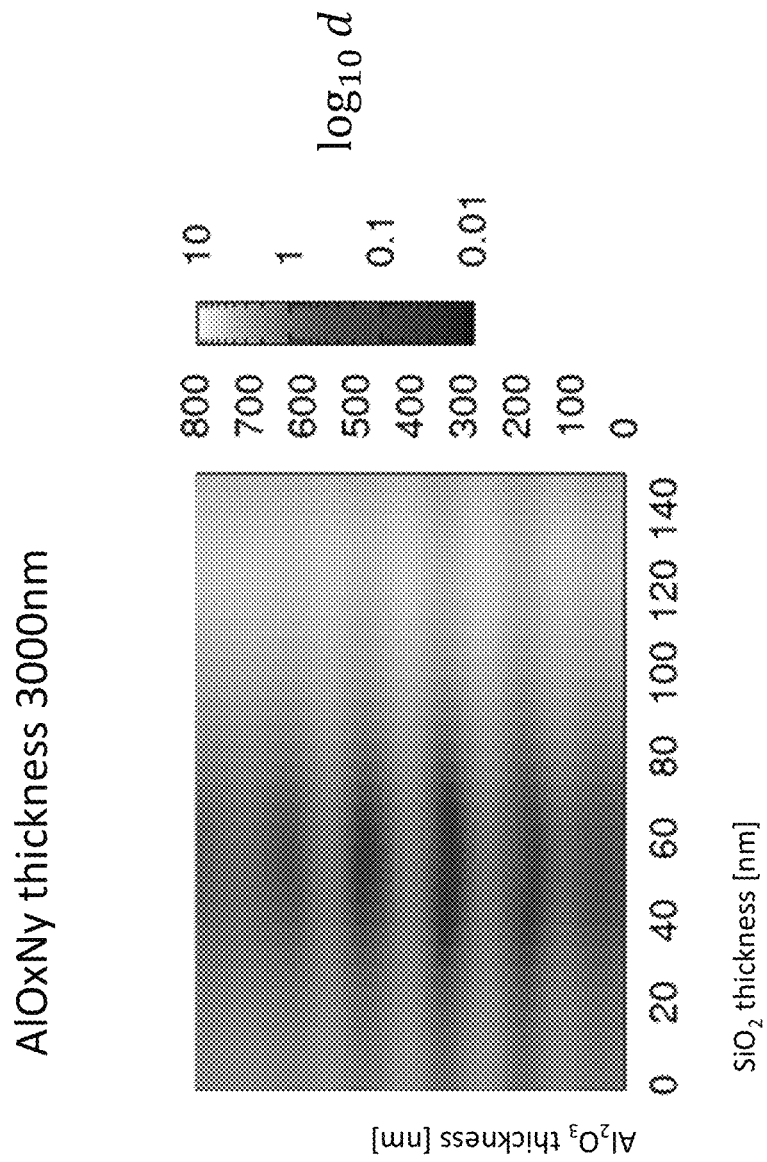
FIG. 24C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 6.
Figure 25B:
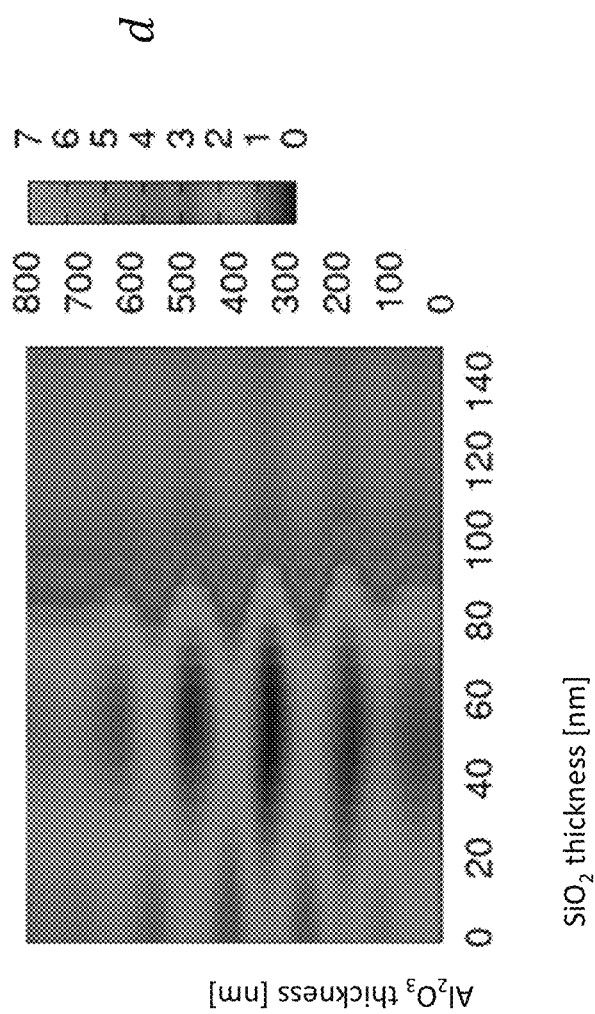
FIG. 25B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 7.
Figure 25C:
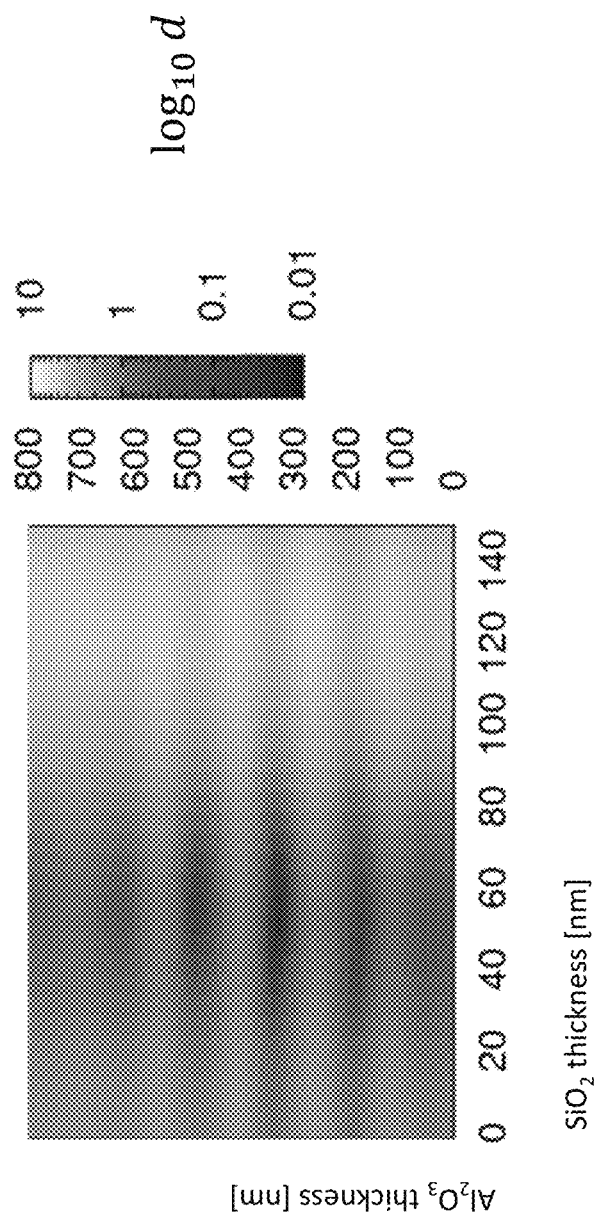
FIG. 25C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 7.
Figure 26A:
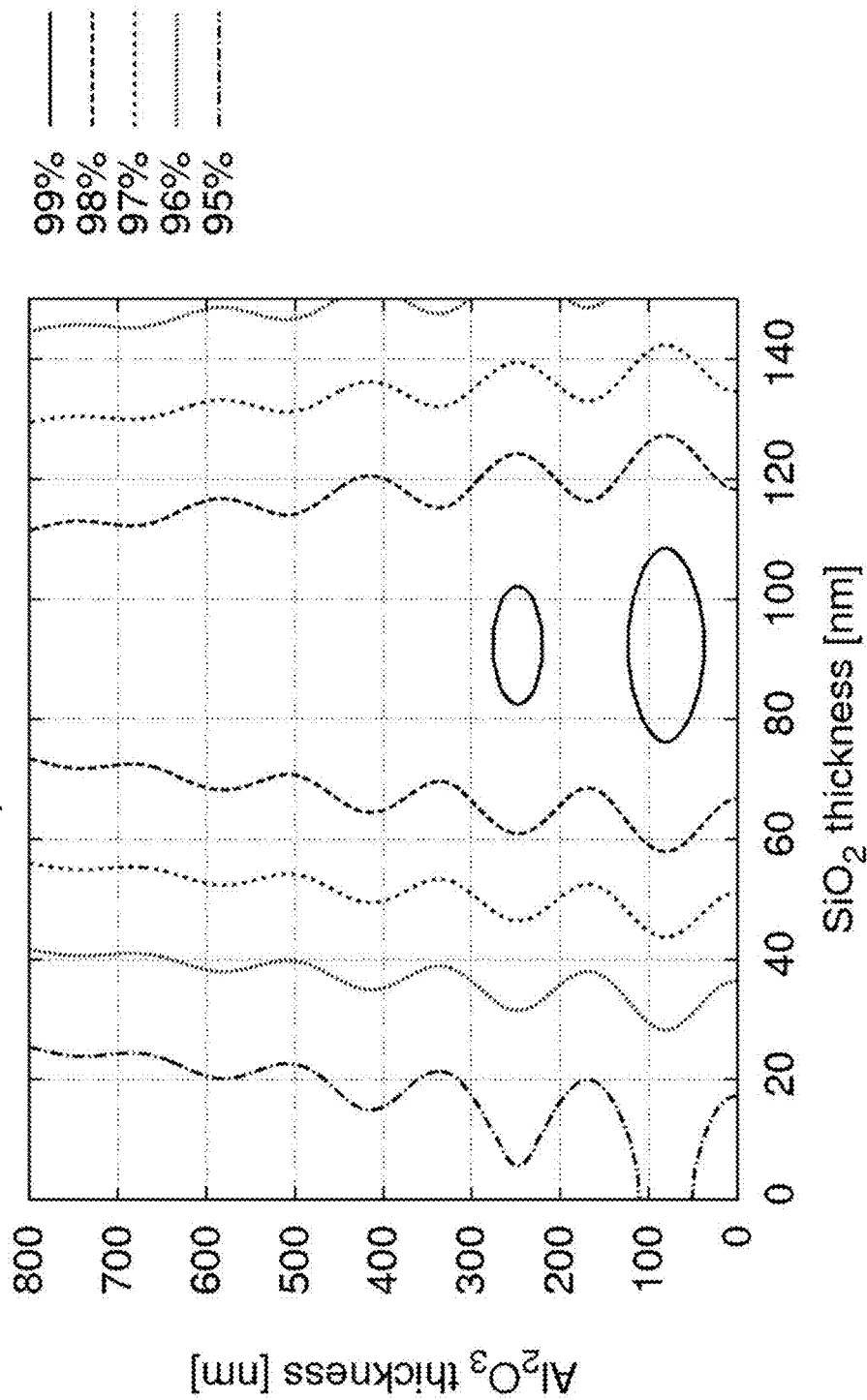
FIG. 26A is a contour plot of the luminosity, L*, in transmittance, for Example 8.
Figure 26B:
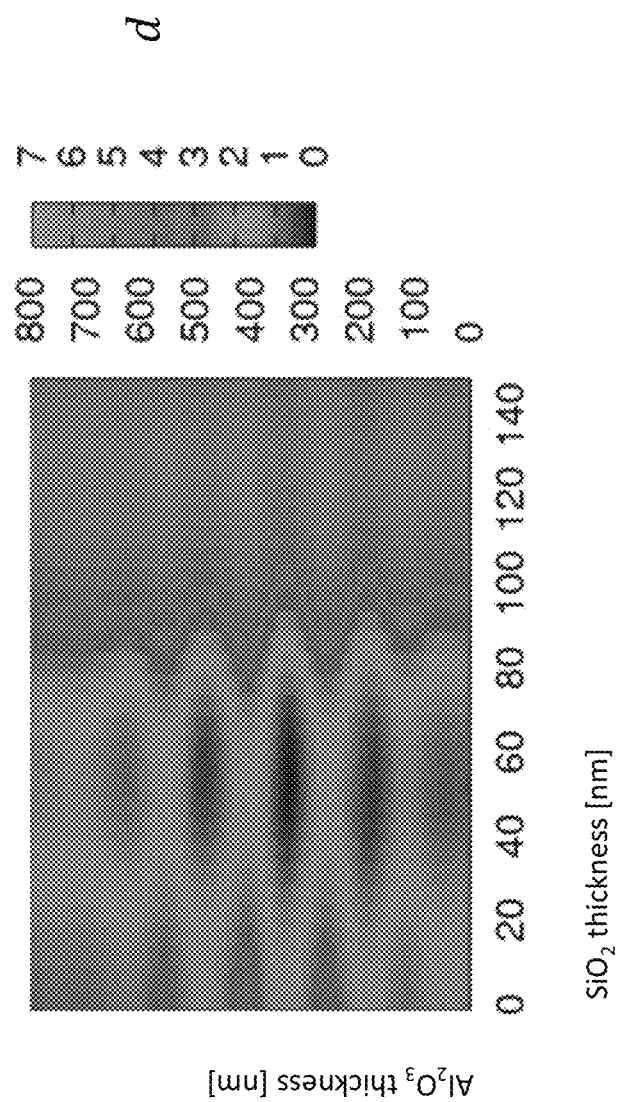
FIG. 26B is a plot showing the distance, d, of a particular color point (a*, b*), in transmittance, corresponding to the $SiO_2$ and $Al_2O_3$ film thicknesses as indicated by the axes from the origin (0, 0) in the L*a*b* color space for Example 8.
Figure 26C:
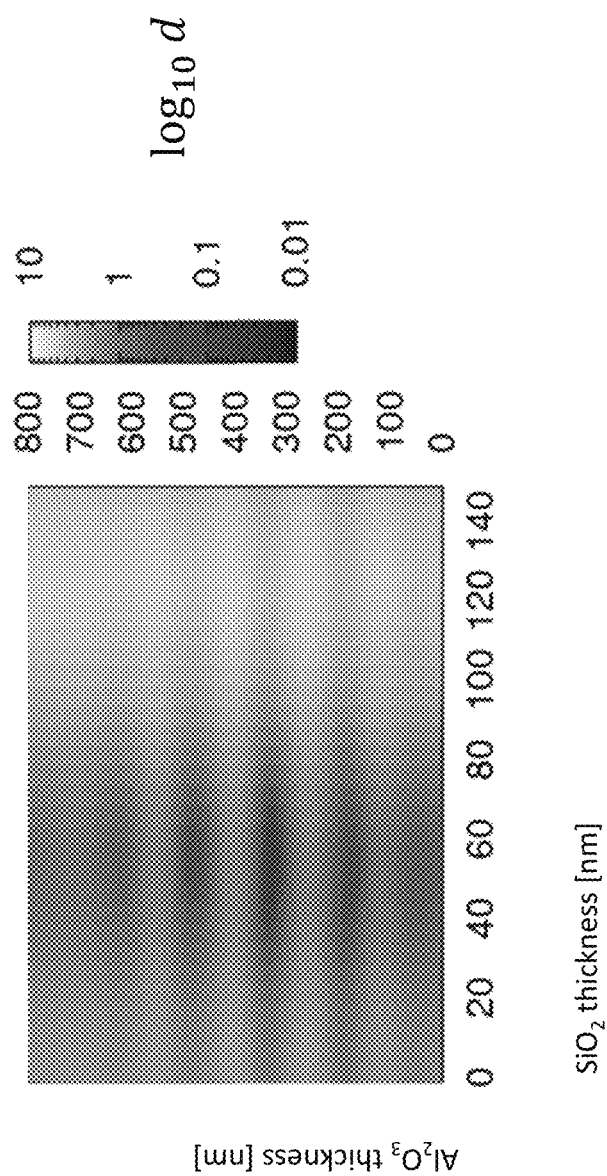
FIG. 26C is a plot showing $\log_{10}d$ of a particular color point (a*, b*), in transmittance, corresponding to the $SiO_2$ and $Al_2O_3$ film thicknesses as indicated by the axes from the origin (0, 0) in the L*a*b* color space for Example 8.

In Example 8, the refractive index and extinction coefficient values measured in Example 1 were utilized. The thicknesses of $Al_2O_3$ and $SiO_2$ layers were varied using modeling, as described above, based on the measured refractive index and extinction coefficient values; however the thickness of the $AlO_xN_y$ layer was constant at about 3500 nm. FIG. 18 is a contour plot of the optical film structure color performance, in transmission, according to Example 8, in which the $AlO_xN_y$ layer has a constant thickness of 3250 nm.

The inclusion of $SiO_2$, $Al_2O_3$, and $AlO_xN_y$ layers having the thicknesses at these intersections in FIG. 18 would provide an optical film structure having a near colorless (but not completely colorless) transmittance. Such optical film structure is shown in Table 8.

TABLE 7

Optical Film Structure having near colorless transmittance from FIG. 18.

| | $SiO_2$ | AlOxNy | $Al_2O_3$ |
|---|---|---|---|
| Optical Film Structure 27 | 55 nm | 3500 nm | 340 nm |

As shown in FIGS. 11-18, for thicker layers of $AlO_xN_y$ within an optical film structure (e.g., thickness of about 3500 nm), the b* surface in parameter space no longer crosses zero for this region of the parameter space (i.e., the b* surface parameter space no longer intersects the a* parameter space where b*=zero and a*=zero. Accordingly, with thicker $AlO_xN_y$ layers, there are fewer options to tune the other layers (e.g., the $SiO_2$ and $Al_2O_3$ layers) to achieve a colorless or near colorless transmittance.

The distance of a particular color point (a*, b*) from the origin (0, 0) in the L*a*b* color space is given by the Euclidean distance, $d=\sqrt{(a^{*2}+b^{*2})}$. The contour plots shown in FIGS. 19A, 20A, 21A, 22A, 23A, 24A, 25A and 26A illustrate luminosity, L* over the same range of the design space for the samples according to Examples 1-8, respectively. FIGS. 19B, 19C, 20B, 20C, 21B, 21C, 22B, 22C, 23B, 23C, 24B, 24C, 25B, 25C, 26B and 26C show plots of the samples of Examples 1-8, respectively, with false color indicating the value of d, the distance from the origin as a function of the $SiO_2$ and $Al_2O_3$ thicknesses on both a linear (FIGS. 19B, 20B, 21B, 22B, 23B, 24B, 25B and 26B) and logarithmic (FIGS. 19C, 20C, 21C, 22C, 23C, 24C, 25C and 26C) scales. The distance from the color origin (clear/white) is plotted as a function of the design parameters.

FIGS. 19A, 20A, 21A, 22A, 23A, 24A, 25A and 26A illustrate the transmittance or luminosity, with greater luminosity representing greater transmittance. The dark areas in FIGS. 19B, 19C, 20B, 20C, 21B, 21C, 22B, 22C, 23B, 23C, 24B, 24C, 25B, 25C, 26B and 26C illustrate the thicknesses of the SiO2, $Al_2O_3$ and AlOxNy layers at which the distance from the origin (0,0) in the L*a*b* color space is the least. When luminosity and distance, d, are compared, the suitable thicknesses of the $SiO_2$, $Al_2O_3$ and AlOxNy can be obtained so that transmittance is maximized, while the distance, d (and the color transmittance) is minimized. For example, in FIGS. 19A and 19B, an optical film structure with a SiO2 layer having a thickness of 35 nm, an $Al_2O_3$ layer having a thickness of 200 nm, and a AlOxNy layer having a thickness of 1850 nm may have colorless transmittance based on FIG. 19B; however, such an optical film structure may have luminosity of between 95% and 96%. Likewise, selecting a SiO2 layer having a thickness of 90 nm, an $Al_2O_3$ layer having a thickness of 100 nm, and an AlOxNy layer having a thickness of 1850 may provide luminosity of 99%; however such an optical film structure may have a distance, d of greater than 2 or 3 and thus would not have colorless transmittance.

Referring to FIGS. 19C, 20C, 21C, 22C, 23C, 24C, 25C and 26C, the darker areas illustrate thicknesses for the layers of the optical film structure design that are less sensitive to variations. Accordingly, these Figures may be used to select thicknesses of the layers of the optical film structure that may be able to withstand manufacturing variances and still achieve the desired colorless transmittance.

Example 9

One sample each of Example 9 and Comparative Example 9A were formed using a sputtering method. Each sample was made by providing the same substrates utilized in Examples 1-8 and having length and width dimensions of 50 mm each. Example 9 included a layer comprising $Si_uAl_vO_xN_y$, wherein the u, v, x and y varied along the thickness of the layer to provide an oxygen content gradient, a silicon content gradient, an aluminum content gradient and a nitrogen content gradient. Comparative Example 9A included an AlN layer. The layer including $Si_uAl_vO_xN_y$ of Example 9 had a thickness of about 260 nm, as measured by profilometry, and was formed via sputtering process using silicon and aluminum targets and nitrogen and oxygen gases. The AlN layer (without a gradient) had a thickness of about 250 nm, as measured by profilometry. The layer without the gradient of Comparative Example 9A was formed in a similar manner as the layer of Example 9; however, only an aluminum target was utilized and only nitrogen gas was utilized. The total deposition time to form the respective layers of Example 9 and Comparative Example 9A was about 6 hours.

Figure 27:
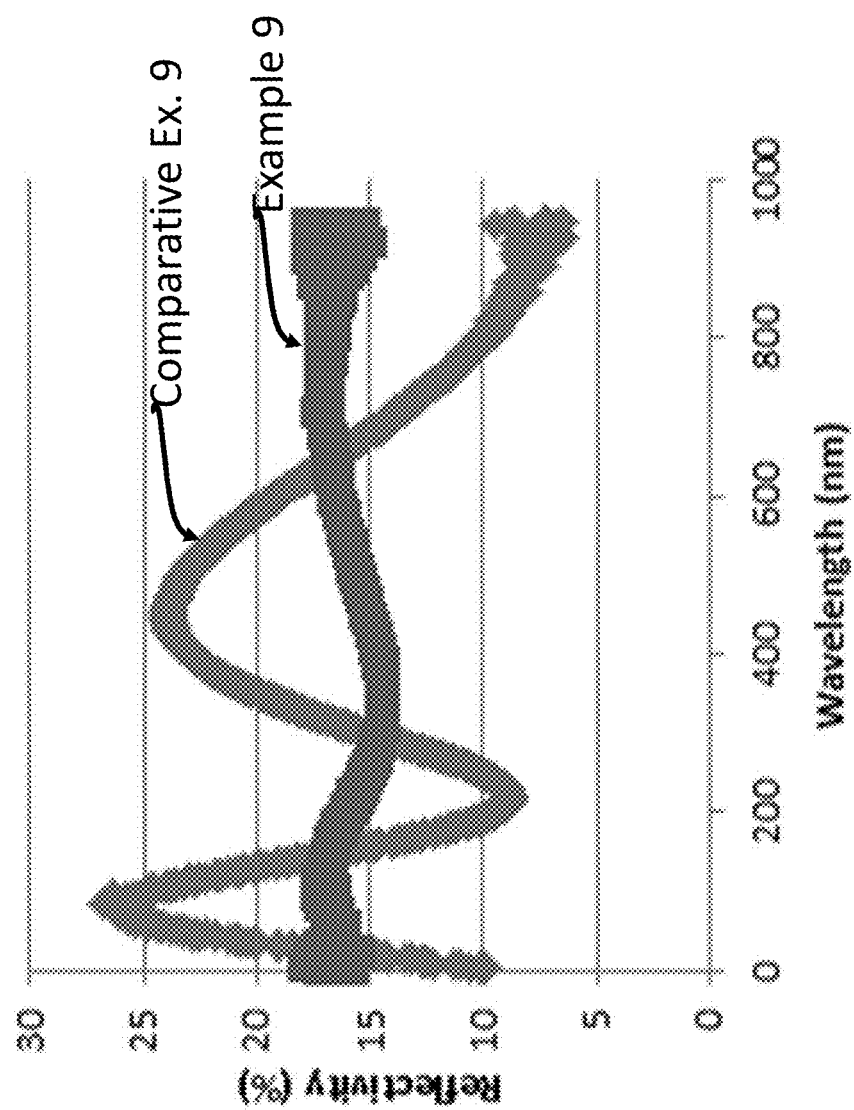
FIG. 27 illustrates the reflectivity % over the visible spectrum of a layer according to one or more embodiments.

FIG. 27 illustrates the reflectivity % of the layer of Example 9 including a $Si_uAl_vO_xN_y$ gradient and the layer of Comparative Example 9A without such a gradient. The layer of Example 9 exhibits a flat reflectance spectra (or transmittance spectra) over the visible spectrum, when compared to the layer without the gradient of Comparative Example 9A. In other words, the layer of Example 9 shows a decrease in the amplitude of the oscillations in reflectivity % relative to the homogeneous layer of Comparative Example 9A. As shown in FIG. 27, the reflectivity of the layer of Example 9 over the visible spectrum is substantially constant or does not vary by more than about 20%. In other words the layer of Example 9 has an average reflectivity of about 16% and the maximum (e.g., 18%) and a minimum (e.g., 14%) are less than about 20% of the average reflectivity of 16%. For comparison, the reflectivity % of the AlN layer of Comparative Example 9A shows oscillations such that the reflectivity % over the visible spectrum varies from as low as about 8% to as high as about 27%.

Example 10

One sample each of Example 10 and Comparative Example 10A were formed using a sputtering method. Each sample was made by providing the same substrates utilized in Examples 1-8 and having length and width dimensions of 50 mm each. Example 10 included a layer with 121 sub-layers comprising $Si_uAl_vO_xN_y$, wherein the u, v, x and y varied along the thickness of the layer to provide an oxygen content gradient, a silicon content gradient, an aluminum content gradient and a nitrogen content gradient. The 121 sub-layers of the $Si_uAl_vO_xN_y$ layer were formed onto one side of a glass substrate. The layer was formed by first sputtering a silicon target at a pressure of about 3 mTorr in the presence of argon flowed at a rate of about 20 sccm, nitrogen flowed at a rate of 40 sccm and oxygen flowed at a rate of 2 sccm. RF power was supplied at 4 W, at least initially for three minutes. After the first three minutes, DC power was then generated to sputter aluminum from an aluminum target starting 50 W. DC power was in 20 W increments every three minutes thereafter until 300 W. While the DC power was being increased, the RF power, argon gas flow rate, nitrogen gas flow rate and oxygen gas flow rate were constant. After reaching 300 W DC power, the RF power was decreased from 400 W to 0 W in successive steps and DC power continued to increase at 20 W increments for three minutes between each increase until 480 W DC power was generated. Thereafter, then in successive steps, the oxygen gas flow rate was decreased from 2 sccm to 0.25 sccm oxygen, in about 0.2 sccm increments, with a final decrease of 0.05 sccm. After the oxygen flow rate was decreased to 0.25 sccm, the deposition process continued for an additional 3 hours and only AlN was being formed in the layer. In other words, the sub-layers formed when oxygen was flowed at 0.25 sccm comprised AlN. During the entire deposition process, the flow rates of nitrogen and argon were constant and the pressure was constant. No cleaning steps were performed during the deposition or between any changes in flow rates, RF power or DC power.

Comparative Example 10A included a single $AlO_xN_y$ layer. The layer including $Si_uAl_vO_xN_y$ of Example 10 had the same thickness as the single layer of $AlO_xN_y$ of comparative Example 10A. Example 10 was formed by sputtering using silicon and aluminum targets and nitrogen and oxygen gases. Comparative Example 10A (without a gradient) was formed in a similar manner as the layer of Example 10; however, only an aluminum target was utilized and oxygen and nitrogen gas was utilized.

Figure 28:
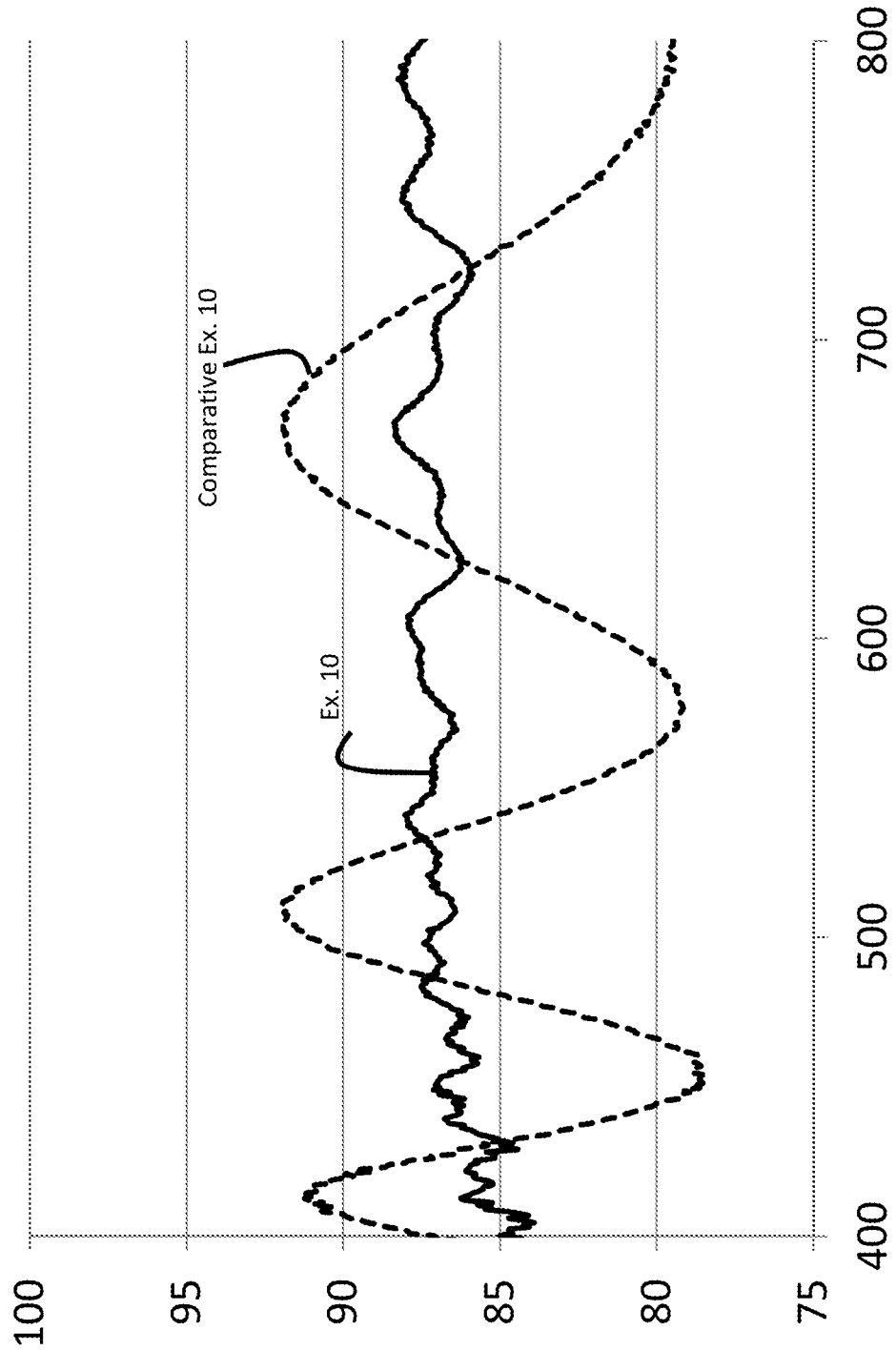
FIG. 28 illustrates transmittance % over the visible spectrum of a layer according to one or more embodiments.

FIG. 28 illustrates the transmittance % of the layer of Example 10 including a $Si_uAl_vO_xN_y$ gradient and the layer of Comparative Example 10A without such a gradient. The layer of Example 10 exhibits a flat transmittance spectrum over the visible spectrum, when compared to the layer without the gradient of Comparative Example 10A. In other words, the layer of Example 10 shows a decrease in the amplitude of the oscillations in transmittance % relative to the homogeneous layer of Comparative Example 10A. As shown in FIG. 28, the transmittance of the layer of Example 10 over the visible spectrum is substantially constant or does not vary by more than about 4%. For comparison, the transmittance % of the $AlO_xN_y$ layer of Comparative Example 10A shows oscillations in such that the transmittance % over the visible spectrum varies from as low as about 78% to as high as about 93%. The gradient layer of Example 10 also exhibited scratch resistance as otherwise described herein.

Without being bound by theory, it is believed that the amplitude of the oscillations in reflectivity % of the optical film structures described herein, and of the layers including an aluminum content, silicon content, nitrogen content and/ or oxygen content gradients (e.g., first layer 422 and/or first sub-layer 526 and/or the layers of Example 9 and Example 10) may be decreased to about zero when the oxygen content is decrease linearly along the thickness of a layer.

Example 11

In the following example, a three-layer optical film structure disposed on a glass substrate was designed. The transmittance and reflectance of the optical film structure and glass substrate were evaluated across the visible spectrum using various models, in the same manner as Examples 1-8. Ellipsometry was again used to characterize the refractive index and extinction coefficient of each layer in the three-layer optical film structure. The refractive index and extinction coefficient information of each of the layers was used in known modeling tools (e.g., thin film designing codes) to determine the optical behavior of the optical film structure and substrate.

The optical film structure was formed in the same manner as Examples 1-8, using the same substrates as used in Examples 1-8.

In Example 11, the impedance-matching layers of the optical film structure included $Al_2O_3$ and $SiO_2$ layers surrounding a layer having a high refractive index and a relatively high hardness. Specifically, the optical film structure included a first sub-layer of $Al_2O_3$, a second sub-layer of $AlO_xN_y$ and a second layer of $SiO_2$. The thicknesses of the $Al_2O_3$ and $SiO_2$ layers were varied using modeling, as described above, based on the measured refractive index and extinction coefficient values. The thickness of the $AlO_xN_y$ layer was constant at 2 μm. For each thickness of the SiO$_2$ and Al$_2$O$_3$ layers, the L*a*b* color coordinates of the samples were predicted.

Figure 29A:
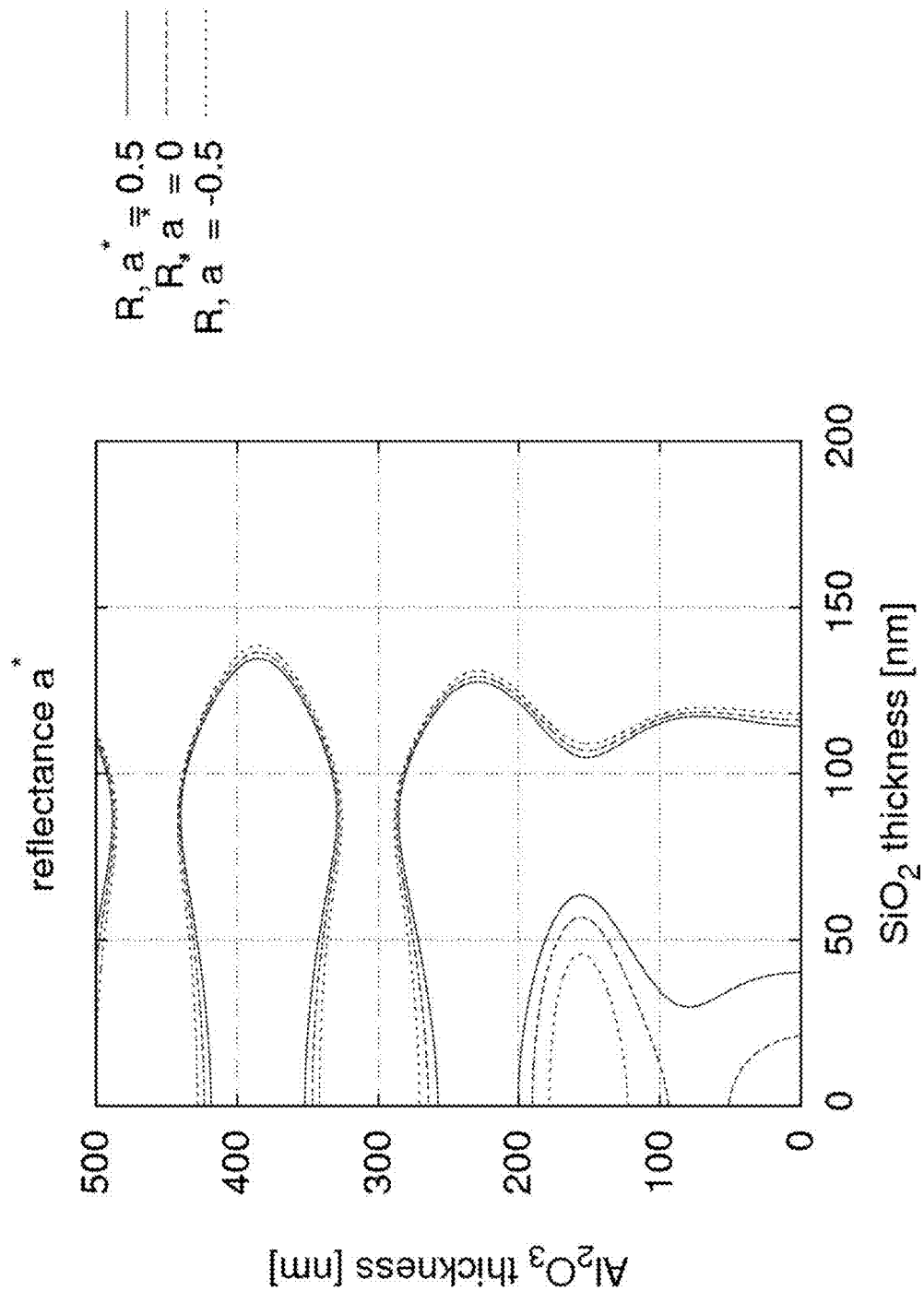
FIG. 29A is a contour plot of a*, in reflectance, for the optical film structure of Example 11.

FIG. 29A shows a contour plot of the a* reflectance color performance of the optical film structure and substrate, according to Example 11. In the contour plot, a value of zero indicates the reflectance of the optical film structure and substrate combination is without color. The suitable thicknesses for the SiO$_2$ layer and the Al$_2$O$_3$ layer include the thicknesses along the contours between the solid R, a*=0.5 line and the dashed R, a*=−0.5 line or in some instances, between two dashed R, a*=0 lines. When SiO$_2$ and Al$_2$O$_3$ layers having these thicknesses are combined with the 2 μm AlO$_x$N$_y$ layer, the optical film and substrate would exhibit a* values in the range from about −0.5 to about 0.5, which would in turn limit the distance between the color coordinates of the optical film and substrate and the color coordinates (a*=0, b*=0). For Al$_2$O$_3$ thicknesses between 0 nm and 500 nm, examples of appropriate SiO$_2$ layer thicknesses include from about 0 nm to about 60 nm, with more specific thicknesses for the Al$_2$O$_3$ and/or SiO$_2$ layers falling between the solid R, a*=0.5 line and the dashed R, a*=−0.5 line. In one or more embodiments, for Al$_2$O$_3$ thicknesses between 0 nm and 500 nm, suitable thicknesses for the SiO$_2$ layer can also include thicknesses in the range from about 0 nm to about 150 nm; however, using a thickness that falls within a wider range of layer thicknesses between the solid R, a*=0.5 line and the dashed R, a*=−0.5 line provides more flexibility in manufacturing (i.e., minor variations in thickness will not dramatically affect a* values). To this end, thicknesses of SiO$_2$ between 0 nm and 60 nm and Al$_2$O$_3$ layer thicknesses between 0 nm and 200 nm may provide greater tolerance to optical film thickness variations, while providing optical film and substrate combinations that exhibit a* values in the range from about −0.5 to about 0.5, and color coordinates with minimized distance from the color coordinates (a*=0, b*=0).

FIG. 29B shows a contour plot of the a* reflectance color performance of the optical film structure and underlying substrate, according to Example 11, with the contours showing the difference between the combination of the optical film structure and substrate and the bare substrate (without the optical film structure). In the contour plot, the value of zero for the plotted quantities means the combination of the optical film structure and substrate has the same color coordinates as the bare substrate. As shown in FIG. 29B, the contours shift to accommodate the substrate. Accordingly, the thicknesses of the SiO$_2$ and Al$_2$O$_3$ layers between the solid R, a*=0.5 line and the dashed R, a*=−0.5 line or in some instances, between two dashed R, a*=−0.5 lines, are modified from those shown in FIG. 29A. When SiO$_2$ and Al$_2$O$_3$ layers having these thicknesses are combined with the 2 μm AlO$_x$N$_y$ layer, the optical film and substrate combination would exhibit a* values in the range from about −0.5 to about 0.5, which would in turn limit the distance between the color coordinates of the optical film and substrate combination and the color coordinates of the bare substrate (without the optical film). For Al$_2$O$_3$ thicknesses between 0 nm and 500 nm, examples of appropriate SiO$_2$ layer thicknesses include from about 0 nm to about 60 nm, with more specific thicknesses for the Al$_2$O$_3$/SiO$_2$ layers falling between the solid R, a*=0.5 line and the dashed R, a*=−0.5 line. In one or more embodiments, for Al$_2$O$_3$ thicknesses between 0 nm and 500 nm, suitable thicknesses for the SiO$_2$ layer can also include thicknesses in the range from about 0 nm to about 140 nm; however, using a thickness that falls within a wider range of layer thicknesses between the solid R, a*=0.5 line and the dashed R, a*=−0.5 line provides more flexibility in manufacturing (i.e., minor variations in thickness will not dramatically affect a* values). To this end, use of a SiO$_2$ layer having a thickness in the range from about 0 nm to about 60 nm and a Al$_2$O$_3$ layer having a thickness in the range from about 0 nm to about 200 nm may provide greater tolerance to optical film thickness variations, while providing optical film and substrate combinations that exhibit a* values in the range from about −0.5 to about 0.5. The use of such SiO$_2$ and Al$_2$O$_3$ layers and a 2 μm-thick AlO$_x$N$_y$ layer in the optical film would provide, when combined with the substrate, an article exhibiting color coordinates that are close in distance (e.g., <2) from the color coordinates (a*=0, b*=0).

Figure 29C:
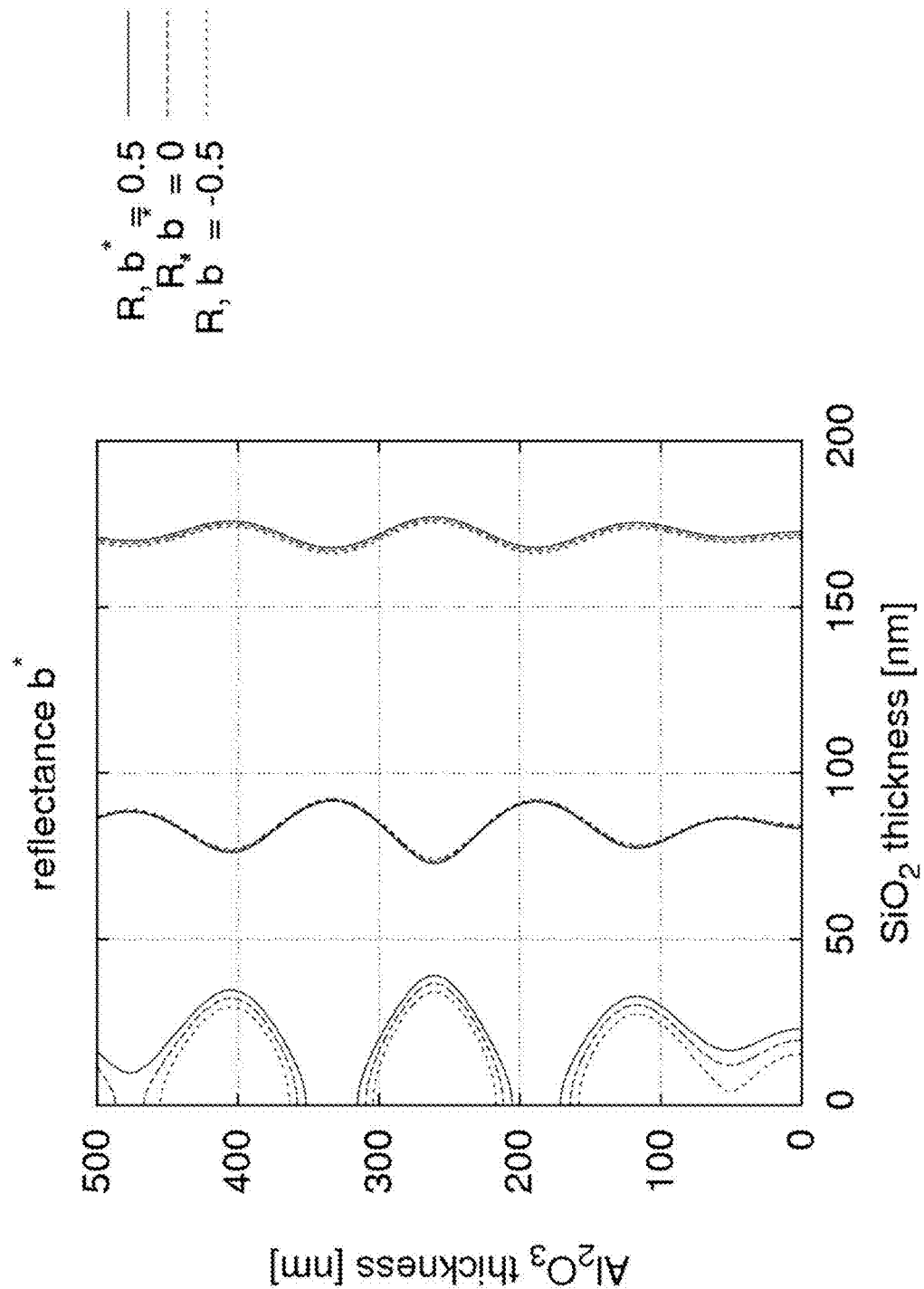
FIG. 29C is a contour plot of b*, in reflectance, for the optical film structure of Example 11.

FIG. 29C shows a contour plot b* reflectance color performance of the optical film structure and substrate, according to Example 11. In the contour plot, a value of zero indicates the optical film structure and substrate combination is without color. The suitable thicknesses for the SiO$_2$ layer and the Al$_2$O$_3$ layer includes the thicknesses along the contours between the solid R, b*=0.5 line and the dashed R, b*=−0.5 line or in some instances, between two dashed R, b*=−0.5 lines. When SiO$_2$ and Al$_2$O$_3$ layers having these thicknesses are combined with the 2 μm AlO$_x$N$_y$ layer, the optical film and substrate combination would exhibit b* values in the range from about −0.5 to about 0.5, which would in turn limit the distance from the color coordinates (a*=0, b*=0). For Al$_2$O$_3$ layer thicknesses between 0 nm to about 500 nm, examples of appropriate SiO$_2$ layer thicknesses include from about 0 to about 40 nm, or from about 170 nm to about 175 nm, with more specific thicknesses for the Al$_2$O$_3$ and SiO$_2$ layers falling between the solid R, b*=0.5 line and the dashed R, b*=−0.5 line. An SiO2 layer having a thickness of about 175 nm may be used and may provide an optical film and substrate combination with improved b* reflectance color performance; however, any deviations from this thickness may result in changes to b* values.

Figure 29D:
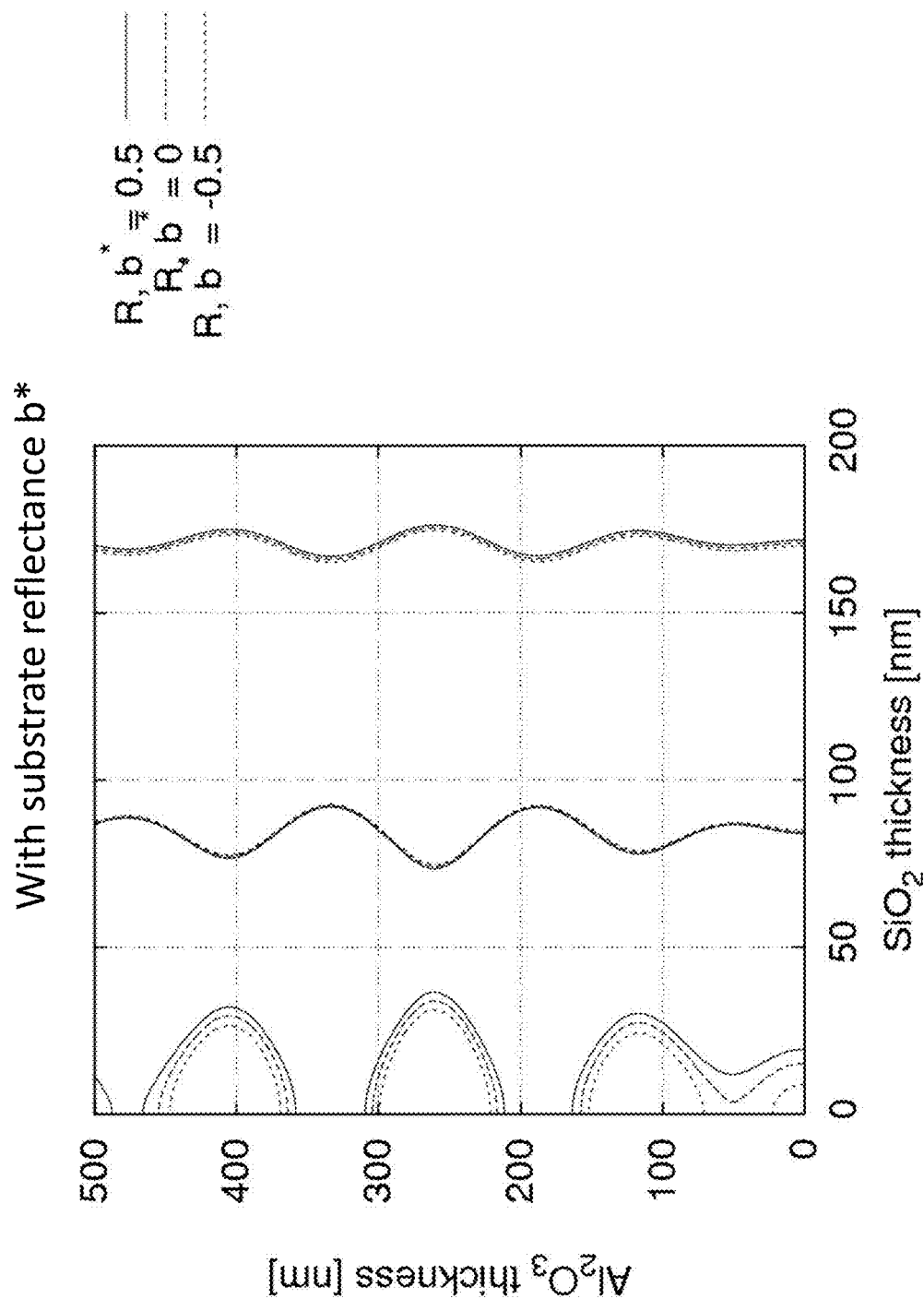
FIG. 29D is a contour plot of b*, in reflectance, for the optical film structure and substrate of Example 11.

FIG. 29D shows a contour plot of the b* reflectance color performance of the optical film structure and substrate, according to Example 11. The contours in the contour plot show the difference between the combination of the optical film structure and substrate and the bare substrate (without the optical film structure). In the contour plot, the value of zero for the plotted quantities means the combination of the optical film structure and substrate has the same color coordinates as the bare substrate. As shown in FIG. 29D, the contours shift to accommodate the substrate. Accordingly, the thicknesses of the SiO$_2$ and Al$_2$O$_3$ layers between the solid R, b*=0.5 line and the dashed R, b*=−0.5 line or in some instances, between two dashed R, b*=−0.5 lines, are modified from those shown in FIG. 29C. When SiO$_2$ and Al$_2$O$_3$ layers having these thicknesses are combined with the 2 μm AlO$_x$N$_y$ layer, the optical film and substrate combination would exhibit b* values in the range from about −0.5 to about 0.5, which would in turn limit the distance between the color coordinates of the optical film and substrate combination and the color coordinates of the bare substrate (without an optical film). For Al$_2$O$_3$ layer thicknesses between 0 nm to about 500 nm, examples of suitable thicknesses for the SiO$_2$ layer include from 0 nm to about 30 nm, or from about 170 nm to about 175 nm, with more specific thicknesses for both Al$_2$O$_3$ and SiO$_2$ falling between the solid R, b*=0.5 line and the dashed R, b*=−0.5 line. The thicknesses and thickness ranges for the Al$_2$O$_3$ layer did not change significantly in FIG. 29D, as compared to FIG. 29C.

Figure 29E:
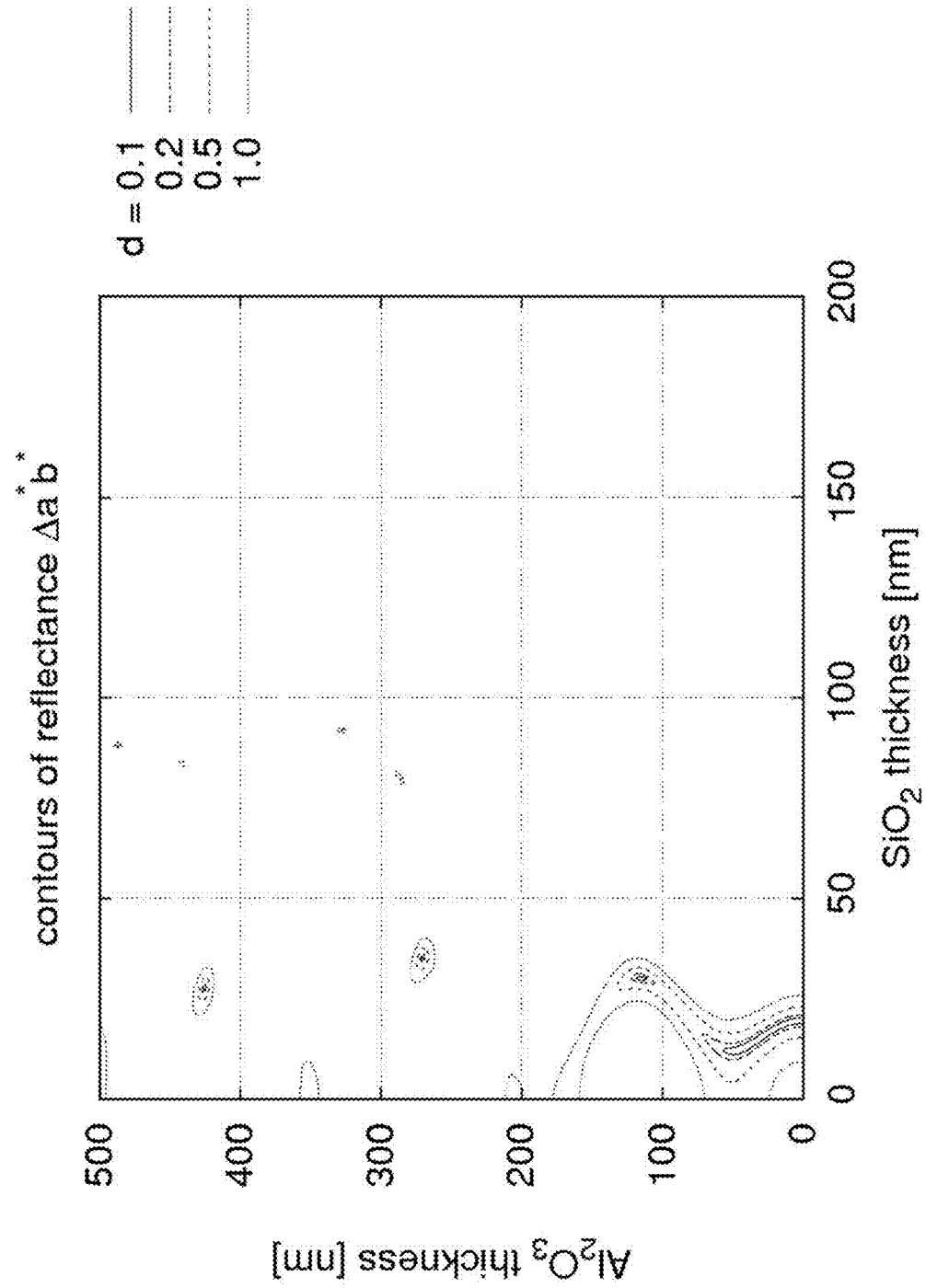
FIG. 29E is a contour plot of the distance of a* and b*, in reflectance, for the optical film structure and substrate of Example 11 from the origin (0, 0) in the L*a*b* color space.

FIG. 29E shows the thicknesses of the $SiO_2$ and $Al_2O_3$ layers at which the distance of the reflectance color coordinates of the article (including the optical film and the substrate) and the color coordinates (a*=0, b*=0) are less than about 1, less than about 0.5, less than about 0.2 and less than about 0.1. FIG. 29E shows that an optical film with a $SiO_2$ layer having a thickness in the range from about 0 nm to about 50 nm and a $Al_2O_3$ layer having a thickness in the range from about 0 nm to about 180 nm, with more specific thicknesses for the $Al_2O_3$ and/or $SiO_2$ layers falling between the solid d=0.1 line and the dashed d=1.0 line, when combined with a 2 μm thick $AlO_xN_y$ layer, will exhibit color coordinates, in reflection, having a distance from the color coordinates (a*=0, b*=0) of less than about 1. In another example, the combination of a $SiO_2$ layer having a thickness in the range from about 0 nm to about 50 nm, a $Al_2O_3$ layer having a thickness in the range from about 0 nm to about 500 nm, a 2 μm-thick $AlO_xN_y$ layer and the glass substrate, would also exhibit desired reflectance color performance. In another example, the combination of a $SiO_2$ layer having a thickness from about 75 nm to about 100 nm, an $Al_2O_3$ layer having a from about 250 nm to about 500 nm, a 2 μm-thick $AlO_xN_y$ layer and the glass substrate, would also exhibit desired reflectance color performance; although these thickness ranges for the $SiO_2$ and $Al_2O_3$ layers allow for lower tolerances in thickness variation, the transmittance of the optical film and substrate combination was found to be improved over some other thicknesses.

Figure 29F:
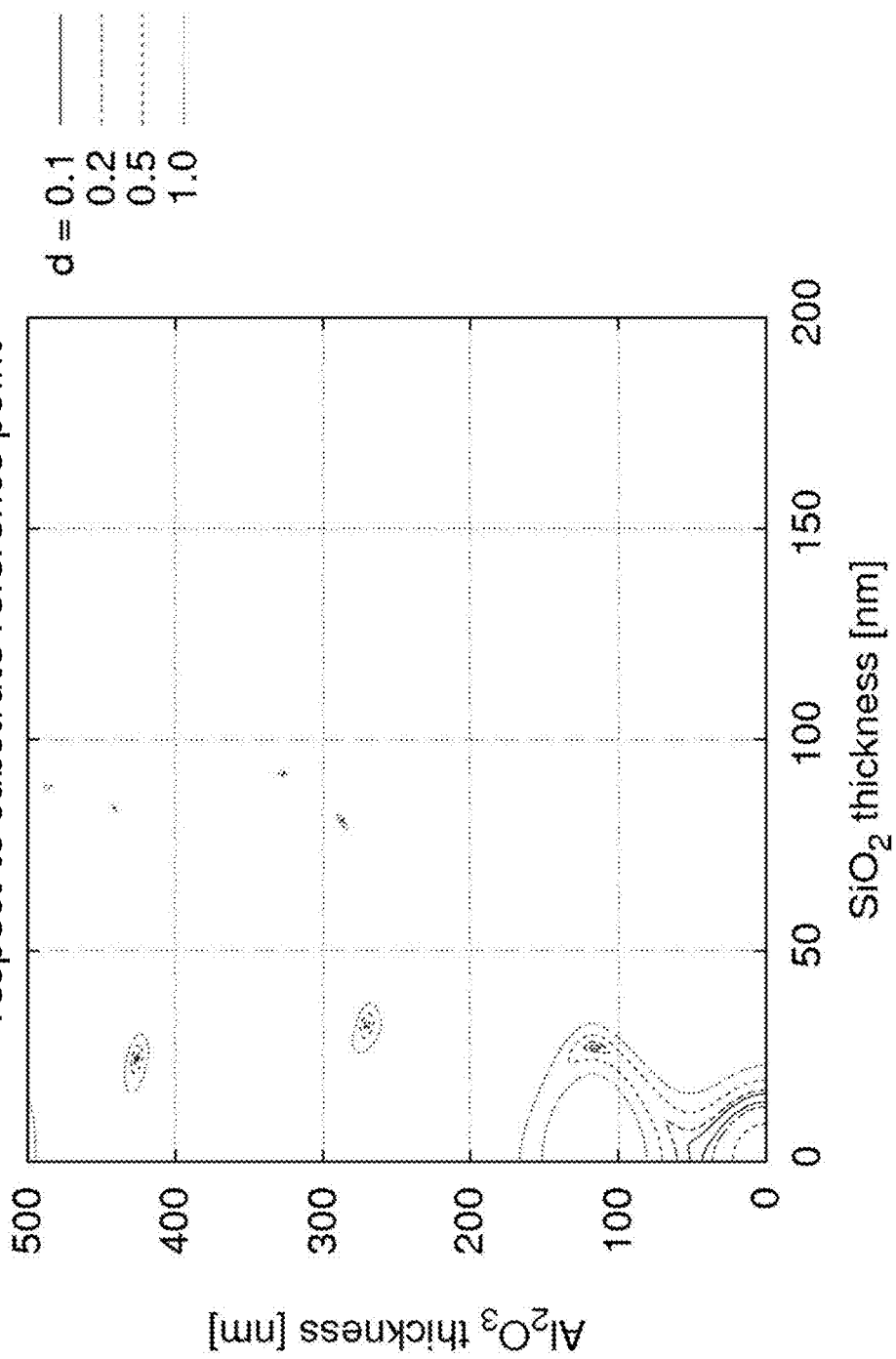
FIG. 29F is a contour plot of the distance of a* and b*, in reflectance, for the optical film structure and substrate from the color coordinates of the substrate.

FIG. 29F shows the thicknesses of the $SiO_2$ and $Al_2O_3$ layers at which the distance of the color coordinates of the article and the color coordinates of the substrate are less than about 1, less than about 0.5, less than about 0.2 and less than about 0.1. FIG. 29F shows that the combination of a glass substrate and an optical film a 2 μm-thick $AlO_xN_y$ layer, a $SiO_2$ layer having a thickness in the range from about 0 nm to about 30 nm or 35 nm and a $Al_2O_3$ layer having a thickness in the range from about 0 nm to about 170 nm (with more specific thicknesses for both $Al_2O_3$ and $SiO_2$ falling between the solid d=0.1 line and the dashed d=1.0 line), would exhibit color coordinates, in reflection, having a distance from the color coordinates of the substrate of less than about 1. Another example includes a substrate and optical film with a 2 μm-thick $AlO_xN_y$ layer, a $SiO_2$ layer having a thickness from about 30 nm to about 40 nm and an $Al_2O_3$ layer having a thickness from about 260 nm to about 290 nm. Yet another example includes a substrate and optical film with a 2 μm-thick $AlO_xN_y$ layer, a $SiO_2$ layer having a thickness from about 20 nm to about 40 nm and an $Al_2O_3$ layer having a thickness from about 420 nm to about 450 nm.

Figure 30A:
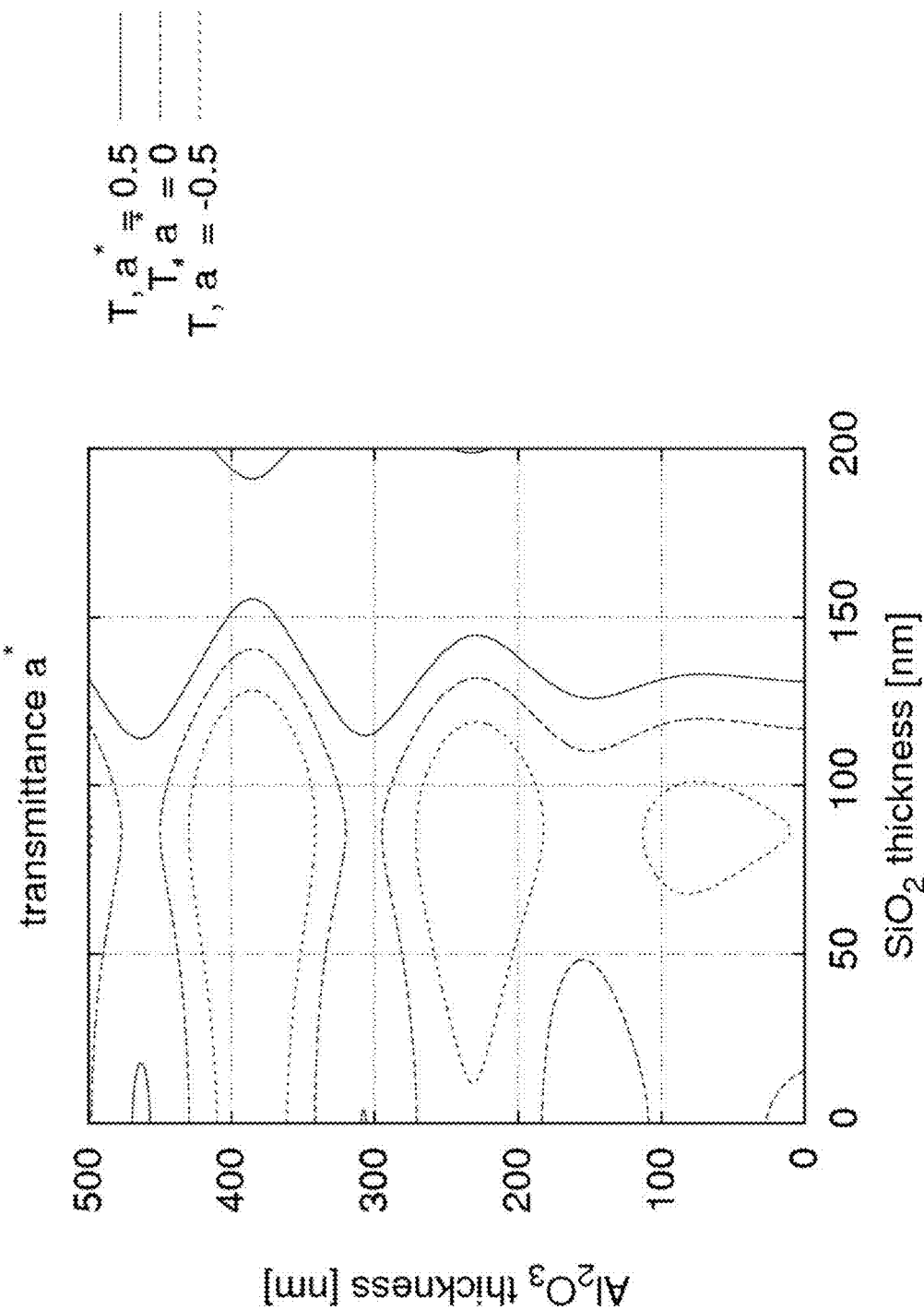
FIG. 30A is a contour plot of a*, in transmittance, for the optical film structure of Example 11.

FIG. 30A shows a contour plot of the a* transmittance color performance of an optical film structure and substrate, according to Example 11. In the contour plot, a value of zero indicates the optical film structure and substrate combination is without color. The suitable thicknesses for the $SiO_2$ layer and the $Al_2O_3$ layer includes the thicknesses along the contours between the solid T, a*=0.5 line and the dashed T, a*=−0.5 line or in some instances, between two dashed T, a*=−0.5 lines, which, when combined with the 2 μm $AlO_xN_y$ layer in the optical film, would provide a* values in the range from about −0.5 to about 0.5. When $SiO_2$ and $Al_2O_3$ layers having these thicknesses are combined with the 2 μm $AlO_xN_y$ layer, the optical film would exhibit a* values in the range from about −0.5 to about 0.5, which would in turn limit the distance between the color coordinates of the optical film and substrate and the color coordinates (a*=0, b*=0). For $Al_2O_3$ layer thicknesses between 0 nm to about 500 nm, examples of suitable thicknesses for the $SiO_2$ layer include from about 0 nm to about 160 nm, with more specific thicknesses for both $Al_2O_3$ and $SiO_2$ falling between the solid T, a*=0.5 line and the dashed T, a*=−0.5 line. Examples of thicknesses that may not provide the desired a* transmittance include an $SiO_2$ layer having a thickness from about 65 nm to about 105 nm in combination with an $Al_2O_3$ layer having a thickness from about 10 nm to about 120 nm, an $SiO_2$ layer having a thickness from about 20 nm to about 140 nm in combination with an $Al_2O_3$ layer having a thickness from about 185 nm to about 275 nm, or an $SiO_2$ layer having a thickness from about 0 nm to about 125 nm in combination with an $Al_2O_3$ layer having a thickness from about 350 nm to about 420 nm, as these thickness ranges and combinations fall between two dashed T, a*=−0.5 lines.

Figure 30B:
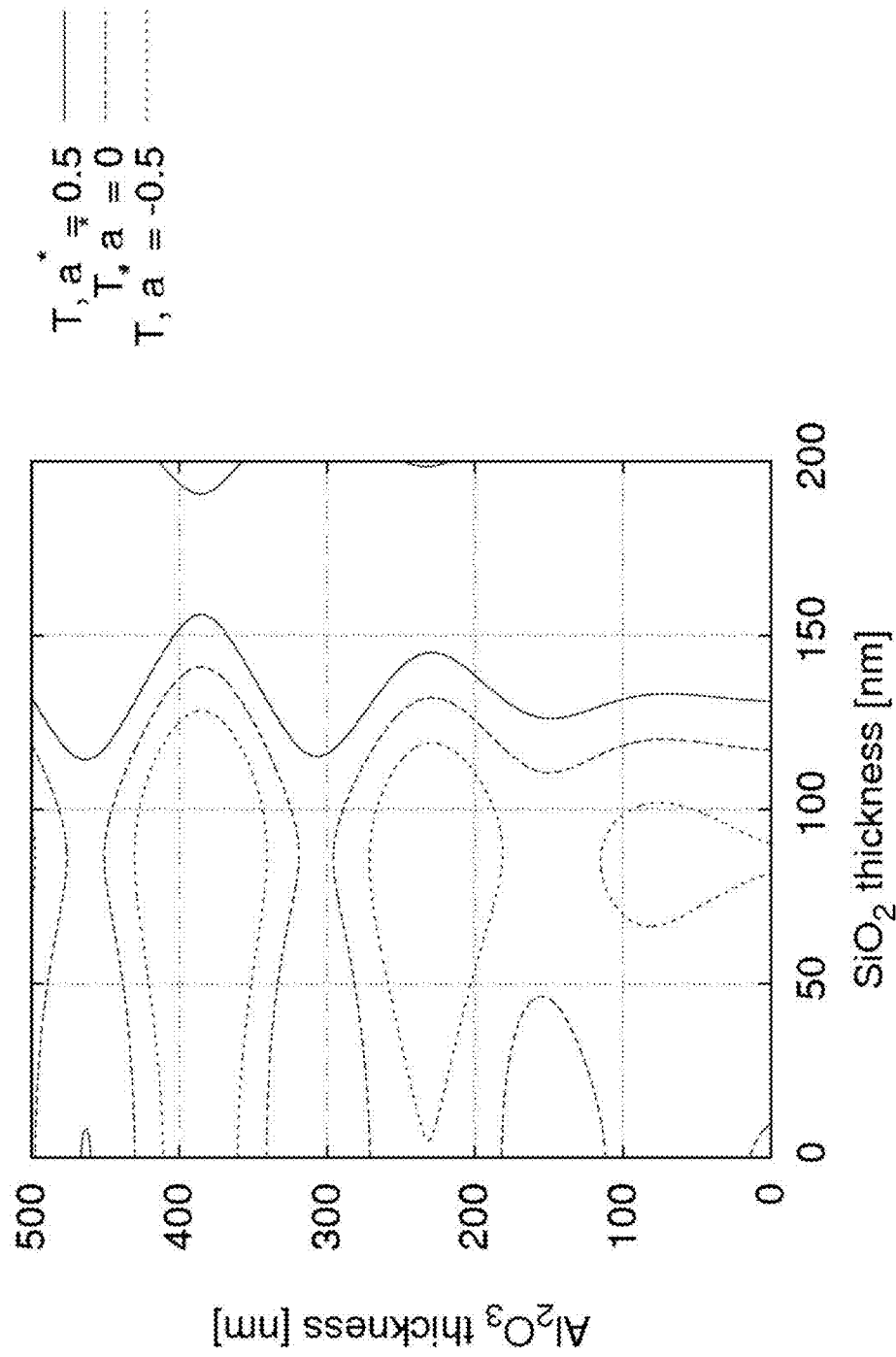
FIG. 30B is a contour plot of a*, in transmittance, for the optical film structure and substrate of Example 11.

FIG. 30B shows a contour plot of the a* transmittance color performance of the optical film structure and substrate, according to Example 11. The contours show the difference between the combination of the optical film structure and substrate and the bare substrate (without the optical film structure). In the contour plot, the value of zero for the plotted quantities means the combination of the optical film structure and substrate has the same color coordinates as the bare substrate. As shown in FIG. 30B, the contours shift to accommodate the substrate. Accordingly, the thicknesses of the $SiO_2$ and $Al_2O_3$ layers between the solid T, a*=0.5 line and the dashed T, a*=−0.5 line or in some instances, between two dashed T, a*=−0.5 lines, are modified from those shown in FIG. 30A. When $SiO_2$ and $Al_2O_3$ layers having these thicknesses are combined with the 2 μm $AlO_xN_y$ layer, the optical film and substrate would exhibit a* values in the range from about −0.5 to about 0.5, which would in turn limit the distance of the color coordinates of the optical film and substrate from the color coordinates of the bare substrate (without an optical film). For $Al_2O_3$ layer thicknesses between 0 nm to about 500 nm, examples of suitable thicknesses for the $SiO_2$ layer include from about 0 nm to about 160 nm, with more specific thicknesses for the $Al_2O_3$ and/or $SiO_2$ layers falling between the solid T, a*=0.5 line and the dashed T, a*=−0.5 line. Examples of thicknesses that may not provide the desired a* transmittance include an $SiO_2$ layer having a thickness from about 65 nm to about 105 nm in combination with an $Al_2O_3$ layer having a thickness from about 0 nm to about 120 nm, an $SiO_2$ layer having a thickness from about 20 nm to about 120 nm in combination with an $Al_2O_3$ layer having a thickness from about 190 nm to about 275 nm, or an $SiO_2$ layer having a thickness from about 0 nm to about 125 nm in combination with an $Al_2O_3$ layer having a thickness from about 330 nm to about 420, as these thickness ranges and combinations fall between two dashed T, a*=−0.5 lines.

Figure 30C:
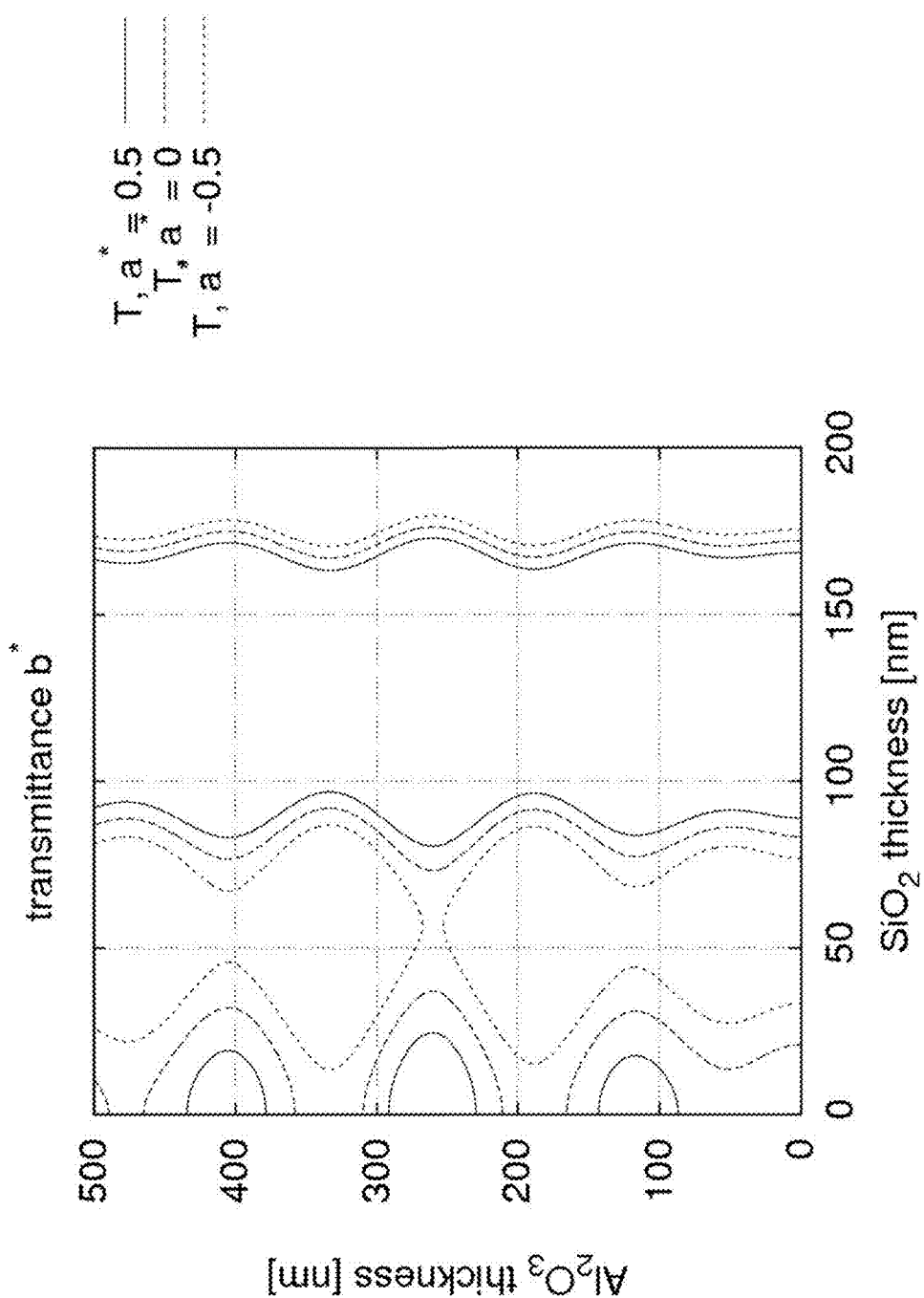
FIG. 30C is a contour plot of b*, in transmittance, for the optical film structure of Example 11.

FIG. 30C shows a contour plot of the b* transmittance color performance of the optical film structure and substrate, according to Example 11. In the contour plot, a value of zero indicates the optical film structure and substrate combination is without color. The suitable thicknesses for the $SiO_2$ layer and the $Al_2O_3$ layer includes the thicknesses along the contours between the solid T, b*=0.5 line and the dashed T, b*=−0.5 line or in some instances, between two dashed T, b*=−0.5 lines. When $SiO_2$ and $Al_2O_3$ layers having these thicknesses are combined with the 2 μm $AlO_xN_y$ layer, the optical film and substrate combination would exhibit b* values in the range from about −0.5 to about 0.5, which would in turn limit the distance between the color coordinates of the optical film structure and substrate and the color coordinates (a*=0, b*=0). For $Al_2O_3$ layer thicknesses between 0 nm to about 500 nm, examples of suitable thicknesses for the SiO$_2$ layer include from about 0 nm to about 90 nm, with more specific thicknesses for the Al$_2$O$_3$ and/or SiO$_2$ layers falling between the solid T, b*=0.5 line and the dashed T, b*=−0.5 line. Examples of thicknesses that may not provide the desired b* transmittance include an SiO$_2$ layer having a thickness from about 20 nm to about 80 nm in combination with an Al$_2$O$_3$ layer having a thickness from about 0 nm to about 250 nm, an SiO$_2$ layer having a thickness from about 20 nm to about 80 nm in combination with an Al$_2$O$_3$ layer having a thickness from about 260 nm to about 500 nm, or an SiO$_2$ layer having a thickness from about 0 nm to about 25 nm in combination with an Al$_2$O$_3$ layer having a thickness from about 80 nm to about 150 nm, from about 220 nm to about 290 nm or from about 380 nm to about 440 nm, as these thickness ranges and combinations fall between two dashed T, b*=−0.5 lines or between two solid T, b*=0.5 lines.

Figure 30D:
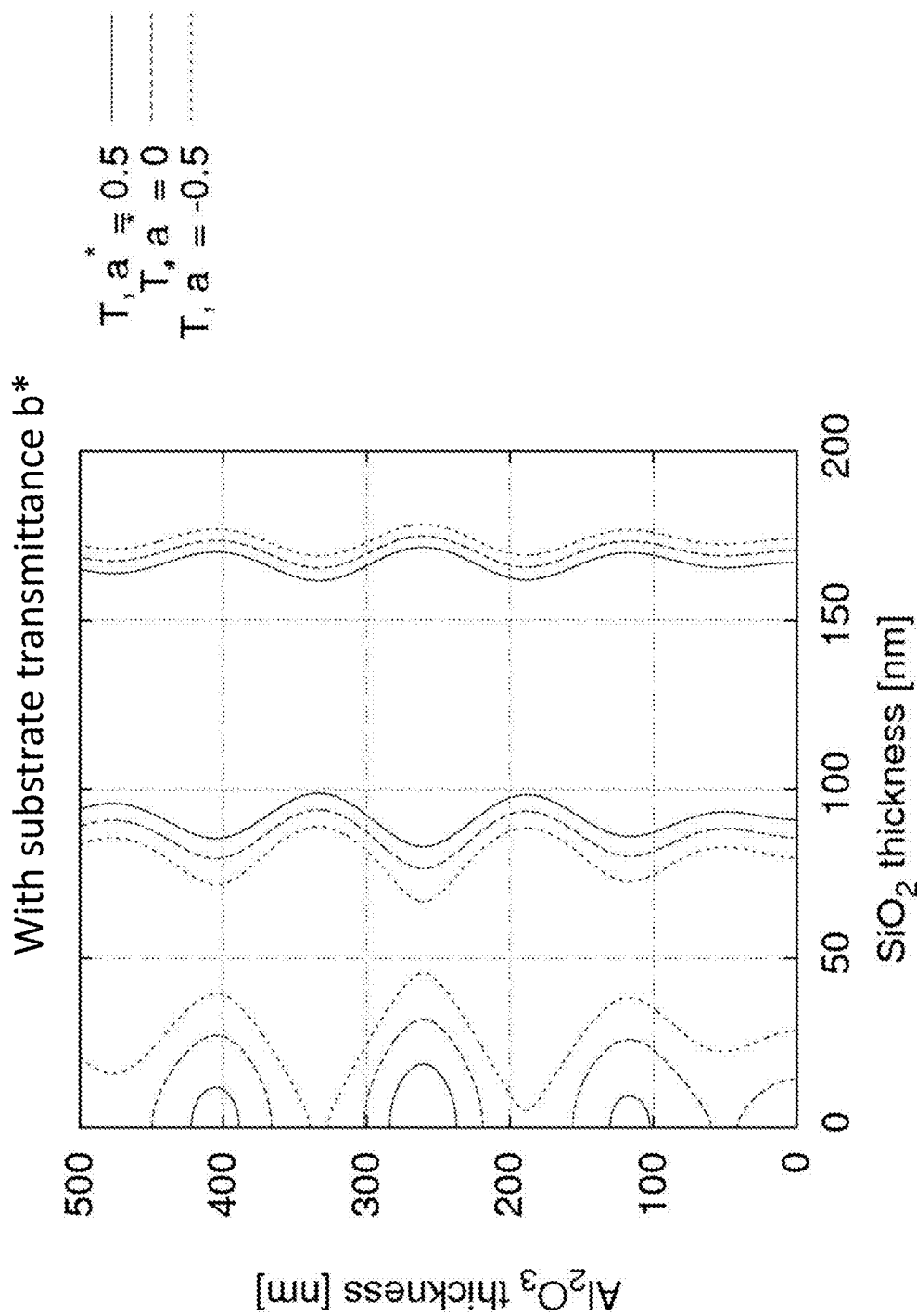
FIG. 30D is a contour plot of b*, in transmittance, for the optical film structure and substrate of Example 11.

FIG. 30D shows a contour plot of the b* reflectance color performance of the optical film structure and substrate, according to Example 11. The contours show the difference between the combination of the optical film structure and substrate and the bare substrate (without the optical film structure). In the contour plot, the value of zero for the plotted quantities means the combination of the optical film structure and substrate has the same color coordinates as the bare substrate. As shown in FIG. 30D, the contours shift to accommodate the substrate. Accordingly, the thicknesses of the SiO$_2$ and Al$_2$O$_3$ layers between the solid T, b*=0.5 line and the dashed T, b*=−0.5 line or in some instances, between two dashed T, b*=−0.5 lines, are modified from those shown in FIG. 30C. When SiO$_2$ and Al$_2$O$_3$ layers having these thicknesses are combined with the 2 μm AlO$_x$N$_y$ layer, the optical film would exhibit b* values in the range from about −0.5 to about 0.5, which would in turn limit the distance between the color coordinates of the optical film and substrate combination and the color coordinates of the bare substrate (without an optical film). For Al$_2$O$_3$ layer thicknesses between 0 nm to about 500 nm, examples of suitable thicknesses for the SiO$_2$ layer include from about 0 nm to about 40 nm, from about 70 nm to about 100 nm or from about 160 nm to about 175 nm, with more specific thicknesses for the Al$_2$O$_3$ and/or SiO$_2$ layers falling between the solid T, b*=0.5 line and the dashed T, b*=−0.5 line. Examples of thicknesses that may not provide the desired b* transmittance include an SiO$_2$ layer having a thickness from about 0 nm to about 80 nm in combination with an Al$_2$O$_3$ layer having a thickness from about 0 nm to about 500 nm, an SiO$_2$ layer having a thickness from about 80 nm to about 170 nm in combination with an Al$_2$O$_3$ layer having a thickness from about 0 nm to about 500, an SiO$_2$ layer having a thickness from about 0 nm to about 25 nm in combination with an Al$_2$O$_3$ layer having a thickness from about 100 nm to about 130 nm, or from about 230 nm to about 290 nm, or from about 390 nm to about 420 nm, as some of these thickness ranges and combinations fall between two dashed T, b*=−0.5 lines or between two solid T, b*=0.5 lines.

Figure 30E:
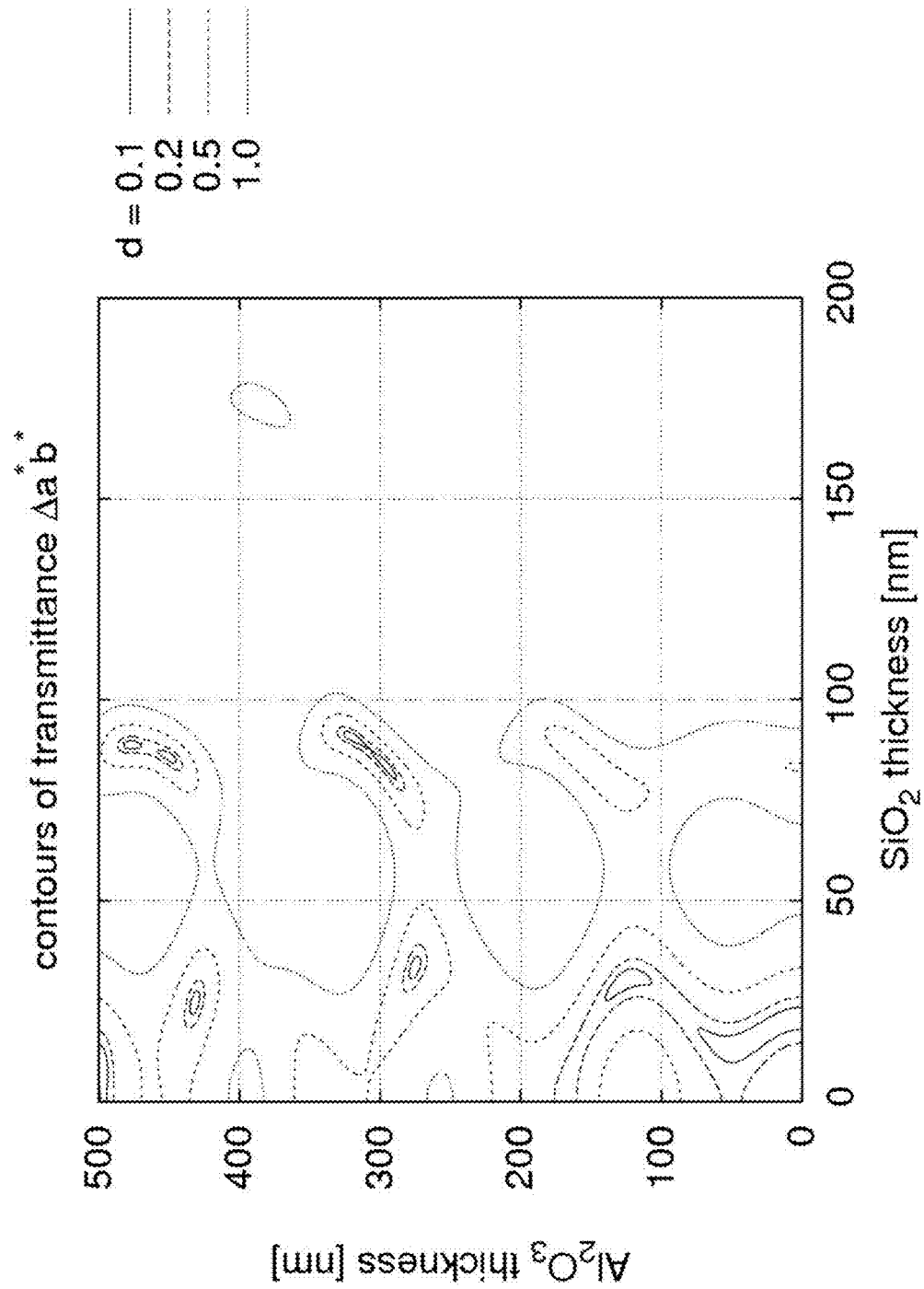
FIG. 30E is a contour plot of the distance of a* and b*, in transmittance, for the optical film structure and substrate of Example 11 from the origin (0, 0) in the L*a*b* color space.

FIG. 30E shows the thicknesses of the SiO$_2$ and Al$_2$O$_3$ layers at which the distance of the reflectance color coordinates of the article (including the optical film and the substrate) and the color coordinates (a*=0, b*=0) are less than about 1, less than about 0.5, less than about 0.2 and less than about 0.1. FIG. 30E shows that an optical film in which there are very few thicknesses for either the SiO$_2$ layer and the Al$_2$O$_3$ layer at which, when combined with a 2 μm thick AlO$_x$N$_y$ layer, will exhibit color coordinates, in transmittance, having a distance from the color coordinates (a*=0, b*=0) of greater than about 1. For example, an optical film with a SiO$_2$ layer having a thickness in the range from about 0 nm to about 50 nm and a Al$_2$O$_3$ layer having a thickness in the range from about 0 nm to about 500 nm (with more specific thicknesses for the Al$_2$O$_3$ and/or SiO$_2$ layers falling between the solid d=0.1 line and the dashed d=1.0 line), when combined with a 2 μm thick AlO$_x$N$_y$ layer, will exhibit color coordinates, in transmittance, having a distance from the color coordinates (a*=0, b*=0) of less than about 1. In another example, the SiO$_2$ layer thickness can be from about 0 nm to about 50 nm and the Al$_2$O$_3$ layer thickness can be from about 0 nm to about 220 nm, with more specific thicknesses for the Al$_2$O$_3$ and/or SiO$_2$ layers falling between the solid d=0.1 line and the dashed d=1.0 line. In another example, the SiO$_2$ layer thickness can be from about 60 nm to about 100 nm, and the Al$_2$O$_3$ layer thickness can be from about 100 nm to about 500 nm, with more specific thicknesses for the Al$_2$O$_3$ and/or SiO$_2$ layers falling between the solid d=0.1 line and the dashed d=1.0 line.

Figure 30F:
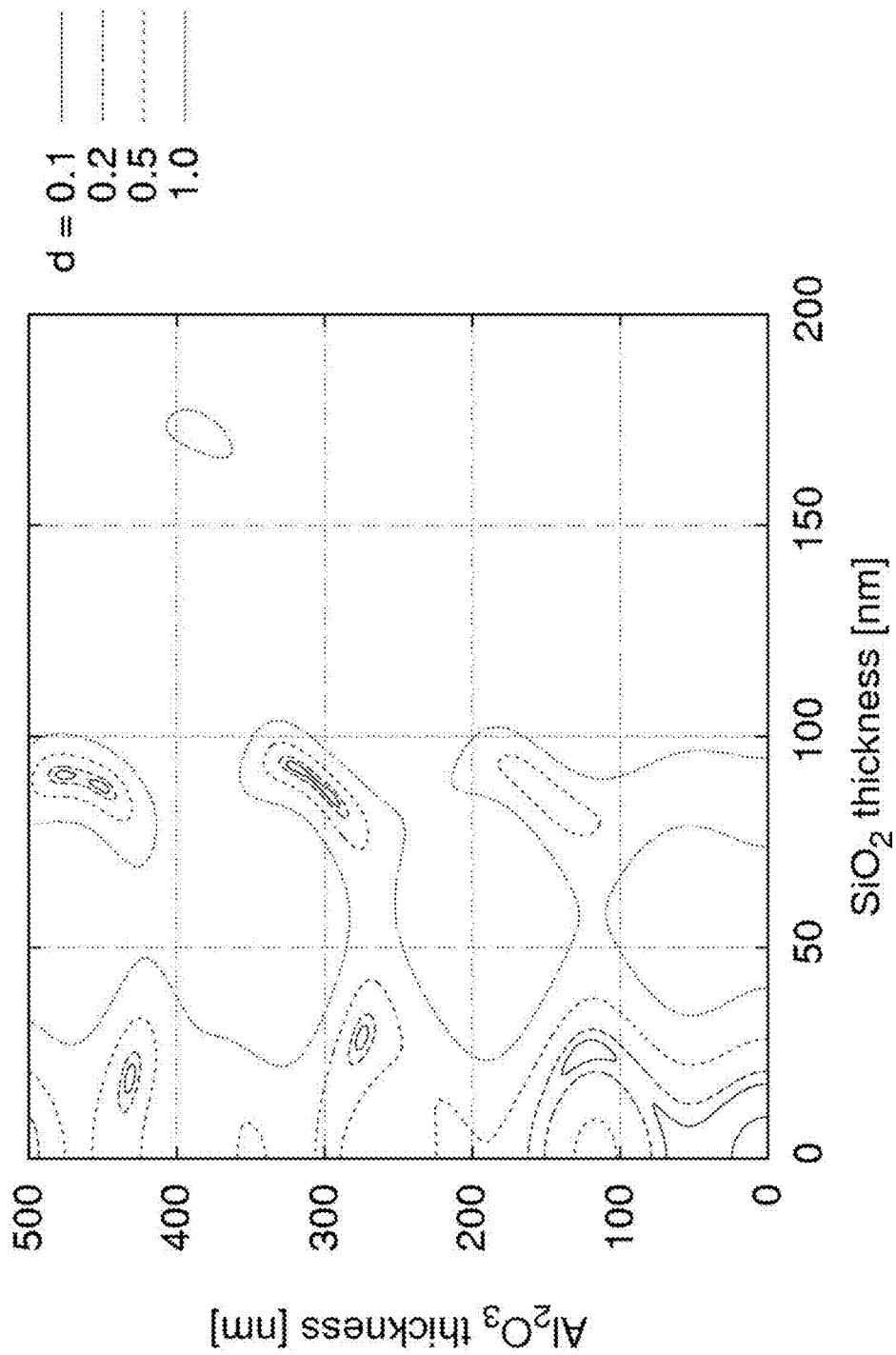
FIG. 30F is a contour plot of the distance of a* and b*, in transmittance, for the optical film structure and substrate from the color coordinates of the substrate.

FIG. 30F shows the thicknesses of the SiO$_2$ and Al$_2$O$_3$ layers at which the distance of the color coordinates of the article and the color coordinates of the substrate are less than about 1, less than about 0.5, less than about 0.2 and less than about 0.1. FIG. 30F shows that a substrate and an optical film with a 2-μm-thick AlOxNy layer, a SiO$_2$ layer having a thickness in the range from about 0 nm to about 50 nm and a Al$_2$O$_3$ layer having a thickness in the range from about 0 nm to about 200 nm (with more specific thicknesses for the Al$_2$O$_3$ and/or SiO$_2$ layers falling between the solid d=0.1 line and the dashed d=1.0 line), would exhibit color coordinates, in transmittance, having a distance from the color coordinates of the bare substrate of less than about 1. In another example, the SiO$_2$ layer thickness can be from about 70 nm to about 100 nm, and the Al$_2$O$_3$ layer thickness can be from about 100 nm to about 500 nm, with more specific thicknesses for the Al$_2$O$_3$ and/or SiO$_2$ layers falling between the solid d=0.1 line and the dashed d=1.0 line.

In FIGS. 29A-29F and 30A-30F, contour lines of a* and b* in the range from −0.5 to 0.5 and d of 0.1, 0.2, 0.5 and 1 were utilized to illustrate various design parameters to achieve the optical properties described herein. It should be noted that contour lines with greater ranges can be used (e.g., a* orb* in the range from about-1 to about 1 or from about −2 to about 2, or d=1.5, 2, 2.5 etc.) depending on illuminant of interest and/or observer preferences (i.e., some observers find greater variations in a*, b*, the combination of a* and b* and greater distances d to be acceptable).

It will be apparent to those skilled in the art that various modifications and variations can be made without departing from the spirit or scope of the invention.

What is claimed is:
1. A transparent article comprising:
a substrate having opposing major surfaces; and
an optical film structure disposed on a first major surface of the substrate forming a front face,
wherein the transparent article comprises a maximum hardness of about 12 GPa or greater, as measured on the front face by a Berkovich Indenter Hardness Test along an indentation depth from about 200 nm to about 600 nm;
wherein the optical film structure comprises a compositional gradient comprising any one or more of an oxygen content gradient, a nitrogen content gradient, a silicon content gradient and an aluminum content gradient; and wherein the article comprises either one or both of:
article transmittance color coordinates in the (L*, a*t b*) colorimetry system at normal incidence exhibiting a color shift of less than about 2 from a reference point as measured at the front face, the reference point comprising at least one of the color coordinates (a*=0, b*=0) and the transmittance color coordinates of the substrate, and
article reflectance color coordinates in the (L*, a*, b*) colorimetry system at normal incidence exhibiting a color shift of less than about 2 from a reference point as measured at the front face, the reference point comprising at least one of the color coordinates (a*=0, b*=0) and the reflectance color coordinates of the substrate,
wherein, when the reference point is the color coordinates of the substrate, the color shift is defined by $\sqrt{((a^*article-a^*substrate)2+(b^*article-b^*substrate)2)}$, and
wherein, when the reference point is the color coordinates (a*=0, b*=0), the color shift is defined by $\sqrt{((a^*article)2+(b^*article)2)}$.

2. The transparent article of claim 1, wherein the article comprises an average transmittance of 85% or more, over the visible spectrum as measured at the front face.

3. The transparent article of claim 1, further comprising a scratch resistance such that, when the front face is scratched with a Berkovich indenter using a load of 160 mN at a speed of 10 μm/seconds for at least a length of 100 μm along the front face of the article, a scratch having a scratch depth of less than 250 nm is formed.

4. The transparent article of claim 1, further comprising a scratch resistance such that, when the front face is scratched with a Berkovich indenter using a load of 160 mN at a speed of 10 μm/seconds for at least a length of 100 μm along the front face of the article, a scratch having a scratch width of less than 10 μm is formed.

5. The transparent article of claim 1, wherein the article comprises a maximum hardness of about 16 GPa or greater, as measured on the front face by a Berkovich Indenter Hardness Test along the indentation depth.

6. The transparent article of claim 1, wherein the optical film structure comprises one of a silicon-containing oxide, a silicon-containing oxy-nitride, silicon nitride, aluminum nitride, an aluminum-containing oxy-nitride, an aluminum-containing oxide, silicon aluminum oxy-nitride or a combination thereof.

7. The transparent article of claim 1, wherein the optical film structure comprises a first layer and a second layer.

8. The transparent article of claim 7, wherein:
the first layer comprises the compositional gradient
the second layer comprises a transparent dielectric material.

9. The transparent article of claim 1, wherein the optical film structure has a thickness of 1 μm or greater.

10. The transparent article of claim 1, wherein the substrate comprises a glass ceramic substrate.

11. An article comprising:
a substrate having opposing major surfaces; and
an optical film structure disposed on a first major surface of the substrate forming a front face;
the optical film structure comprising a first layer, the first layer comprising a first sub-layer and a second sub-layer wherein the first sub-layer is disposed between substrate and the second sub-layer,
the first sub-layer having a thickness and comprising a silicon-containing oxy-nitride, with the amount of oxygen in the silicon-containing oxy-nitride decreasing along the thickness moving away from the substrate,
the first sub-layer being disposed directly on the substrate and having a refractive index gradient that increases along the thickness of the first sub-layer in a direction moving away from the substrate and changes with the change in the amount of oxygen in the first sub-layer.

12. The article of claim 11, wherein the article comprises either one or both of:
article transmittance color coordinates in the (L*, a*, b*) colorimetry system at normal incidence exhibiting a color shift of less than about 2 from a reference point as measured at the front face, the reference point comprising at least one of the color coordinates (a*=0, b*=0) and the transmittance color coordinates of the substrate, and
article reflectance color coordinates in the (L*, a*, b*) colorimetry system at normal incidence exhibiting a color shift of less than about 2 from a reference point as measured at the front face, the reference point comprising at least one of the color coordinates (a*=0, b*=0) and the reflectance color coordinates of the substrate,
wherein, when the reference point is the color coordinates of the substrate, the color shift is defined by $\sqrt{((a^*_{article}-a^*_{substrate})^2+(b^*_{article}-b^*_{substrate})^2)}$, and
wherein, when the reference point is the color coordinates (a*=0, b*=0), the color shift is defined by $\sqrt{((a^*_{article})^2+(b^*_{article})^2)}$.

13. The article of claim 11, wherein the article comprises an average transmittance of 85% or more, over the visible spectrum as measured at the front face.

14. The article of claim 11, wherein the article comprises a maximum hardness of about 12 GPa or greater, as measured on the front face by a Berkovich Indenter Hardness Test along an indentation depth from about 200 nm to about 600 nm.

15. The article of claim 11, wherein the article comprises a maximum hardness of about 16 GPa or greater, as measured on the front face by a Berkovich Indenter Hardness Test along an indentation depth from about 200 nm to about 600 nm.

16. The article of claim 11, wherein the optical film structure has a thickness of 1 μm or greater.

17. The article of claim 11, wherein the substrate comprises a glass ceramic substrate.

18. The article of claim 11, wherein the substrate comprises an amorphous substrate.

19. The article of claim 11, wherein the second sub-layer comprises a transparent dielectric material.

20. The article of claim 1, wherein the optical film structure comprises a first sub-layer of a silicon-containing oxy-nitride or a silicon-containing aluminum oxy-nitride, the first sub-layer comprising the compositional gradient.

21. The article of claim 11, wherein the second sub-layer comprises AlN, $AlO_xN_y$, SiAlN, $Si_{u1}Al_vO_xN_y$, or combinations thereof.

* * * * *